(12) United States Patent
St. Amand et al.

(10) Patent No.: US 7,071,568 B1
(45) Date of Patent: Jul. 4, 2006

(54) STACKED-DIE EXTENSION SUPPORT STRUCTURE AND METHOD THEREOF

(75) Inventors: Roger D. St. Amand, Tempe, AZ (US); InTae Kim, Gwangju (KR); Vladimir Perelman, Fremont, CA (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 10/991,631

(22) Filed: Nov. 17, 2004

Related U.S. Application Data

(63) Continuation-in-part of application No. 10/705,194, filed on Nov. 10, 2003, now Pat. No. 6,930,378.

(51) Int. Cl.
*H01L 23/48* (2006.01)
*H01L 23/52* (2006.01)
*H01L 29/40* (2006.01)

(52) U.S. Cl. .............. 257/777; 257/783; 257/786; 438/109

(58) Field of Classification Search ............ 257/777, 257/685, 686, 723, 783, 786, 753, E25.021, 257/E25.27, E25.085, E21.614; 438/109, 438/FOR. 368, FOR. 426
See application file for complete search history.

(56) References Cited

U.S. PATENT DOCUMENTS

| | | | |
|---|---|---|---|
| 5,291,061 A | 3/1994 | Ball | 257/686 |
| 5,323,060 A | 6/1994 | Fogal et al. | 257/777 |
| 5,502,289 A | 3/1996 | Takiar et al. | 174/266 |
| 5,721,452 A | 2/1998 | Fogal et al. | 257/685 |
| 5,815,372 A | 9/1998 | Gallas | 361/760 |
| 5,886,412 A | 3/1999 | Fogal et al. | 257/777 |
| 5,963,794 A | 10/1999 | Fogal et al. | 438/108 |
| 6,005,778 A | 12/1999 | Spielberger et al. | 361/770 |
| 6,051,886 A | 4/2000 | Fogal et al. | 257/777 |
| 6,100,594 A | 8/2000 | Fukui et al. | 257/777 |
| 6,215,193 B1 | 4/2001 | Tao et al. | 257/777 |
| 6,448,659 B1 | 9/2002 | Lee | 257/777 |
| 6,633,086 B1 | 10/2003 | Peng et al. | 257/777 |
| 6,664,644 B1 | 12/2003 | Morozumi | 257/777 |
| 6,714,418 B1 | 3/2004 | Frankowsky et al. | 361/735 |
| 6,744,141 B1 | 6/2004 | Kimura | 257/777 |
| 6,750,545 B1 | 6/2004 | Lee et al. | 257/777 |

(Continued)

FOREIGN PATENT DOCUMENTS

JP          60182731        9/1985

(Continued)

*Primary Examiner*—Jasmine Clark
(74) *Attorney, Agent, or Firm*—Gunnison, McKay & Hodgson, L.L.P.; Serge J. Hodgson

(57) ABSTRACT

A structure includes a substrate having a first surface, a first semiconductor die, a spacer and a second semiconductor die. The first semiconductor die has an active surface with opposite first and second parallel rows of bond pads, and an opposite inactive surface attached to the first surface of the substrate. The spacer is coupled to the active surface of the first semiconductor die entirely within the first and second rows of bond pads of the first semiconductor die, the spacer overhanging at least one side of the first semiconductor die. The second semiconductor die has an active surface and an opposite inactive surface, the active surface of the second semiconductor die larger in area than the active surface of the first semiconductor die, the active surface of the second semiconductor die with at least one row of bond pads.

25 Claims, 88 Drawing Sheets

U.S. PATENT DOCUMENTS

| | | | |
|---|---|---|---|
| 2002/0096785 A1 | 7/2002 | Kimura | 257/778 |
| 2003/0011067 A1* | 1/2003 | Kimura | 257/723 |
| 2003/0038374 A1* | 2/2003 | Shim et al. | 257/777 |
| 2004/0016939 A1 | 1/2004 | Akiba et al. | 257/126 |
| 2004/0037059 A1 | 2/2004 | Stiborek et al. | 361/764 |
| 2004/0053442 A1 | 3/2004 | Akram et al. | 438/106 |
| 2004/0075164 A1 | 4/2004 | Pu et al. | 257/686 |
| 2004/0126926 A1 | 7/2004 | Arai et al. | 438/107 |

FOREIGN PATENT DOCUMENTS

| | | |
|---|---|---|
| JP | 63128736 | 6/1988 |

* cited by examiner

STACKED-DIE EXTENSION SUPPORT STRUCTURE AND METHOD THEREOF

CROSS-REFERENCE TO RELATED APPLICATIONS

This application is a continuation-in-part of St. Amand et al, U.S. patent application Ser. No. 10/705,194, entitled "STACKED SEMICONDUCTOR DIE ASSEMBLY", filed on Nov. 10, 2003, U.S. Pat. No. 6,930,378 which is herein incorporated by reference in its entirety.

BACKGROUND OF THE INVENTION a. Field of the Invention

The present invention is in the field of semiconductor die packaging.

b. Description of the Related Art

Electronic equipment that includes packaged semiconductor dies, such as portable telephones, personal computers, and digital cameras, are being developed with increased functionality. To meet this trend, companies that assemble semiconductor dies into packages are developing semiconductor packages that include a plurality of stacked semiconductor dies in a single package.

A conventional technique for stacking plural semiconductor dies in a single package is to couple an inactive (i.e., backside) surface of a first semiconductor die to a substrate, so that the active surface of the first semiconductor die faces away from the substrate, and then to attach the inactive surface of a second semiconductor die onto the active surface of the first semiconductor die using an electrically insulating adhesive layer. The first and second semiconductor dies are each electrically coupled to the substrate by bond wires that extend from bond pads on the active surface of the respective semiconductor dies to the substrate. In order that the upper second semiconductor die not interfere with the bond wires coupled to the lower first semiconductor die, the second semiconductor die is typically smaller than the first semiconductor die so that the second semiconductor die fits fully within the opposed parallel rows of bond pads on the active surface of the first semiconductor die. In a case where a die attach paste is used to couple the first and second semiconductor dies, the size of the second semiconductor die also is limited to account for the die-attach fillet that is formed during the die-attach process for the second semiconductor die. Unfortunately, this approach of stacking a smaller second semiconductor die on a larger first semiconductor die is not feasible where it is desired to stack two same-size semiconductor dies, or to stack a larger semiconductor die on top of a smaller semiconductor die.

An alternative approach for die stacking is to attach a first side of a rectangular prism of silicon or of a dielectric film, called a "spacer," to the active surface of the first semiconductor die, and to attach the inactive surface of the second semiconductor die to an opposite second side of the spacer. The spacer has an upper and lower surface area that is smaller than the area of the active surface of the lower die, and is placed so as to be entirely within the bond pads and active surface edges of the lower semiconductor die. The spacer has a thickness sufficient to space the inactive surface of the second die above the bond wires that are coupled from the bond pads of the first semiconductor die to the substrate. Unfortunately, the spacer adds additional vertical height to the package, and thus is not optimal for certain applications. Accordingly, a new approach to stacking a plurality of semiconductor dies is desirable.

SUMMARY OF THE INVENTION

The present invention includes structures and methods that allow a plurality of semiconductor dies to be stacked in a compact manner in semiconductor packages and in other electronic assemblies.

In one embodiment, a first semiconductor die and at least one member, called a "support" or "support member" herein, are coupled to a die mounting surface of a substrate. The first semiconductor die includes an active surface that includes a plurality of bond pads. Bond wires electrically couple the bond pads of the first semiconductor die to the substrate. The at least one support is laterally adjacent to the first semiconductor die on the die mounting surface. The active surface of the first semiconductor die and the upper surface of the at least one support are coplanar, and parallel to the die mounting surface of the substrate. To achieve this coplanarity, the at least one support may have the same thickness, i.e., vertical height from the mounting surface, as the adjacent first semiconductor die. A second semiconductor die, which may be smaller, the same size, or larger than the first semiconductor die is stacked on the coplanar active surface of the first semiconductor die and the upper surface of the at least one support. The second semiconductor die also has a plurality of bond pads, which may be aligned in one or more rows, with each row being along a respective one of the four edges of the active surface of the second semiconductor die. The bond pads are electrically coupled to the substrate and/or to respective bond pads of the underlying first semiconductor die by bond wires. The second semiconductor die may have a uniformly-thick, electrically insulative, adhesive layer covering its entire inactive (i.e., backside) surface. This adhesive layer simultaneously couples the inactive surface of the second semiconductor die to the coplanar active surface of the first semiconductor die and the upper surface of the at least one support. Accordingly, the second semiconductor die is level and parallel with the die mounting surface of the substrate. The second semiconductor die is sized and disposed on the first semiconductor die so that the second semiconductor die does not overlap any of the bond pads of the underlying first semiconductor die, and hence the bond wires coupled to the first semiconductor die are not adversely contacted by the second semiconductor die. The second semiconductor die may overhang one, two, or three edges of the active surface of the underlying first semiconductor die, depending on the size and configuration of the first semiconductor die, the location of the bond pads of the first semiconductor die, and the positioning and size of the second semiconductor die.

Practitioners will appreciate that, with the above-described embodiment, the second semiconductor die may be stacked on the active surface of the first semiconductor die and overlap the one or more of the peripheral sides of the first semiconductor die, provided that the bond pads of the first semiconductor die are not obstructed. The overlap may be significant and may exceed conventional tolerances because of the provision of the at least one support beneath the second semiconductor die. In addition, since there is no overlap of the first semiconductor die's bond pads by the second semiconductor die, the wirebonding step for each of these two stacked semiconductor die may be performed together in a single wirebonding operation, thereby saving time and cost in the assembly process.

A further embodiment increases the size of the stack by attaching at least one second-level support on the active surface of the first semiconductor die adjacent to the second semiconductor die, using an electrically insulative adhesive layer having the same thickness as the adhesive layer coupling the second semiconductor die to the first semiconductor die. The second-level support(s) has the same thickness (i.e., vertical height) as the second semiconductor die. Accordingly, the active surface of the second semiconductor die and the upper surface of the at least one second-level support are coplanar. A third semiconductor die having an uniformly-thick, electrically insulative, adhesive layer over its entire inactive surface is then attached to the coplanar active surface of the second semiconductor die and the upper surface of the at least one second-level support. The third semiconductor die is sized and disposed so that the third semiconductor die does not overlap the bond pads of the underlying second semiconductor die, notwithstanding that the third die may overhang one or more edges of the active surface of the second semiconductor die and may overlap the bond wires of the first semiconductor die, provided that there is no adverse contact with the bond wires of the first semiconductor die. The process can be repeated to provide stacks of four, five, six, or more levels of semiconductor dies and support(s).

In accordance with another embodiment, a structure includes a substrate having a first surface, a first semiconductor die, a spacer and a second semiconductor die. The first semiconductor die has an active surface with opposite first and second rows of bond pads, and an opposite inactive surface attached to the first surface of the substrate. The spacer is coupled to the active surface of the first semiconductor die entirely within the first and second rows of bond pads of the first semiconductor die, with the spacer overhanging at least one side of the first semiconductor die. The second semiconductor die has an active surface and an opposite inactive surface, the active surface of the second semiconductor die is larger in area than the active surface of the first semiconductor die, such that the second semiconductor die overhangs the bond pads of the first semiconductor die and the sides of the first semiconductor die having no bond pads, with the active surface of the second semiconductor die having at least one row of bond pads.

The present invention is best understood by reference to the following detailed description when read in conjunction with the accompanying drawings.

BRIEF DESCRIPTION OF THE DRAWINGS

Common reference numerals are used throughout the drawings and the detailed description to indicate like elements.

DETAILED DESCRIPTION

The present invention includes methods and structures that allow for the stacking of semiconductor dies. In a particular application, the semiconductor dies may be packaged in a semiconductor package, and for the sake of example, we show and describe various semiconductor package embodiments. However, the methods and structures shown herein may be used in electronic assemblies generally, and not just in semiconductor packages.

Figure 1A:
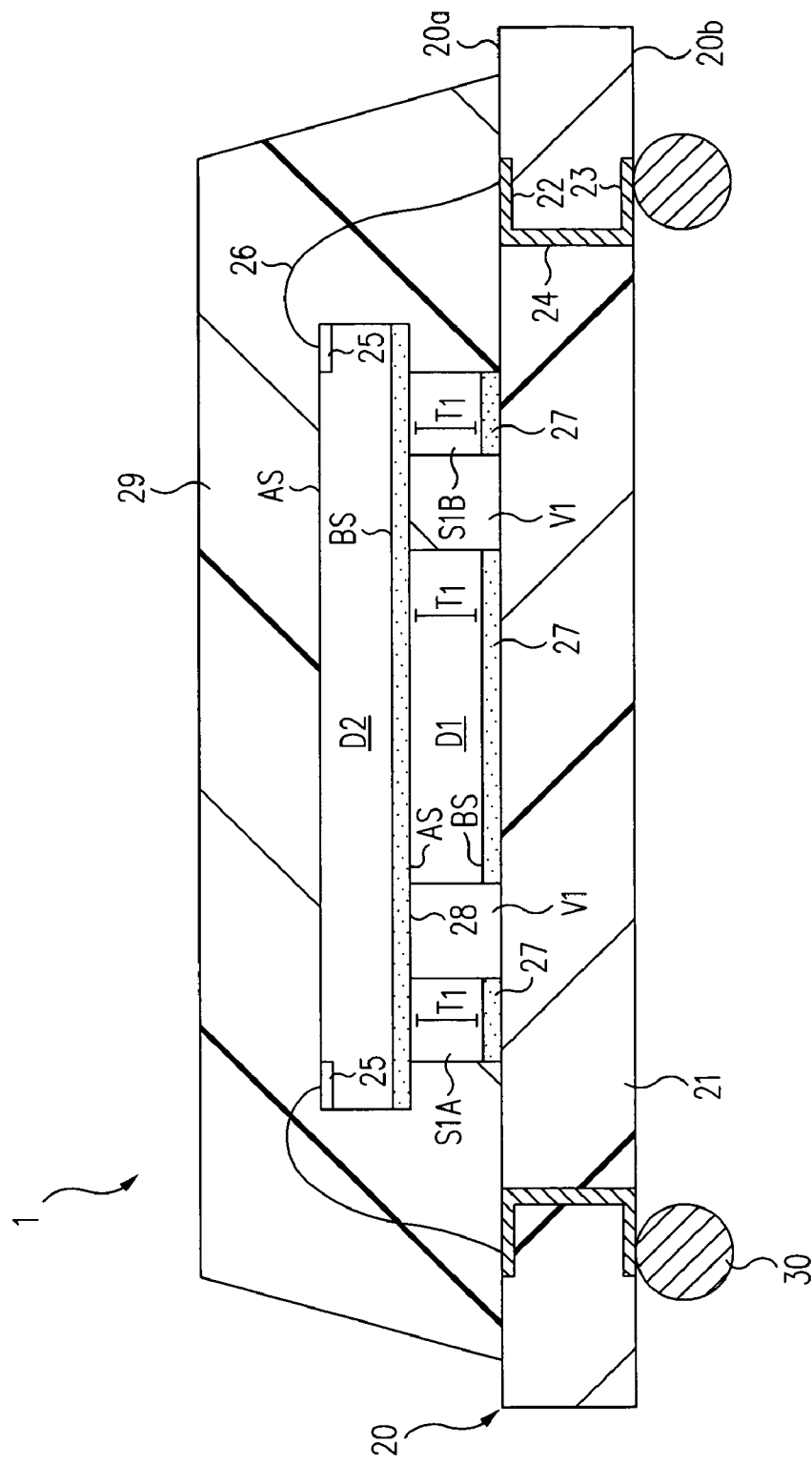
FIGS. 1A and 1B are cross-sectional side views of a first embodiment of a semiconductor package.
Figure 1B:
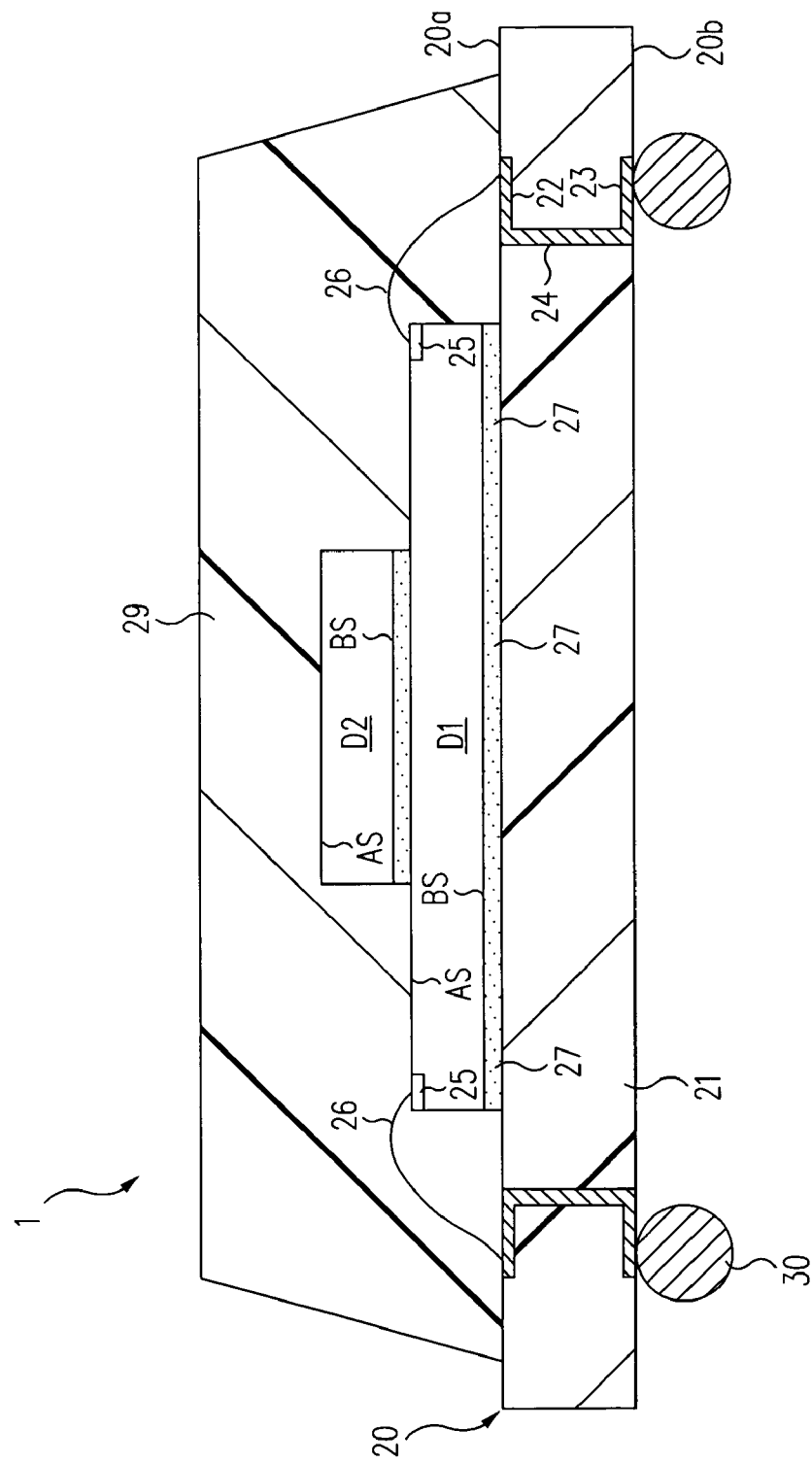

FIGS. 1A and 1B illustrate a first embodiment of a semiconductor package 1 in accordance with the present invention. The views of FIGS. 1A and 1B are at 90 degree angles to each other. FIG. 1A is taken along line 1A—1A of FIG. 3B, and the cross-sectional side view of FIG. 1B is taken along line 1B—1B of FIG. 3B.

Semiconductor package 1 includes two semiconductor dies, labeled D1 and D2, stacked one on top of the other and coupled together by an adhesive layer 28. The upper semiconductor die D2 is supported by underlying semiconductor die D1 and two underlying supports, labeled S1A and S1B. The number "1" in the labels D1 and S1A, S1B indicates that these structures are at a first level of a semiconductor die stack relative to the substrate. The number "2" in the label D2 indicates that the structure is in the second layer of the stack relative to the substrate. The letters "A" and "B" in the labels S1A and S1B distinguish between two similar structures in the same level of the stack. We will use similar labeling techniques throughout the specification for the semiconductor dies and support structures of the various levels of the stack.

Returning to FIG. 1, semiconductor package 1 includes a substrate 20 to which semiconductor dies D1 and D2 are coupled. In this example, substrate 20 includes a core insulative layer 21, a planar upper surface 20a and a planar lower surface 20b that is opposite and parallel to upper surface 20a. Electrically conductive circuit patterns 22 are accessible at upper surface 20a of substrate 20, and electrically conductive circuit patterns 23 are accessible at lower surface 20b. Electrically conductive vias 24 couple the circuit patterns 22 and 23 through the insulative layer 21. Typically, the circuit patterns 23, and vias 24 are formed of metal, but any electrically conductive material may be used. The upper and lower surfaces 20a and 20b of substrate 20 may include an outermost insulative cover coat (e.g., an epoxy-based resin) though which electrically conductive bond fingers and ball lands of the circuit patterns 22 and 23, respectively, are exposed.

Bond wires 26 electrically couple bond pads 25 on the active surface AS of semiconductor dies D1 and D2 to the bond fingers of upper circuit patterns 22. In some cases, low profile bond wires 26, e.g., standoff stitch bond wires, are used. The semiconductor dies D1, D2 may be electrically coupled to each other, for instance, indirectly through a pair of bond wires 26 each coupled to a same upper circuit pattern 22, or directly through a bond wire 26 coupled from a bond pad 25 of semiconductor die D1 to a bond pad 25 of semiconductor die D2.

Metal solder balls 30 are fused to the ball lands of lower circuit patterns 23, and serve as terminals for electrically coupling semiconductor package 1 to external equipment, such as a printed circuit board.

A hardened plastic encapsulant 29 covers semiconductor dies D1 and D2, supports S1A and S1B, bond wires 26, and most or all of the upper surface 20a of substrate 20.

Supports S1A and S1B are rectangular prisms, identical to each other. Supports S1A and S1B are disposed on opposite sides of semiconductor die D1. Supports S1A and S1B may be monolithic blocks of a semiconductor material, such as silicon or gallium arsenide, monolithic blocks of metal, such as copper or aluminum, or monolitihic blocks of a dielectric material, such as an elastomeric film, a polyimide film, or some other type of dielectric film or tape.

The inactive surface BS of semiconductor die D1 and the respective lower surfaces of supports S1A, S1B are each attached to the upper surface 20a of substrate 20 by an electrically insulative adhesive layer 27. The adhesive layers 27 may be, for example, a die attach paste (e.g., epoxy).

In the embodiment of FIG. 1A, the semiconductor die D1 and supports S1A and S1B have the same thickness $T_1$, or vertical height, relative to upper surface 20a. In addition, the adhesive layer 27 that attaches the inactive surface BS of semiconductor die D1 to upper surface 20a of substrate 20 has the same thickness as the respective adhesive layers 27 that attach supports S1A and S1B to upper surface 20a. By the term "same", we mean identical within a manufacturing tolerance. Accordingly, the active surface AS of semiconductor die D1 and the upper surfaces of supports S1A and S1B should be coplanar, and parallel to the underlying upper surface 20a of substrate 20, within a manufacturing tolerance of, for example, +/−5 microns.

Regardless of the manner or materials by which the supports S1A, S1B are formed and attached to upper surface 20a of substrate 20, the total thickness of the overall support structure (e.g., a homogeneous single- or double-sided adhesive dielectric film, a dielectric film with inherent adhesive properties, or a silicon blank plus die attach paste) and the total thickness of the adjacent semiconductor die D1 and its corresponding die attach should be such that the next-level semiconductor die D2 is supported flat and parallel to upper surface 20a of substrate 20.

Typically, but not necessarily, the adhesive layer 27 that attaches the inactive surface BS of semiconductor die D1 to upper surface 20a will be the same material as the adhesive layer 27 that attaches the lower surfaces of supports S1A, S1B to upper surface 20a. Alternatively, in a case where the supports S1A, S1B are a formed of a single-sided or double-sided adhesive dielectric film, then the adhesive layer 27 under the supports S1A, S1 could be the adhesive layer supplied on the film, and the adhesive layer 27 under the semiconductor die D1 could be a die attach paste. In such a case, care should be taken to ensure that the active surface of semiconductor die D1 and the upper surfaces of the supports S1A, S1B are coplanar.

While the adhesive layers 27 under the semiconductor die D1 and supports S1A, S1B are shown as discrete bodies in FIG. 1A, in an alternative embodiment, the adhesive layer 27 may be a single body that couples all of semiconductor die D1 and supports S1A, S1B to upper surface 20a and spans or fills (partially or completely) the spaces between the semiconductor die D1 and supports S1A, S1B.

If desired, the upper surface 20a of substrate 20 may include a metal die paddle to which semiconductor die D1 and supports S1A, S2A are attached.

As mentioned above, the inactive surface BS of second-level semiconductor die D2 is attached to the coplanar active surface AS of semiconductor die D1 and upper surfaces of supports S1A and S1B by a uniformly-thick electrically insulative adhesive layer 28. The adhesive layer 28 covers the entire inactive surface BS of semiconductor die D2, thereby assuring the adhesive layer 28 makes simultaneous contact with the active surface AS of semiconductor die D1 and the upper surfaces of supports S1A, S1B during the stacking process. It is desirable that semiconductor die D2 be parallel with upper surface 20a of substrate 20. Note that, in the case where a dielectric film is used for supports S1A, S1B, it is not necessary that the upper surface of the supports S1A, S1B have its own adhesive layer, since the adhesive layer 28 on the inactive surface BS of the semiconductor die D2 will couple the semiconductor die D2 to the upper surface of the supports S1A, S1B. Note also that the adhesive layers 28 on the supports S1A, S1B may be inherent in the material of the support S1A, S1B.

Figure 2B:
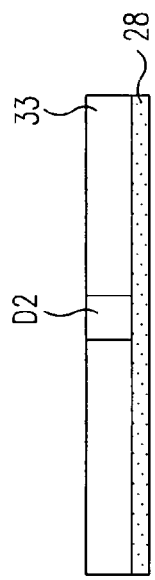
FIG. 2B is a cross-sectional side view of the semiconductor wafer of FIG. 2A.
Figure 2A:
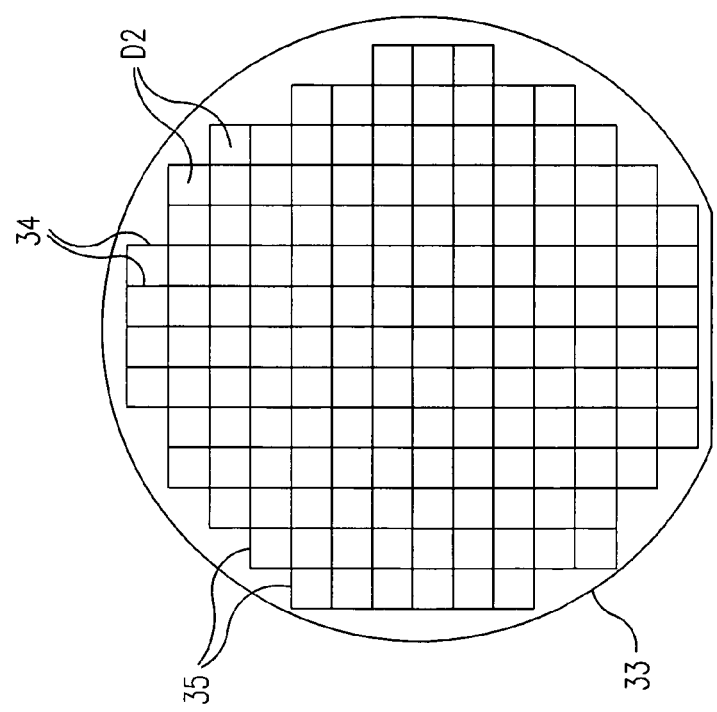
FIG. 2A is a top plan view of a semiconductor wafer.

FIGS. 2A and 2B illustrate an exemplary method of preparing semiconductor die D2 for its mounting in semiconductor package 1. Semiconductor die D2 is formed with other identical dies on a semiconductor wafer 33. Adhesive layer 28 is applied over the entire backside of the semiconductor wafer 33. For instance, adhesive layer 28 may be a double-sided adhesive dielectric film. Subsequently, individual semiconductor dies D2 are singulated by sawing along scribe lines 34 and 35 of wafer 33. The sawing also cuts through the adhesive layer 28, thereby assuring that the entire inactive surface of each semiconductor die D2 is covered by the adhesive layer 28, and that the severed sides of semiconductor die D2 and adhesive layer 28 are coplanar. If semiconductor die D1 and supports S1A and S1B are adhered to substrate 20 with a double-sided adhesive dielectric film as adhesive layer 27, as opposed to a die attach paste, then they may be covered with an adhesive layer 27 in the same manner that semiconductor die D2 is covered by adhesive layer 28. This would especially be desirable if supports S1A, S1B are formed from a wafer of semiconductor material.

Semiconductor dies D1 and D2 may be diced from semiconductor wafers that have had their backsides polished or etched to reduce the thickness of the semiconductor dies of the wafer. Such backside polishing or etching would reduce the vertical height of the semiconductor dies D1, D2, and thereby allow for a decrease the overall height of semiconductor package 1.

Figure 3A:
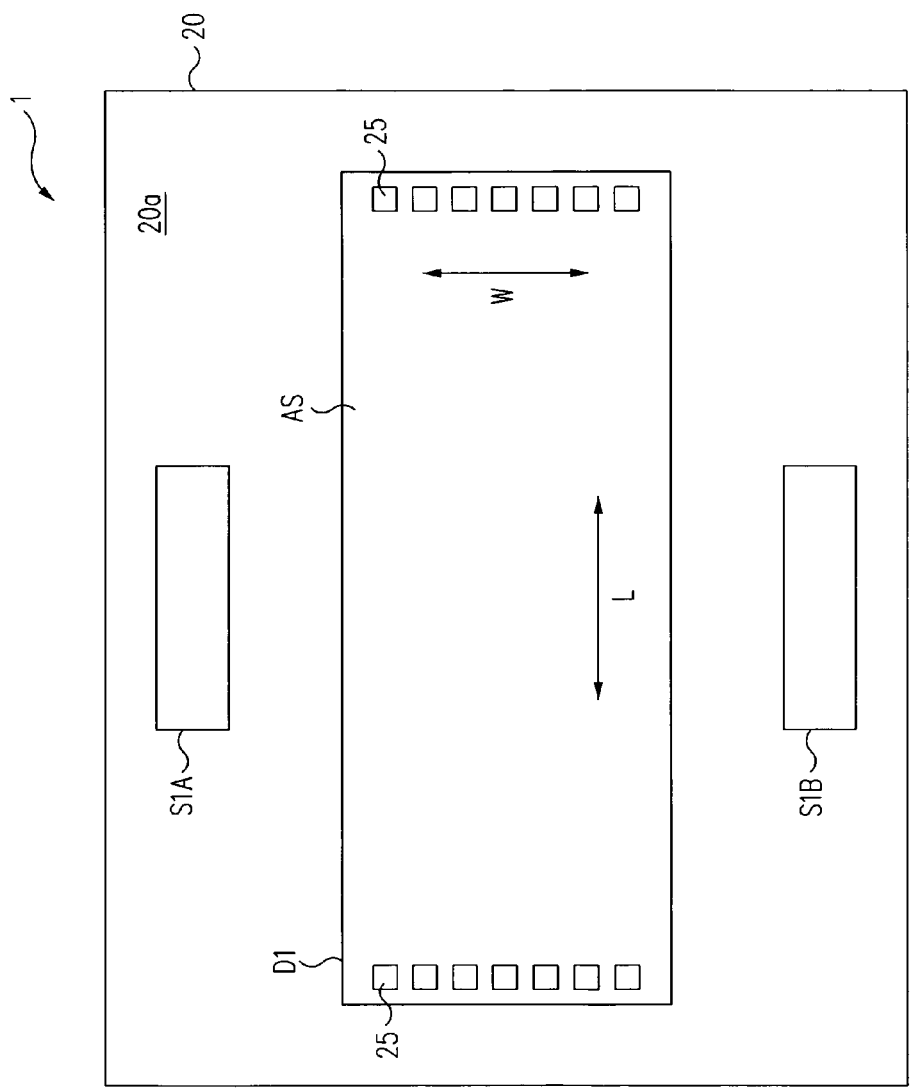
FIGS. 3A and 3B are simplified top plan views of levels in the semiconductor package of FIG. 1.
Figure 3B:
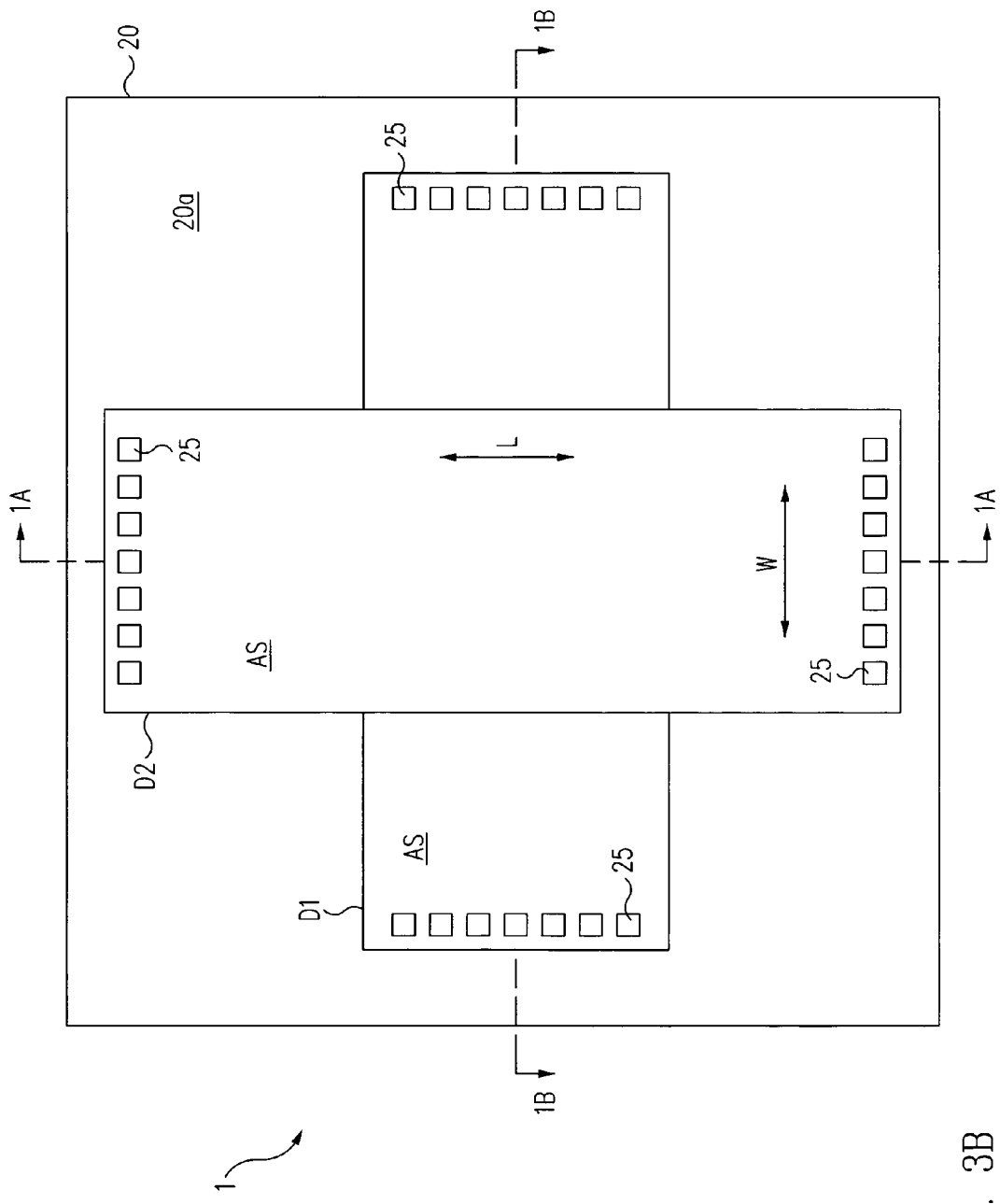

FIGS. 3A–3B are simplified top plan views of semiconductor package 1. The cross-sectional side view of FIGS. 3A–3B show the arrangement and manner of stacking semiconductor dies D1, D2 and supports S1A, S1B on the upper surface 20a of substrate 20. For ease of view, the bond wires 26, circuit patterns 22, and encapsulant 29 of semiconductor package 1 are omitted from FIGS. 3A and 3B.

Referring to FIG. 3A, semiconductor die D1 is attached to upper surface 20a of substrate 20. The active surface AS of semiconductor die D1 faces away from upper surface 20a. The active surface AS is oblong rectangular, and includes two rows of bond pads 25. One row of the bond pads 25 is along each of the two opposed, parallel short edges of active surface AS. The aspect ratio (i.e., ratio of length to width) of semiconductor die D1 is such that its length L is greater than its width W. There are no rows of bond pads along the long edges of the active surface AS of semiconductor die D1.

Support S1A is adjacent to one of the two parallel long sides of semiconductor die S1A, and support S1B is adjacent to the opposed long side of semiconductor die D1 in a mirror image placement to support S1A. The supports S1A, S1B are the same-size, and have the form of rectangular prisms. The supports S1A, S1B are each disposed so that the long sides of the supports S1A, S1B are parallel to, but spaced from, the adjacent long side of the semiconductor die D1.

The dimensions and placement of supports S1A, S1B can vary, provided that the supports S1A, S1B provide the necessary support for the next-higher-level semiconductor die D2. Referring to FIGS. 1A, 1B, 3A, and 3B, the long side of supports S1A, S1B is lesser in length than the short side width W of semiconductor die D2, but could be made to be greater in length, if desired.

Referring to FIGS. 1A, 1B, 3A, and 3B, consideration in selecting the dimensions and placement of supports S1A, S1B is to regulate the amount by which semiconductor die D2 overhangs the outermost long sides of supports S1A, S1B, so that, when bond wires 26 are electrically coupled to the bond pads 25 of semiconductor die D2 by automated wire bond machines, the force applied to the semiconductor die D2 by the wire bond machine head does not, through a cantilever effect, damage semiconductor die D1 or D2, and does not alter the bond wires 26 of die D1 to the point of causing an electrical open or a short circuit or some other failure condition. For instance, it may be appropriate that some portion of the supports S1A, S1B be directly under the bond pads 25 of semiconductor die D2. On the other hand, it may be acceptable to have the supports S1A, S1B only partially under, or even entirely inward of, the bond pads 25 of semiconductor die D2, provided that a wire bonding step or some other processing step does not, as a result of the amount of overhang, damage semiconductor die D1 or D2, and does not adversely effect the electrical performance of bond wires 26 of semiconductor die D1.

In the embodiment of FIGS. 1A, 1B, 3A, and 3B, supports S1A and S1B are equally spaced a relatively-large equivalent distance from the respective adjacent long side of semiconductor die D1. Referring to FIG. 1A, this spacing allows encapsulant 29 to easily flow into and fill the volume V1 defined by upper surface 20a of substrate 20, the facing sides of semiconductor die D1 and supports S1A, S1B, and the lower side of the adhesive layer 28 on the inactive surface BS of semiconductor die D2. An air pocket in volume V1 after encapsulation is not desirable.

In an alternative embodiment, such as where supports S1A, S1B are formed of a semiconductor material (e.g., silicon) and are attached to upper surface 20a using a die attach paste as adhesive layer 27, then supports S1A, S1B may be placed sufficiently close to the sides of semiconductor die D1 that a fillet of the die attach paste fills the space between, and contacts, the facing sides of supports S1A, S1B and semiconductor die D1. Accordingly, there would be no need, or little need, for encapsulant 29 to fill in between the facing sides of supports S1A, S1B and semiconductor die D1, since the volume V1 of FIG. 1A would be largely eliminated.

In a further alternative embodiment, such as where supports S1A, S1B are formed of an homogeneous film (e.g., having adhesive upper and lower surfaces (either through the application of an adhesive material or as an inherent property of the homogeneous film), the long sides of supports S1A, S1B may abut respective adjacent long side of semiconductor die D1. Accordingly, there would be no need, or little need, for encapsulant 29 to fill in between the facing sides long of supports S1A, S1B and semiconductor die D1.

Referring to FIG. 3B, the semiconductor die D2 is stacked on, and is attached by adhesive layer 28 to, the coplanar active surface AS of semiconductor die D1 and upper surfaces of supports S1A, S1B. Semiconductor die D2 is supported flat and parallel to the upper surface 20a of substrate 20. Like semiconductor die D1, semiconductor die D2 also has an oblong rectangular active surface AS, with an aspect ratio such that the length L of semiconductor die D2 is greater than its width W. Semiconductor die D2 is oriented so that both of its short side ends and rows of bond pads 25 overhang the nearest long side of semiconductor die D1 and the respective nearest outermost long side of supports S1A, S1B. The rows of bond pads 25 of semiconductor die D2 are at a 90 degree angle to the rows of bond pads 25 of semiconductor die D1.

The aspect ratio of semiconductor die D2 is such that semiconductor die D2 and its underlying adhesive layer 28 fit entirely within (i.e., entirely inside of) the two, opposed rows of bond pads 25 on the active surface AS of semiconductor die D1, so that bond pads 25 of semiconductor die D1 are unobstructed and fully accessible for wire bonding.

In the embodiment of FIGS. 1 and 3B, semiconductor dies D1 and D2 are the same size, which would be the case if semiconductor dies D1 and D2 are identical devices, e.g., both the same type of memory device. However, it is not necessary that semiconductor dies D1 and D2 be the same size or type, as long as semiconductor die D2 has one dimension such that semiconductor die D2 fits entirely within the two opposed rows of bond pads 25 of the active surface AS of semiconductor die D1, with the other dimension of semiconductor die D2 being free to overlap the edge of the active surface AS of underlying semiconductor die D1, as necessary per the application.

Figure 3C:
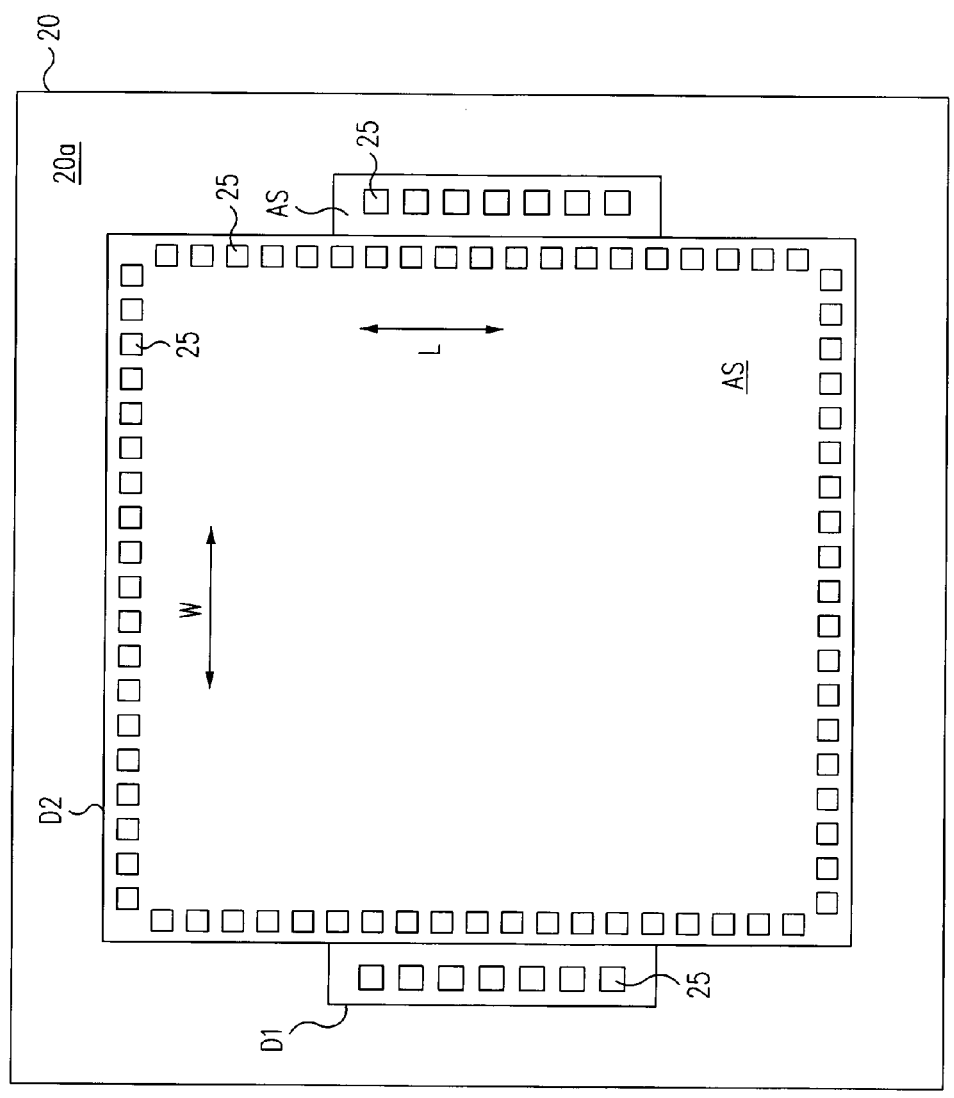
FIG. 3C is a simplified top plan view of an alternative embodiment of FIG. 3B.

For instance, in the alternative embodiment of FIG. 3C, semiconductor die D2 is square and has bond pads 25 in four rows, with one row adjacent to each of the four edges of active surface AS. While semiconductor die D2 is larger than semiconductor die D1 in this embodiment, semiconductor die D2 nonetheless fits entirely within the two rows of bond pads 25 of semiconductor die D1. In particular, two parallel rows of bond pads 25 of semiconductor die D2 are parallel to and within the two rows of bond pads 25 of semiconductor die D1, and two other parallel rows of bond pads 25 of semiconductor die D2 are perpendicular to and within the two rows of bond pads 25 of semiconductor die D2, while also overhanging the nearest respective one of the long sides of semiconductor die D1. Note that at least some of the bond pads 25 of each of the four rows of bond pads of semiconductor die D2 of FIG. 3C overhang the nearest respective long side of semiconductor die D1. The support structures S1A, S2A of FIG. 3A would be enlarged to provide sufficient support for the enlarged semiconductor die D2 of FIG. 3C, as discussed above, especially during the wirebonding operation.

Note that, in the embodiments of FIGS. 3B and 3C, that all of the bond pads 25 of semiconductor dies D1, D2 are exposed. Semiconductor die D2 does not cover any bond pads 25 of semiconductor die D1. Accordingly, after semiconductor dies D1 and D2 are stacked, bond wires 26 (FIG. 1) may be electrically coupled to all of the bond pads 25 of semiconductor dies D1, D2 in a single wire bonding operation. As mentioned, some of the bond pads 25 of semiconductor dies D1 and/or D2 may be electrically coupled by bond wires 26 to bond fingers of circuit patterns 22, and others of the bond pads 25 of semiconductor dies D1 and/or D2 may be electrically coupled by bond wires 26 to respective bond pads 25 of the other semiconductor die. Use of low profile bond wires 26, e.g., standoff stitch bonds, will help to minimize the height of semiconductor package 1.

Note that, in the embodiments of FIGS. 3B and 3C, the upper semiconductor die D2 overhangs the two long edges of the lower semiconductor die D1. If, in an alternative embodiment, semiconductor die D1 only had one row of bond pads 25, rather than two parallel rows of bond pads 25, then semiconductor die D2 could overhang the two long sides of semiconductor die D1 as well as the one short side of semiconductor die D1 that does not have an adjacent row of bond pads 25. Examples of such an embodiment will be provided below.

Practitioners will appreciate that the above-described stacking method and structure of semiconductor dies D1, D2 and supports S1A, S1B of semiconductor package 1 of FIGS. 1A–3C may be practiced without the use of other aspects of semiconductor package 1. For instance, substrate 20 is merely an example of a semiconductor package substrate upon which the semiconductor dies D1 and D2 may be stacked and to which the semiconductor dies D1, D2 may be electrically coupled. In other embodiments, substrate 20 may be a metal leadframe of a semiconductor package, or a circuit film with circuit patterns only on one side thereof. Alternatively, semiconductor dies D1 and D2 may be stacked with supports S1A, S2A on a motherboard to which other semiconductor packages are coupled, and covered with a glob top encapsulant or a hollow metal cap.

Figure 4A:
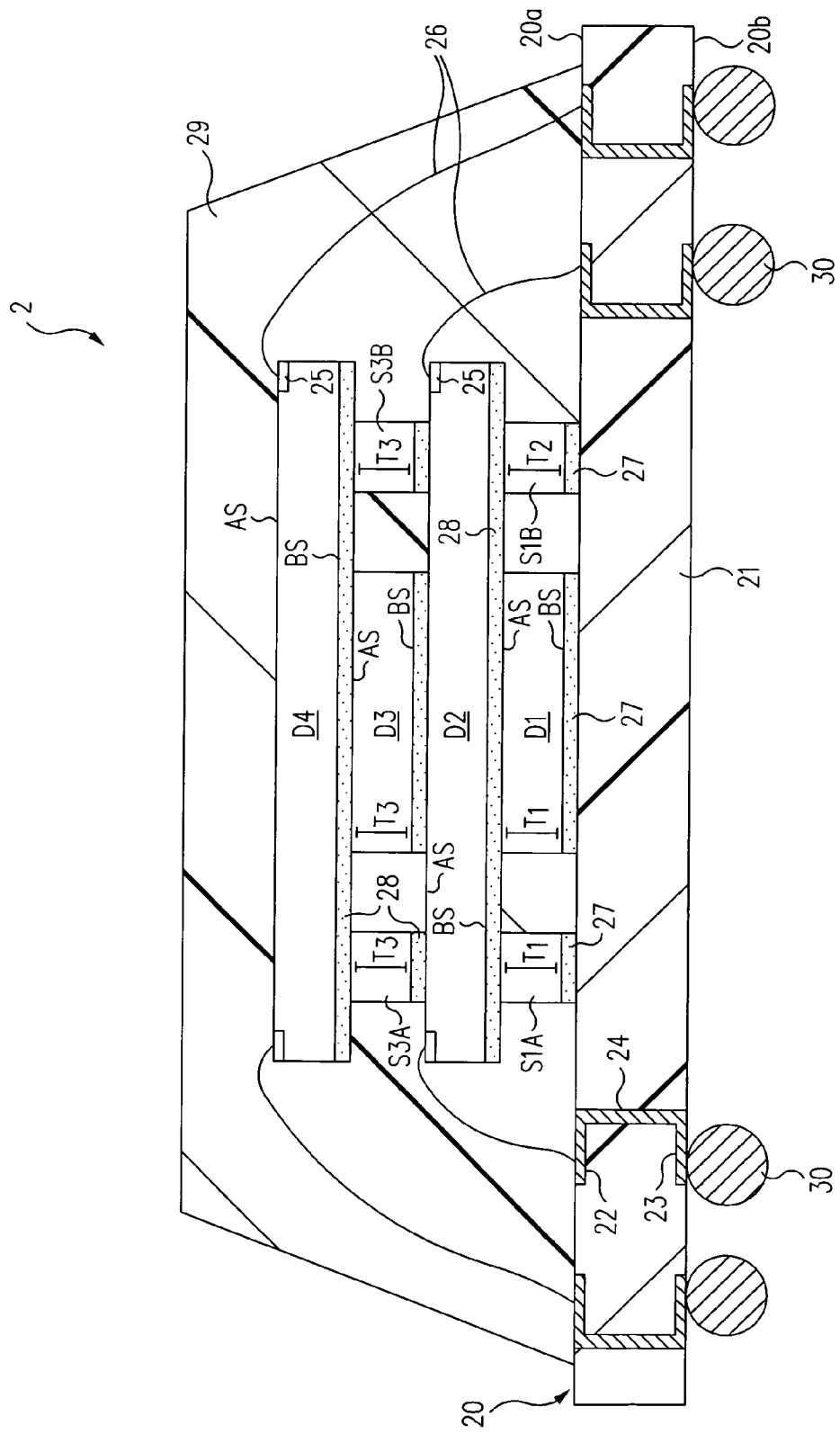
FIGS. 4A and 4B are cross-sectional side views of a second embodiment of a semiconductor package.
Figure 4B:
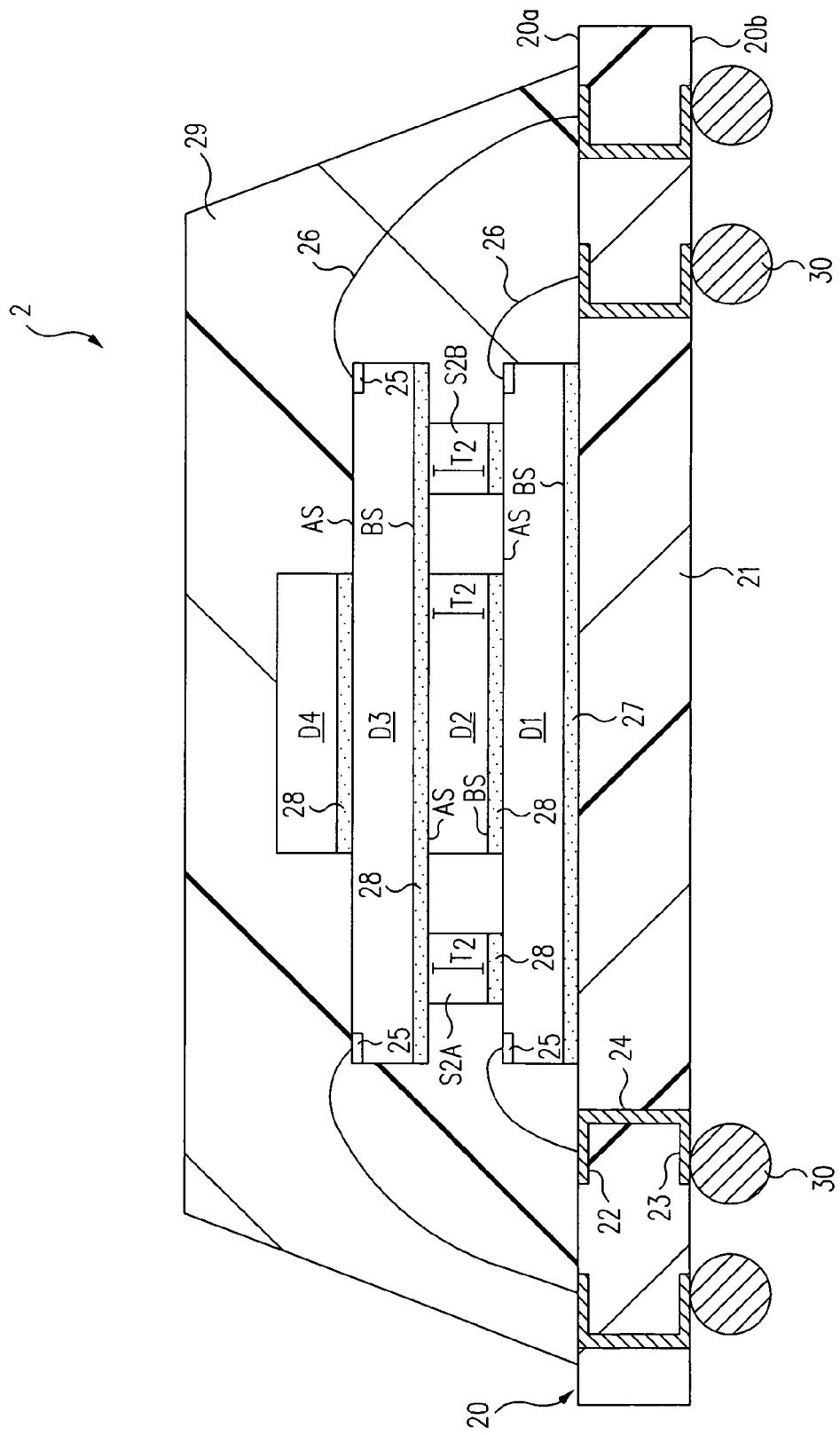

FIGS. 4A and 4B are cross-sectional side views of a second embodiment of a semiconductor package 2 within the present invention. FIGS. 5A–5D are simplified top plan views of semiconductor package 2. The cross-sectional view of FIG. 4A is taken along line 4A—4A of FIG. 5D, and the cross-sectional view of FIG. 4B is taken along line 4B—4B of FIG. 5D, which is 90 degrees from line 4A—4A.

Semiconductor package 2 includes a stack of four same-size semiconductor dies D1, D2, D3, and D4. Many aspects of semiconductor package 2 match aspects of semiconductor package 1, such as the form of substrate 20, bond wires 26, encapsulant 29, and solder balls 30. In addition, the arrangement and stacking of the lowest two semiconductor dies D1 and D2 and supports S1A, S1B of semiconductor die 2 of FIGS. 4A, 4B, 5A, and 5B is the same as the arrangement and stacking of semiconductor dies D1 and D2 and supports S1A, S1B of semiconductor package 1 of FIGS. 1A, 1B, 3A, and 3B. Accordingly, redundant discussion may be omitted, and further discussion will focus on the differences between semiconductor packages 1 and 2.

Referring to FIGS. 4A and 4B, semiconductor package 2 includes two additional dies D3, D4, which are optionally the same size, and optionally the same type (e.g., memory devices), as semiconductor dies D1, D2. All of the semiconductor dies D1–D4 are oblong rectangular, and include bond pads 25 in two rows, with one row along each of the two parallel short edges of active surface AS. Like semiconductor die D2, each of semiconductor dies D3 and D4 includes a uniformly-thick electrically insulative adhesive layer 28 that covers their respective entire inactive surface BS. The supports S2A, S2B, S3A and S3B also include a uniformly-thick adhesive layer 28 that covers their respective entire lower surfaces.

Figure 5A:
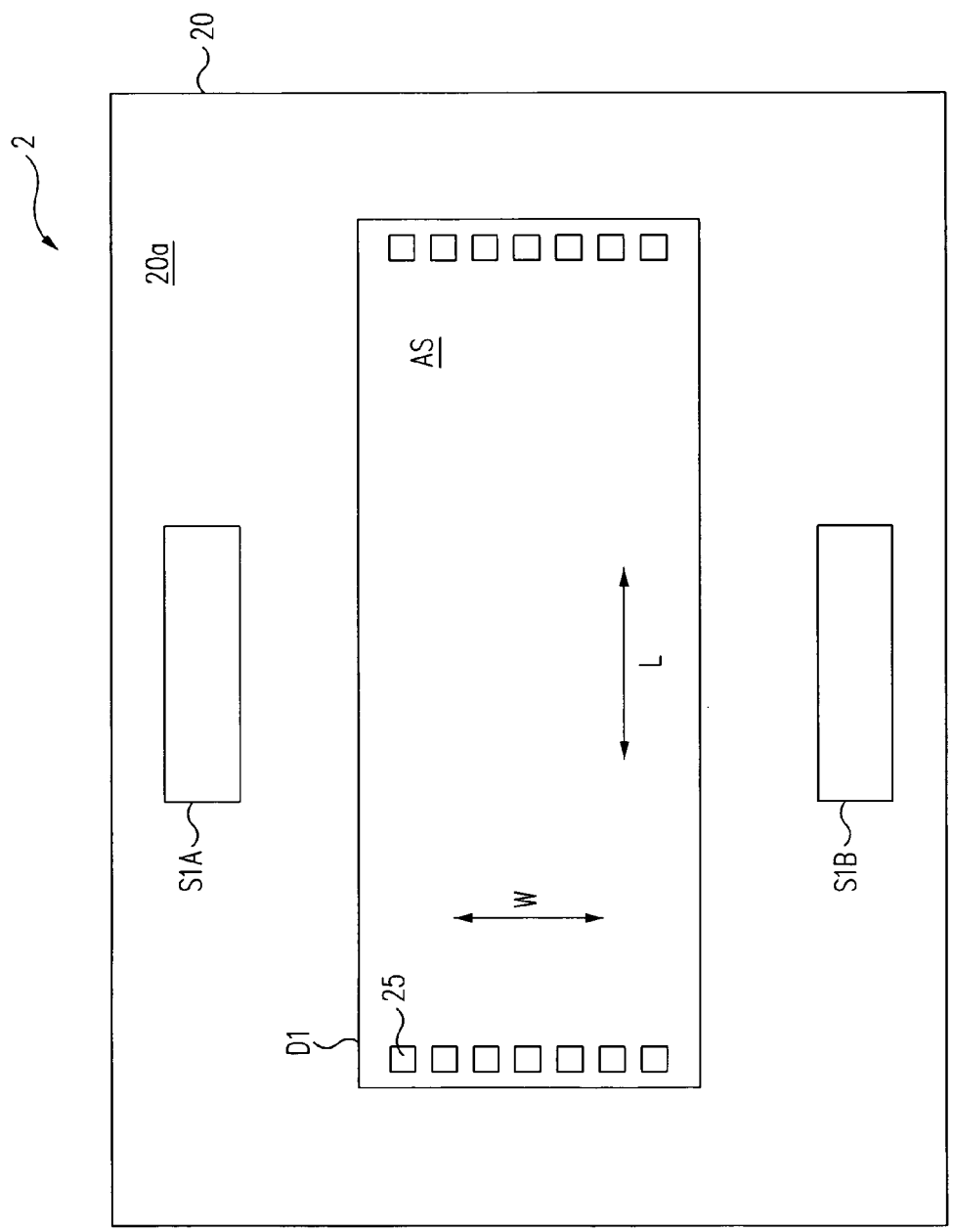
FIGS. 5A–5D are simplified top plan views of levels in the semiconductor package of FIGS. 4A and 4B.
Figure 5B:
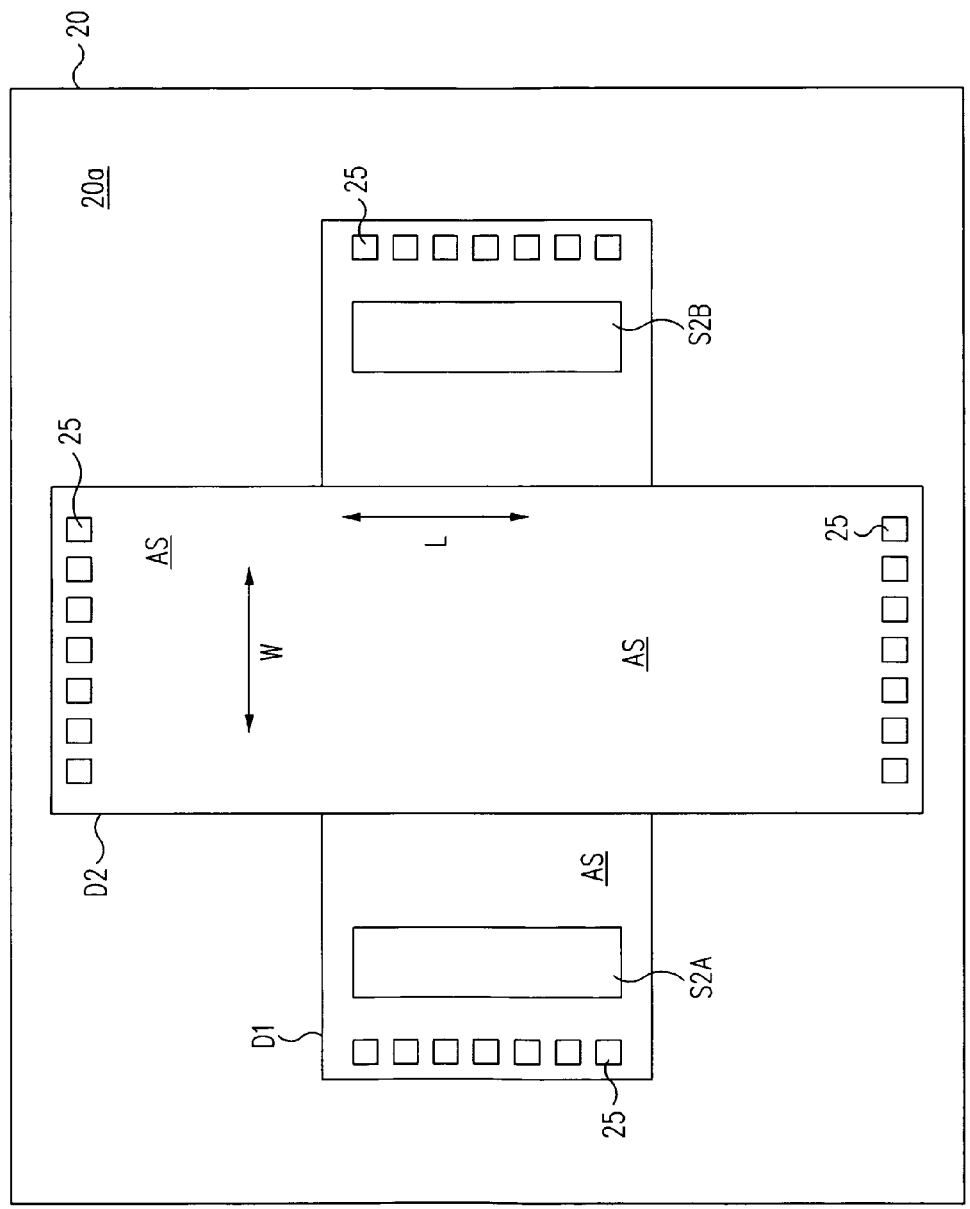

As best shown in FIGS. 4B and 5B, semiconductor package 2 includes a second layer of identical support structures S2A, S2B, which are attached in a mirror image configuration to the active surface AS of semiconductor die D1, one adjacent each long side of semiconductor die D2, by a respective adhesive layer 28. The support structures S2A, S2B are each disposed between a respective one of the parallel long sides of semiconductor die D2 and a respective one of the two rows of bond pads 25 on the active surface AS of semiconductor die D1.

The size, shape, composition, and placement considerations relative to supports S2A, S2B are the same as those discussed above with respect to supports S1A, S1B, except that they are attached to the active surface AS of semiconductor die D1 rather than being attached to the upper surface 20a of substrate 20. Moreover, the support structures S2A, S2B must be placed at an adequate distance from the bond pads 25 of semiconductor die D1 so that neither the supports S2A, S2B nor their respective underlying adhesive layers 28 adversely affect the electrical or physical properties of the bond pads 25 of semiconductor die D1 or the bond wires 26 that are coupled to the bond pads 25.

In one exemplary embodiment, supports S2A and S2B of semiconductor package 2 are the same thickness $T_2$ (i.e., vertical height) as the adjacent semiconductor die D2. Moreover, the thickness of the adhesive layer 28 coupling the supports S2A, S2B to the active surface AS of semiconductor die D1 is the same as the thickness of the adhesive layer 28 that attaches the inactive surface BS of semiconductor die D2 to the active surface AS of semiconductor die D1. Accordingly, the active surface AS of semiconductor die D2 and the upper surfaces of supports S2A, S2B are coplanar (within a tolerance). In an alternative embodiment, where the support structures S2A, S2B are formed of a homogenous single- or double-sided adhesive film or a homogeneous inherently adhesive film, the thickness of the adhesive film or inherently adhesive film is the same as the combined thickness of semiconductor die D2 and the adhesive layer 28 coupled between the active surface AS of semiconductor die D1 and the inactive surface BS of semiconductor die D2.

Referring to 4A, 4B, and 5C, semiconductor die D3 is attached to the coplanar active surface AS of semiconductor die D2 and upper surfaces of supports S2A, S2B by the uniformly-thick adhesive layer 28 on the inactive surface BS of semiconductor die D3. Accordingly, semiconductor die D3 is supported parallel to upper surface 20a of substrate 20. Semiconductor die D3 has an aspect ratio such that semiconductor die D3 fits entirely within the two parallel rows of bond pads 25 on the active surface of semiconductor die D2. In other words, semiconductor die D3 does not overlap the bond pads 25 of semiconductor die D2.

As is apparent from FIG. 4B, the adhesive layer 28 on the inactive surface BS of semiconductor die D3 is spaced from the active surface AS and bond pads 25 of semiconductor die D1 by a distance equal to the thickness $T_2$ of semiconductor die D2 and supports S2A, S2B and the thickness of the adhesive layer 28 underlying semiconductor die D2 and supports S2A, S2B.

Figure 5C:
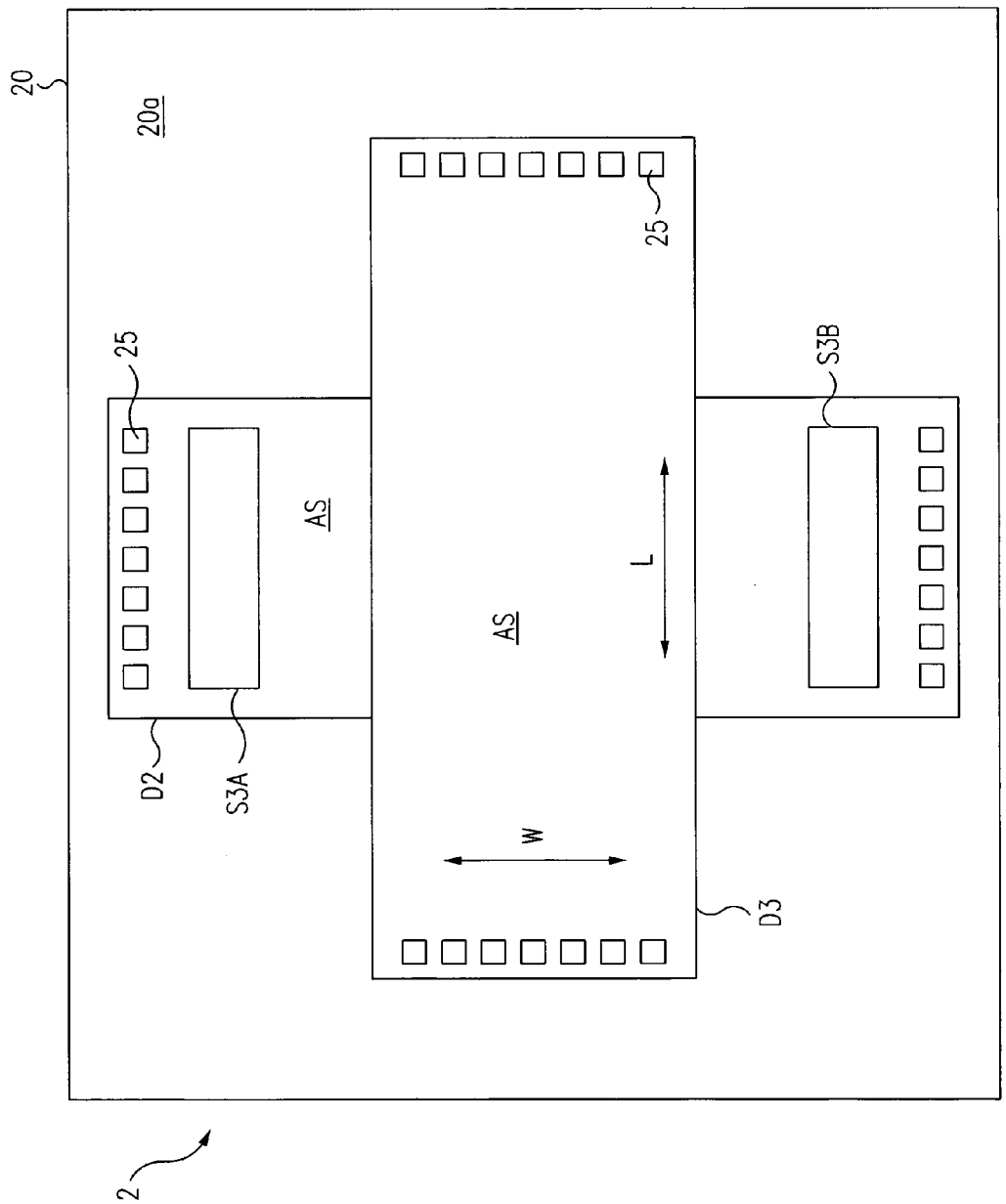

Referring to FIGS. 4B, 5B, and 5C, semiconductor die D3 overlies semiconductor die D1. The sides of semiconductor die D3 are laterally coincident with the corresponding sides of same-size semiconductor die D1, and therefore semiconductor die D1 is not visible in FIG. 5C. In other words, a long direction centerline of semiconductor die D3 is coincident with a corresponding parallel long direction centerline of semiconductor die D1. The two rows of bond pads 25 of semiconductor die D3 are perpendicular to the two rows of bond pads 25 of semiconductor die D2, and parallel to the rows of bond pads 25 of semiconductor die D1 (FIG. 4A). In addition, note that the short side ends and bond pads 25 of semiconductor die D3 overhang the short side ends, bond pads 25, and bond wires 26 of semiconductor die D1, but are spaced above the bond pads 25 and bond wires 26 by semiconductor die D2, supports S2A, S2B and the uniformly thick adhesive layer 28. In such a configuration, one would typically couple the bond wires 26 to semiconductor dies D1 and D2 in a single wirebonding step once the configuration of FIG. 5B is attained, and before the placing semiconductor die D3 on the stack. Use of low profile bond wires 26 (e.g., standoff stitch bonds) will help to assure that the bond wires 26 that are coupled to semiconductor die D1 are not impacted by the overlying semiconductor die D3.

Referring to FIGS. 4A and 5C, a third layer of identical support structures S3A, S3B are attached to the active surface AS of semiconductor die D2 in a mirror image configuration about semiconductor die D3 by a respective adhesive layer 28. The support structures S3A, S3B are each disposed between a respective one of the parallel long sides of semiconductor die D3 and a respective one of the two rows of bond pads 25 of the active surface AS of semiconductor die D2. Semiconductor D3 and supports S3A, S3B together fit entirely within the two rows of bond pads 25 on the active surface AS of semiconductor die D2, so that all of the bond pads 25 of semiconductor D2 are accessible for wire bonding.

Referring to FIG. 4A, note that the thickness $T_3$ of semiconductor die D3 is the same (within a tolerance) as the thickness $T_3$ of supports S3A, S3B, and that the adhesive layers 28 underlying semiconductor die D3 and support structures S3A, S3B are uniformly thick. Accordingly, the active surface of semiconductor die D3 and the upper surfaces of supports S3A, S3B are coplanar, so that the semiconductor die D4 of the next upper level of the stack will be supported parallel to the upper surface 20a of substrate 20. In an alternative embodiment, the thickness of each homogeneous support structure S3A, S3B is equal to the combined thickness of semiconductor die D3 and the adhesive layer 28 underlying semiconductor die D3.

Again, considerations concerning the sizing and placement of support structures S3A, S3B include, for instance: (1) assuring that the bond pads 25 and bond wires 26 of underlying semiconductor die D2 are not obstructed; (2) assuring that encapsulant flow between the facing surfaces of support structures S3A, S3B and the intervening semiconductor die D3 is either unobstructed, or alternatively blocked by the abutting of the support structures S3A, S3B against the facing sides of semiconductor die D3; (3) assuring that the active surface of semiconductor die D3 and the upper surfaces of support structures S3A, S3B are coplanar, so that the overlying semiconductor die D4 is parallel to the upper surface 20a of the substrate 20; and (4) assuring that the overlying semiconductor die D4 is adequately supported, and that semiconductor die D4 and all of the underlying die are not subjected to damage due to cantilevering during the attachment of bond wires 26 to the bond pads 25 of semiconductor die D4. In the particular embodiment of FIG. 4A, support structures S3A, S3B are placed directly over support structures S1A, S1B, and have the same dimensions, but other configurations are possible.

Figure 5D:
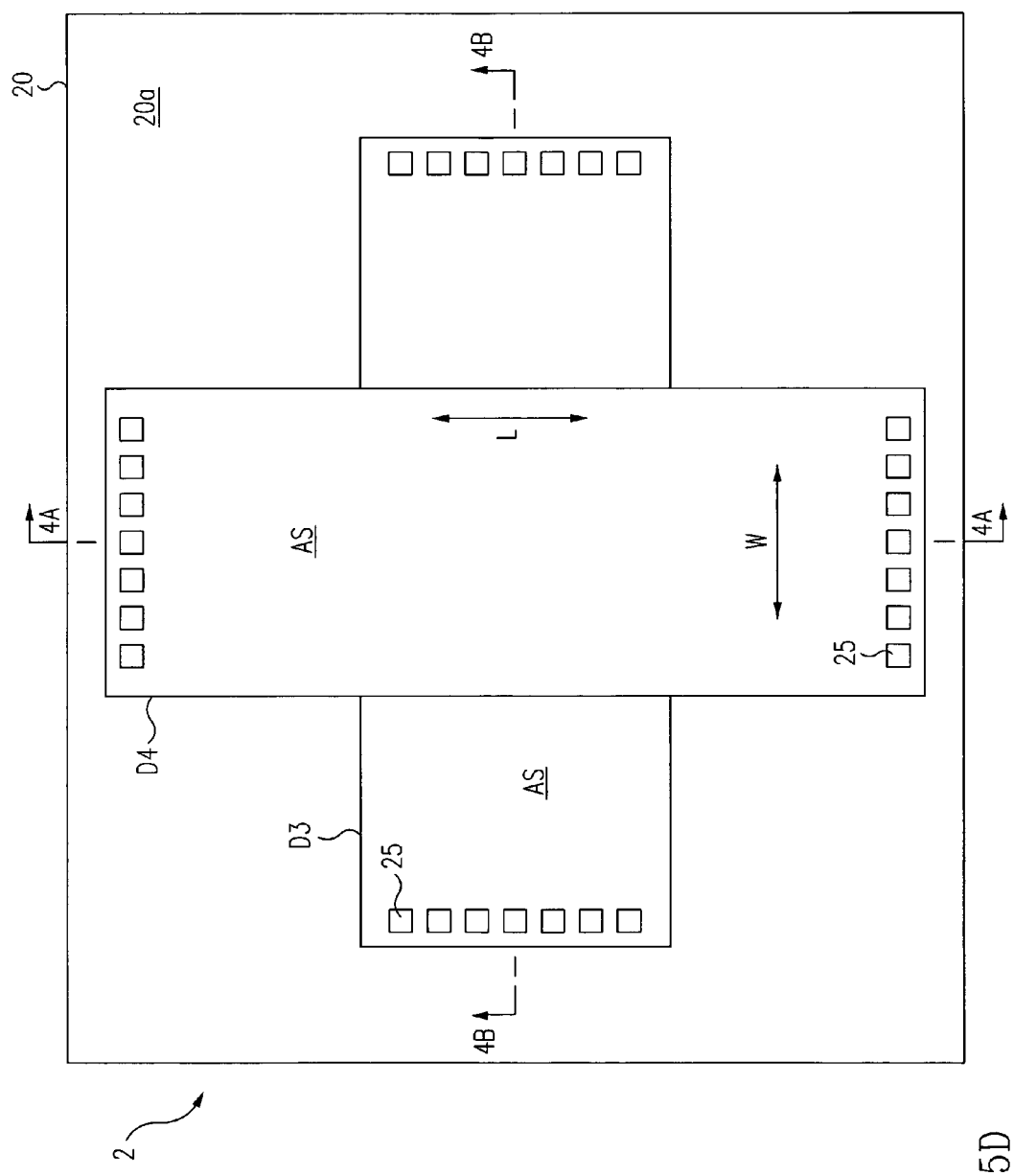

Referring to FIGS. 4A and 4B, the topmost semiconductor die D4 of semiconductor package 2 has an adhesive layer 28 on its entire inactive surface BS. The adhesive layer 28 serves to attach semiconductor die D4 to the active surface AS of semiconductor die D3 and to the upper surface of support structures S3A, S3B, which are coplanar. As is shown in FIG. 5D, semiconductor die D4 and its underlying adhesive layer 28 fit entirely within the two rows of bond pads 25 on the active surface of semiconductor die D3. In other words, semiconductor die D4 and its underlying adhesive layer 28 do not overlap any of the bond pads 25 of semiconductor die D3. The rows of bond pads 25 of semiconductor die D4 are parallel to the rows of bond pads of semiconductor die D3 and perpendicular to the rows of bond pads 25 of semiconductor dies D1 and D3. With the bond pads 25 of semiconductor dies D3 and D4 being exposed, as shown in FIG. 5D, bond wires 26 may be attached to semiconductor dies D3 and D4 in a single wirebonding operation.

In an alternative embodiment, semiconductor die D4 of semiconductor package 2 may be sized like semiconductor die D2 of FIG. 3C to be larger than semiconductor dies D1, D2, and D3, and may have bond pads 25 along all of its four sides, provided that semiconductor die D4 fits entirely within the two rows of bond pads 25 of semiconductor die D3.

Practitioners will appreciate that semiconductor dies D1, D2, D3 and D4 of semiconductor package 2 all could be different sizes and types relative to each other, as long as each of second-level and higher semiconductor dies D2, D3, and D4 does not overlap the bond pads 25 of the immediately underlying semiconductor die D1, D2, or D3, respectively. In all cases, manufacturing tolerances must be taken into consideration when determining the allowable sizes and thicknesses of the semiconductor dies and supports. The bond pads 25 of one of the semiconductor dies may also extend around the sides of the immediately underlying semiconductor die if the subsequent upper semiconductor die is narrower than the distance between the bond pads 25 located on the short sides of the immediately lower semiconductor die.

Figure 6A:
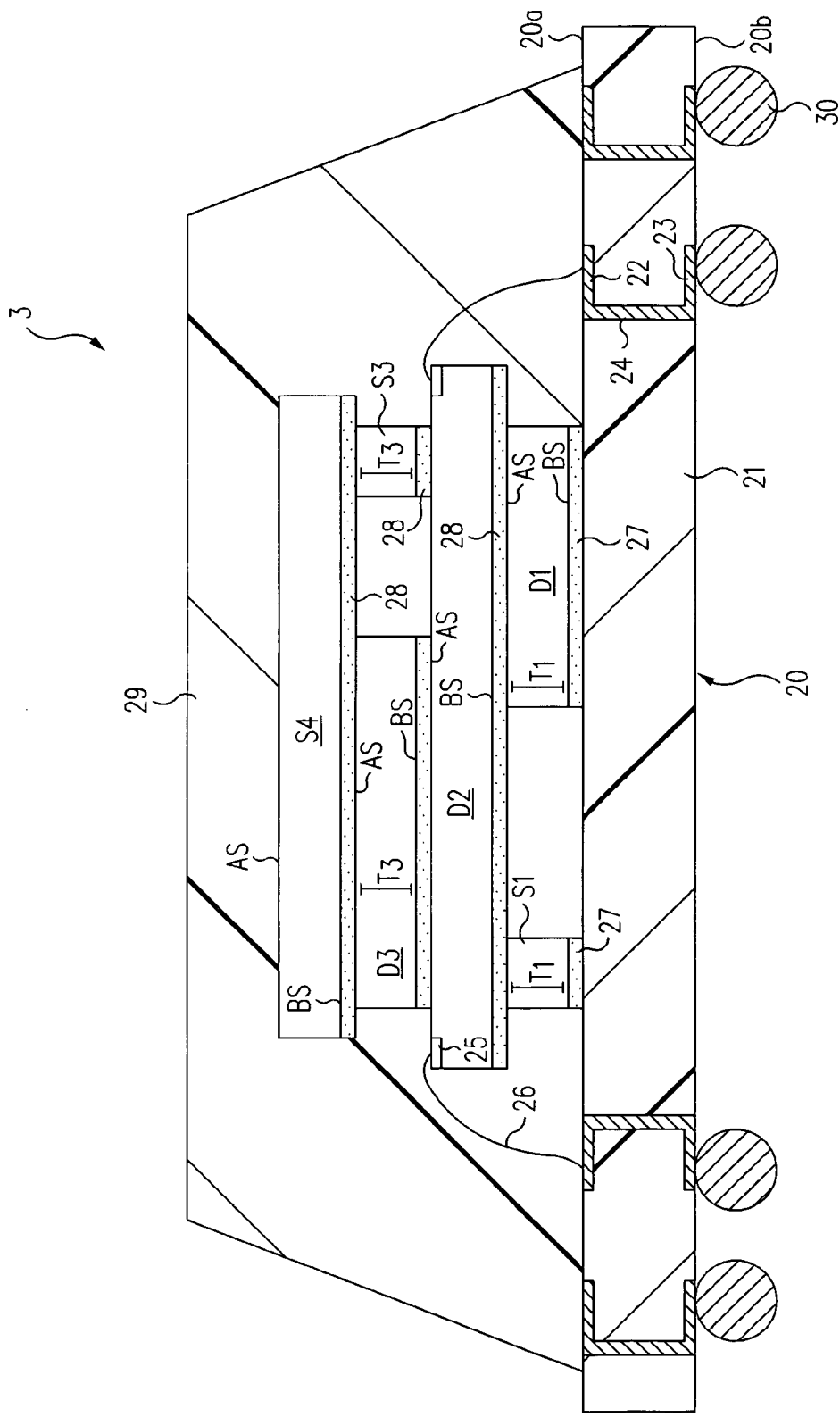
FIGS. 6A and 6B are cross-sectional side views of a third embodiment of a semiconductor package.
Figure 6B:
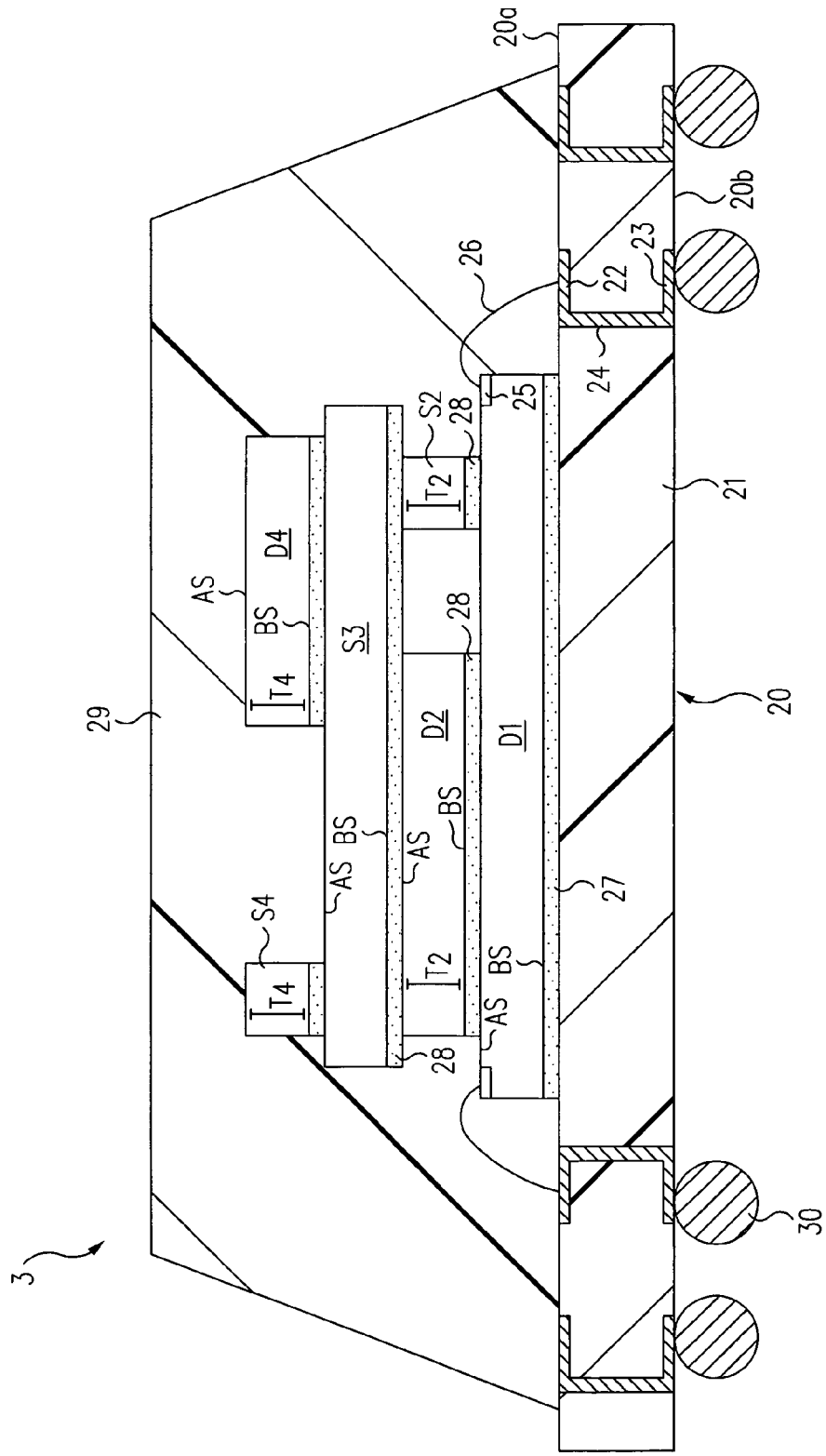

FIGS. 6A and 6B are cross-sectional side views of a third embodiment of a semiconductor package 3 within the present invention. FIGS. 7A–7D are simplified top plan views of semiconductor package 3. The cross-sectional view of FIG. 6A is taken along line 6A—6A of FIG. 7D, and the cross-sectional view of FIG. 6B is taken along line 6B—6B of FIG. 7D, 90 degrees from line 6A—6A. Many aspects of semiconductor package 3 are the same as in semiconductor packages 1 and 2, and hence our discussion will focus on differences between the semiconductor packages and will largely omit redundant discussion.

Semiconductor package 3 includes a stack of four semiconductor dies D1, D2, D3, and D4. Unlike the die stacks of semiconductor packages 1 and 2, however, each successive semiconductor die DN (where "N" is the stack level) above the lowermost semiconductor die D1 is supported by the immediately underlying die D(N−1) and only one immediately underlying support S(N−1), whereas in semiconductor packages 1 and 2, each successive semiconductor die DN above the lowermost semiconductor die D1 is supported by the underlying semiconductor die D(N−1) and two mirror-image supports S(N−1)A, S(N−1)B. The supports SN (where "N" is the stack level) of semiconductor package 3 are all rectangular prisms, and are each of the same thickness (i.e., vertical height) as the adjacent semiconductor die DN in the same stack level. As mentioned in the previous discussion, when the support structures are a homogeneous adhesive material, the thickness of these support structures will each equal the combined thickness of the laterally adjacent die and the underlying die attach.

Referring to FIGS. 7A–7D, the single support SN of each level of semiconductor package 3 is disposed parallel to, but spaced apart from, one of the two long sides of the adjacent semiconductor die DN of the same stack level. The supports SN of semiconductor package 3 all have a long side length that is greater that the short side width W of the adjacent semiconductor die DN, but is less than the long side length L of the semiconductor die DN. However, this is not necessarily so. The supports SN could have a long side length greater than the long side length L of the adjacent semiconductor die DN. As previously mentioned, there are several considerations to be made in determining the sizing and placement of the supports SN, such as the need to adequately support the overlying semiconductor die during wire bonding.

As in semiconductor packages 1 and 2, each successive die DN above the lowermost semiconductor die D1 of semiconductor package 3 is attached to the active surface AS of the immediately underlying semiconductor die D(N−1) and the upper surface of the single immediately underlying support S(N−1) by a uniformly-thick adhesive layer 28 that covers the entire inactive surface BS of the semiconductor die DN. Moreover, each successive semiconductor die DN above the lowermost semiconductor die D1 has an aspect ratio such that the semiconductor die DN and the adjacent single support structure SN together fit entirely within the bond pads 25 of the active surface AS of the immediately underlying semiconductor die D(N−1). Accordingly, none of the semiconductor dies DN interferes with the coupling of bond wires 26 to the bond pads 25 of the immediately underlying semiconductor die D(N−1).

Another aspect of semiconductor package 3 that differs from semiconductor package 2 is that, in semiconductor package 3, dies D1 and D3 are not the same size, whereas in semiconductor package 2, all of the semiconductor dies D1–D4 are the same size and possibly the same type. In particular, in semiconductor package 3, semiconductor die D3 is wider in width W than semiconductor die D1, and greater in length L. Similarly, semiconductor dies D2 and D4 are not the same size. Semiconductor die D4 is wider in width W than semiconductor die D2, and greater in length L. Semiconductor dies D1 and D2 may be the same size and type, and semiconductor dies D3 and D4 may be the same size and type, but not necessarily so. Semiconductor dies D1–D4 may all be different sizes and different types relative to each other.

Another aspect of semiconductor package 3 that differs from semiconductor package 2 is that, in semiconductor package 3, semiconductor die D3 is laterally offset from semiconductor die D1, and hence only partially overlies semiconductor die D1. Likewise, semiconductor die D4 is laterally off-set from semiconductor die D2, and hence only partially overlies semiconductor die D2. By contrast, in semiconductor package 2, semiconductor dies 1 and 3 are the same size and laterally coincident with each other, and semiconductor dies 2 and 4 are the same size and laterally coincident with each other. In this type of configuration, where the semiconductor die is not centered between two symmetrical support structures, one may forego the lateral symmetry within a layer to allow for more space between the semiconductor die and the support structure in an effort to allow for better flow of the molding compound during the encapsulation process.

Practitioners will appreciate that support S4 of semiconductor package 3 (FIGS. 6A, 6B, and 7D) is not necessary unless, in an alternative embodiment, a fifth semiconductor die is added to the die stack. However, even if a fifth die is not added, support S4 may be provided to provide symmetry within semiconductor package S4, which may provide benefits in terms of the distribution of stress within the package.

In our subsequent discussion of FIGS. 8A–16D and 20A–23D, alternative semiconductor packages 4–12 and 15–18 are discussed. For the sake of brevity, we will omit the cross-sectional views of the semiconductor packages 4–12 and 15–18, and direct our discussion toward the simplified top plan views that show the successive layers and arrangements of the semiconductor dies and supports. Where certain not-shown features of semiconductor packages 4–12 and 15–18, such as adhesive layers 27 and 28 and bond wires 26, are mentioned, the reader may refer to the previous discussion of FIGS. 1A, 1B, 4A, 4B, 6A, and 6B for examples of identical structures.

FIGS. 8A–8D are simplified top plan views of levels of a fourth embodiment of a semiconductor package 4 in accordance with the present invention. Semiconductor package 4 includes four stacked semiconductor dies D1–D4.

Figure 8A:
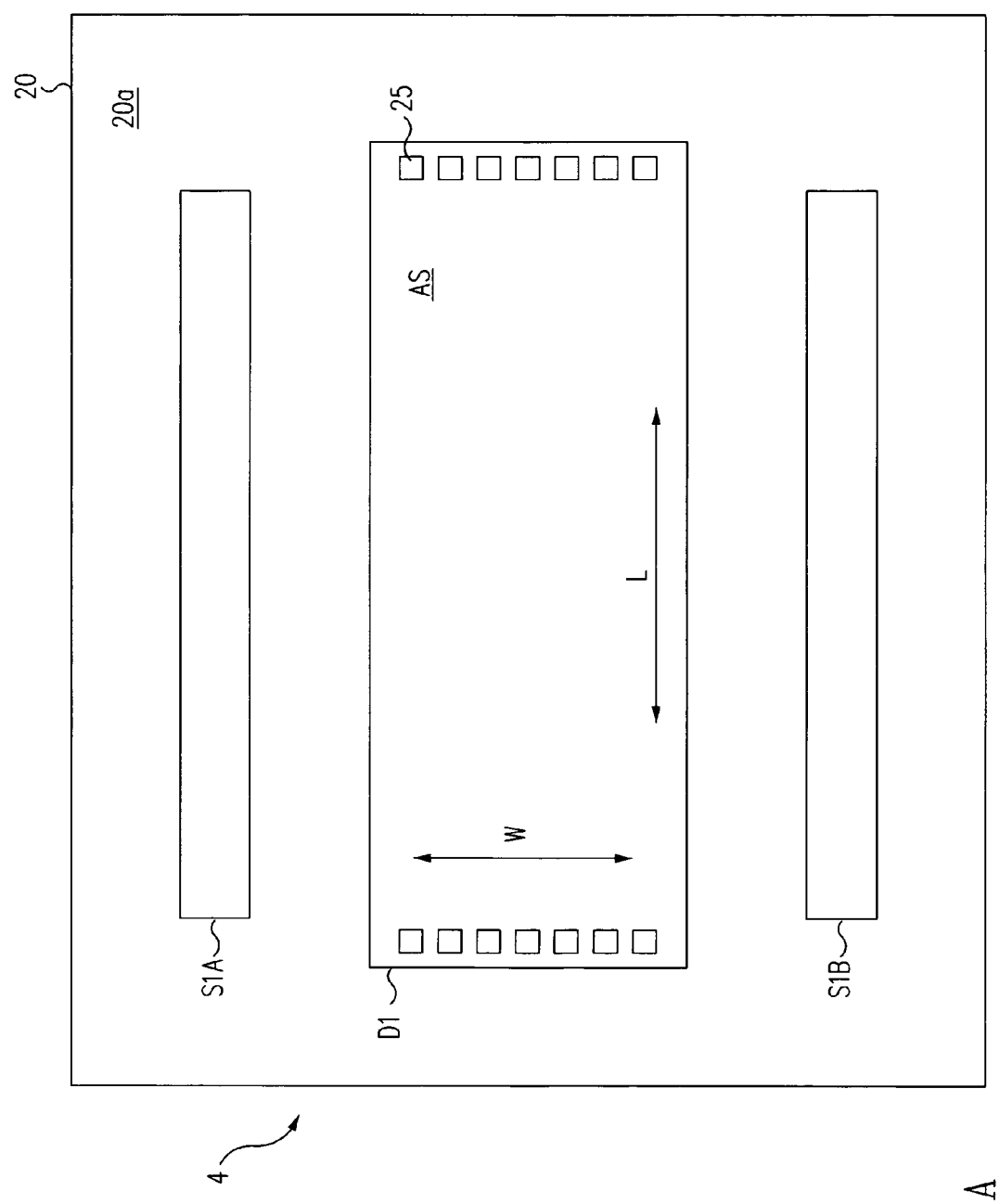
FIGS. 8A–8D are simplified top plan views of levels in a fourth embodiment of a semiconductor package.

In FIG. 8A, a first stack level includes a semiconductor die D1 and two supports S1A, S1B, which are attached to the upper surface 20a of substrate 20 by an adhesive layer 27. Semiconductor die D1 includes an oblong rectangular active surface AS with two rows of bond pads 25. A respective one of the rows of bond pads 25 is adjacent to each of the two short edges of active surface AS. The two supports S1A, S1B are coupled to upper surface 20a adjacent to semiconductor die D1, with one of the supports S1A, S2A adjacent to each of the two long sides of semiconductor die D1.

As in previous examples, semiconductor die D1 has an oblong aspect ratio, with the length L being greater than the width W.

Figure 8B:
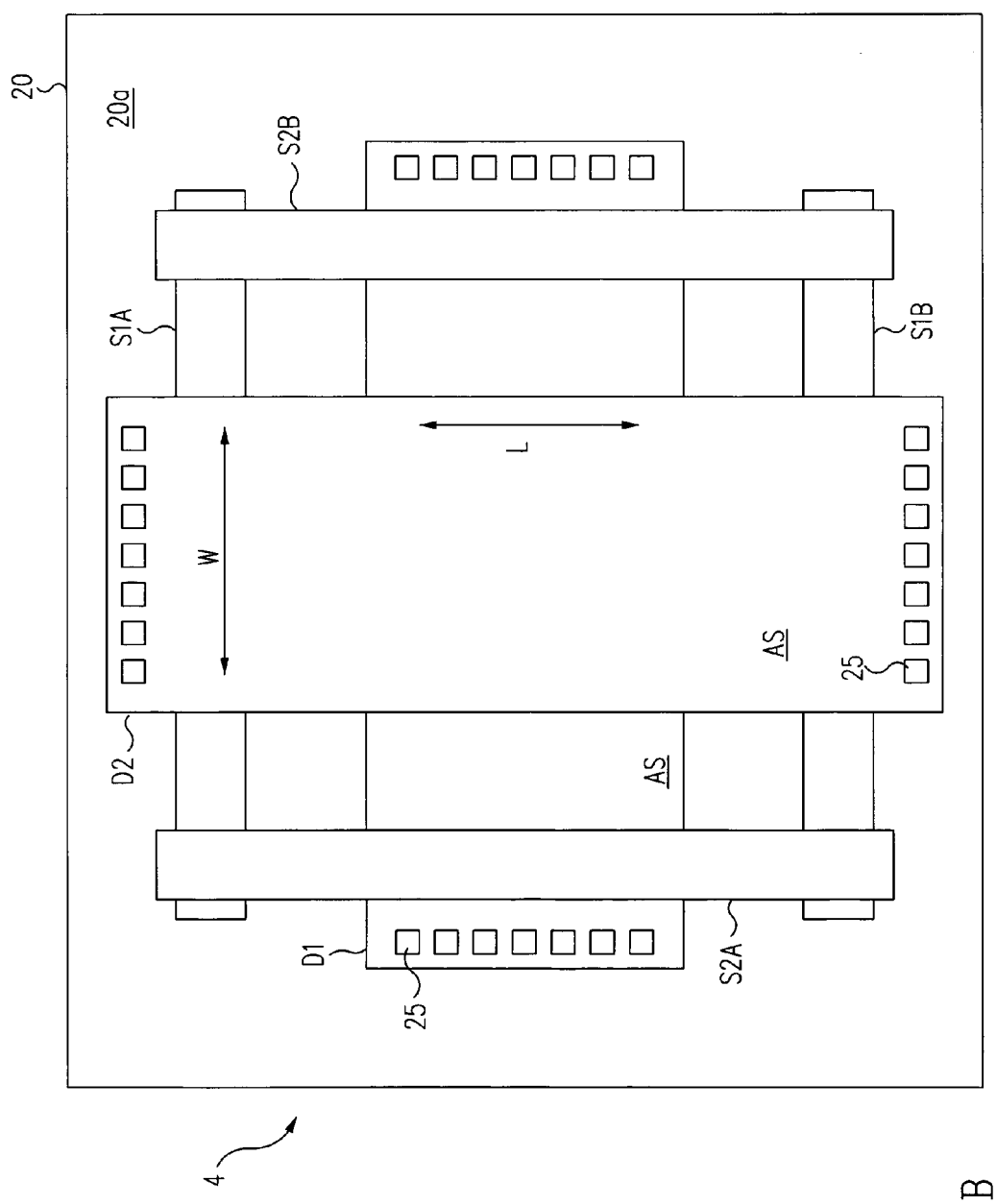

The supports S1A, S1B of semiconductor package 4 are rectangular prisms, and have an oblong rectangular upper surface, as shown in FIG. 8A. The long sides of supports S1A, S1B are parallel to the long sides of semiconductor die D1. The long sides of the supports S1A, S1B are greater in length than the width of the supports S1A, S1B and the width of semiconductor die D1, but are optionally slightly shorter than the long side length L of semiconductor die D1. Again, the long-side length of the supports S1A, S1B is dependant, for example, on the size of the second level semiconductor die D2 to be stacked on the supports S1A, S1B and semiconductor die D1, as shown in FIG. 8B. (Or, the length of the supports S1A, S1B may be dependent, for example, on the size of semiconductor die D4 only, depending on the sizes of the semiconductor dies.)

The thickness (i.e., vertical height relative to upper surface 20) of the supports S1A, S1B is the same as semiconductor die D1, so that the active surface of semiconductor die D1 and the upper surface of supports S1A, S1B are in a common plane parallel to upper surface 20a. This assumes that the adhesive layer 27 under the supports S1A, S1B is equivalent in thickness to the adhesive layer 27 under the semiconductor die D1.

Referring to FIG. 8B, a second layer including a semiconductor die D2 and two identical, elongated supports S2A, S2B are together attached to the active surface of semiconductor die D1 and the upper surface of supports S1A, S1B entirely within the bond pads 25 of the active surface AS of semiconductor die D1 by an adhesive layer 28. In other words, semiconductor die D2 does not overlap the bond pads 25 of semiconductor die D1.

Semiconductor die D2 includes two rows of bond pads 25, with one of the rows adjacent to each of the two short edges of active surface AS. The short side ends and bond pads 25 of semiconductor die D2 overhang the long sides of semiconductor die D1 and the outermost long sides of the supports S1A, S1B.

Supports S2A, S2B are attached to the coplanar active surface AS of semiconductor die D1 and upper surfaces of supports S1A, S1B. One of the supports S2A, S2B is adjacent to, but spaced from, each of the two long sides of semiconductor die D1. Supports S2A, S2B extend perpendicularly to supports S1A, S1B, and parallel to the rows of bond pads 25 of semiconductor die D1. The supports 2A, 2B each have a long side length greater than the width W of semiconductor die D1, but less than the length L of semiconductor die D1. In this case, semiconductor dies D1, D2 are the same size, and supports S1A, S1B, S2A, S2B are the same size. The long-side length of the supports S1A, S1B, S2A, S2B must be such that they overlap to provide support for the uppermost semiconductor die D4 (FIG. 8D), which has the largest active surface AS area of the four semiconductor dies D1–D4 of the stack.

Figure 8C:
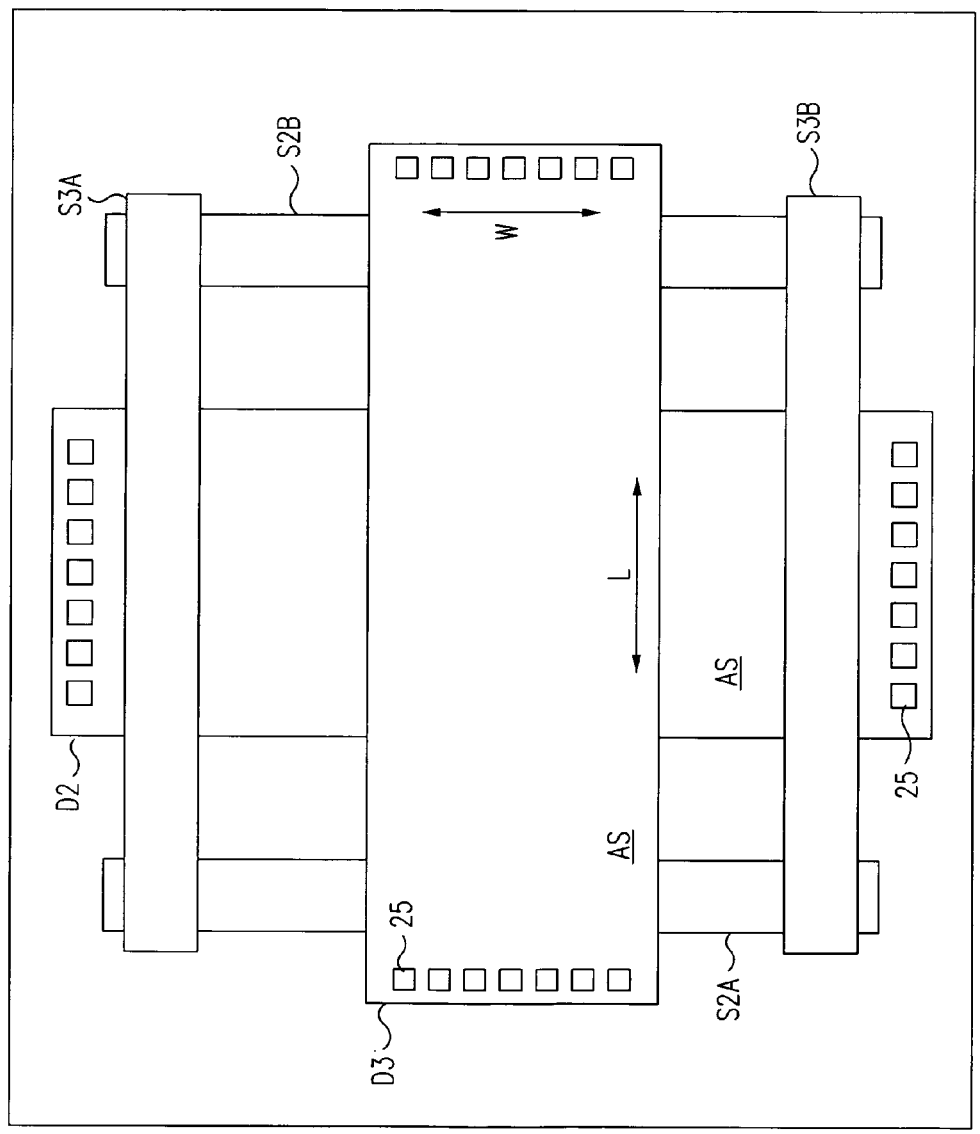

Referring to FIG. 8C, a third layer including a semiconductor die D3 and two elongated supports S3A, S3B are together attached to the coplanar active surface AS of semiconductor die D2 and upper surface of supports S2A, S2B entirely within the bond pads 25 of the active surface of semiconductor die D2. In other words, semiconductor die D3 does not overlap the bond pads 25 of semiconductor die D2. An adhesive layer 28, as shown in FIG. 1, is used for the attachment of semiconductor die D3 and supports S3A, S3B to semiconductor D2 and supports S2A, S2B.

Semiconductor die D3 includes two rows of bond pads 25, with one of the rows adjacent to each of the two short edges of active surface AS. The rows of bond pads 25 of semiconductor die D3 are parallel to the rows of bond pads 25 of semiconductor die D1, and perpendicular to the rows of bond pads 25 of semiconductor die D2. Supports S3A, S3B are each adjacent to a respective one of the long sides of semiconductor die D3, and have a length greater than the width W, but just less than, the length L of semiconductor die D3.

In this example, semiconductor dies D1, D2, D3 are the same size, and supports S1A, S1B, S2A, S2B, S3A, S3B are the same size. Semiconductor die D3 is laterally coincident with semiconductor die D1, and supports S3A, S3B are laterally coincident with supports S1A, S1B, which is why semiconductor die D3 and supports S1A, S1B are not visible in the top view of FIG. 8C. Semiconductor die D2 and supports S2A, S2B separate semiconductor dies D1 and D3, providing a vertical space between them. Accordingly, the bond wires 26 that are coupled to the bond pads 25 of semiconductor die D1 are not contacted by the overlying adhesive layer 28 on the inactive surface BS of semiconductor die D3.

Figure 8D:
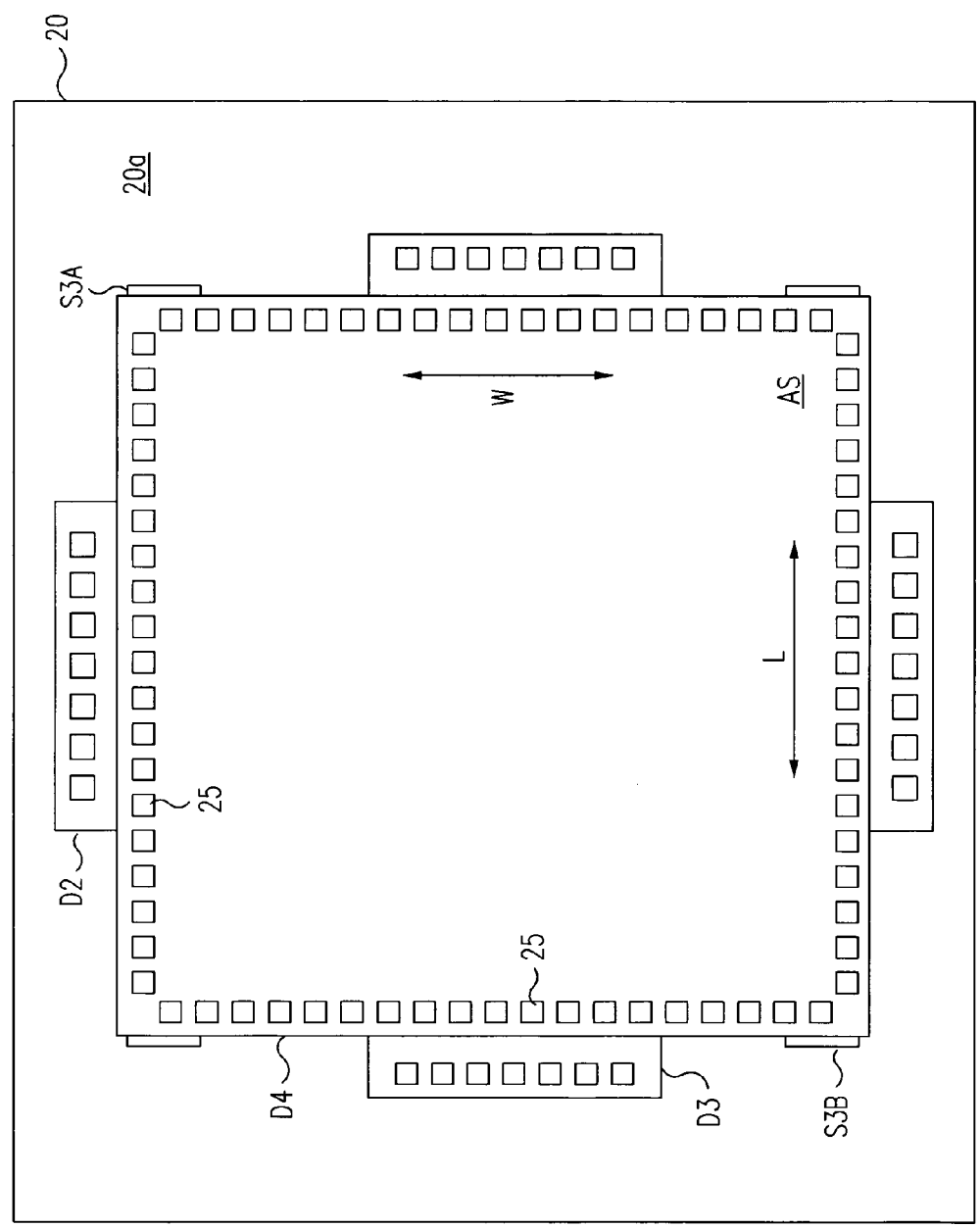

Referring to FIG. 8D, an uppermost fourth layer including a relatively large square semiconductor die D4 is attached to the coplanar active surface AS of semiconductor die D3 and upper surfaces of supports S3A, S3B by an adhesive layer 28. Semiconductor die D4 fits entirely within the bond pads 25 of active surface AS of semiconductor die D3, thereby not interfering with the coupling of bond wires 26 to the bond pads 25 of semiconductor die D3. In addition, semiconductor die D4 optionally fits entirely within the bond pads 25 of semiconductor die D2. In an alternative embodiment, semiconductor die D4 may overhang of the bond pads 25 of semiconductor die D2, since semiconductor die D3 and supports S3A, S3B provide a space between semiconductor dies D2 and D4.

As shown in FIG. 8D, semiconductor die D4 has a square active surface AS that includes a row of bond pads 25 along each of the four edges of active surface AS. Semiconductor die D4 may be, for instance, a logic device, and semiconductor dies D1–D3 may be identical memory devices.

In assembling semiconductor package 4 of FIGS. 8A–8D, the attachment of bond wires 26 (e.g., FIG. 1) to semiconductor dies D1–D4 may be done in a single wirebond operation, since there is clear access to the bond pads 25 of all of semiconductor dies D1–D4, as shown in FIG. 8D. Bond wires 26 may be coupled between the bond pads 25 of each of the semiconductor dies D1–D4 and the circuit patterns 22 of substrate 20. In addition, because the uppermost semiconductor die D4 is within the bond pads 25 of each of the two underlying semiconductor dies D2–D3, it is convenient to couple bond wires 25 between the bond pads 25 of semiconductor die D4 and one or all of semiconductor dies D2–D3, thereby electrically coupling semiconductor die D4 to one or all of semiconductor dies D2–D3. Such would be useful, for instance, where semiconductor dies D2–D3 are memory devices, and semiconductor die D4 is a processor or logic device.

FIGS. 9A–9D are simplified top plan views of levels of a fifth embodiment of a semiconductor package 5 in accordance with the present invention.

Figure 9A:
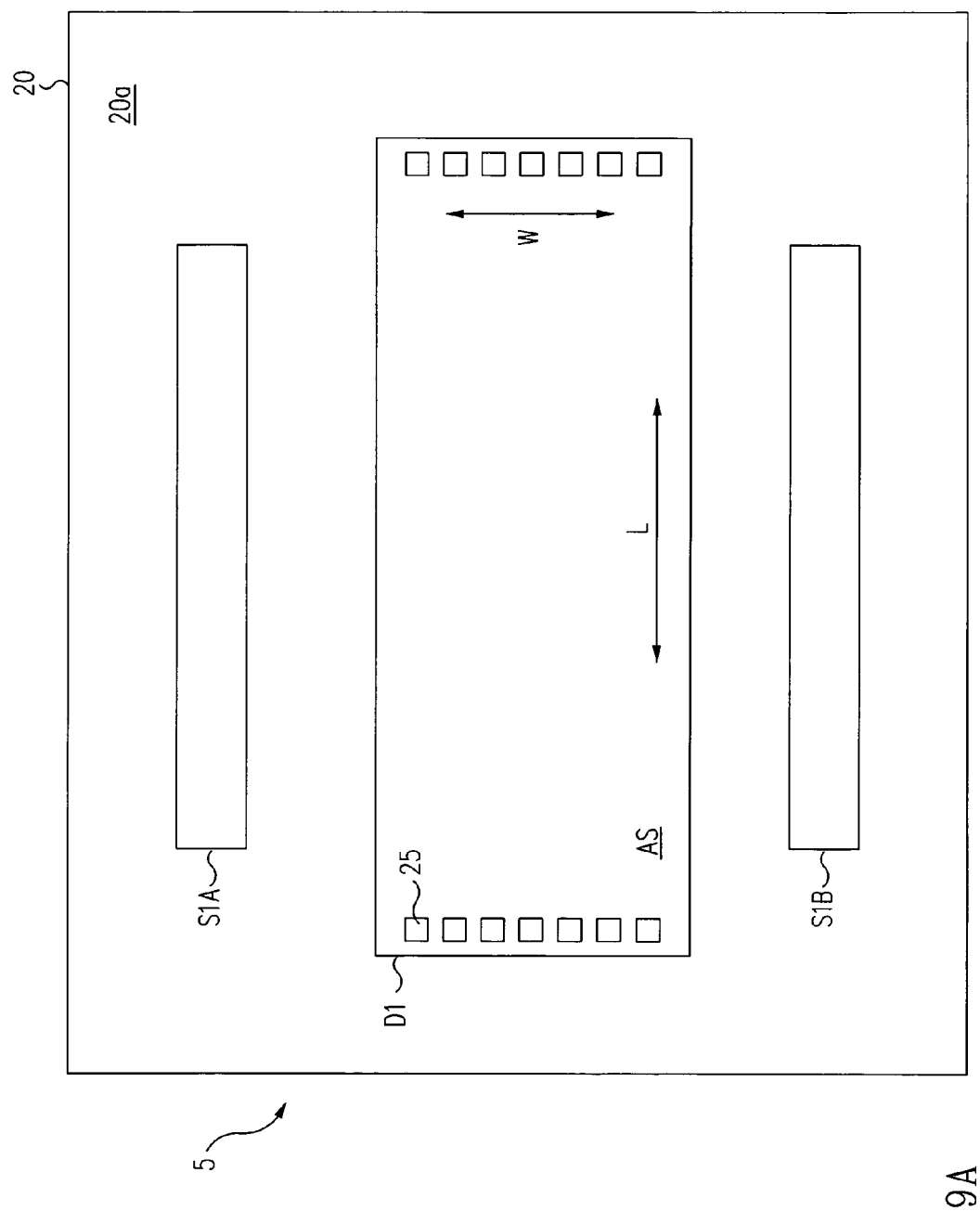
FIGS. 9A–9D are simplified top plan views of levels in a fifth embodiment of a semiconductor package.

Referring to FIG. 9A, semiconductor package 5 includes four stacked semiconductor dies D1–D4. A first level includes a semiconductor die D1 coupled to the upper surface 20a of substrate 20 with an adhesive layer 27. As in previous examples, semiconductor die D1 has an oblong aspect ratio, with the length L being greater than the width W. Semiconductor die D1 has two rows of bond pads 25, with one of the rows adjacent to each of the two short edges of active surface AS. Two elongated supports S1A, S1B are coupled to upper surface 20 adjacent to semiconductor die D1, with one of the supports S1A, S2A adjacent to each of the two parallel long sides of semiconductor die D1.

Figure 9B:
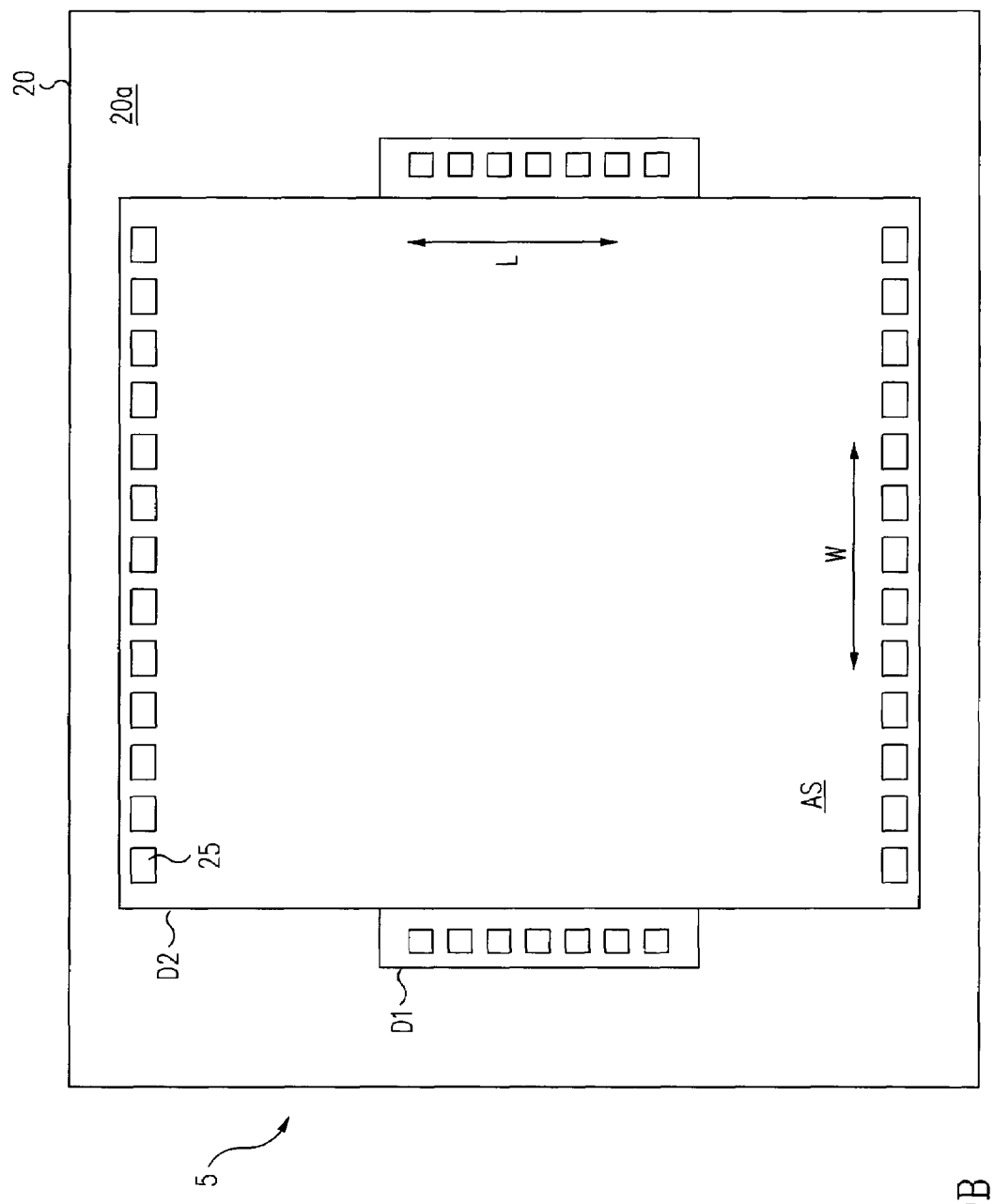

Referring to FIG. 9B, a relatively large semiconductor die D2 is attached to the active surface AS of semiconductor die D1 and the upper surface of supports S1A, S1B. Semiconductor die D2 includes two rows of bond pads 25, with one of the rows adjacent to two parallel edges of active surface AS. The rows of bond pads 25 of semiconductor die D2 are perpendicular to the rows of bond pads 25 of semiconductor die D1. Semiconductor die D2 is square, and is sized such that semiconductor die D2 fits entirely within the bond pads 25 of the active surface AS of underlying semiconductor die D1, thereby not interfering with the bond pads 25 or the bond wires 26 coupled thereto.

Figure 9C:
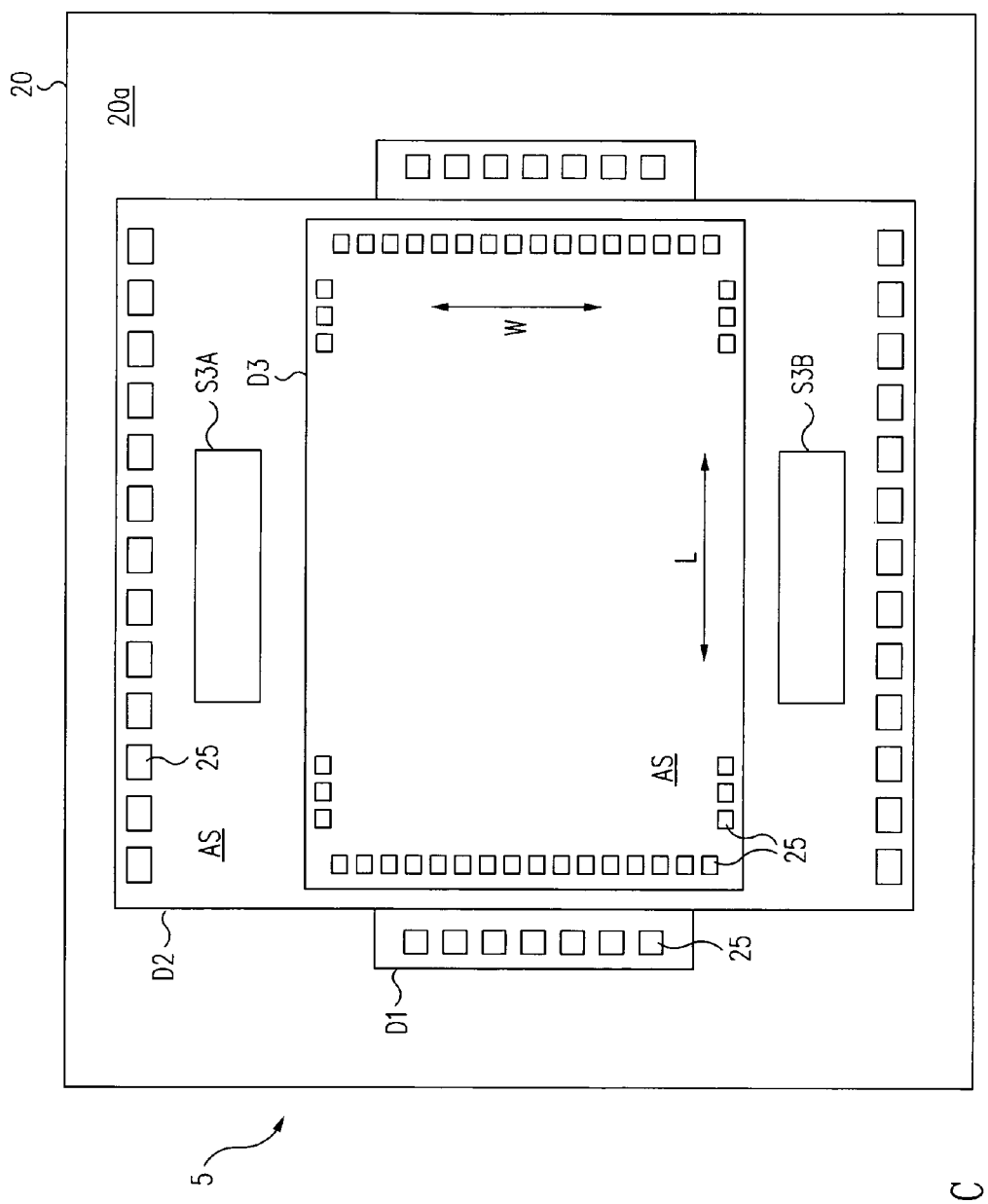

Referring to FIG. 9C, a third layer including a semiconductor die D3 and two identical relatively short length supports S3A, S3B are attached to the active surface AS of semiconductor die D2. Note that, in this embodiment, semiconductor die D3 is supported only on semiconductor die D2.

Semiconductor die D3 of FIG. 9C has an oblong rectangular active surface AS. A respective row of bond pads 25 is adjacent to each of the four sides of its active surface AS. The majority of the bond pads 25 are in two rows that are each adjacent to a respective one of the short edges of active surface AS of semiconductor die D3. The remaining bond pads 25 are in two rows each adjacent to a respective one of the long edges of active surface AS. The two rows of bond pads 25 adjacent the long edges of active surface AS are each grouped into two spaced-apart subsets of three bond pads. The subsets of three bond pads 25 are each positioned relatively close to the short edges of active surface AS to minimize the length of bond wires 26 coupled to those bond pads 25.

Still referring to FIG. 9C, semiconductor die D3 has an oblong rectangular active surface, with the length L being greater than the width W. Semiconductor die D3 and supports S3A, S3B are sized so that they together fit entirely within the bond pads 25 of the active surface of semiconductor die D2. Optionally, semiconductor D3 also is sized so as to fit entirely within the bond pads 25 of the active surface of semiconductor die D1. In other words, semiconductor die D3 does not, in this embodiment, overhang the bond pads 25 of semiconductor die D1. In an alternative embodiment, a larger semiconductor die D3 may overhang the bond pads 25 and bond wires 26 of semiconductor die D1 because of the spacing provided by semiconductor die D2. Supports S3A, S3B have the same thickness as semiconductor die D3, and have a length and width sufficient to support the next higher level semiconductor die D4, as shown in FIG. 9D.

Figure 9D:
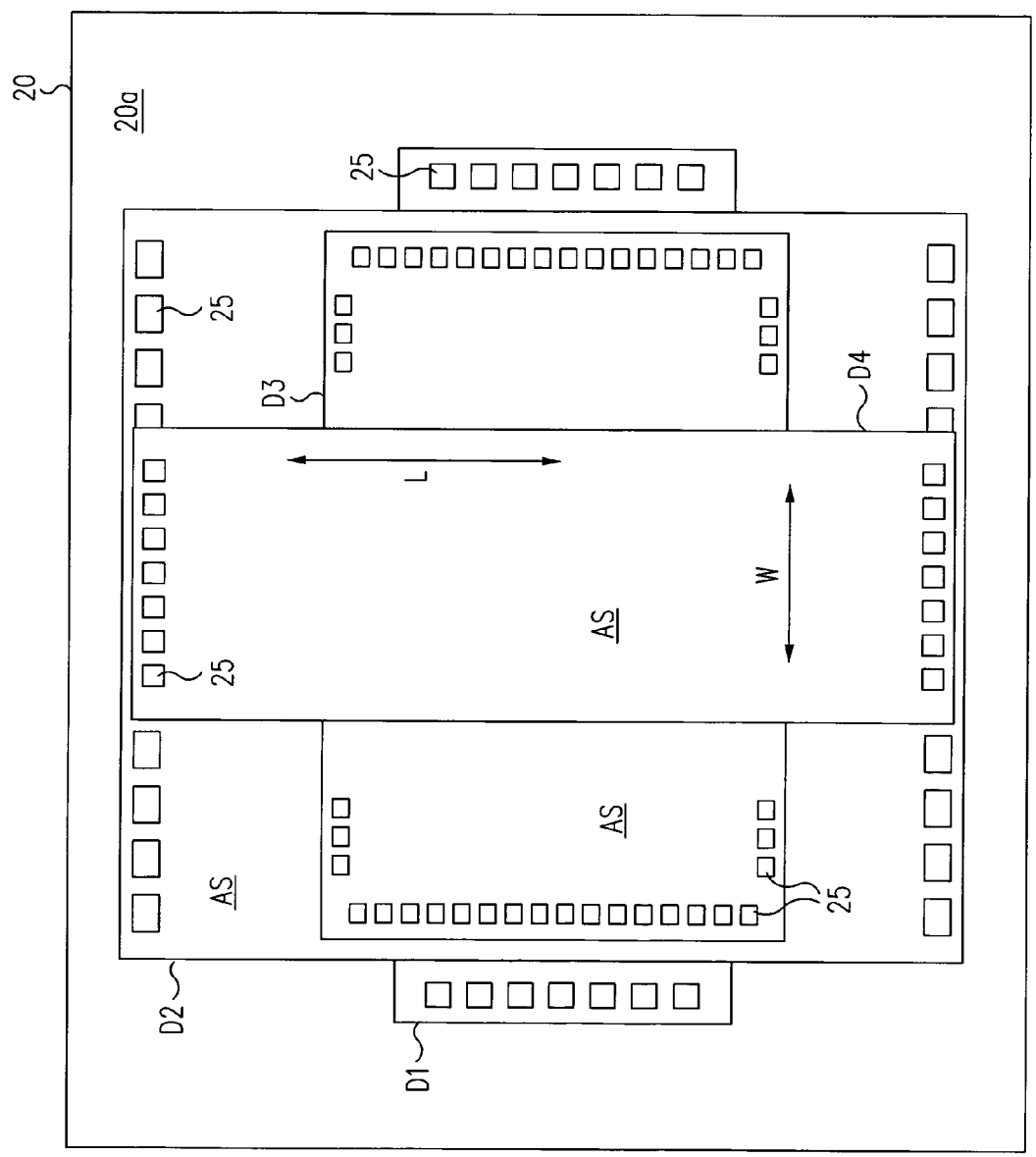

Referring to FIG. 9D, a fourth layer including a semiconductor die D4 is attached to the active surface AS of semiconductor die D3 and the upper surfaces of supports S3A, S3B. Semiconductor die D4 has an aspect ratio such that semiconductor die D4 fits entirely within the bond pads 25 of semiconductor die D3. In other words, semiconductor die D4 does not overlap any of the bond pads 25 of semiconductor die D3, including the bond pads 25 adjacent the long sides of semiconductor die D2. Rather, semiconductor die D4 fits within the space between the two subsets of three bond pads 25 adjacent the long sides of semiconductor die D3. Semiconductor die D4 overhangs the bond pads 25 of semiconductor die D2, but because of the vertical spacing provided by semiconductor die D3, and supports S3A, S3B, semiconductor die D4 does not interfere with the bond wires 26 coupled to semiconductor die D2. The rows of bond pads 25 of semiconductor die D4 are parallel to the rows of bond pads of semiconductor die D2 and perpendicular to the rows of bond pads 25 of semiconductor die D1.

Referring back to FIG. 9C, the first three levels of semiconductor dies D1–D3 of semiconductor package 5 could be wirebonded together in a single wirebond operation, since all of the bond pads 25 are accessible of the three semiconductor dies D1–D3 are accessible. Supports S3A, S3B could be placed before or after the wirebonding step. Semiconductor die D4 would be wirebonded in a second wirebond operation, since semiconductor die D4 overlaps the bond pads of semiconductor die D2. If there was no such overlap, then the stack could be wirebonded in a single wirebond operation.

FIGS. 10A–10D are simplified top plan views of levels of a sixth embodiment of a semiconductor package 6 in accordance with the present invention.

Figure 10A:
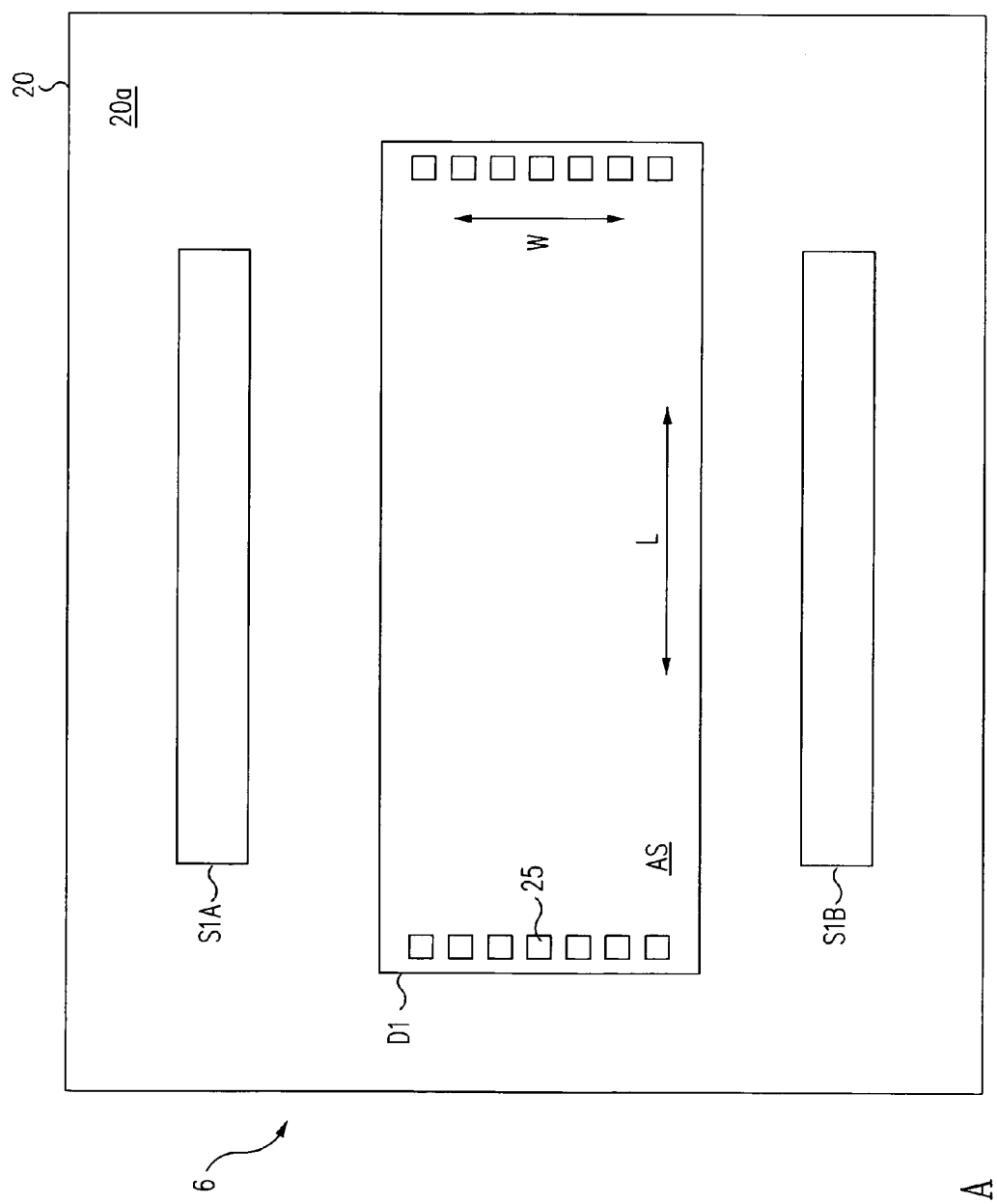
FIGS. 10A–10D are simplified top plan views of levels in a sixth embodiment of a semiconductor package.
Figure 10B:
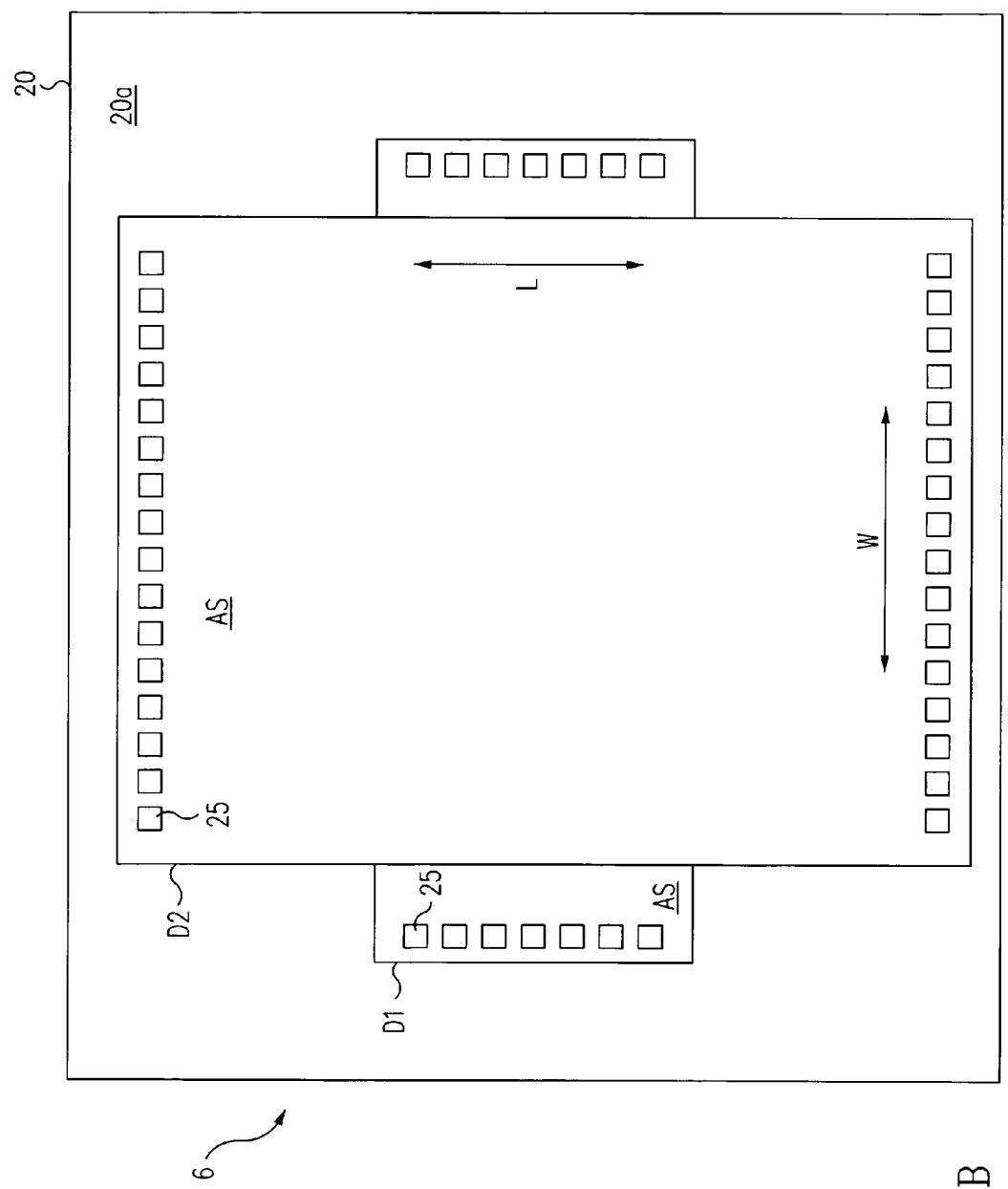

Referring to FIGS. 10A and 10B, semiconductor package 6 includes a first stack level including a semiconductor die D1 and elongated supports S1A, S1B adjacent to the long side of semiconductor D1, and a second stack level including a relatively large semiconductor die D2 that is attached to the active surface AS of semiconductor die D1 entirely within the bond pads 25 of active surface AS. With respect to its first and second stack levels, semiconductor package 6 is similar to semiconductor package 4 of FIGS. 8A, 8B, excluding the use of supports S2A, S2B. Hence, further discussion will be omitted as redundant.

Figure 10C:
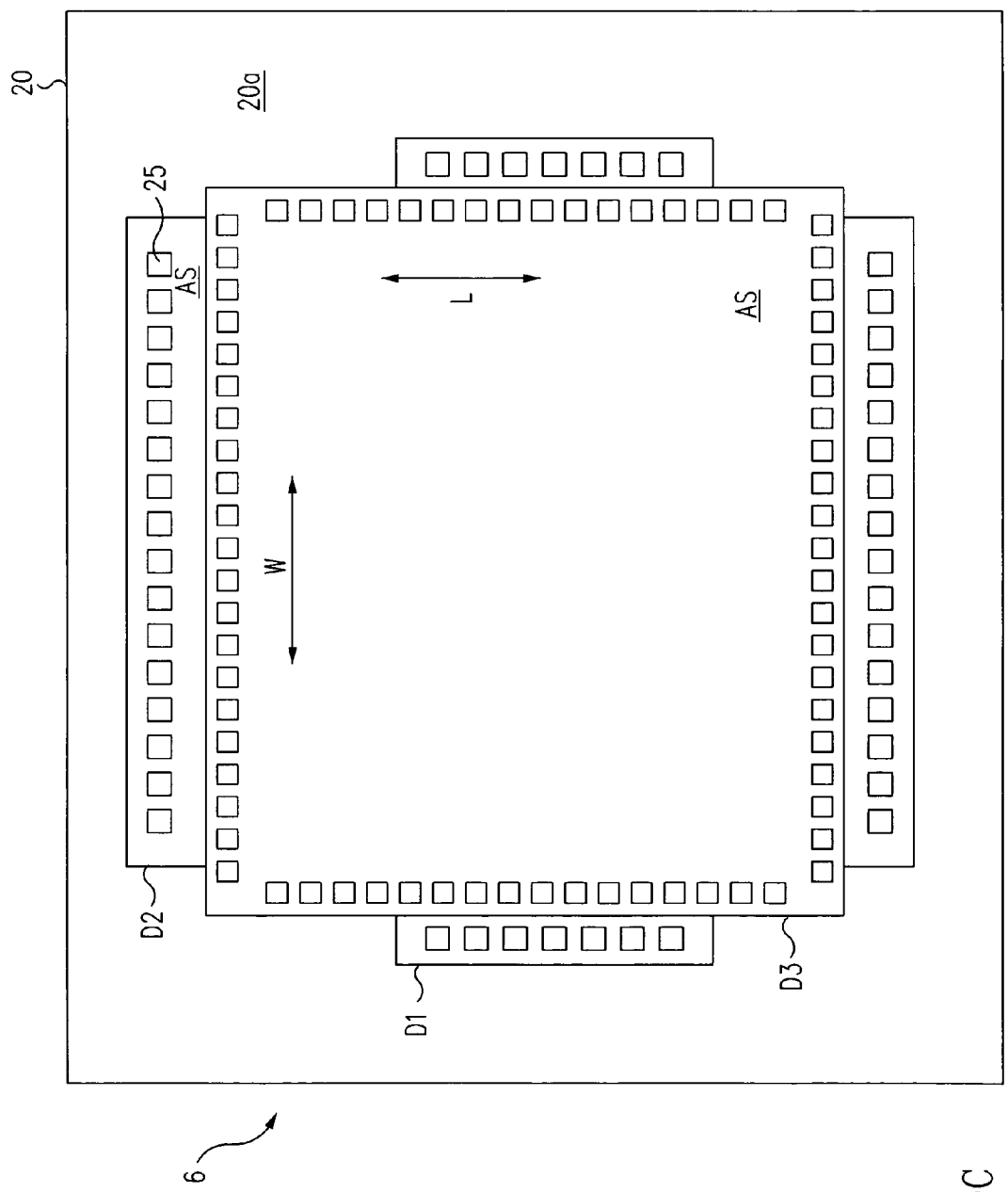

Referring to FIG. 10C, a third stack layer including a relatively large semiconductor die D3 is attached to the active surface AS of semiconductor die D2 entirely within the two parallel rows of bond pads 25 of the active surface AS of semiconductor die D2. Semiconductor die D3 also optionally fits entirely within the two parallel rows of bond pads 25 of the active surface AS of semiconductor die D1. Accordingly, semiconductor die D3 does not overlie the bond pads of semiconductor dies D1 or D2. Semiconductor die D3 has a square active surface AS with four rows of bond pads 25. Each of the four rows of bond pads 25 is adjacent to a respective one of the four edges of active surface AS of semiconductor die D3. In an alternative embodiment, semiconductor die D3 may be larger, so as to overhang the bond pads 25 of semiconductor die D1, but not the bond pads 25 of semiconductor die D2.

Figure 10D:
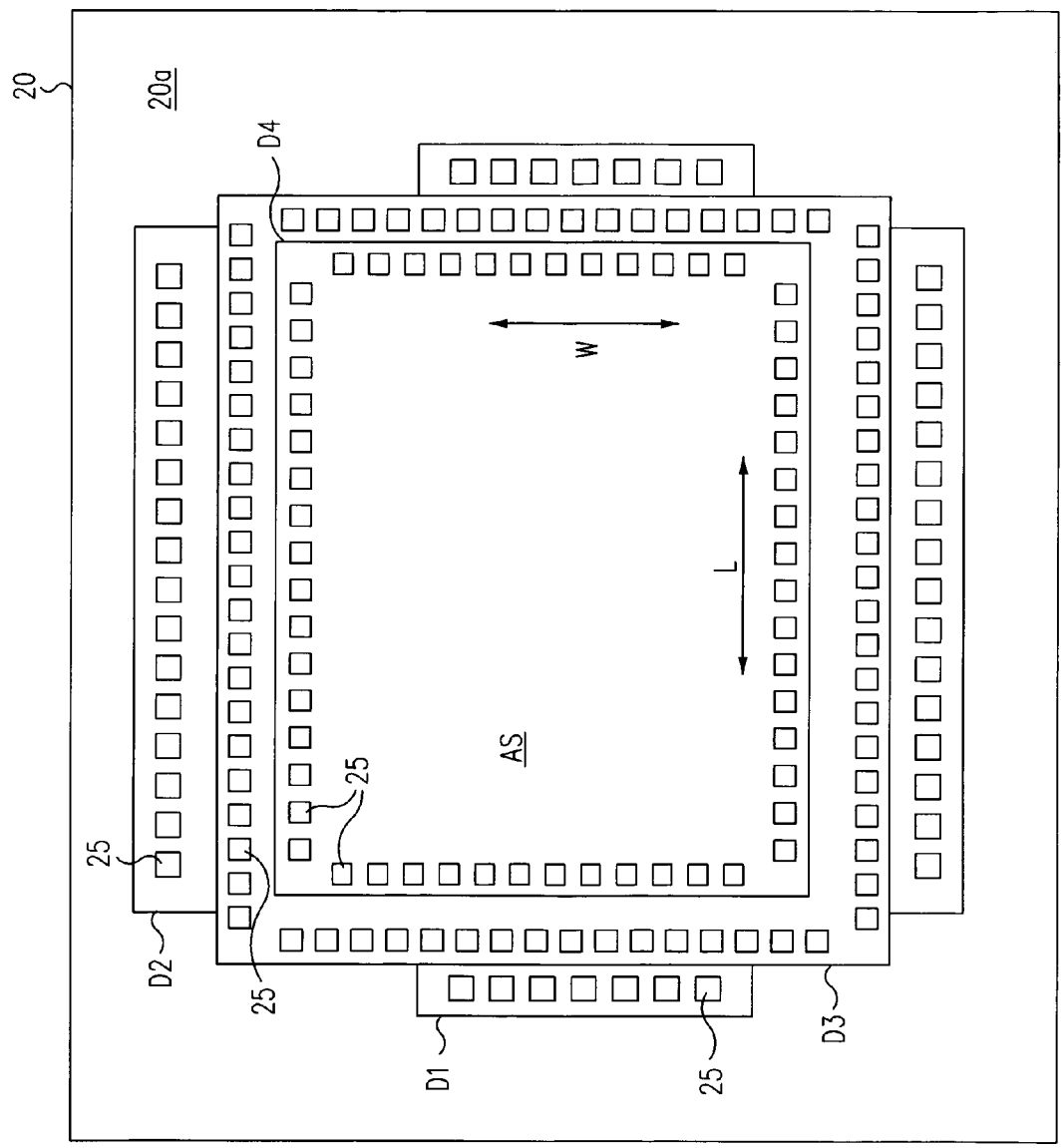

Referring to FIG. 10D, a fourth stack layer including a relatively large semiconductor die D4 is attached to the active surface AS of semiconductor die D3 using an adhesive layer 28. Semiconductor die D4 includes four rows of bond pads 25, with one of the rows adjacent to each of the four edges of active surface AS of semiconductor die D4. Semiconductor die D4 is sized to fit entirely within the four rows of bond pads of the active surface AS of semiconductor die D3. Semiconductor die D4 also fits entirely within the bond pads 25 of the active surface AS of semiconductor dies D1 and D2. In other words, semiconductor die D4 does not overlap any of the bond pads 25 of semiconductor dies D1–D3.

In semiconductor package 6, each of the four semiconductor dies D1–D4 is a different size and type.

During the assembly of semiconductor package 6, bond wires 26 (e.g., FIG. 1) may be coupled to the bond pads 25 of all of the four semiconductor dies D1–D4 in a single wire bond operation, because none of upper level semiconductor dies D2–D4 overhangs the bond pads 25 of any of the respective underlying semiconductor dies of the stack.

Figure 11A:
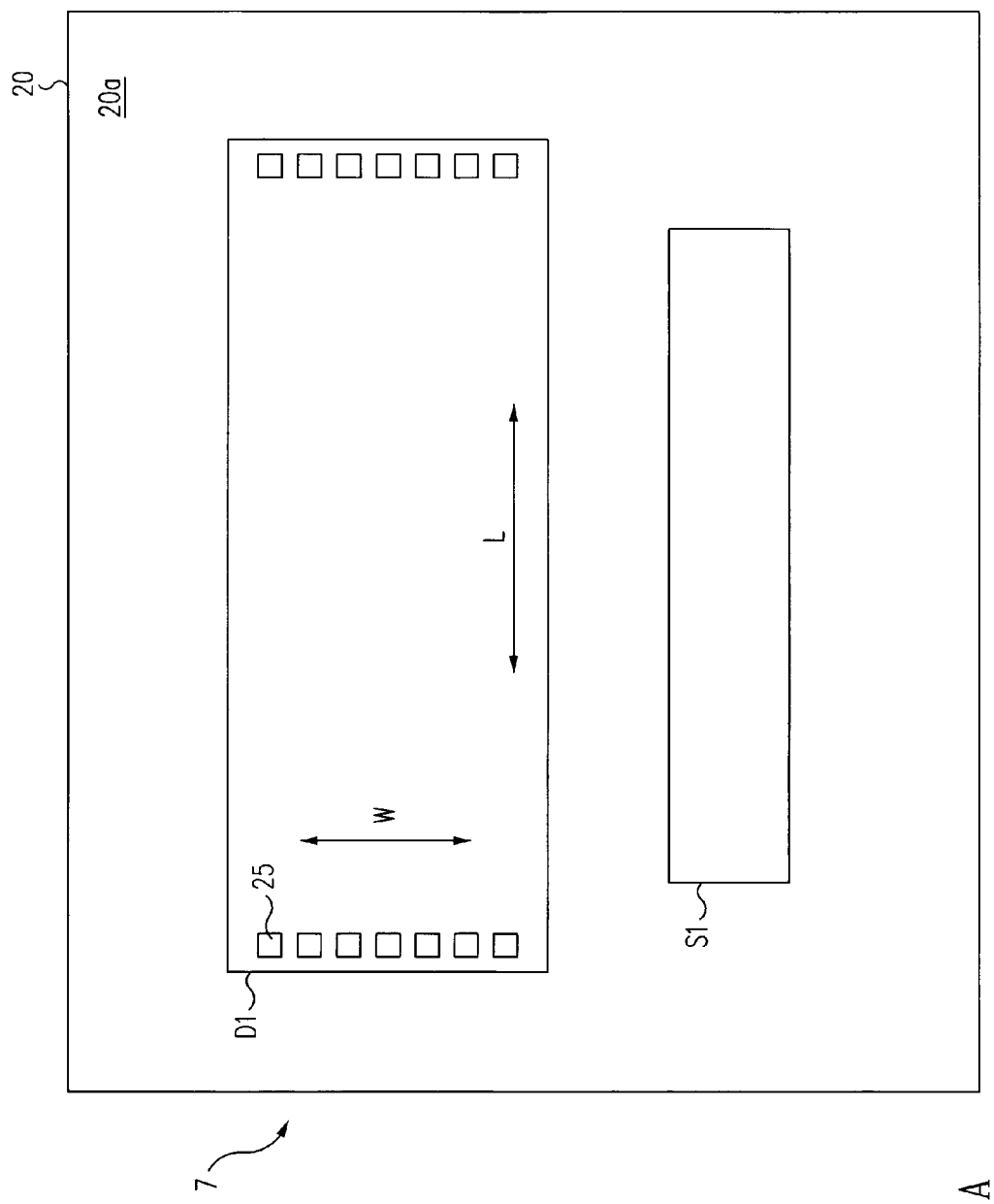
FIGS. 11A–11D are simplified top plan views of levels in a seventh embodiment of a semiconductor package.
Figure 11B:
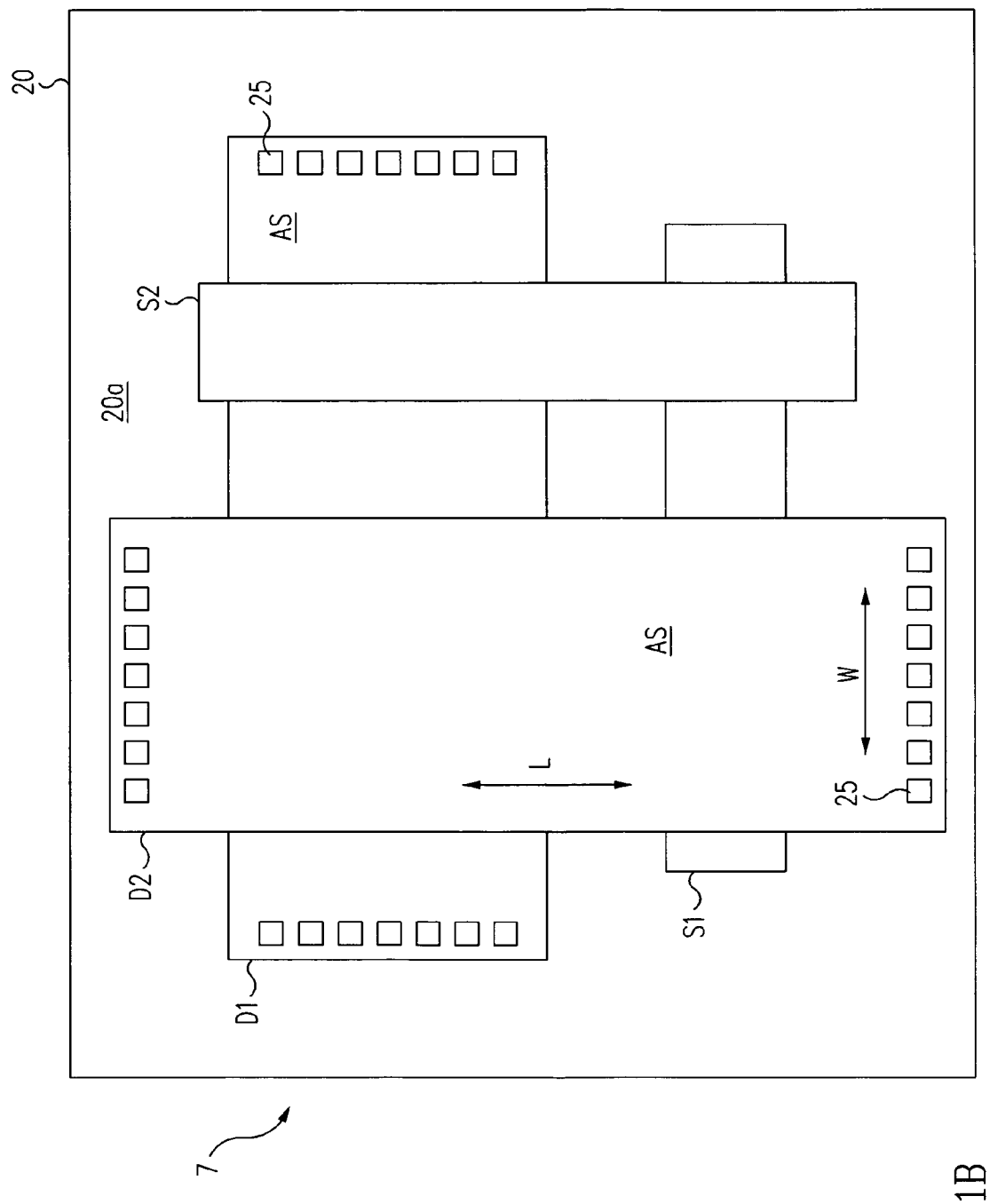
Figure 11C:
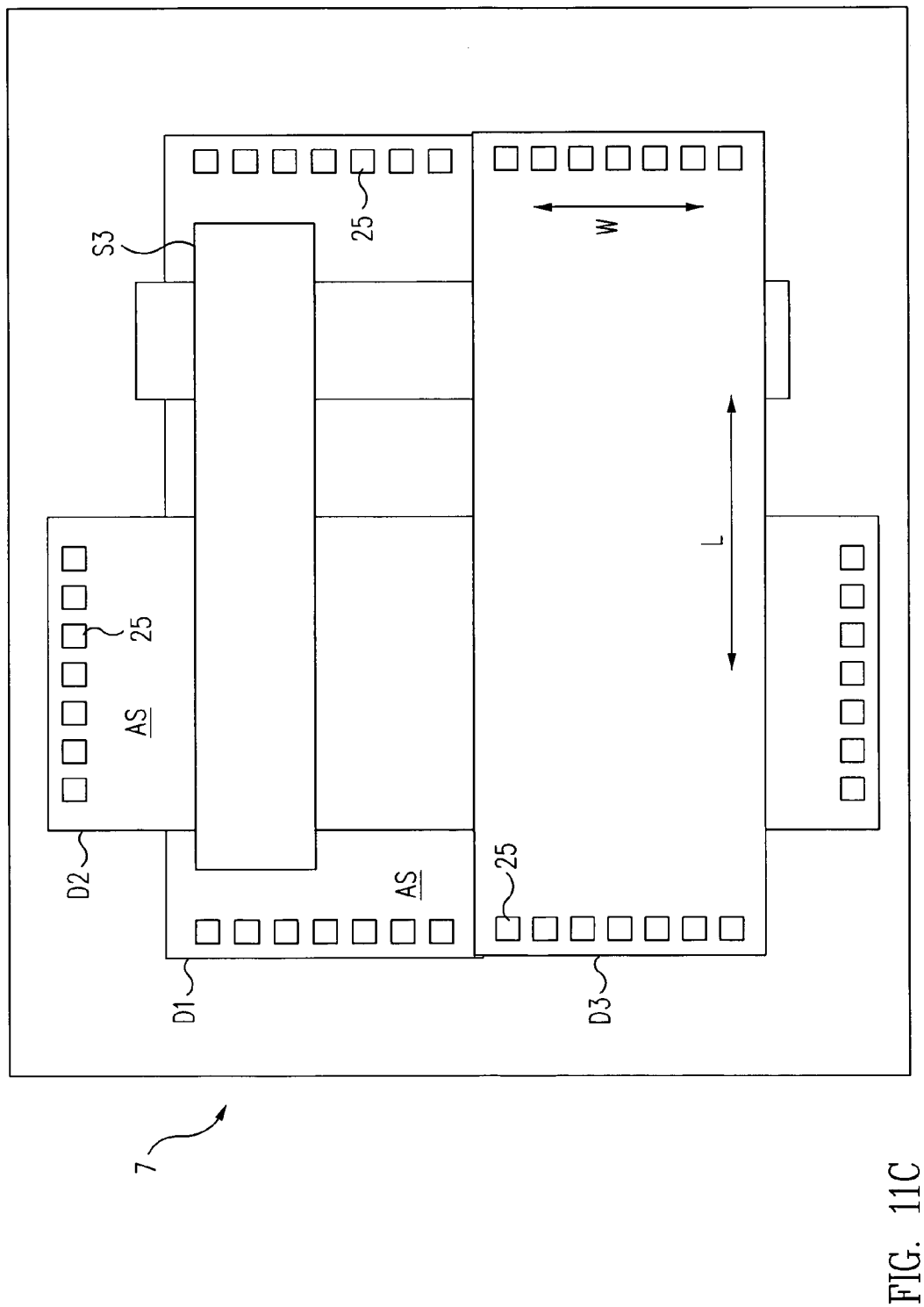
Figure 11D:
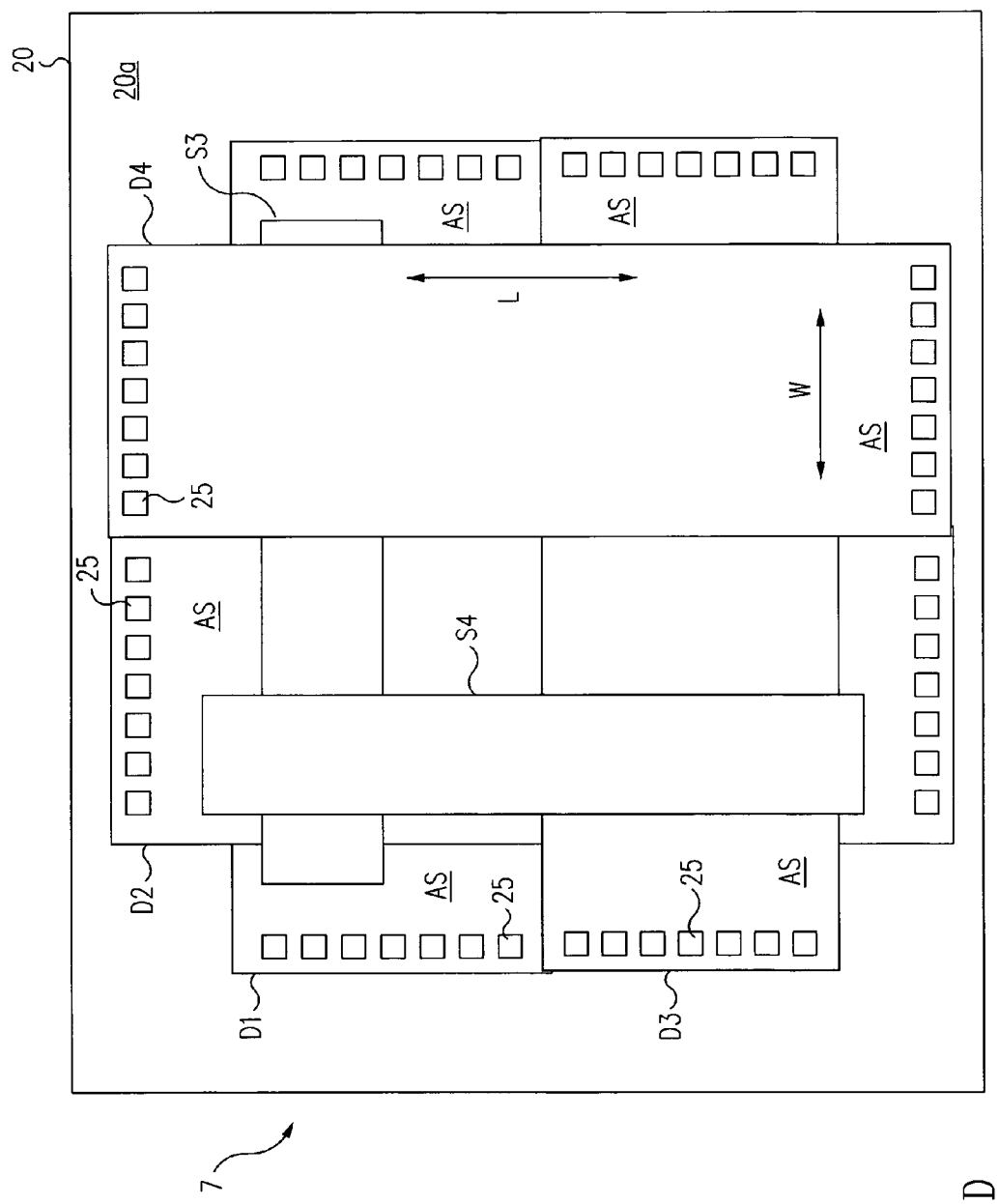

FIGS. 11A–11D are simplified top plan views of levels of a seventh embodiment of a semiconductor package 7 in accordance with the present invention. Semiconductor package 7 includes a four level stack, with each level including one semiconductor die DN (where "N" is the level number)

and a single elongated support SN. With respect to the arrangement of the four levels of the stack, semiconductor package 7 is identical to semiconductor package 3 of FIGS. 6A–7D, except that, as shown in FIG. 11D, all of the four semiconductor dies of semiconductor package 7 are the same size and type (e.g., memory devices), and the second and higher level semiconductor dies D2–D4 and supports S2–S4 are sized and located such that none of the semiconductor dies D2–D4 or supports S2–S4 overhangs any of the bond pads 25 of any of the respective underlying semiconductor dies of the stack. There is some optional overlap between the active surfaces of semiconductor dies D1 and D3, and D2 and D4, respectively, but the overlap ends clear of the bond pads 25 of the semiconductors D1 and D2, respectively. Accordingly, during the assembly of semiconductor package 7, bond wires 26 may be coupled to the bond pads 25 of all of the stacked semiconductor dies D1–D4 in a single wire bond operation. The rows of bond pads 25 of semiconductor die D4 are parallel to and aligned with the rows of bond pads of semiconductor die D2 and perpendicular to the rows of bond pads 25 of semiconductor dies D1 and D3, which also are aligned.

In an alternative embodiment, the second and higher level semiconductor dies D2–D4 may be disposed so that there is absolutely no overlap between semiconductor dies D1 and D3, and D2 and D4, respectively. The stack arrangement of semiconductor packages 3 and 7 may facilitate encapsulant flow and thermal properties of the packages.

FIGS. 12A–12D are simplified top plan views of levels of an eighth embodiment of a semiconductor package 8 in accordance with the present invention.

Figure 7A:
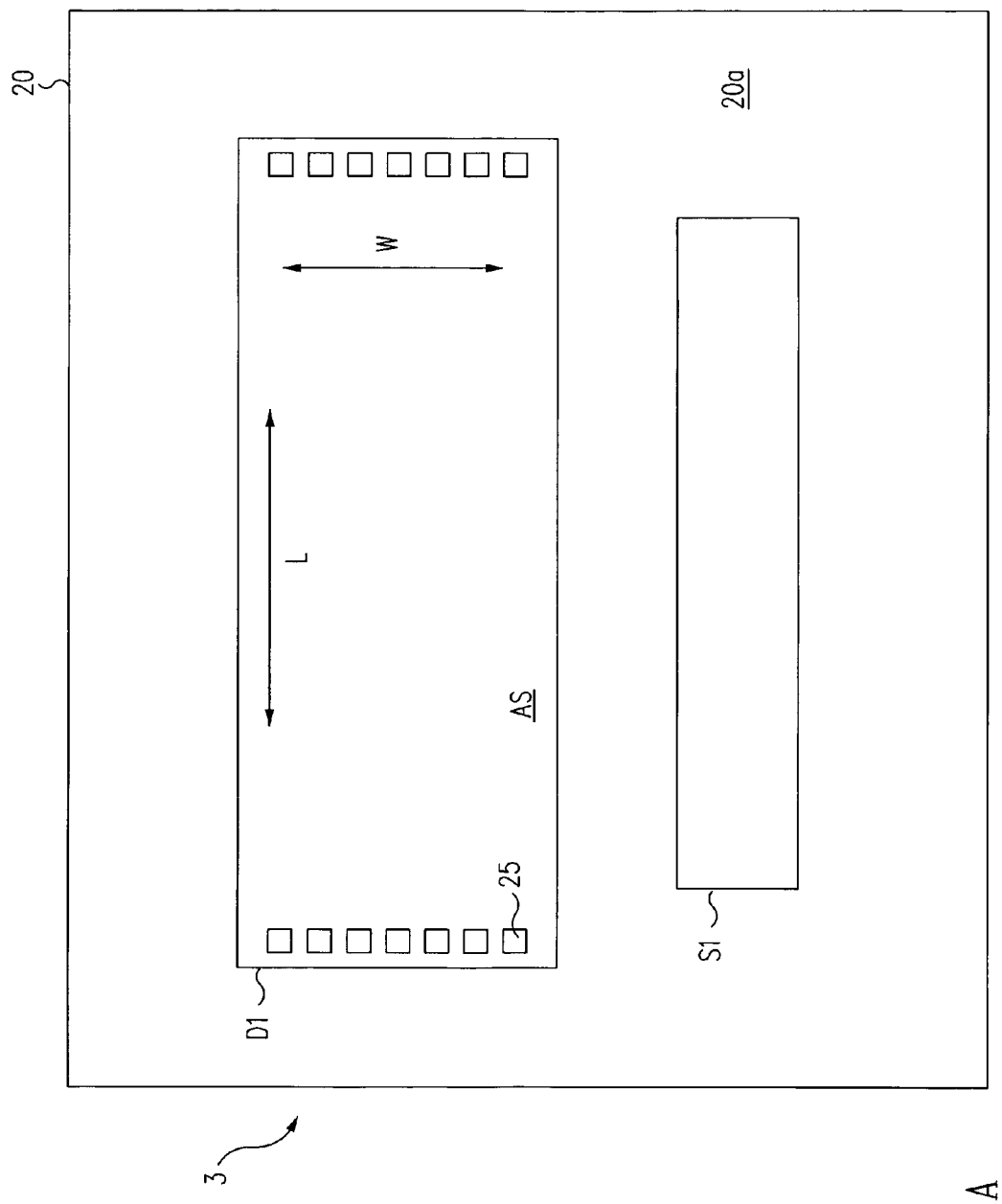
FIGS. 7A–7D are simplified top plan views of levels in the semiconductor package of FIGS. 6A and 6B.
Figure 7B:
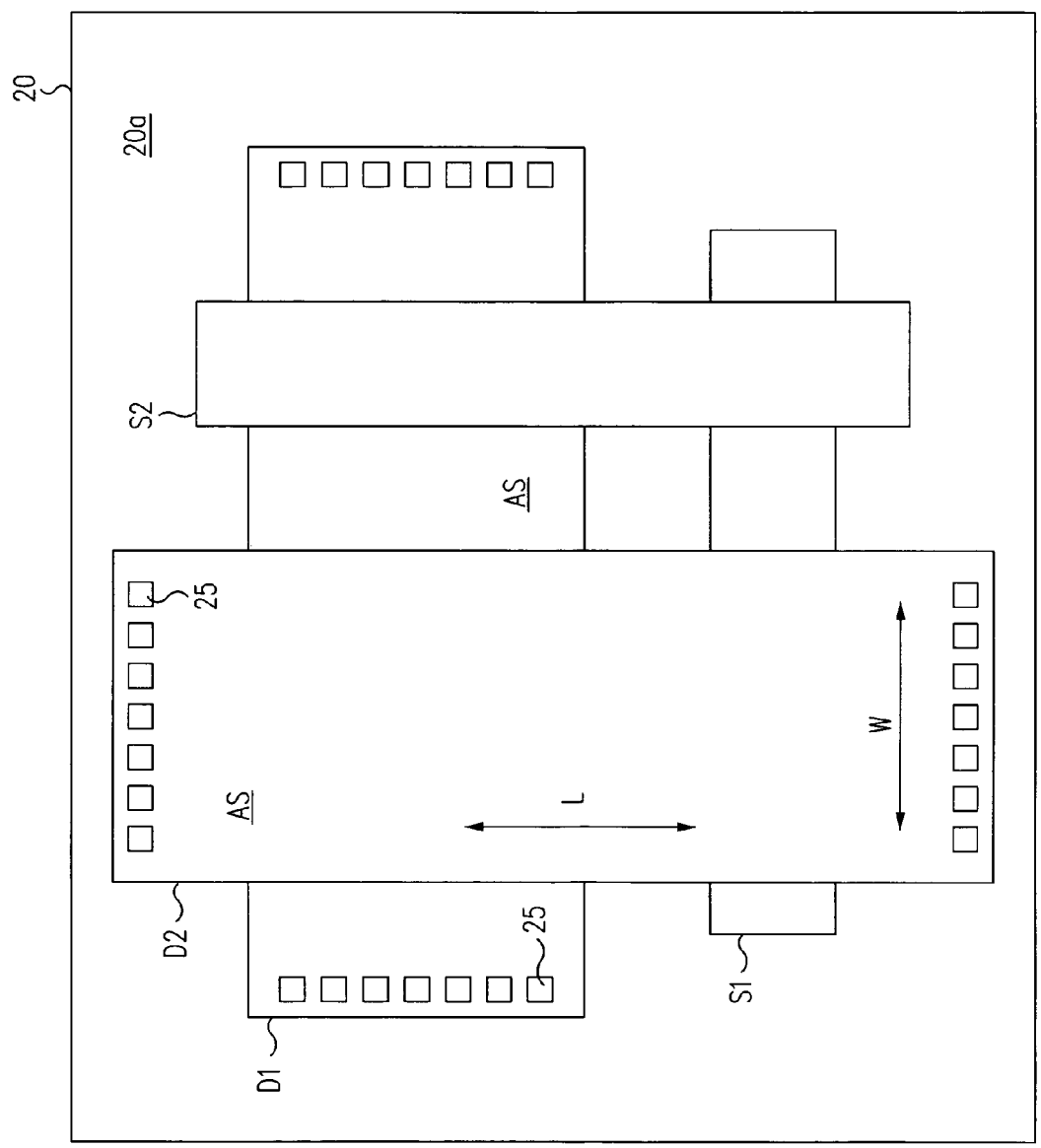
Figure 7C:
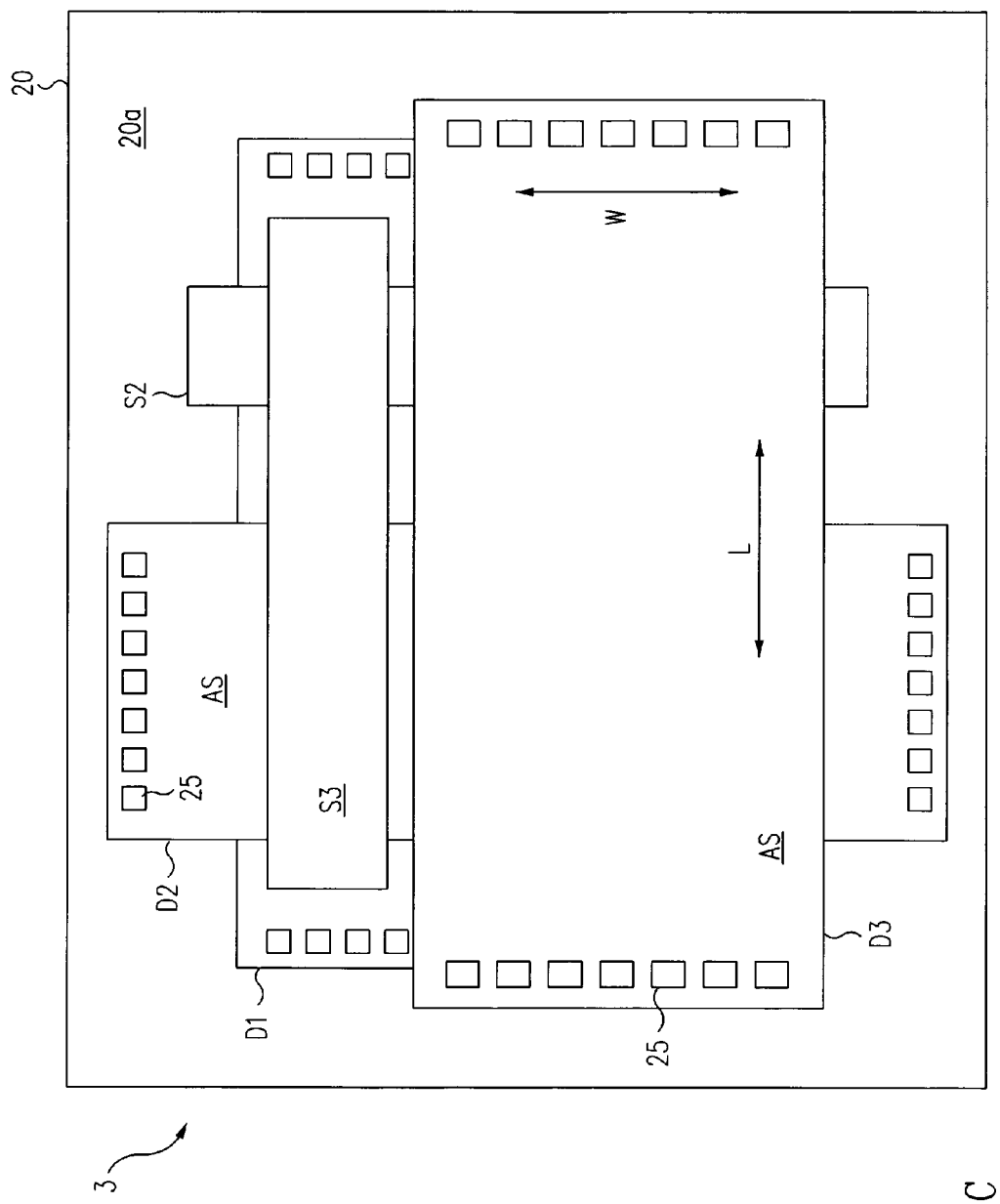
Figure 7D:
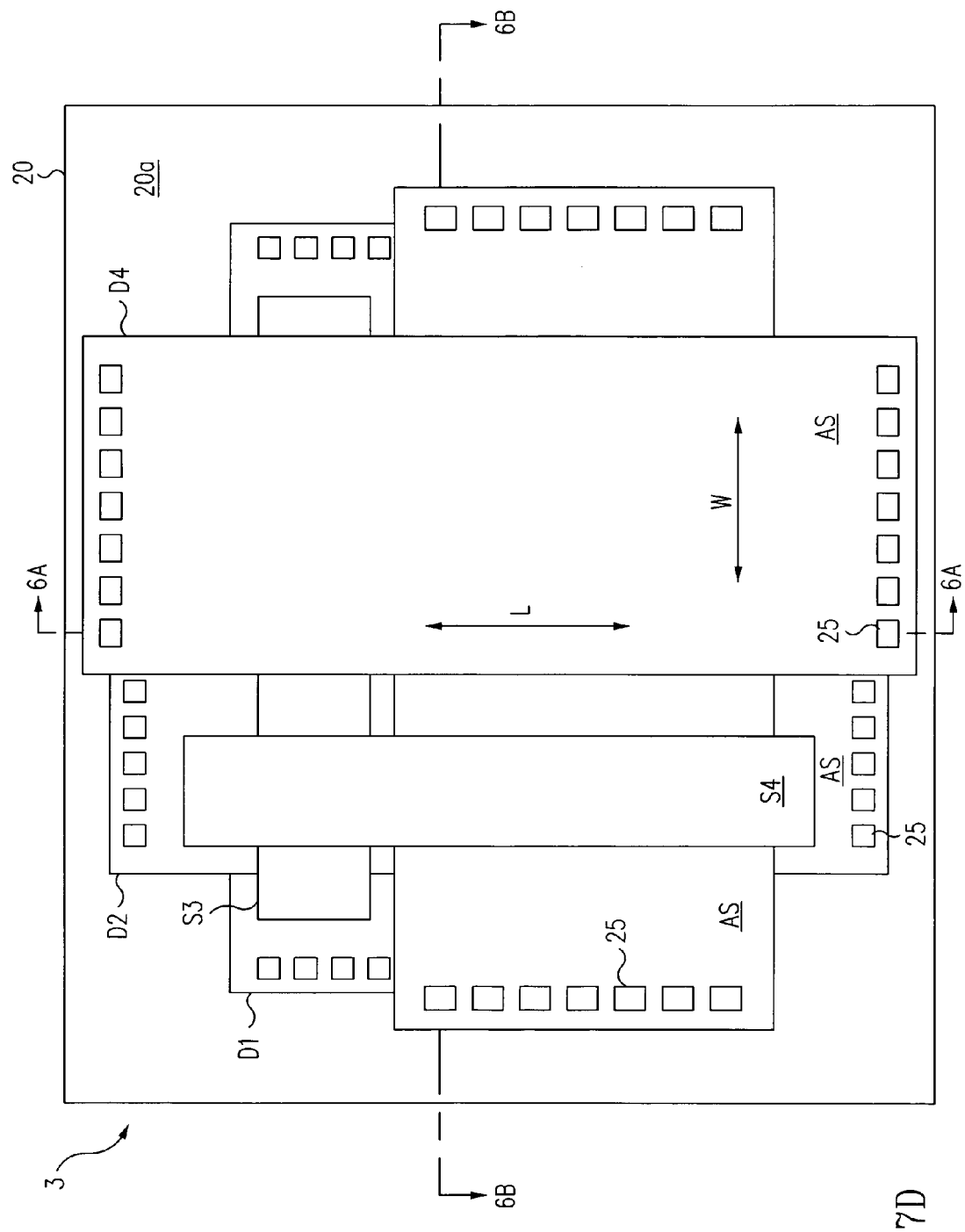
Figure 12A:
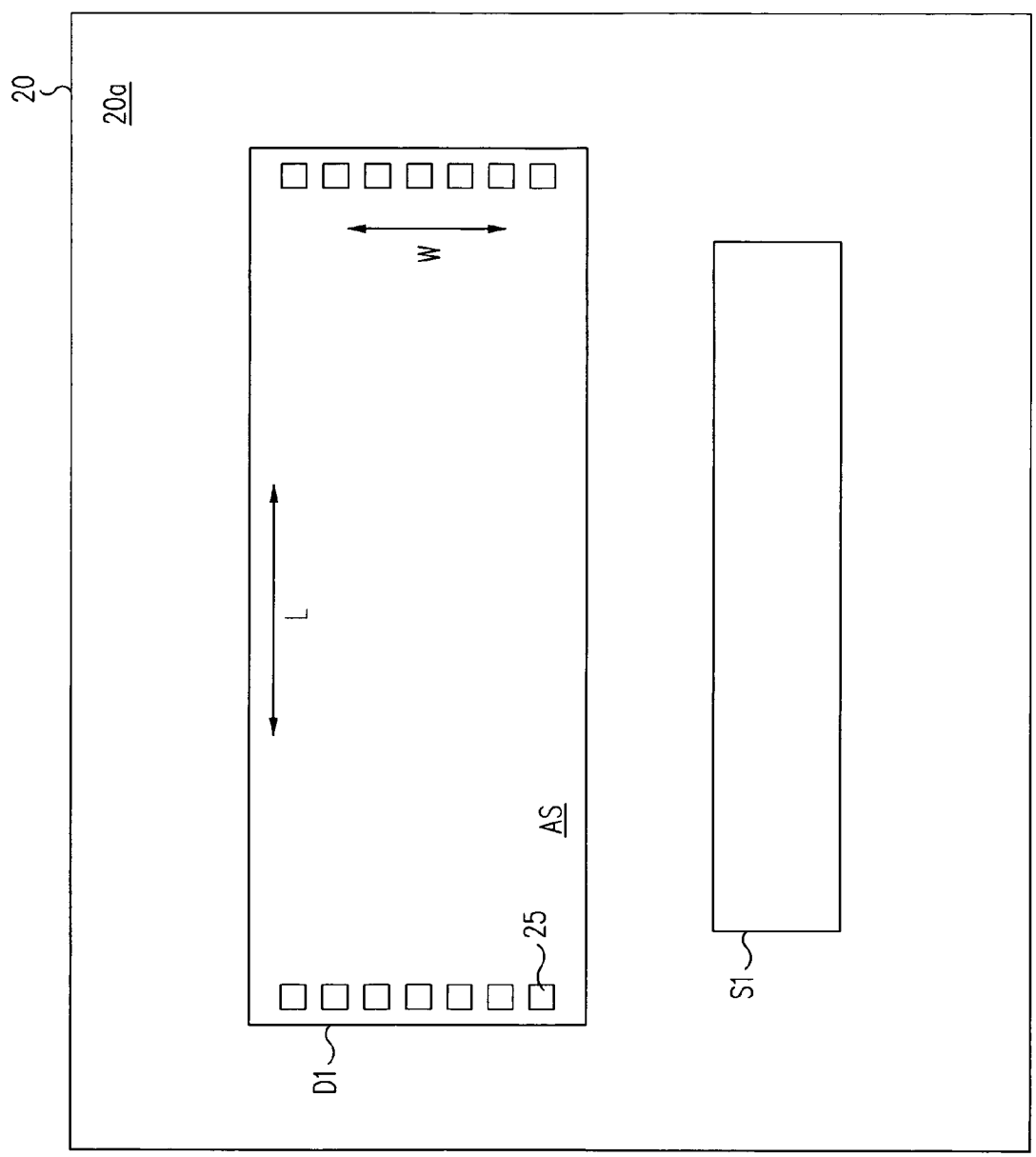
FIGS. 12A–12D are simplified top plan views of levels in an eighth embodiment of a semiconductor package.

Referring to FIG. 12A, a first level of semiconductor package 8 includes a semiconductor die D1 and a single elongated support S1, which are arranged on, and attached by an adhesive layer 27 to, the upper surface 20a of substrate 20 in a manner similar to the first level of semiconductor package 3 of FIG. 7A. The single support S1 is adjacent to one of the long sides of semiconductor die D1. The length of support S1 is greater than the width W of semiconductor die D1, but slightly less than the length L of semiconductor die D1. The thickness (i.e., vertical height relative to upper surface 20a) of support S1 is the same as the thickness of semiconductor die D1, so that the upper surface of support S1 and the active surface AS of semiconductor die D1 are in a common plane parallel to upper surface 20a.

Figure 12B:
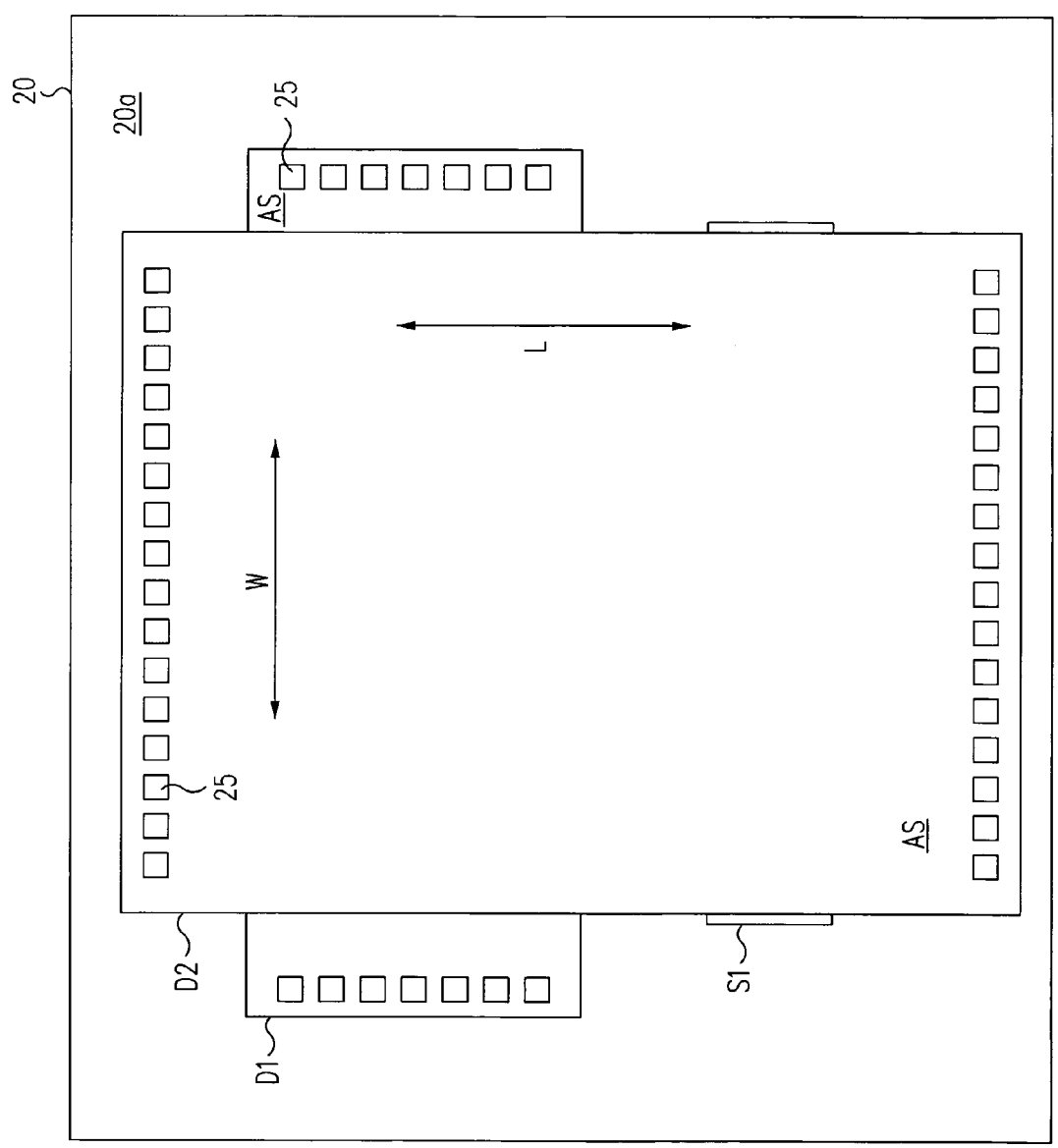

Referring to FIG. 12B, a second level of semiconductor package 8 includes a semiconductor die D2, which is much larger than semiconductor die D1. Semiconductor die D2 is attached to the coplanar active surface AS of semiconductor die D1 and upper surface of support S1 by an adhesive layer 28. The support S1 is sized and located to provide adequate support to semiconductor die D2, including during the attachment of bond wires 26 to semiconductor die D2.

Semiconductor die D2 has bond pads 25 in two rows, with one row adjacent to each of two parallel edges of active surface AS. The rows of bond pads 25 of semiconductor die D2 are perpendicular to the rows of bond pads of semiconductor die D1. The rows of bond pads 25 of semiconductor die D2 overhang the respective adjacent long side of semiconductor die D1 and support S1.

Semiconductor die D2 is sized and located such that it fits entirely within the bond pads 25 of the active surface AS of semiconductor die D1. In other words, semiconductor die D2 does not overlap the bond pads 25 of semiconductor die D1.

Figure 12C:
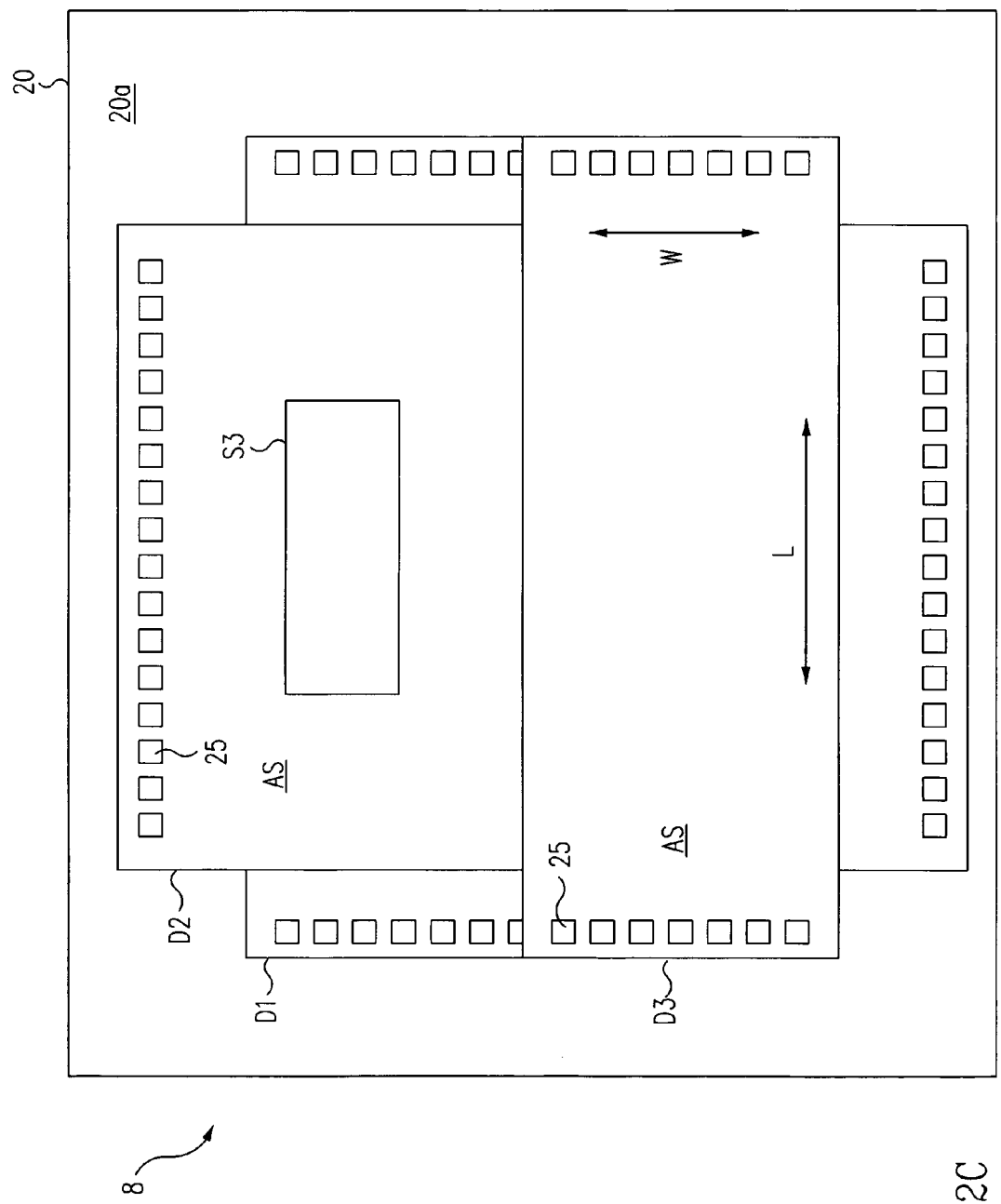

Referring to FIG. 12C, a third level of semiconductor package 8 includes a semiconductor die D3 and a single support S3 that are together attached to the active surface of semiconductor die D2 entirely within the bond pads 25 of semiconductor die D2 by an adhesive layer 28. Semiconductor die D3 has an oblong rectangular active surface AS, with a row of bond pads 25 along each of the short edges of active surface AS. The rows of bond pads 25 of semiconductor die D3 are parallel to the rows of bond pads 25 of semiconductor die D1, and perpendicular to the rows of bond pads 25 of semiconductor die D2. While semiconductor die D3 and support S3 do not overlie the bond pads 25 of semiconductor die D2, there is some overlap between semiconductor die D3 and the bond pads 25 of semiconductor die D1. However, the amount of overlap may vary, from zero to 100%, because semiconductor die D3 is adequately spaced above the bond pads 25 of semiconductor die D1 by the thickness of semiconductor die D2 so that the bond wires 25 coupled to semiconductor die D1 are not adversely contacted.

Figure 12D:
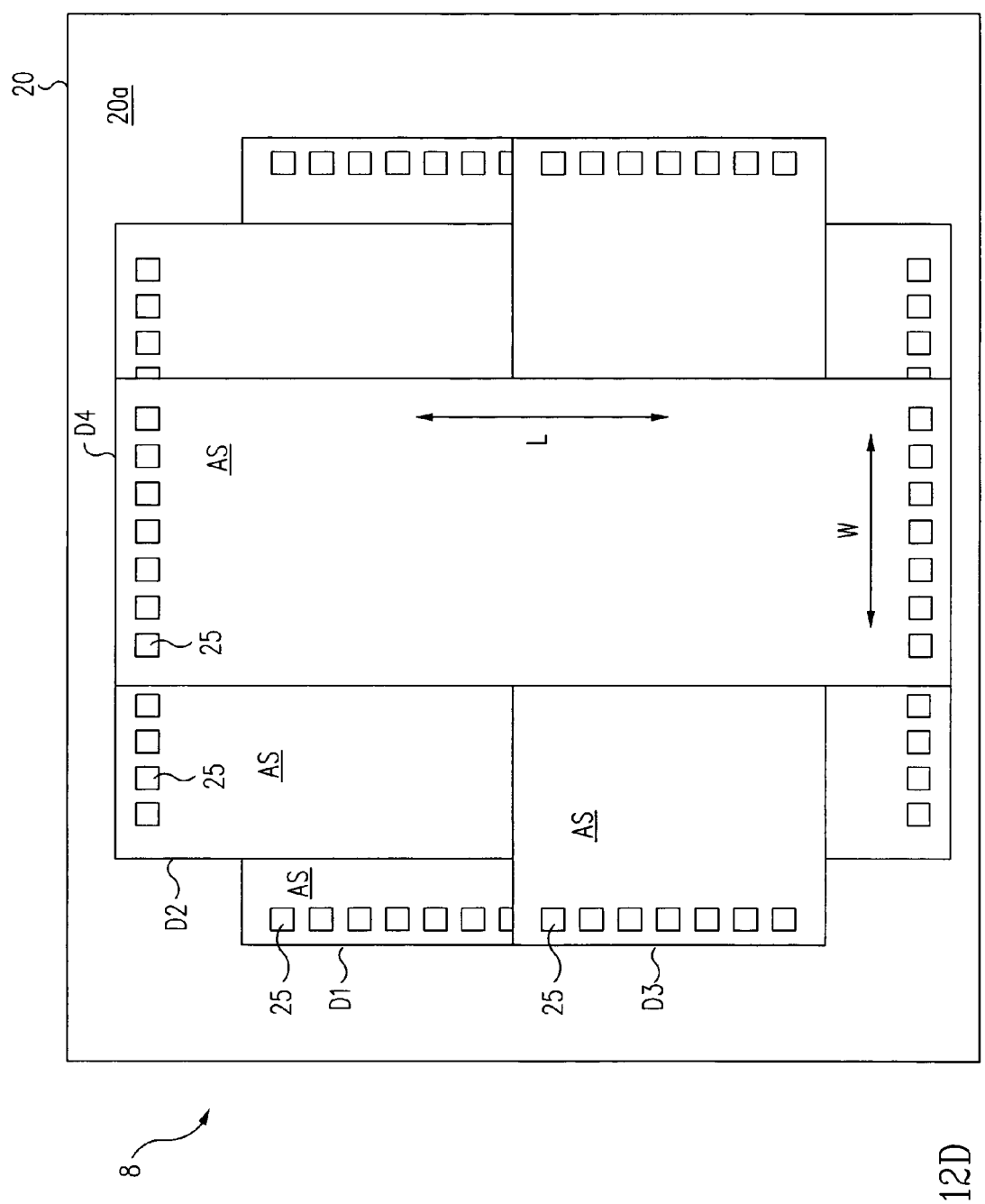

Support S3 is disposed adjacent to, but spaced from, one of the long sides of semiconductor die D1. Support S3 has length and width sufficient to support the next higher level semiconductor die D4, as shown in FIG. 12D. A thickness (i.e., vertical height) of spacer S3 is the same as that of semiconductor die D3, so that the active surface AS of semiconductor die D3 and the upper surface of support S3 are in a common plane parallel to upper surface 20a of substrate 20.

Referring to FIG. 12D, a fourth layer including a semiconductor die D4 is attached to the coplanar active surface AS of semiconductor die D3 and upper surface of support S3 by an adhesive layer 28. Semiconductor die D4 has an oblong rectangular active surface AS, with bond pads 25 in a row adjacent to each of the short edges of active surface AS. The rows of bond pads 25 of semiconductor die D4 are parallel to the rows of bond pads 25 of semiconductor die D2 and perpendicular to the rows of bond pads 25 of semiconductor dies D1 and D3. Semiconductor die D4 has an aspect ratio such that semiconductor die D4 fits entirely within the bond pads 25 of active surface AS of semiconductor die D3. In other words, semiconductor die D4 does not overlap the bond pads 25 of semiconductor die D3. Semiconductor die D4 overhangs some of the bond pads 25 of semiconductor die D2, but is adequately spaced from the bond pads 25 and the bond wires 26 coupled to the bond pads 25 by semiconductor die D3 and support S3.

FIGS. 13A–13D are simplified top plan views of levels of a ninth embodiment of a semiconductor package 9 in accordance with the present invention. Semiconductor package 9 includes a stack of four semiconductor dies D1–D4. With respect to the first three levels of semiconductor dies D1–D3 and supports S1–S3, respectively, semiconductor package 9 is the same as semiconductor package 8 of FIGS. 12A–12C. While some overlap is shown between semiconductor dies D1 and D3, the amount of overlap may vary from zero to 100%, as long as semiconductor die D2 and support S2 sufficiently space semiconductor die D3 over the bond wires 26 coupled to semiconductor die D1.

Figure 13A:
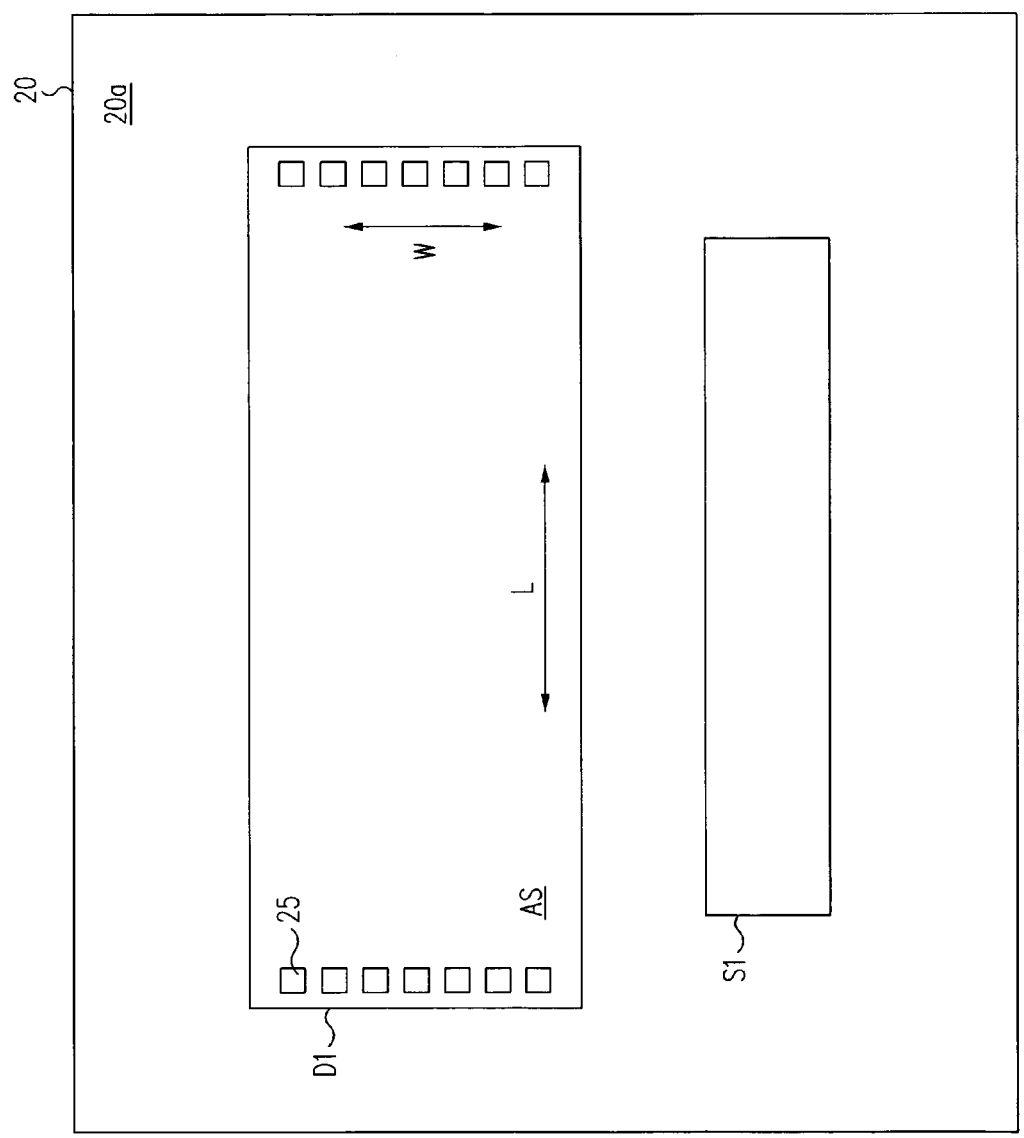
FIGS. 13A–13D are simplified top plan views of levels in a ninth embodiment of a semiconductor package.
Figure 13B:
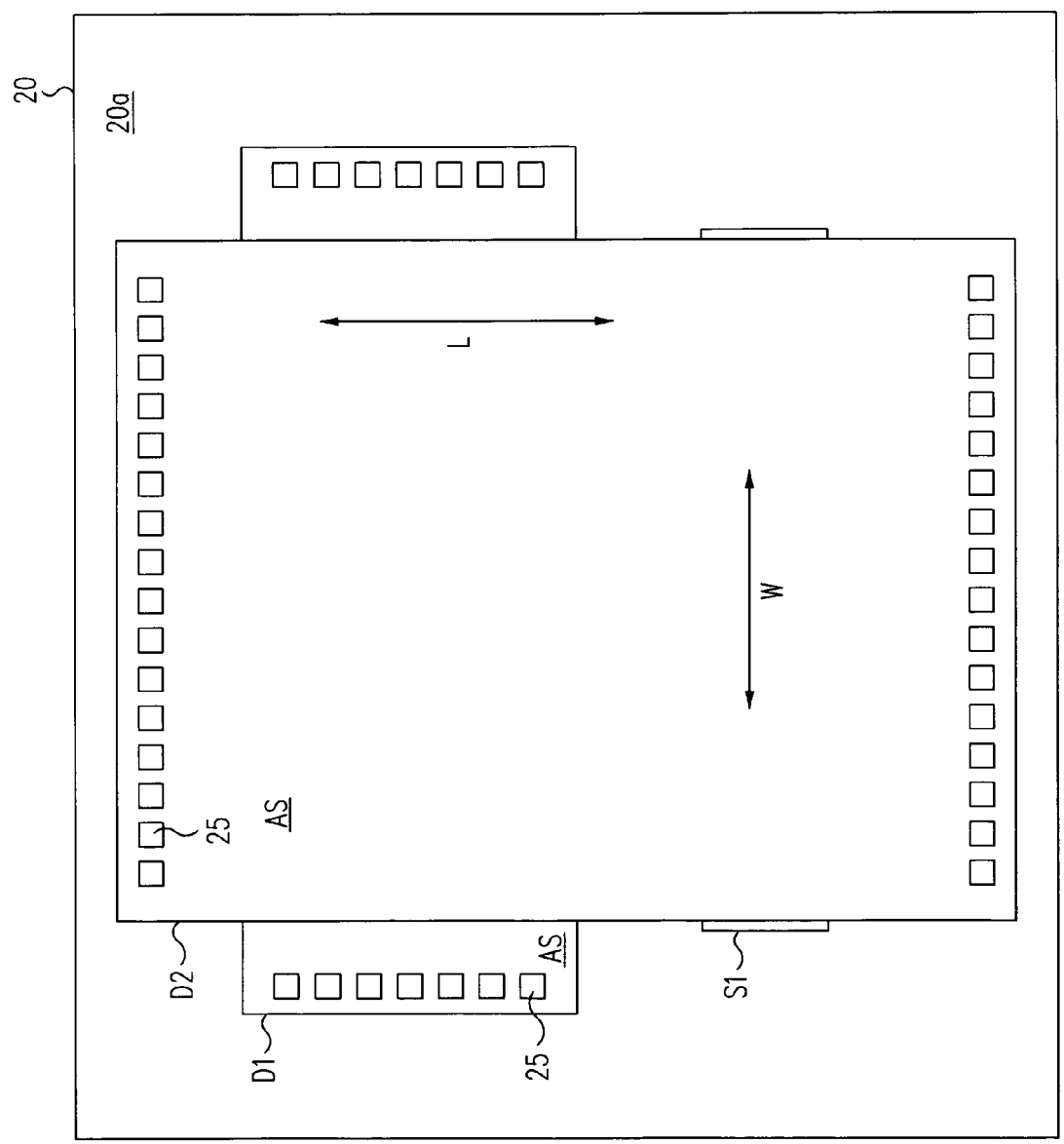
Figure 13C:
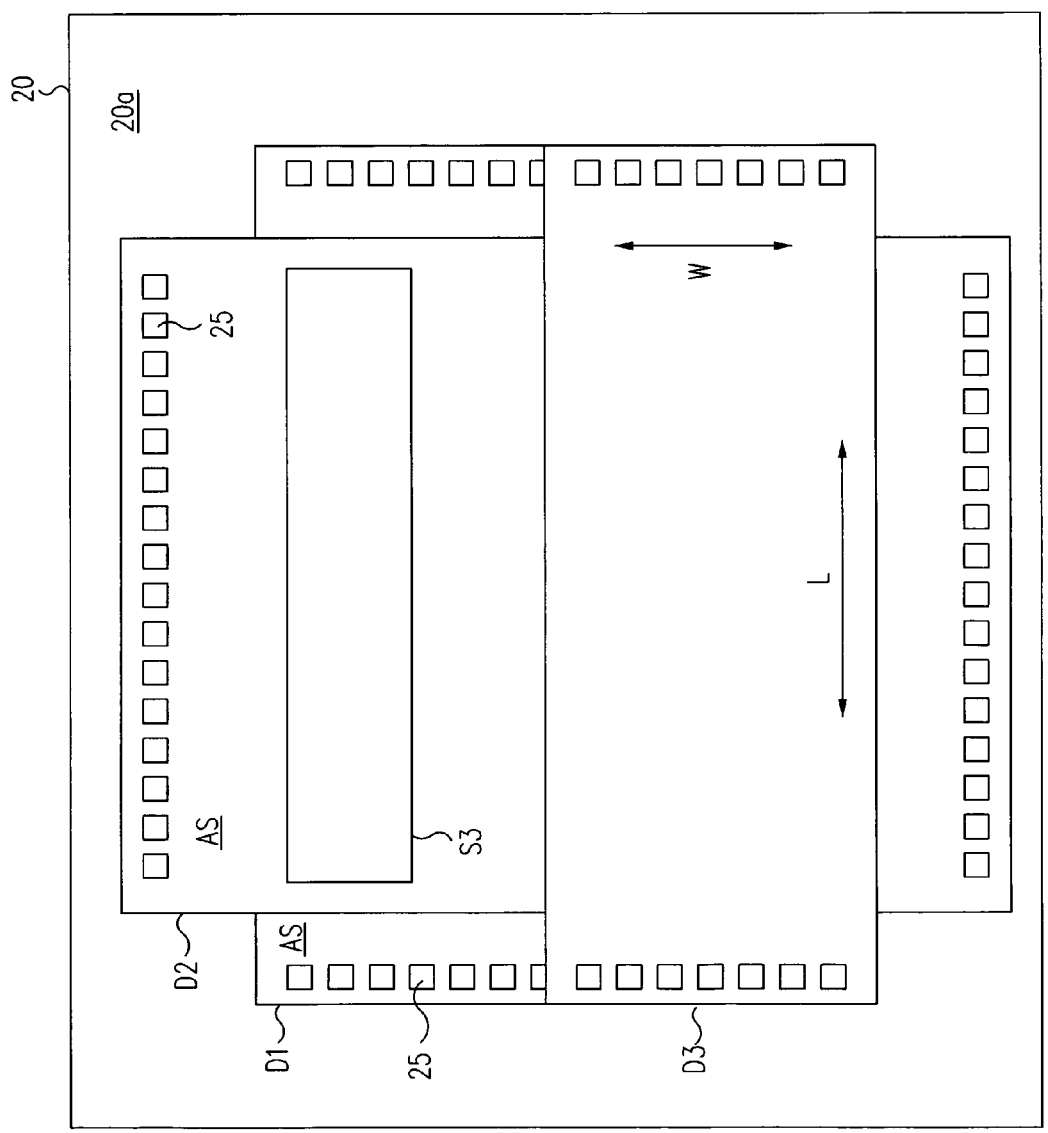
Figure 13D:
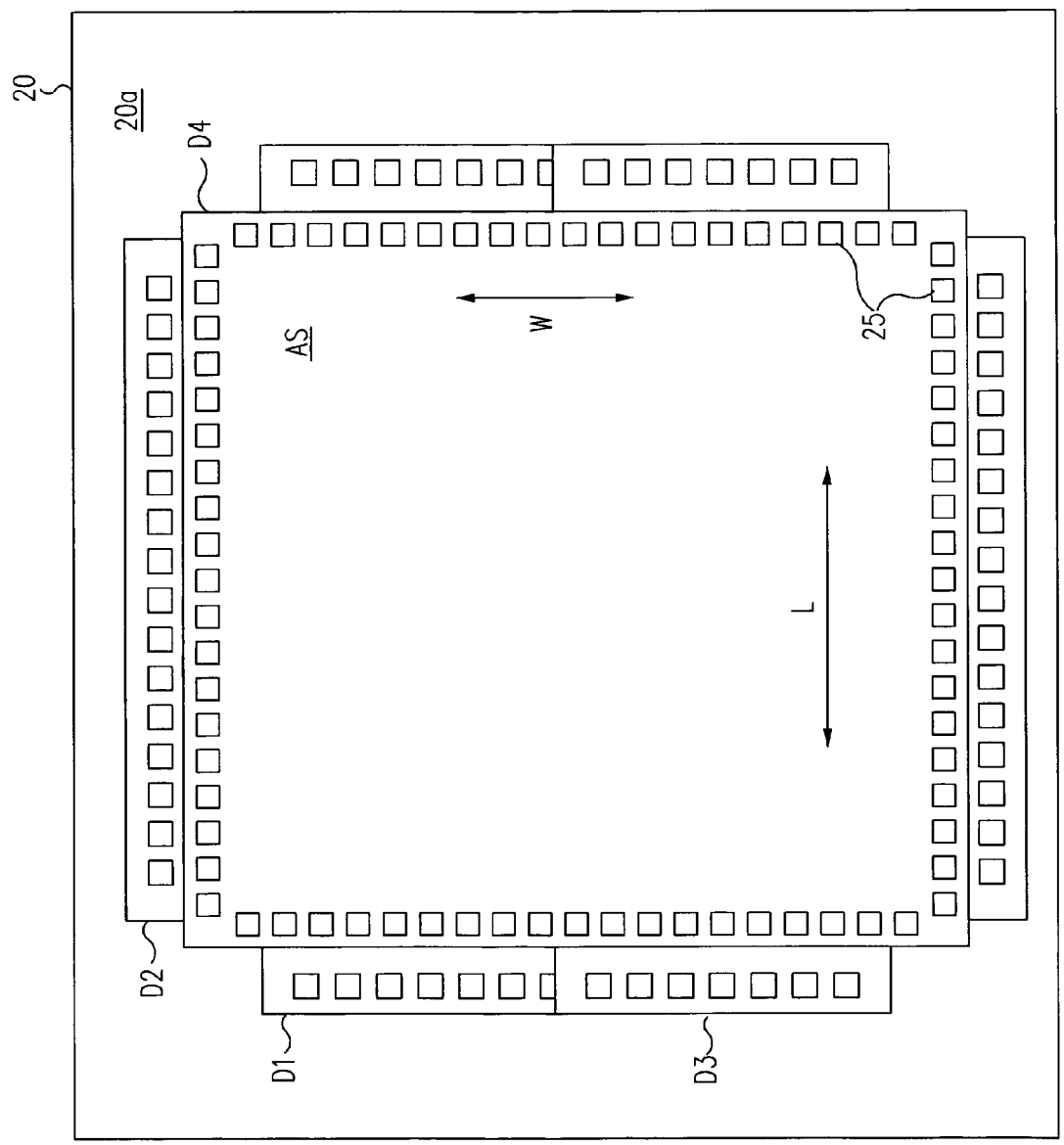

Referring to FIGS. 13C and 13D, a relatively large square semiconductor die D4 is attached via a blanket backside adhesive layer 28 to the coplanar active surface of semiconductor die D3 and upper surface of support S3. Semiconductor die D4 has bond pads 25 in four rows, with one row adjacent to each of the rectilinear edges of the active surface AS of semiconductor die D4. Support S3 is sized to provide adequate support to the major portion of semiconductor die D4 that overhangs semiconductor die D3. Semiconductor die D4 is sized so that it fits entirely within the bond pads 25 of semiconductor die D3, and optionally entirely within the bond pads 25 of semiconductor dies D1 and D2. During assembly, a single wirebond operation may be used to coupled bond wires 26 to all of the semiconductor dies D1–D4, provided that semiconductor die D3 does not overlap the bond pads 25 of semiconductor die D1. If there is overlap of the bond pads 25, then at least semiconductor die D1 will be wirebonded before semiconductor die D3 is added to the stack.

FIGS. 14A–14D are simplified top plan views of levels of a tenth embodiment of a semiconductor package 10 in accordance with the present invention. Semiconductor package 10 includes a stack of five semiconductor dies D1A, D1B, and D2–D4.

Figure 14A:
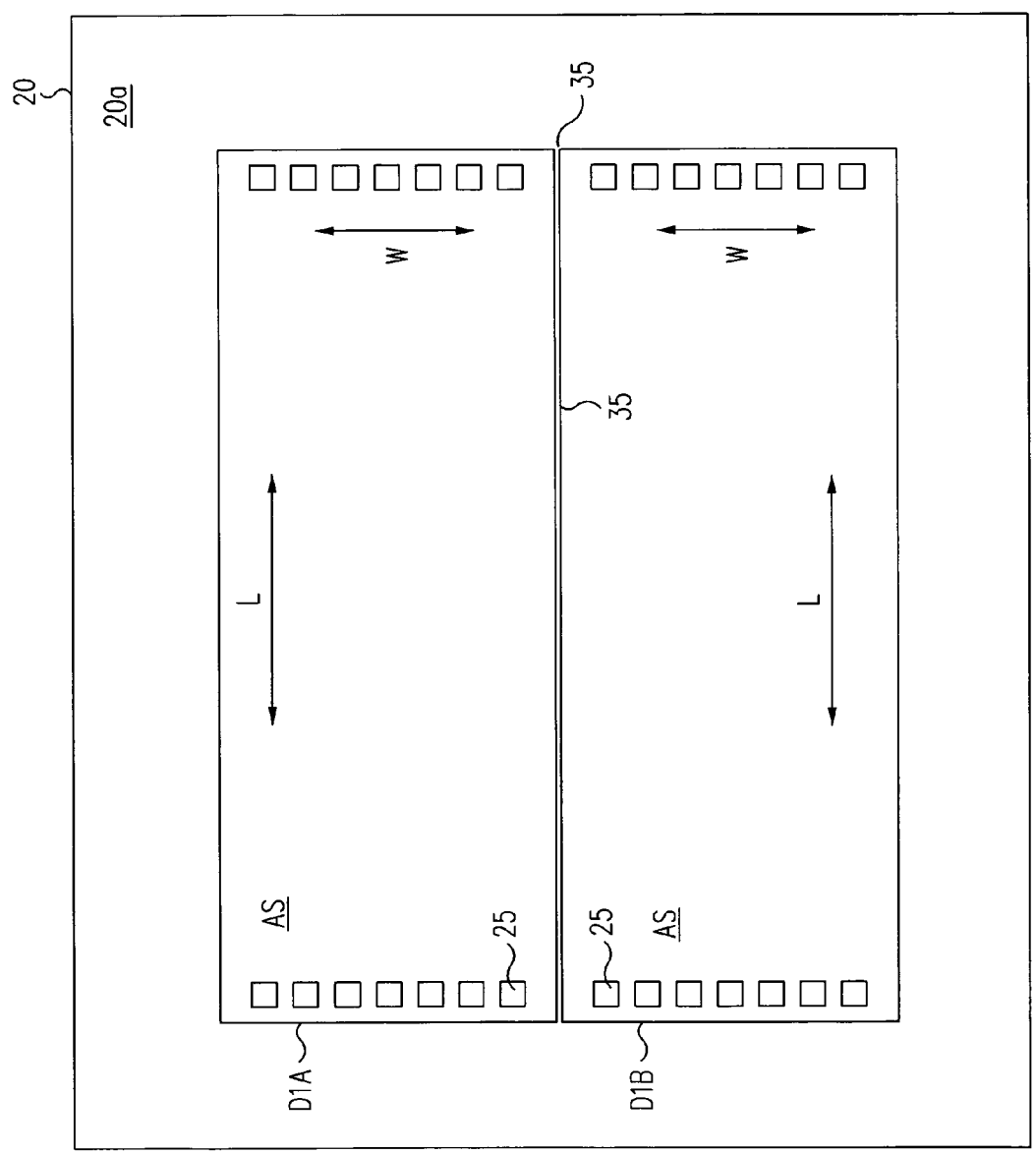
FIGS. 14A–14D are simplified top plan views of levels in a tenth embodiment of a semiconductor package.

Referring to FIG. 14A, the first level of semiconductor package 10 includes a pair of laterally joined semiconductor dies D1A, D1B that are coupled to upper surface 20a of substrate 20 by a contiguous adhesive layer 27. Semiconductor dies D1A, D1B were singulated from the same semiconductor wafer (see, e.g., FIG. 2A). Typically, but not necessarily, semiconductor dies D1A and D2A, are identical. However, instead of being singulated from each other and from the other semiconductor dies of the wafer, as discussed above with respect to FIGS. 2A and 2B, the pair of semiconductor dies D1A, D1B were not separated by cutting through the scribe line 35 between their adjacent long sides. Accordingly, the integrated circuits of semiconductor die D1A are electrically isolated from the integrated circuits of semiconductor die D1B, except that their common semiconductor material base would be at a single electrical potential (e.g., ground). From a packaging standpoint, having two physically connected, but largely electrically separate adjacent semiconductor dies allows for a smaller footprint on upper surface 20a of substrate 20 than having two laterally separate adjacent dies, while at the same time providing the electrical functionality of two separate semiconductor dies D1A, D1B. The inactive surface BS of semiconductor dies D1A, D1B may or may not be polished or etched to reduce the thickness (i.e., vertical height) of semiconductor dies D1A, D1B.

Figure 14B:
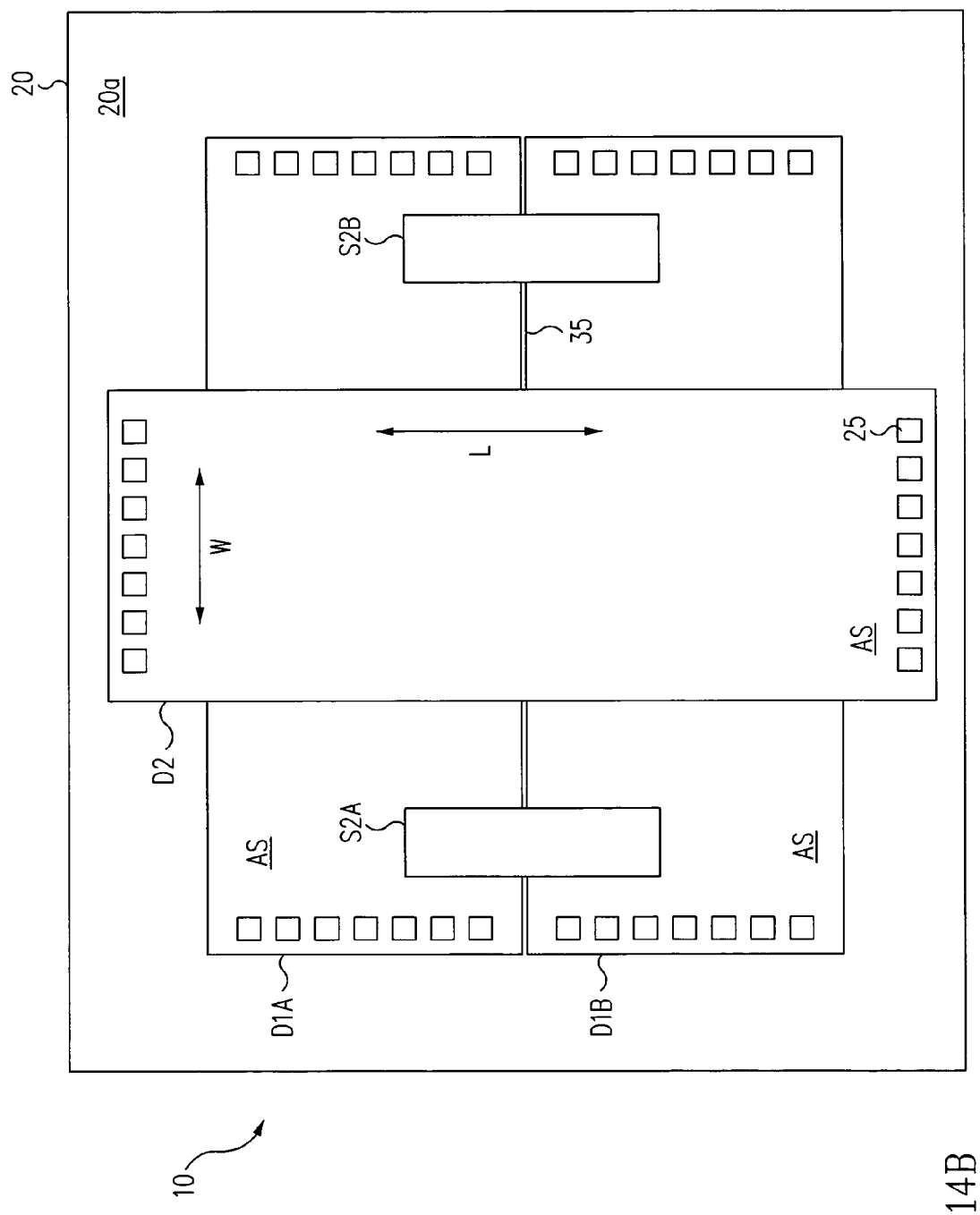

Referring to FIG. 14B, a second level of semiconductor package 10 includes a semiconductor die D2 and two supports S2A, S2B that are attached to the active surface AS of semiconductor dies D1A, D1B by an adhesive layer 28 so that they span scribe line 35. The long sides of semiconductor die D2 and supports S2A, S2B are perpendicular to scribe line 35. The two opposed short sides of semiconductor die D2 each overhang one of the free long sides of semiconductor dies D1A, D1B. Semiconductor die D3 may be the same size and type (e.g., memory device) as the individual semiconductor dies D1A, D2A.

Semiconductor die D2 and supports S2A, S2B are sized and arranged so that they together fit entirely within the bond pads 25 of the active surface AS of semiconductor dies D1A, D1B. In other words, no bond pads 25 of semiconductor dies D1A, D1B are overlapped by semiconductor die D2 or supports S2A, S2B.

Semiconductor die D2 has an oblong rectangular active surface AS, with one row of bond pads 25 adjacent to each of the parallel short edges of active surface AS. The rows of bond pads 25 of semiconductor die D2 are perpendicular to the rows of bond pads 25 of semiconductor dies D1A, D1B.

Supports S2A, S2B are each adjacent to a respective one of the long sides of semiconductor die D2, and are attached to the active surface AS of the semiconductor dies D1A, D1B centered over scribe line 35. Supports S1A, S1B are relatively short, and are sized to provide adequate support to semiconductor die D2. The thickness of supports S2A, S2B is the same as the thickness of semiconductor die D2, so that the active surface AS of semiconductor die D2 and the upper surfaces of supports S2A, S2B are in a common plane parallel to upper surface 20a.

Figure 14C:
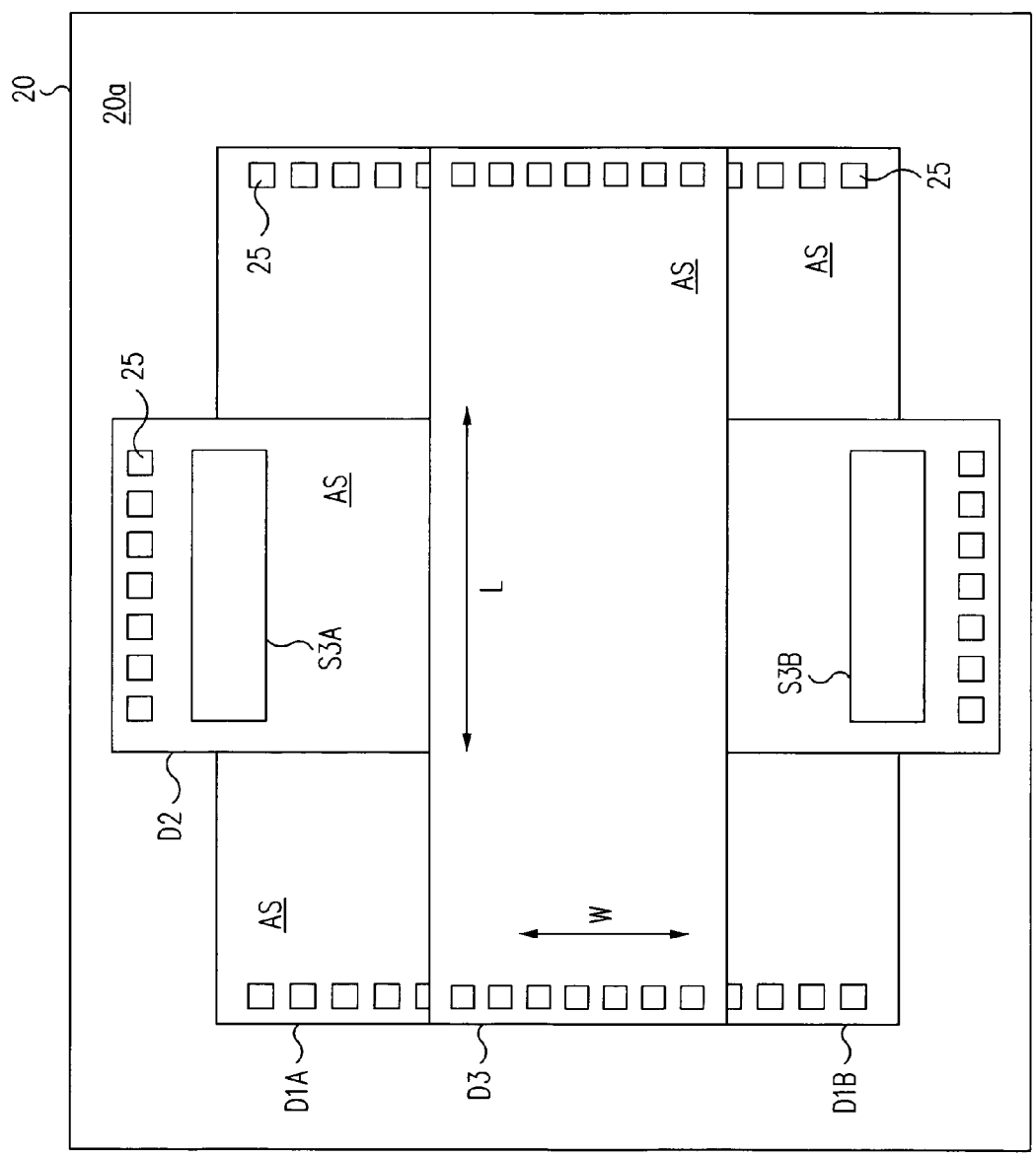

Referring to FIG. 14C, a third level of semiconductor device 10 includes a semiconductor die D3 that is attached to the active surface AS of semiconductor die D2 and the upper surface of supports S2A, S2B. Semiconductor die D3 may be the same size and type (e.g., memory device) as the individual semiconductor dies D1A, D1B, and D2.

Semiconductor die D3 has an oblong rectangular active surface AS, with two rows of bond pads 25 each adjacent to one of the short sides of semiconductor die D3. The rows of bond pads 25 of semiconductor die D3 are parallel to the rows of bond pads 25 of semiconductor dies D1A, D1B, and perpendicular to the rows of bond pads 25 of semiconductor die D2. A long direction centerline of semiconductor die D3 is centered over and parallel to scribe line 35 between semiconductor dies D1A, D1B. The two short side ends and bond pads 25 of semiconductor die D3 overhang the bond pads 25 of semiconductor dies D1A, D1B, but are spaced over the bond wires 26 attached to the bond pads 25 of semiconductor dies D1A, D1B by semiconductor die D2 and supports S2A, S2B.

Two supports S3A, S3B also are attached to the active surface AS of semiconductor die D2. One of the supports S3A, S3B is adjacent to each of the long sides of semiconductor die D3. Semiconductor die D3 and supports S3A, S3B are sized so that they together fit entirely within the bond pads 25 of the underlying semiconductor die D2. None of the bond pads 25 of semiconductor die D2 are overlaid by semiconductor die D3.

Figure 14D:
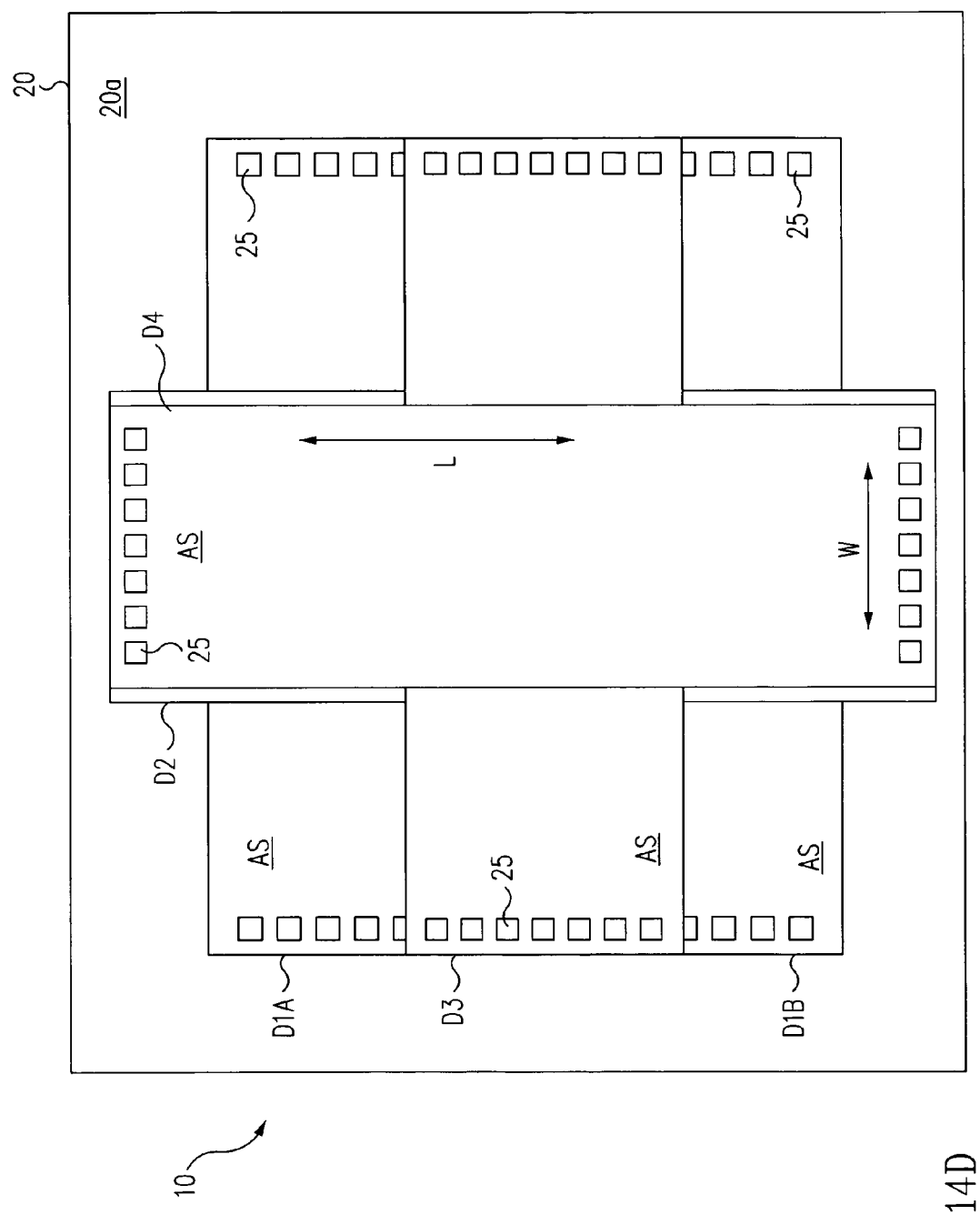

Referring to FIG. 14D, a fourth layer of semiconductor package 10 includes a semiconductor die D4 that is attached by an adhesive layer 28 to the coplanar active surface AS of semiconductor die D3 and upper surfaces of supports S3A, S3B. Semiconductor die D4 has a row of bond pads 25 adjacent to each of the two parallel short edges of its active surface AS. The rows of bond pads 25 of semiconductor die D4 are parallel to the rows of bond pads of semiconductor die D2 and perpendicular to the rows of bond pads 25 of semiconductor dies D1A, D1B, and D3.

Semiconductor die D4 is sized and disposed so that it fits entirely within the rows of bond pads 25 of semiconductor die D3, and optionally fits entirely within the rows of bond pads 25 of semiconductor dies D1A, D1B. In this embodiment, semiconductor die D4 is shown as being smaller in its width W than the width W of semiconductor die D2, but semiconductor die D4 may be wider, narrower, or the same width as semiconductor die D2, provided that supports S3A, S3B provide sufficient support to semiconductor die D4, and provided that semiconductor die D4 remains entirely within the bond pads 25 of semiconductor die D3.

Figure 15A:
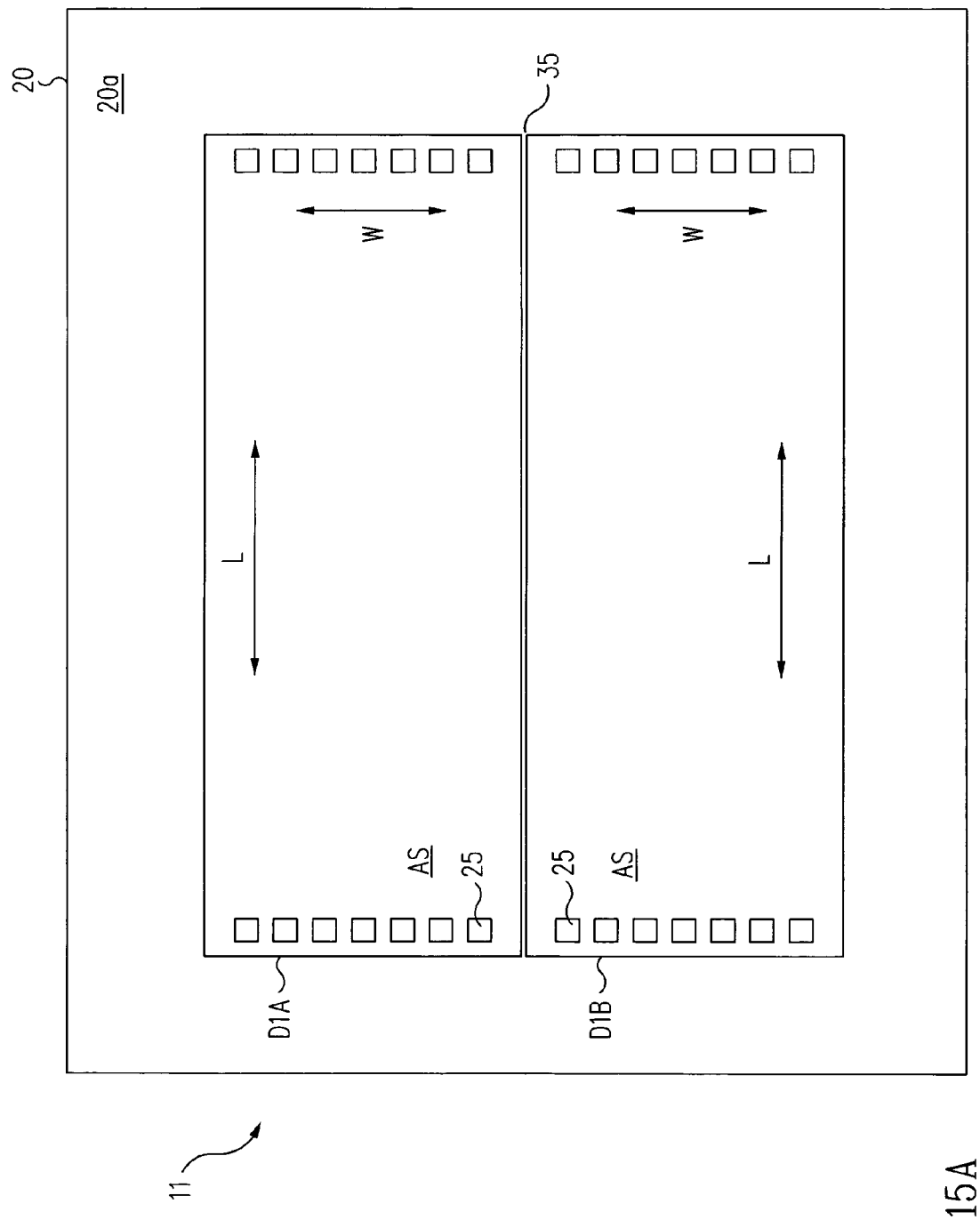
FIGS. 15A–15D are simplified top plan views of levels in an $11^{th}$ embodiment of a semiconductor package.

FIGS. 15A–15D are simplified top plan views of levels of a tenth embodiment of a semiconductor package 11 in accordance with the present invention. Referring to FIG. 15A, a first level of semiconductor package 11 is identical to the first level of semiconductor package 10 of FIG. 14A, in that semiconductor package 11 likewise includes a laterally-joined pair of typically identical semiconductor dies D1A, D1B that are electrically isolated from each other, except via their common semiconductor base. The semiconductor dies D1A, D1B each identically include two rows of bond pads 25, with one row being adjacent to each of the two short edges of the active surface AS of the respective semiconductor dies D1A, D1B. Each row of the bond pads 25 of semiconductor die D1A is in a straight line with a respective one of the rows of bond pads 25 of semiconductor die D1B.

Figure 15B:
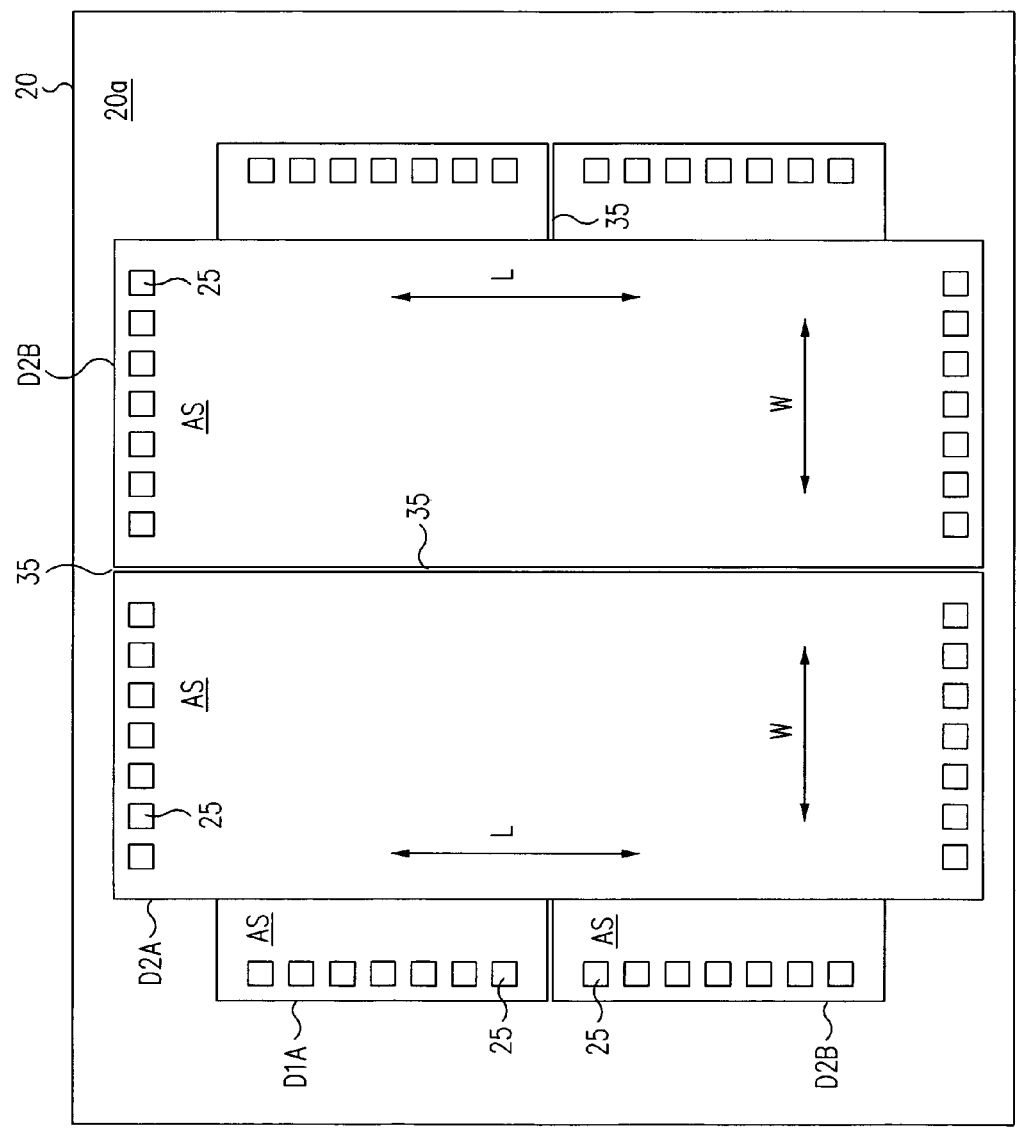

Referring to FIG. 15B, a second level of semiconductor package 11 likewise includes a pair of laterally-joined, typically identical semiconductor dies D2A, D2B that are electrically isolated from each other, except through their common semiconductor base. The semiconductor dies D2A, D2B each identically include two rows of bond pads 25, with one row being adjacent to each of the two short edges of the active surface AS of the respective semiconductor dies D2A, D2B. Each row of the bond pads 25 of semiconductor die D2A is in a straight line with a respective one of the rows of bond pads 25 of semiconductor die D2B. The semiconductor dies D2A, D2B may be the same size and type as semiconductor dies D1A, D1B, e.g., memory devices, or may be a different size and type.

The joined semiconductor dies D2A, D2B of FIG. 15B are attached to the active surfaces of semiconductor dies D1A, D1B by an adhesive layer 28. The semiconductor dies D2A, D2B have their rows of bond pads 25 oriented perpendicularly to the rows of bond pads 25 of semiconductor dies D1A, D1B.

Semiconductor dies D2A, D2B have an aspect ratio such that the joined pair of semiconductor dies D2A, D2B fits entirely within the aligned rows of bond pads 25 of semiconductor dies D1A, D1B. Where, for instance, semiconductor dies D1A, D1B and D2A, D2B are the same size and type, then their respective aspect ratios (i.e., length L to width W) must be greater than 2:1 to have the joined pair of semiconductor dies D2A, D2B fit entirely within the aligned rows of bond pads 25 of semiconductor dies D1A, D1B and to allow for manufacturing tolerances.

Figure 15C:
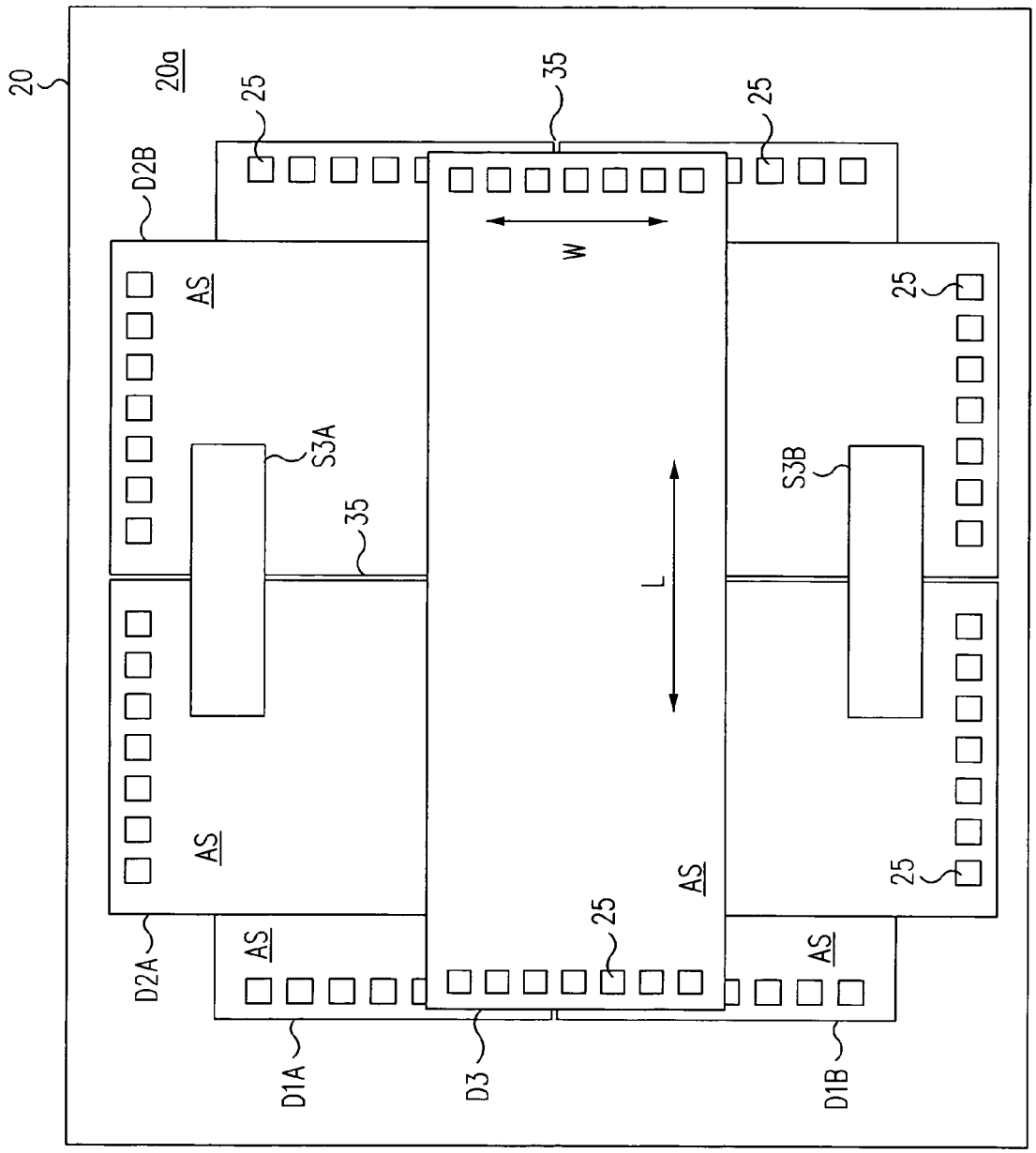

Referring to FIG. 15C, a third level of semiconductor package 11 includes a semiconductor die D3 that is attached to the active surface AS of semiconductor dies D2A, D2B. Semiconductor die D3 may be the same size and type (e.g., memory device) as the individual semiconductor dies D1A, D1B, and D2A, D2B.

Semiconductor die D3 has an oblong rectangular active surface AS, with two rows of bond pads 25 each adjacent to one of the short sides of semiconductor die D3. A long direction centerline of semiconductor die D3 is centered over and parallel to scribe line 35 between semiconductor dies D1A, D1B. The two short side ends and bond pads 25 of semiconductor die D3 overhang the bond pads 25 of semiconductor dies D1A, D1B, but are spaced over the bond pads 25 and bond wires 26 of semiconductor dies D1A, D1B by semiconductor dies D2A, D2B. The rows of bond pads 25 of semiconductor die D3 are parallel to the rows of bond pads of semiconductor dies D1A, D1B, but are perpendicular to the rows of bond pads 25 of semiconductor dies D2A, D2B.

Two supports S3A, S3B also are attached to the active surface AS of semiconductor dies D2A, D2B. One of the supports S3A, S3B is adjacent to each of the long sides of semiconductor die D3. Semiconductor die D3 and supports S3A, S3B are sized so as to together fit entirely within the rows of bond pads 25 of the underlying semiconductor dies D2A, D2B. The supports S3A, S3B are rectangular prisms having a thickness (i.e., vertical height) equal to a thickness of semiconductor die D3. The supports S3A, S3B overlie the scribe line 35 between semiconductor dies D2A, D2B, with the long sides of supports S3A, S3B being perpendicular to the scribe line 35.

Figure 15D:
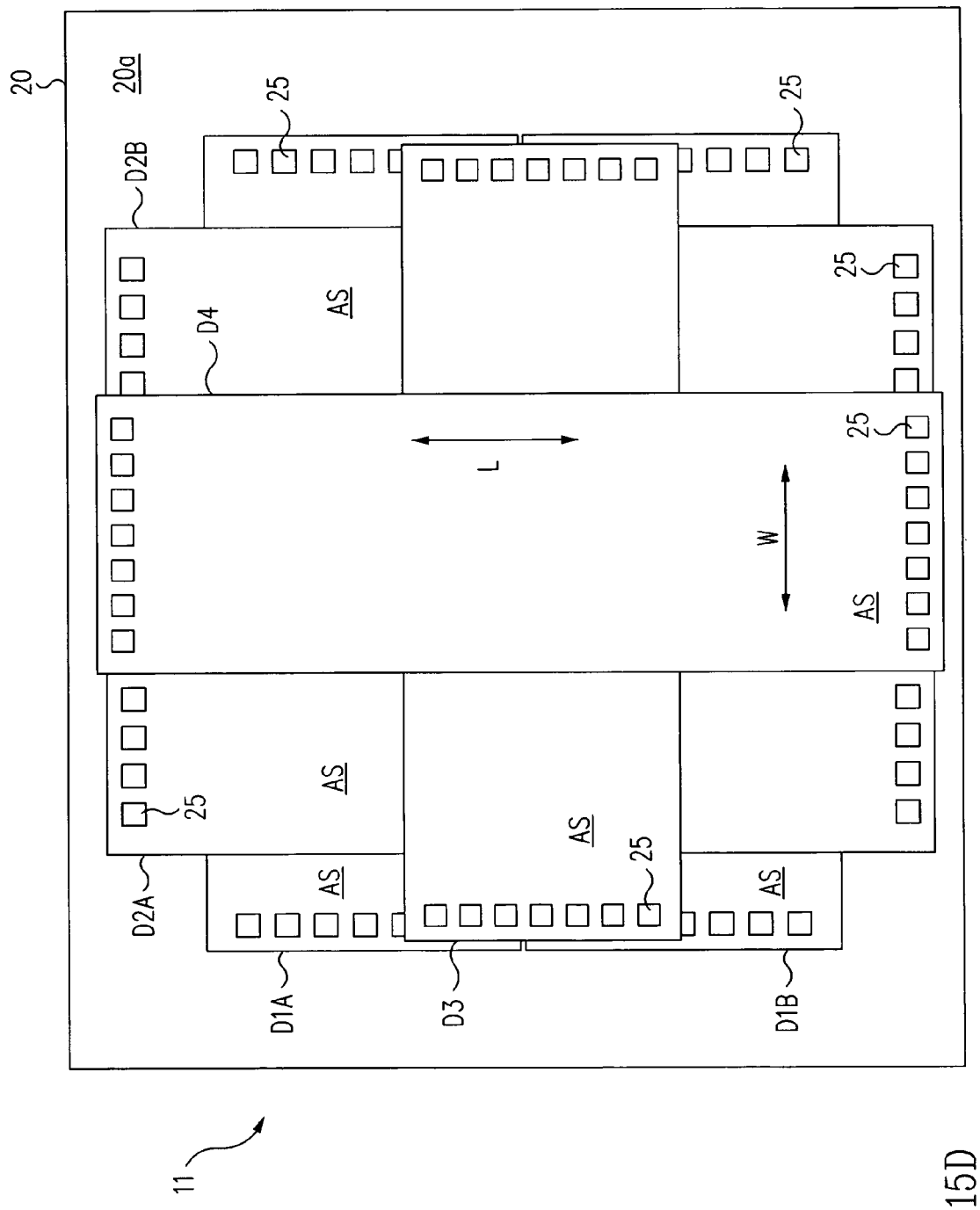

Referring to FIG. 15D, a fourth layer of semiconductor package 11 includes a semiconductor die D4 that is attached by an adhesive layer 28 to the coplanar active surface AS of semiconductor die D3 and upper surfaces of supports S3A, S3B. Semiconductor die D4 has a row of bond pads 25 adjacent to each of the two parallel short edges of its active surface AS. The rows of bond pads 25 of semiconductor die D4 are parallel to the rows of bond pads of semiconductor dies D2A, D2B and perpendicular to the rows of bond pads 25 of semiconductor dies D1A, D1B, and D3.

The short side ends and bond pads 25 of semiconductor die D4 overlie the bond pads 25 of semiconductor dies D2A, D2B, but are spaced from the bond pads 25 and the bond wires 26 coupled thereto by semiconductor die D3 and supports S3A, S3B. Semiconductor die D4 may be the same size and type as semiconductor dies D1A, D1B, D2A, D2B, and D3.

Because semiconductor dies D3 and D4 overlie the bond pads 25 of semiconductor dies D1A, D1B and D2A, D2B, respectively, the bond wires 26 typically will be coupled to the bond pads 25 of semiconductor dies D1A, D1B, D2A, D2B in a single operation prior to the placement of semiconductor die D3 on the active surface AS of semiconductor dies D2A, D2B. Bond wires 26 typically will be coupled to semiconductor dies D3 and D4 in a second wire bond operation after the stacking of semiconductor die D4. If however, semiconductor dies D3 and D4 did not overhang the bond pads 25 of semiconductor dies D1A, D1B and D2A, D2B, respectively, the bond wires 26 could be coupled to the bond pads 25 for all for the die in a single wire bond operation.

FIGS. 16A–16D are simplified top plan views of levels of an embodiment of a semiconductor package 12 in accordance with the present invention.

Figure 16A:
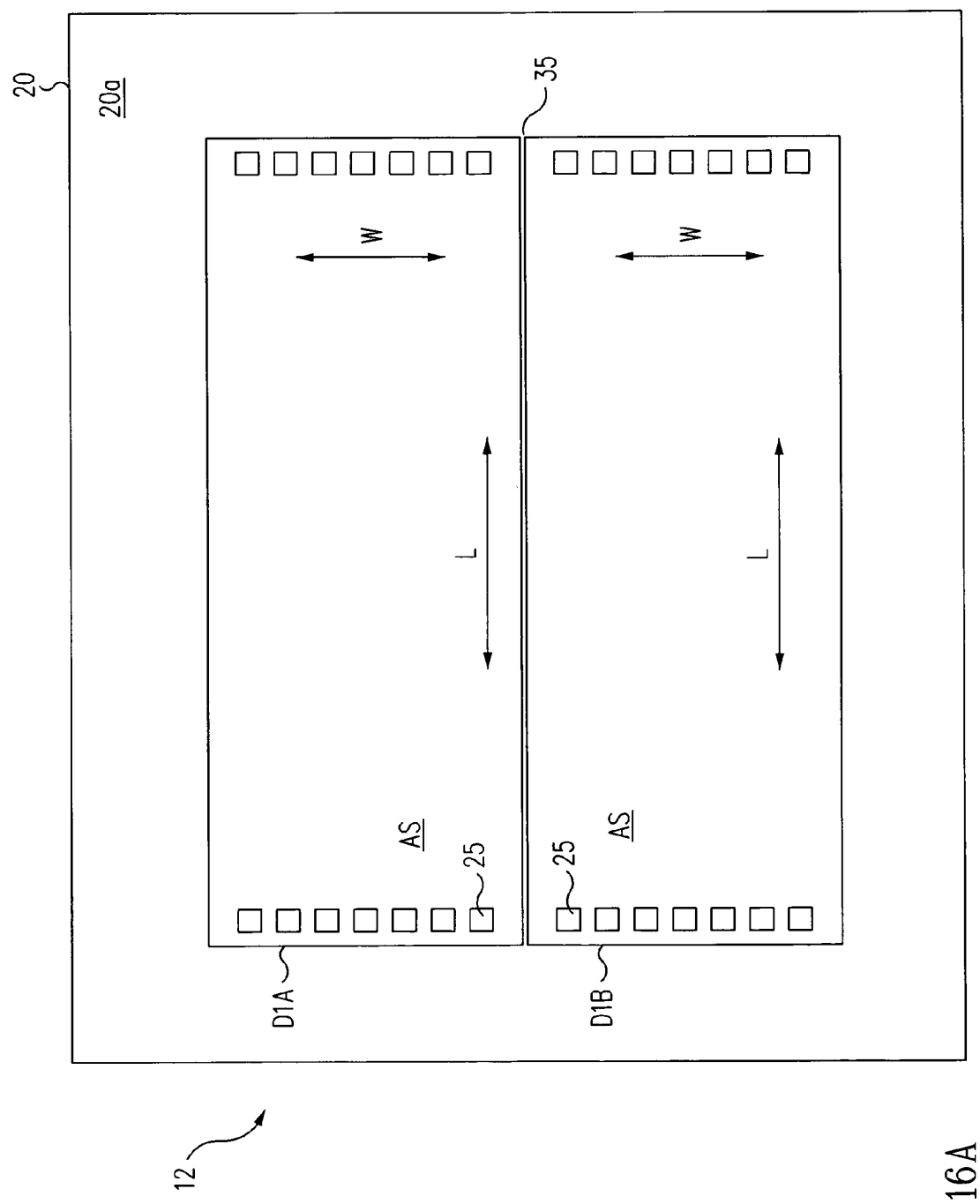
FIGS. 16A–16D are simplified top plan views of levels in a $12^{th}$ embodiment of a semiconductor package.
Figure 16B:
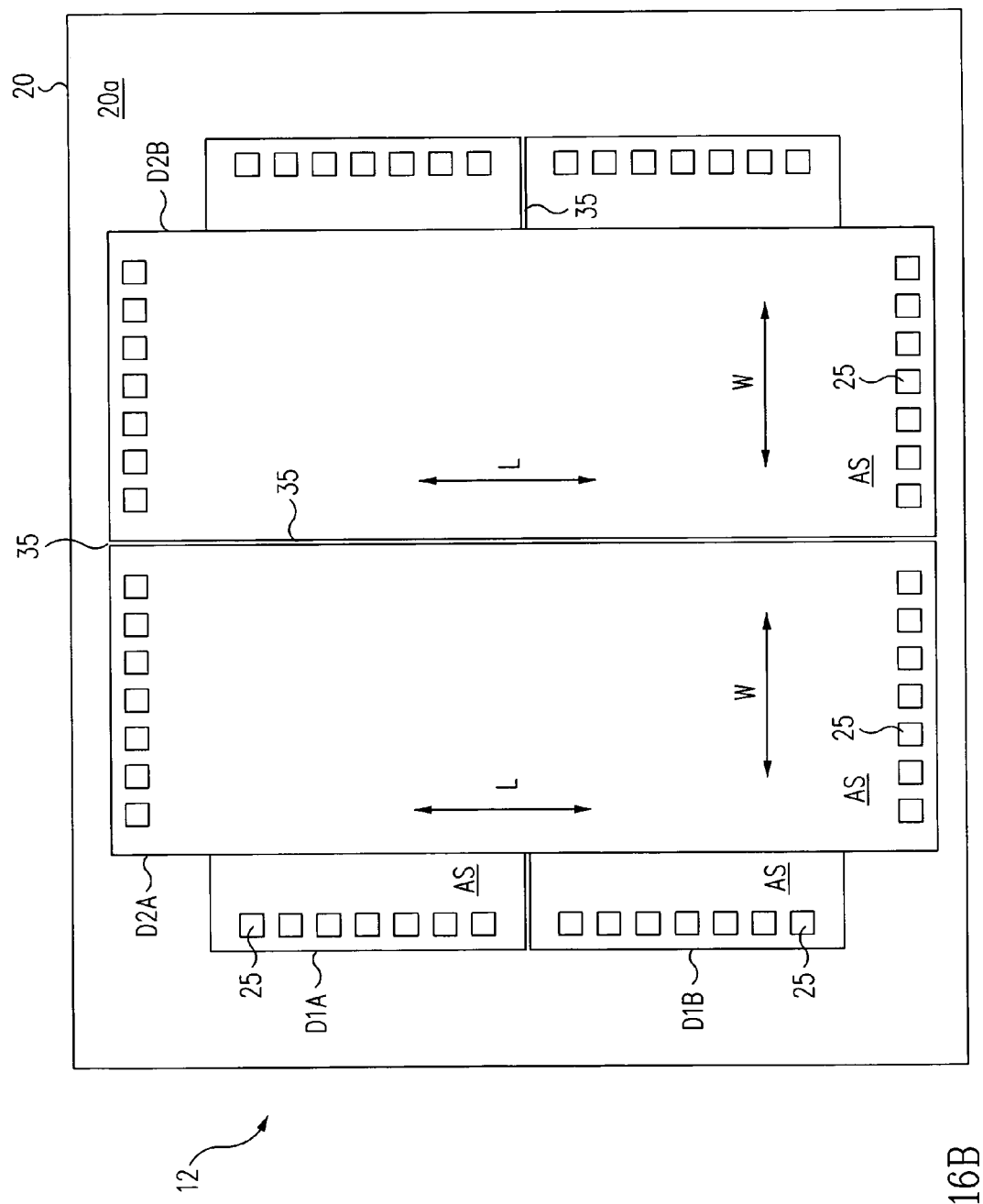

Referring to FIGS. 16A and 16B, first and second levels of semiconductor package 12 are identical to the first and second levels of semiconductor package 11 of FIGS. 15A and 15B, and hence the discussion of FIGS. 15A and 15B provide above applies to FIGS. 16A and 16B.

Figure 16C:
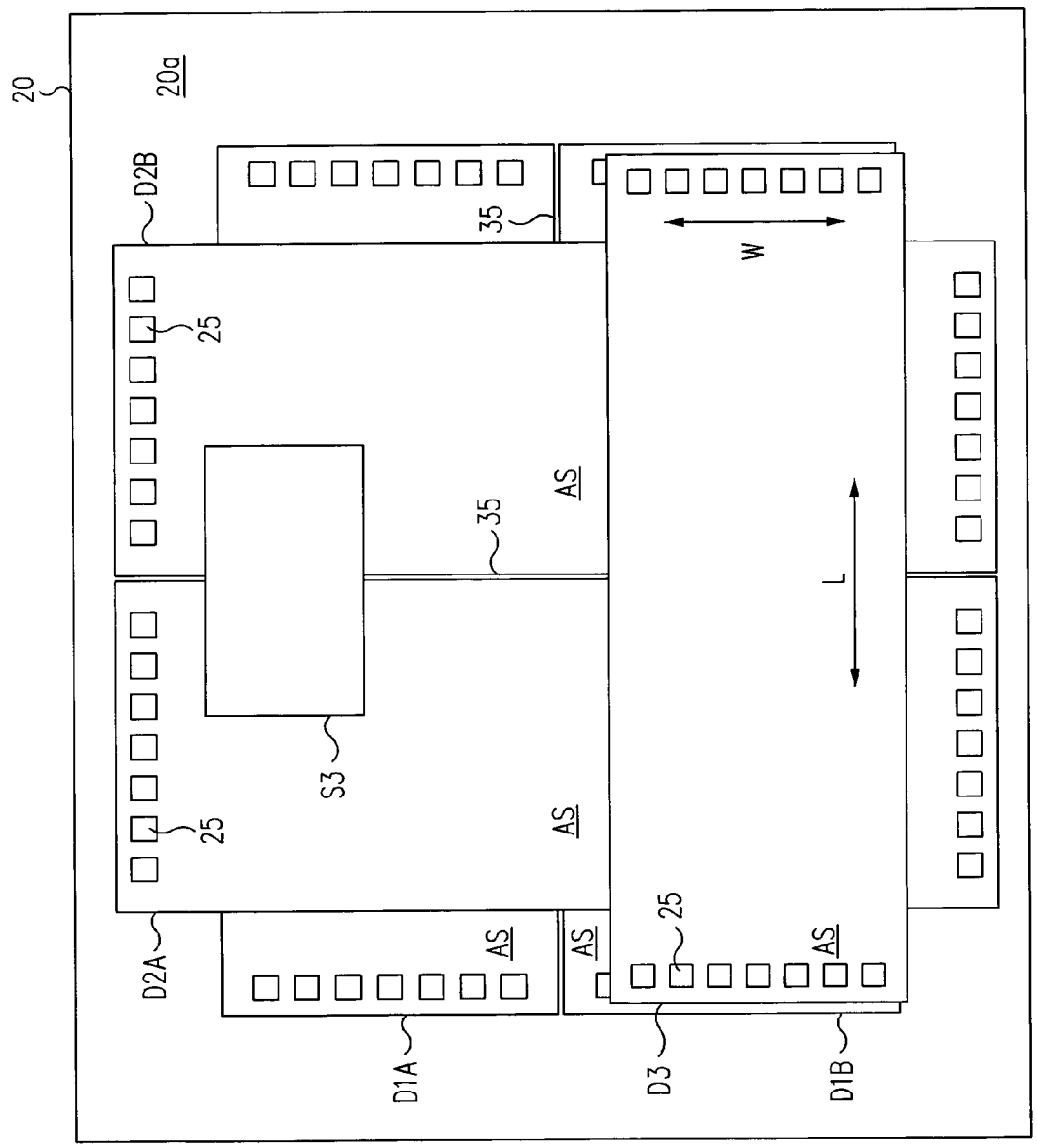

Referring to FIG. 16C, a third level of semiconductor package 12 includes a semiconductor die D3 and a single spacer S3 that are attached to the active surface of semiconductor dies D2A, D2B by an adhesive layer 28. Semiconductor die D3 includes two rows of bond pads 25 on an oblong rectangular active surface AS, with one row adjacent to each of the parallel short edges of the active surface AS. The rows of bond pads 25 of semiconductor die D3 are parallel to the rows of bond pads 25 of semiconductor dies D1A, D1B, but perpendicular to the rows of bond pads 25 of semiconductor dies D2A, D2B. Support S3 also has an oblong rectangular upper surface, and is disposed adjacent to one of the long sides of semiconductor die D3. Support S3 has a thickness equal to the thickness of semiconductor die D3, so that the active surface of semiconductor die D3 and the upper surface of support S3 are coplanar and parallel to upper surface 20a of substrate 20. The support S3 is sized to support the overlying semiconductor die D4, as shown in FIG. 16D.

Both semiconductor die D3 and support S3 of FIG. 16C are disposed on the active surface AS of semiconductor dies D2A, D2B so as to be laterally offset from the scribe line 35 between semiconductor dies D1A, D1B. Semiconductor die D3 is disposed over semiconductor die D1B, and is laterally offset from (i.e., does not overlie) semiconductor die D1A. Hence, the two short ends and bond pads 25 of semiconductor die D3 overlie the bond pads 25 of semiconductor die D1B, but do not overlie the bond pads 25 of semiconductor die D1A. Support S3 is disposed over semiconductor die D1A, and is laterally offset from semiconductor die D1B. The long sides of semiconductor die D3 and support S3 are parallel to the scribe line 35 between semiconductor dies D1A, D1B. In addition, a short-direction centerline of semiconductor die D3 and support S3 overlies and is parallel to the scribe line 35 between semiconductor dies D2A, D2B. That is, semiconductor die D3 and support S3 are bisected by the scribe line 35 between semiconductor dies D2A, D2B.

Figure 16D:
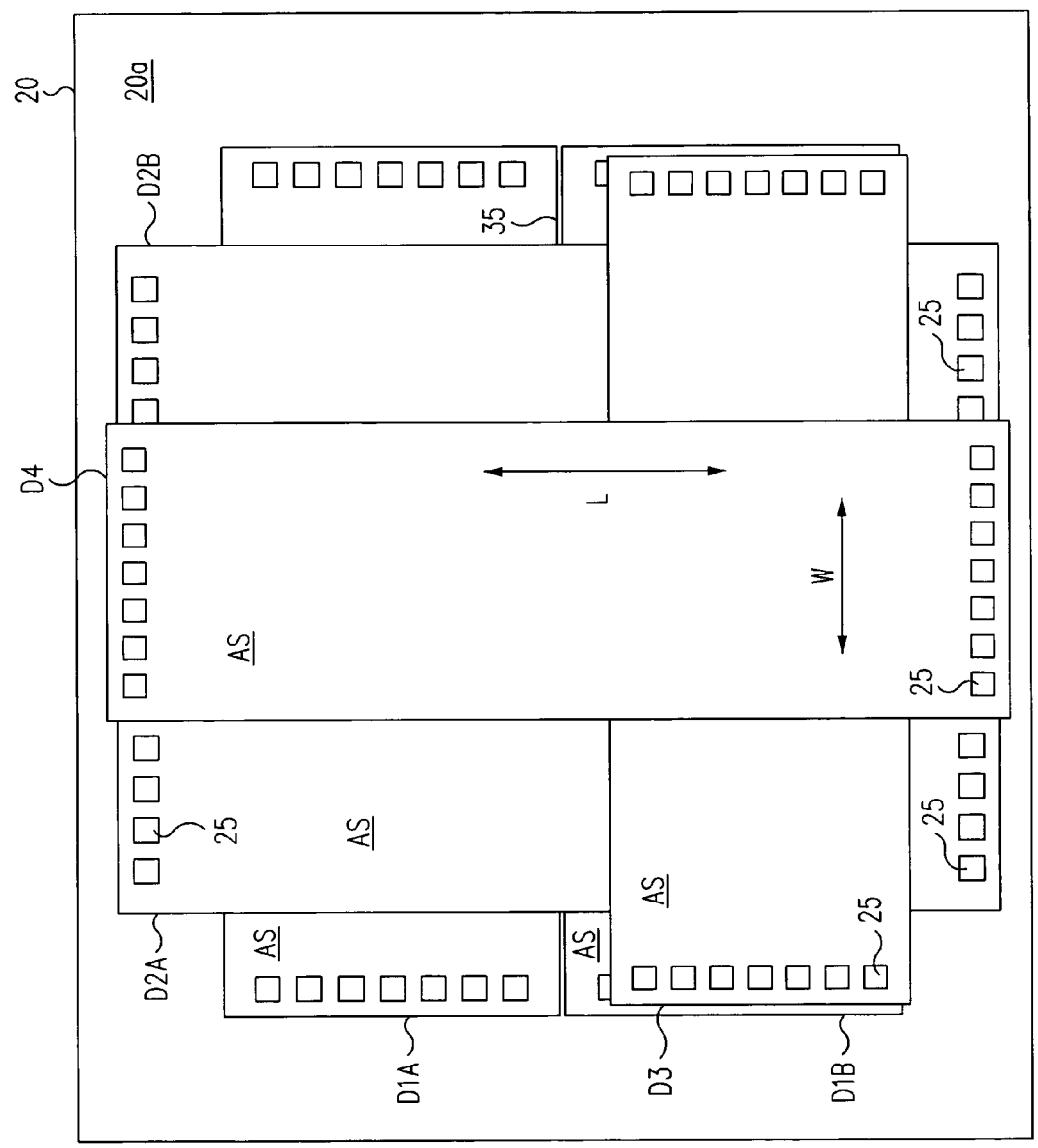

Referring to FIG. 16D, semiconductor die D4 is attached to the coplanar active surface AS of semiconductor die D3 and upper surface of support S3 by an adhesive layer 28 that fully covers the inactive surface BS of semiconductor die D4. Semiconductor die D4 has an oblong rectangular active surface AS with a row a bond pads 25 adjacent to each of the two short sides of active surface AS. The rows of bond pads 25 of semiconductor die D4 are parallel to the rows of bond pads of semiconductor dies D2A, D2B, and perpendicular to the rows of bond pads 25 of semiconductor dies D1A, D1B, and D3.

Semiconductor die D4 has an aspect ratio such that semiconductor die D4 fits entirely within the two rows of bond pads 25 on the active surface of semiconductor die D3. In other words, semiconductor die D4 does not overlap the bond pads 25 of semiconductor die D3. Semiconductor die D4 does overlie the bond pads 25 of semiconductor dies D2A, D2B, but is spaced from those bond pads 25 (and the bond wires 26 coupled thereto) by semiconductor die D3 and support S3. A long-direction centerline of semiconductor die D4 is centered over, and parallel to, the scribe line 35 between semiconductor dies D2A, D2B (i.e., the scribe line 35 bisects semiconductor die D4).

Semiconductor die D4 may be the same size and type as semiconductor dies D1A, D1B, D2A, D2B, and D3. During assembly, because semiconductor dies D3 and D4 overlie the bond pads 25 of semiconductor dies D1A, D1B and D2A, D2B, respectively, semiconductor dies D1A, D1B, D2A, and D2B typically would be wire bonded in a single operation before the placement of semiconductor die D3 on semiconductor dies D2A, D2B. Semiconductor dies D3 and D4 typically would be wirebonded in a subsequent single operation.

In an alternative embodiment, the sizes of semiconductor dies D3 and D4 of semiconductor packages 11 and 12 could be enlarged, provided that they still fit between the two rows of bond pads of the immediately underlying semiconductor dies D2A, D2B and D3, respectively.

Figure 17:
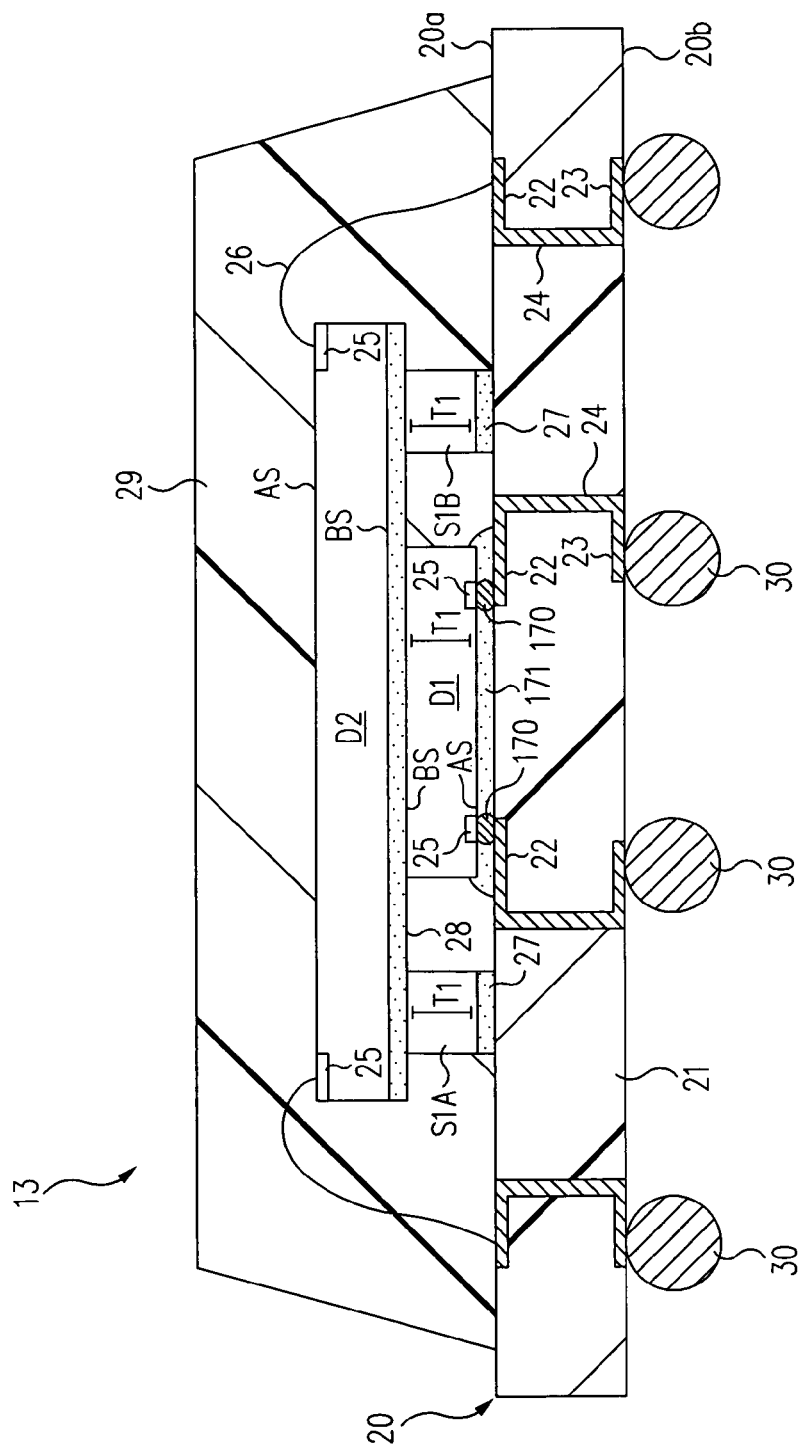
FIG. 17 is a cross-sectional side view of a $13^{th}$ embodiment of a semiconductor package.

FIG. 17 is a cross-sectional side view of an embodiment of a semiconductor package 13 in accordance with the present invention. Semiconductor package 13 is identical to semiconductor package 1 of FIG. 1, except with respect to semiconductor die D1. In particular, semiconductor package D1 of semiconductor package 13 is electrically coupled to the circuit patterns 22 of upper surface 20a of substrate 20 in a flip chip, or C4, style connection. The active surface AS of semiconductor die D1 faces upper surface 20a, and the bond pads 25 each face a corresponding bond finger of the circuit patterns 22. One of a plurality of solder balls 170 (sometimes called "solder bumps") electrically connects each bond pad 25 to the corresponding bond finger of circuit patterns 22. Accordingly, there are no bond wires 26 coupled to semiconductor die D1. An insulative underfill material 171 is disposed between the active surface AS of semiconductor die D1 and the upper surface 20a, and between the adjacent solder balls 170.

The supports S1A, S1B of semiconductor package 13, one of which is adjacent to each of the long sides of semiconductor die D1, just as in semiconductor package 1 of FIG. 3A, are the same thickness $T_1$ as semiconductor die D1. Moreover, the adhesive layers 27 that attach supports S1A, S1B to upper surface 20a have a thickness equal to the thickness of solder balls 170. Accordingly, the inactive surface BS of semiconductor die D1 and the upper surfaces of supports S1A, S1B are coplanar (within a tolerance) and parallel to upper surface 20a. A second layer semiconductor die D2 is attached to the coplanar inactive surface BS of semiconductor die D1 and upper surfaces of supports S1A, S1B by an adhesive layer 28 that fully covers the inactive surface BS of semiconductor die D2. Bond wires 26 electrically couple the bond pads 25 of semiconductor die D2 to the bond fingers of other circuit patterns 22 of upper surface 20a.

The use of a flip-chip-connected first level semiconductor die, as in semiconductor package 13, may be used in place of the wire-bonded first level semiconductor die(s) of semiconductor packages 2–12.

Practitioners will appreciate that, in accordance with the present invention, as exemplified by the foregoing embodiments, successive levels of semiconductor dies and supports may be stacked, provided that each upper level semiconductor die of the stack does not overlie the bond pads 25 of the immediately underlying semiconductor die. In fact, the overlying semiconductor die may be the same size or larger in size than the immediately underlying semiconductor die, provided that the larger upper level semiconductor die does not overlie the bond pads 25 of the immediately underlying semiconductor die. The vertical height of the stacks of three or more same-size or successively larger semiconductor dies is reduced by comparison to the conventional processes mentioned above, because a third semiconductor die overlying the bond pads of a first semiconductor die are adequately spaced from the bond pads and bond wires of the first semiconductor die by a second semiconductor die and one or more supports between the first and third semiconductor dies. The inactive surfaces BS of the semiconductor dies of the stack may be blanket polished or etched to reduce the thickness of the semiconductor dies, thereby yielding further reductions in the package height.

Figure 18A:
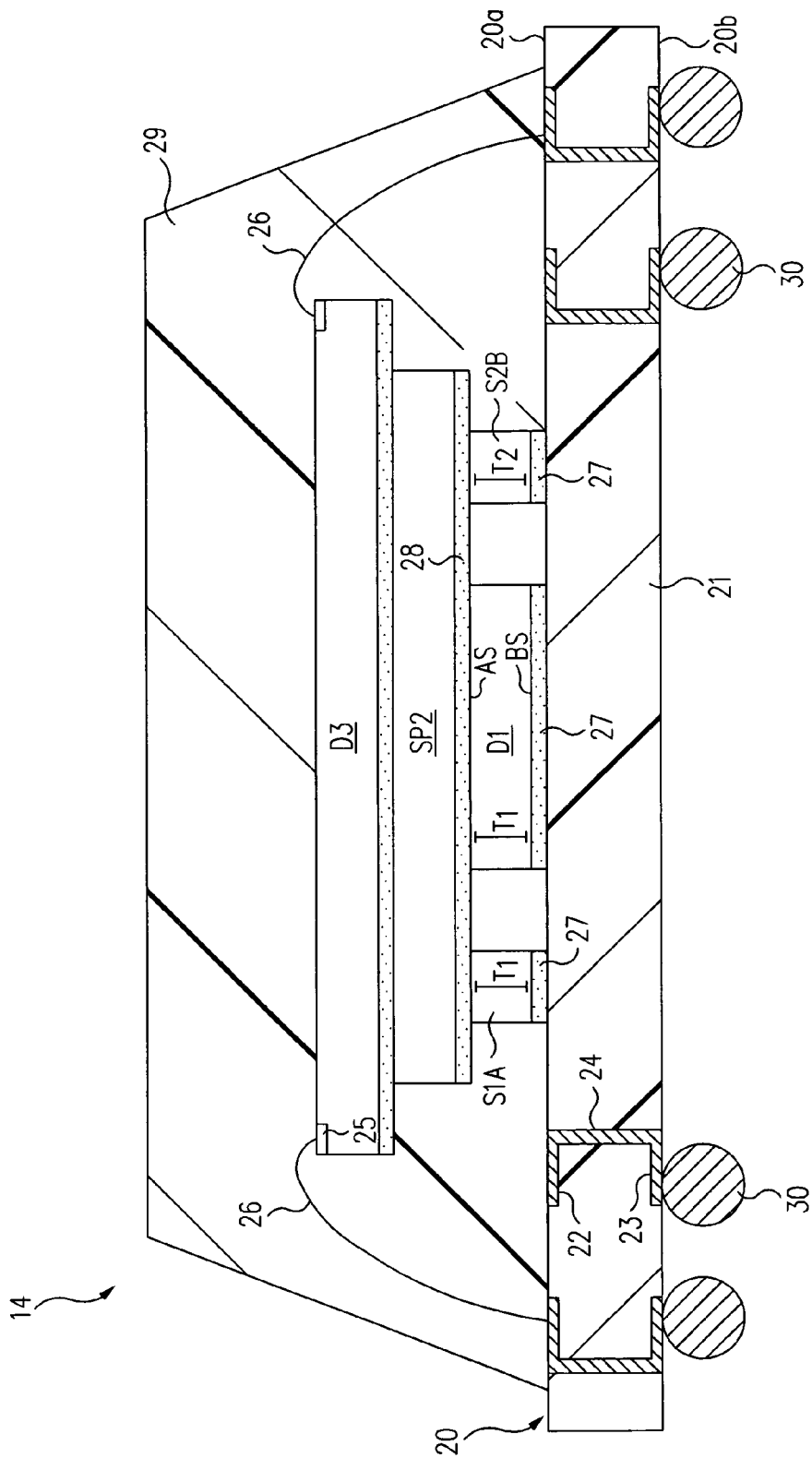
FIGS. 18A and 18B are cross-sectional side views of a $14^{th}$ embodiment of a semiconductor package in accordance with the present invention.
Figure 18B:
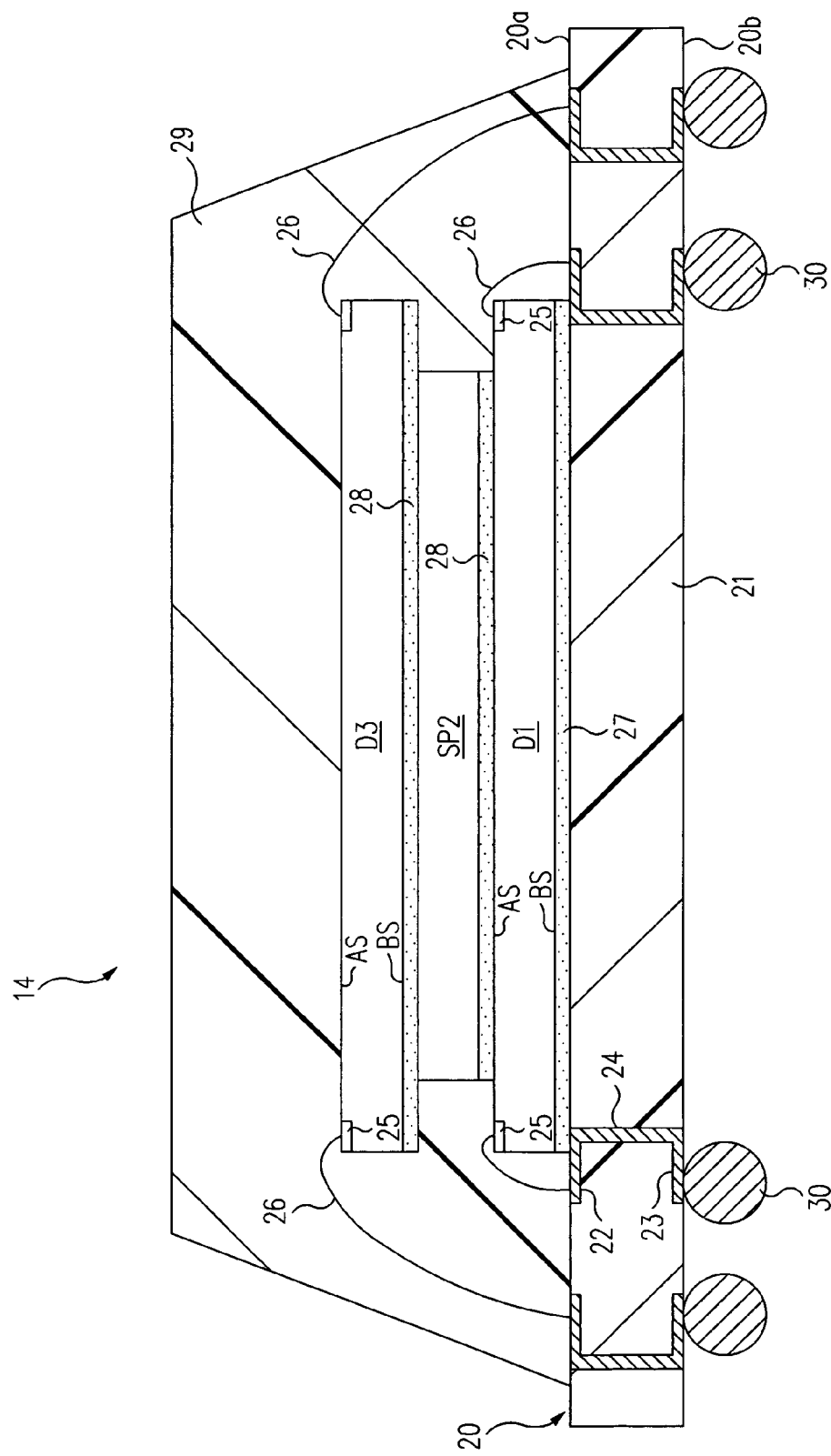
Figure 19A:
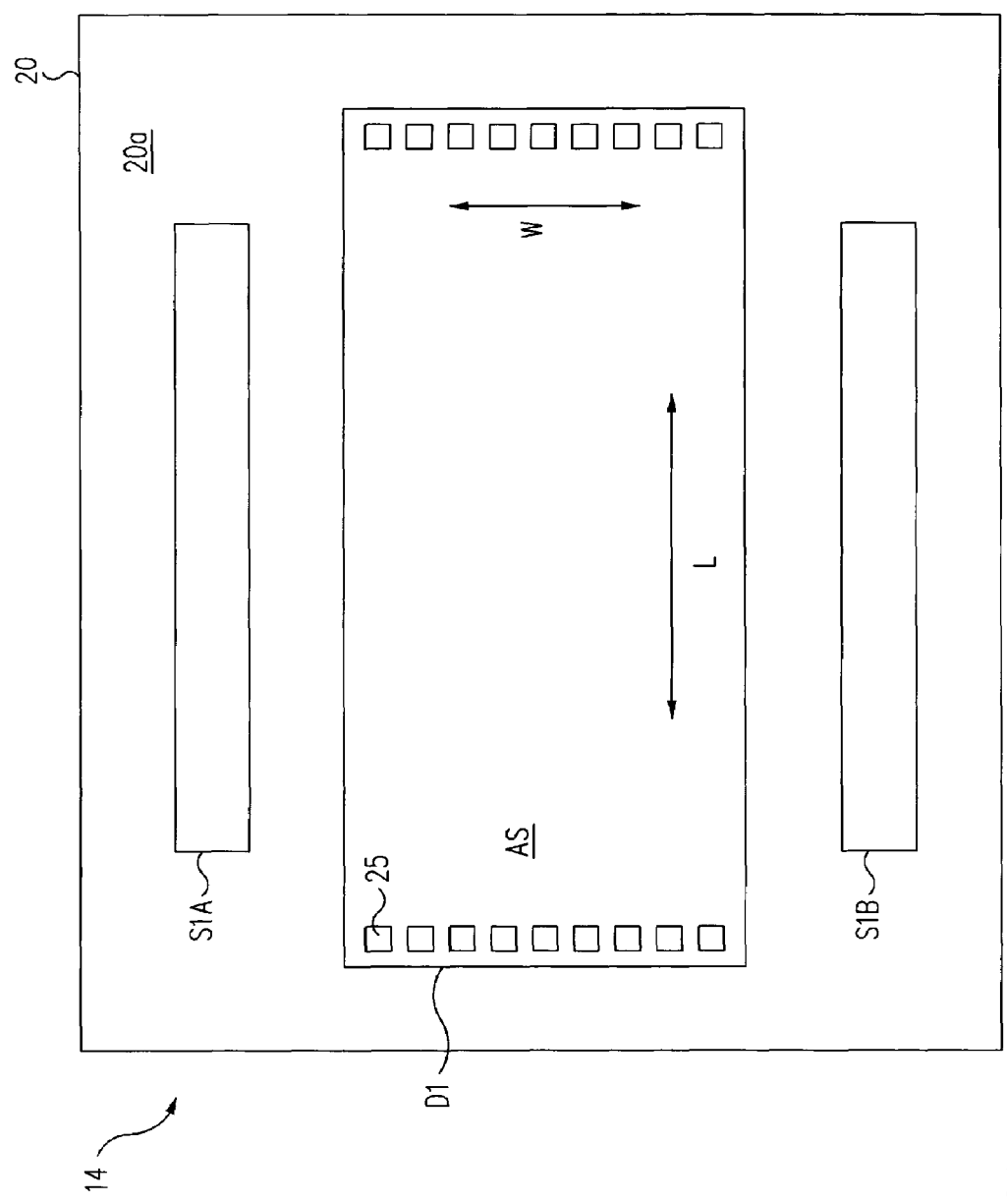
FIGS. 19A–19C are simplified top plan views of levels of the semiconductor package of FIGS. 18A and 18B.
Figure 19B:
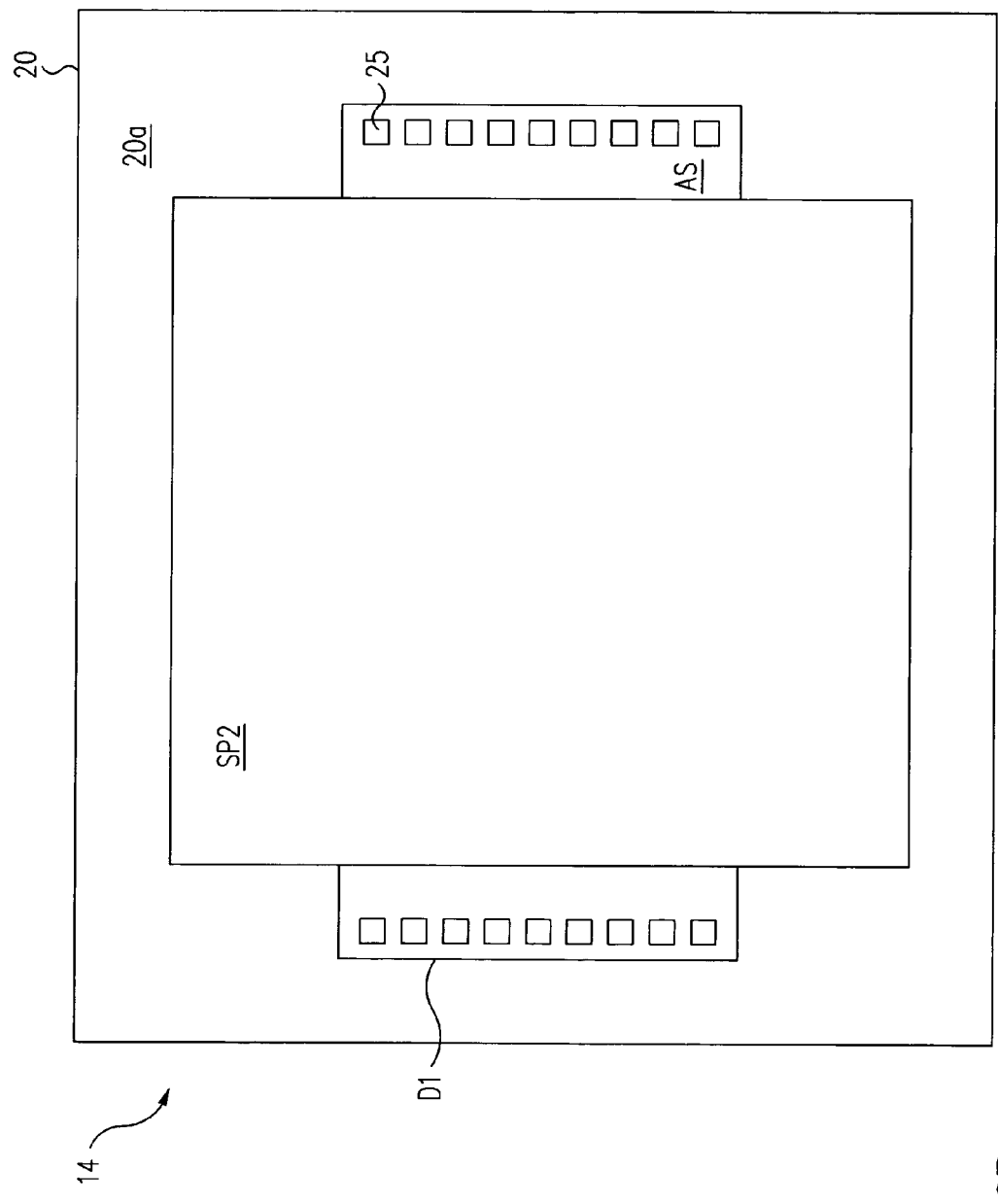
Figure 19C:
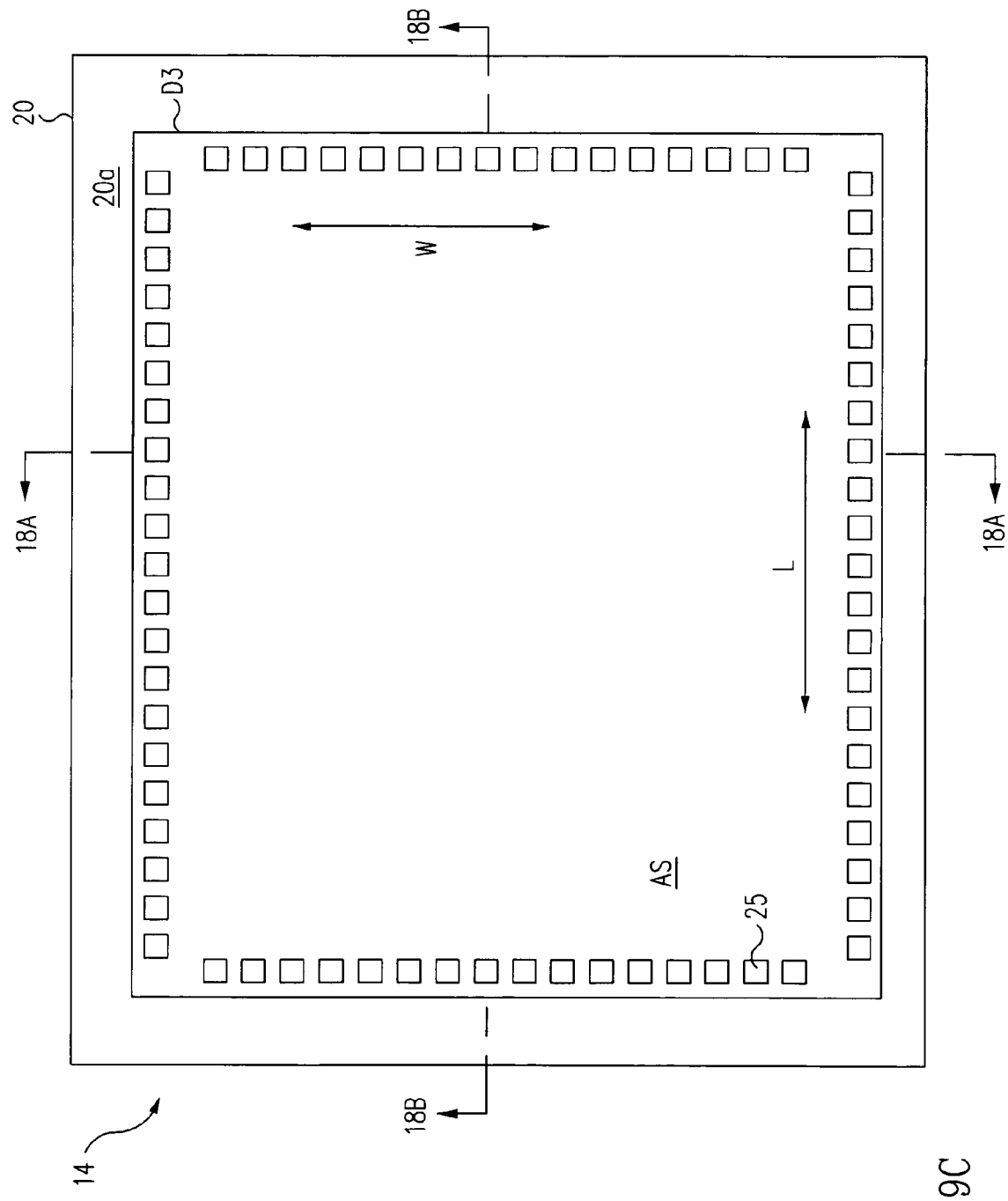

FIGS. 18A and 18B are cross-sectional side views of an embodiment of a semiconductor package 14 in accordance with the present invention. FIGS. 19A–19C are simplified top plan views of levels of semiconductor package 14. FIGS. 18A and 18B are taken 90 degrees apart, along lines 18A—18A and 18B—18B, respectively, of FIG. 19C.

Referring to FIGS. 18A, 18B, and 19A, semiconductor package 14 includes a first level with a semiconductor die D1 disposed laterally between two elongated supports S1A, S1B that are parallel to the long sides of semiconductor die D1, just as in package 4 of FIG. 8A. The semiconductor die D1 and supports S1A, S1B are attached to upper surface 20a of substrate 20 by a uniformly-thick, electrically-insulative adhesive layer 27.

Referring to FIGS. 18A, 18B, and 19B, a second level of semiconductor package 14 includes a spacer, denoted as "SP2", that is coupled to the coplanar active surface AS of semiconductor die D1 and upper surfaces of supports S1A, S1B by an electrically insulative adhesive layer 28. The spacer SP2 may be formed of, for example, a rectangular prism of a semiconductor material (e.g., silicon) or of a dielectric material (e.g., an elastomeric film adhesive). For this embodiment, the material may be assumed to be silicon. The adhesive layer 28 covers the entire lower surface of the spacer SP2.

As mentioned, spacer SP2 is a rectangular prism, e.g., a square prism. The upper and lower surfaces of spacer SP2 have an area such that spacer SP2 fits entirely within the two rows of bond pads 25 of semiconductor die D1, so that no bond pads 25 of semiconductor die D1 are overlapped by spacer SP2. On the other hand, spacer SP2 overhangs the two parallel long sides of semiconductor die D1, as well as the long sides of supports S1A, S1B. Supports S1A, S1B are sized and placed so as to provide adequate support for spacer SP2.

Referring to FIG. 19C, a third level of semiconductor package 14 includes a semiconductor die D3 whose active surface AS is larger in area than the active surface of semiconductor die D1 and the upper and lower surfaces of spacer SP2. Semiconductor die D3 includes four rows of bond pads 25 on its active surface AS, with one row along each of the four edges of the active surface AS.

A feature of semiconductor package 18 is that the semiconductor die D3 is too large to fit within the bond pads 25 of semiconductor die D1, and hence would interfere with the bond pads 25 and bond wires 26 of semiconductor die D1. Accordingly, spacer SP2 has a thickness (i.e., vertical height) such that spacer SP2 spaces the adhesive layer 28 on the inactive surface BS of semiconductor die D3 vertically away from the bond pads 25 and bond wires 26 of semiconductor die D1. Since adhesive layer 28 is electrically insulative, and typically resilient, its presence over the entire bottom surface of semiconductor die D3 will help to prevent the shorting of, or damage to, the bond wires 26 of semiconductor die D1 should the apex of the bond wires 26 come into contact with adhesive layer 28.

Spacer SP2 is sized to provide adequate support to semiconductor die D3, such as during wirebonding. In various embodiments, spacer SP2 could be located inward of or directly under the bond pads 25 of semiconductor die D3, as long as the above-mentioned adequate support is provided.

A difference between the spacer SP2 of package 14 and the conventional die stacking spacers mentioned above is that spacer SP2 overhangs the two long edges of active surface AS of semiconductor die D1, and is coupled to both the active surface of semiconductor die D1 and the upper surfaces of supports S1A, S1B, whereas the conventional die stacking spacers are entirely within the active surface and bond pads of the underlying semiconductor die. The sizing of spacer SP2 allows spacer SP2 to provide adequate support to semiconductor die D3, while at the same time providing vertical spacing between the bond pads 25 and bond wires 26 of semiconductor die D1 and the overlapping adhesive layer 28 and inactive surface BS of semiconductor die D3. Prior art spacers, as mentioned above, are entirely within the active surface AS and bond pads of the underlying semiconductor die.

Figure 20A:
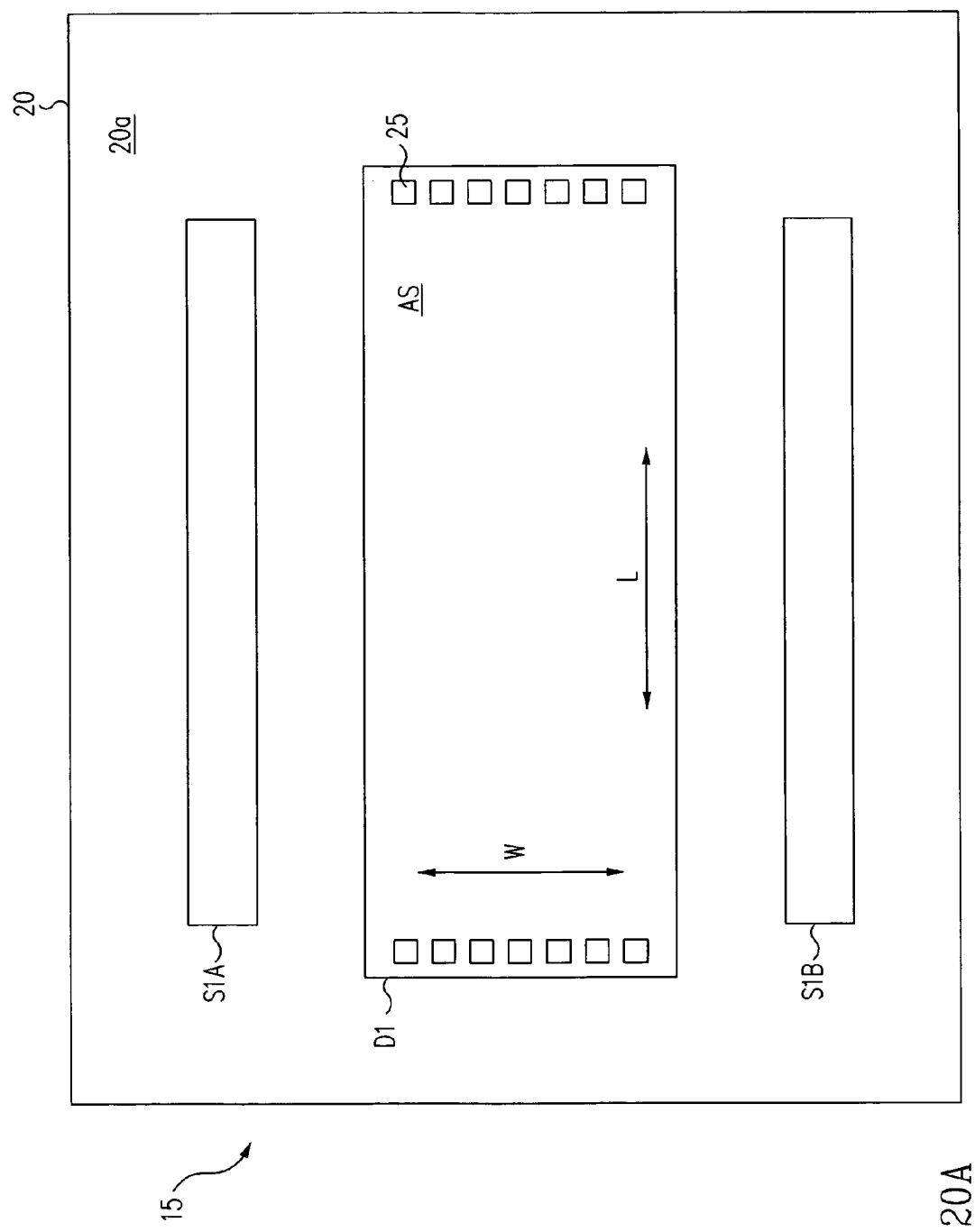
FIGS. 20A–20D are simplified top plan views of levels of a $15^{th}$ embodiment of a semiconductor package in accordance with the present invention
Figure 20B:
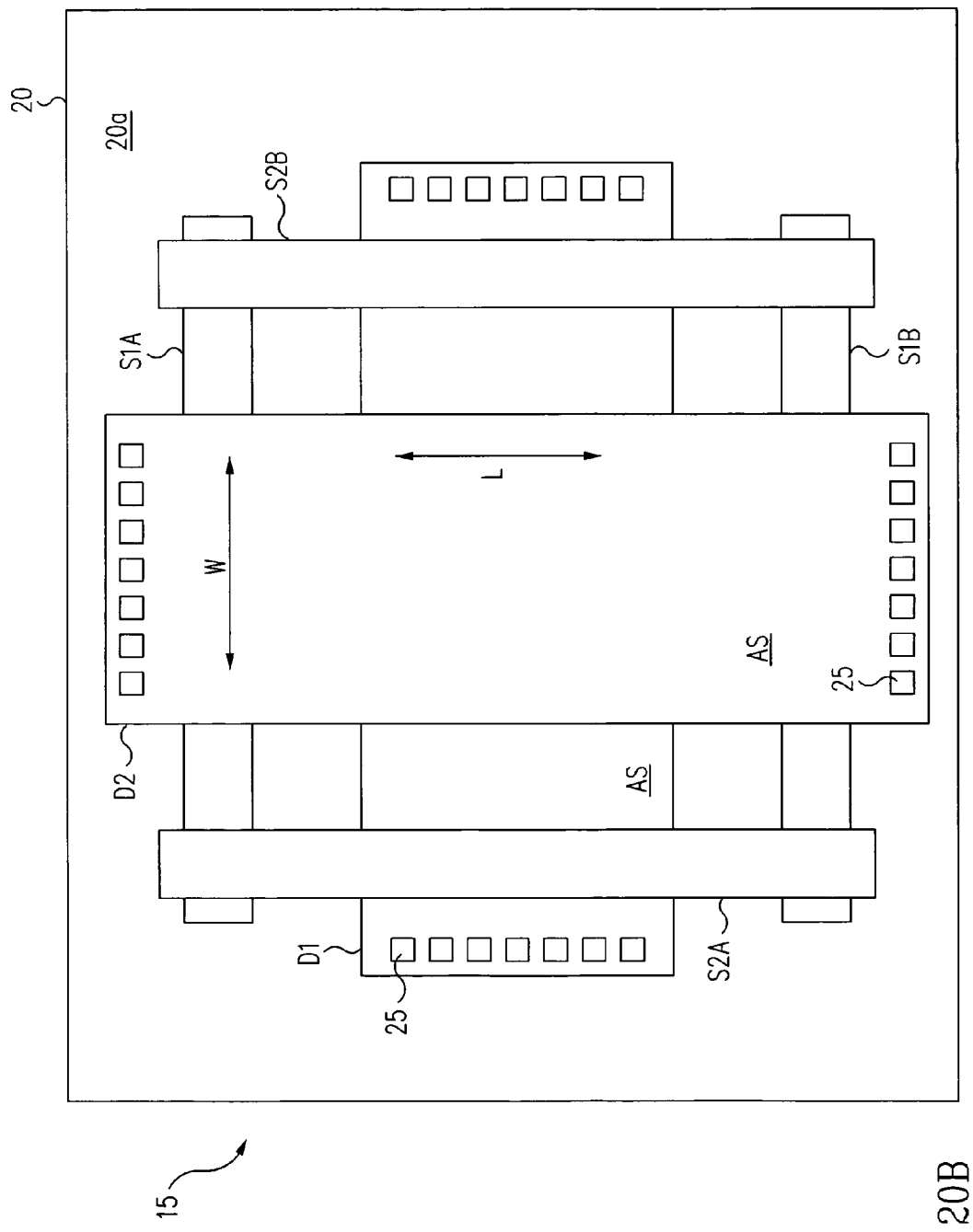
Figure 20C:
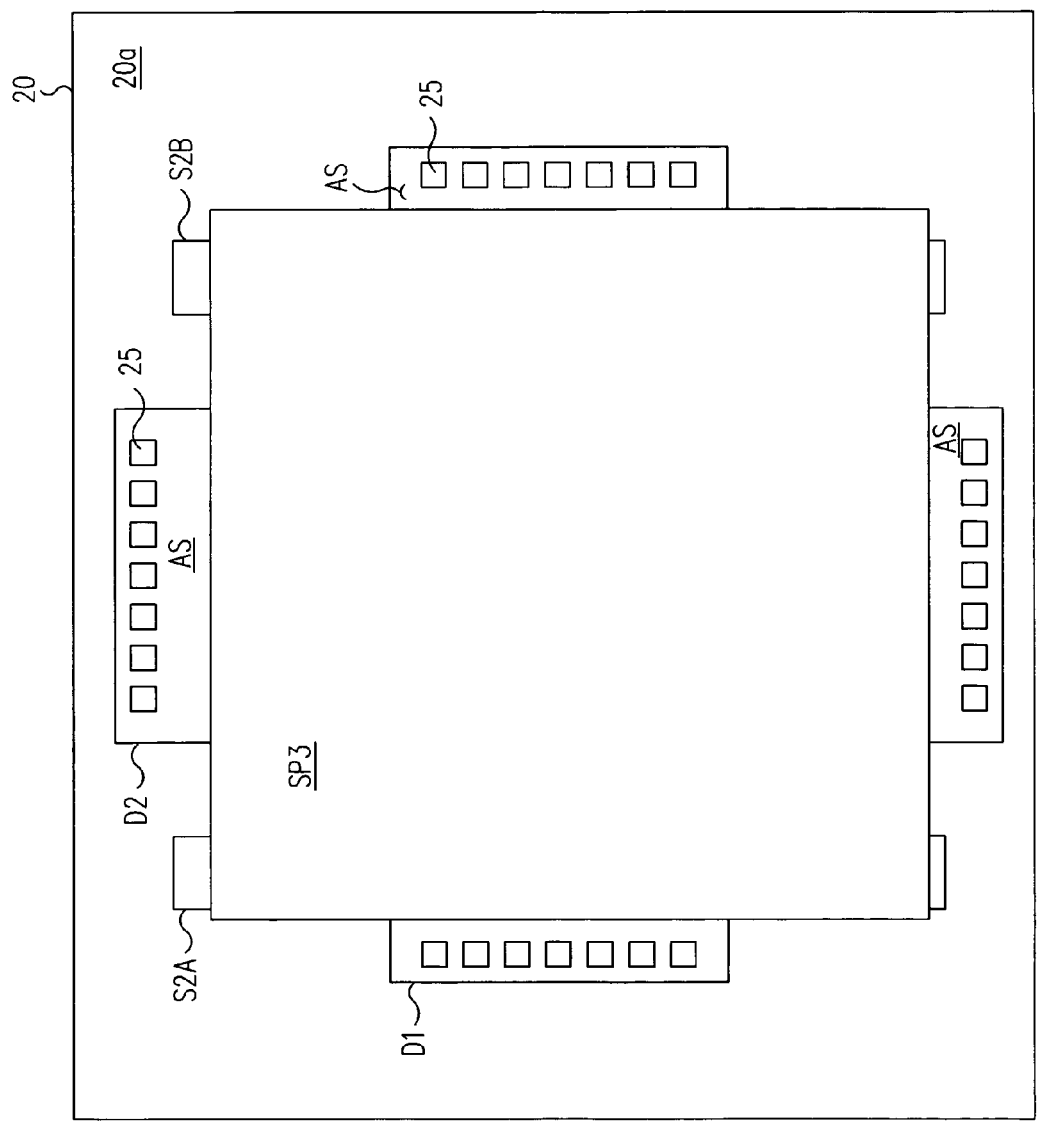

FIGS. 20A–20D are simplified top plan views of levels of an embodiment of a semiconductor package 15 in accordance with the present invention. Referring to FIGS. 20A–20C, the first three levels of semiconductor package 15 are the same as those of semiconductor package 4 of FIGS. 8A and 8B, except that semiconductor die D3 of semiconductor package 4 is omitted. Supports S1A, S1B, S2A, and S2B are approximately the same size, and are sized to provide adequate support to a third-level spacer SP3, as is shown in FIG. 20C.

Referring to FIG. 20C, spacer SP3 has relatively large area square upper and lower surfaces. Spacer SP3 is coupled by an adhesive layer 28 to the coplanar upper surfaces of semiconductor die D2 and supports S2A, S2B. The adhesive layer 28 covers the entire bottom surface of spacer SP3. Spacer SP3 fits within the rows of bond pads 25 of both semiconductor dies D1 and D2. Accordingly, a wire bonding step could be performed after the attachment of spacer SP3 that couples bond wires 26 to both of semiconductor dies D1 and D2.

Figure 20D:
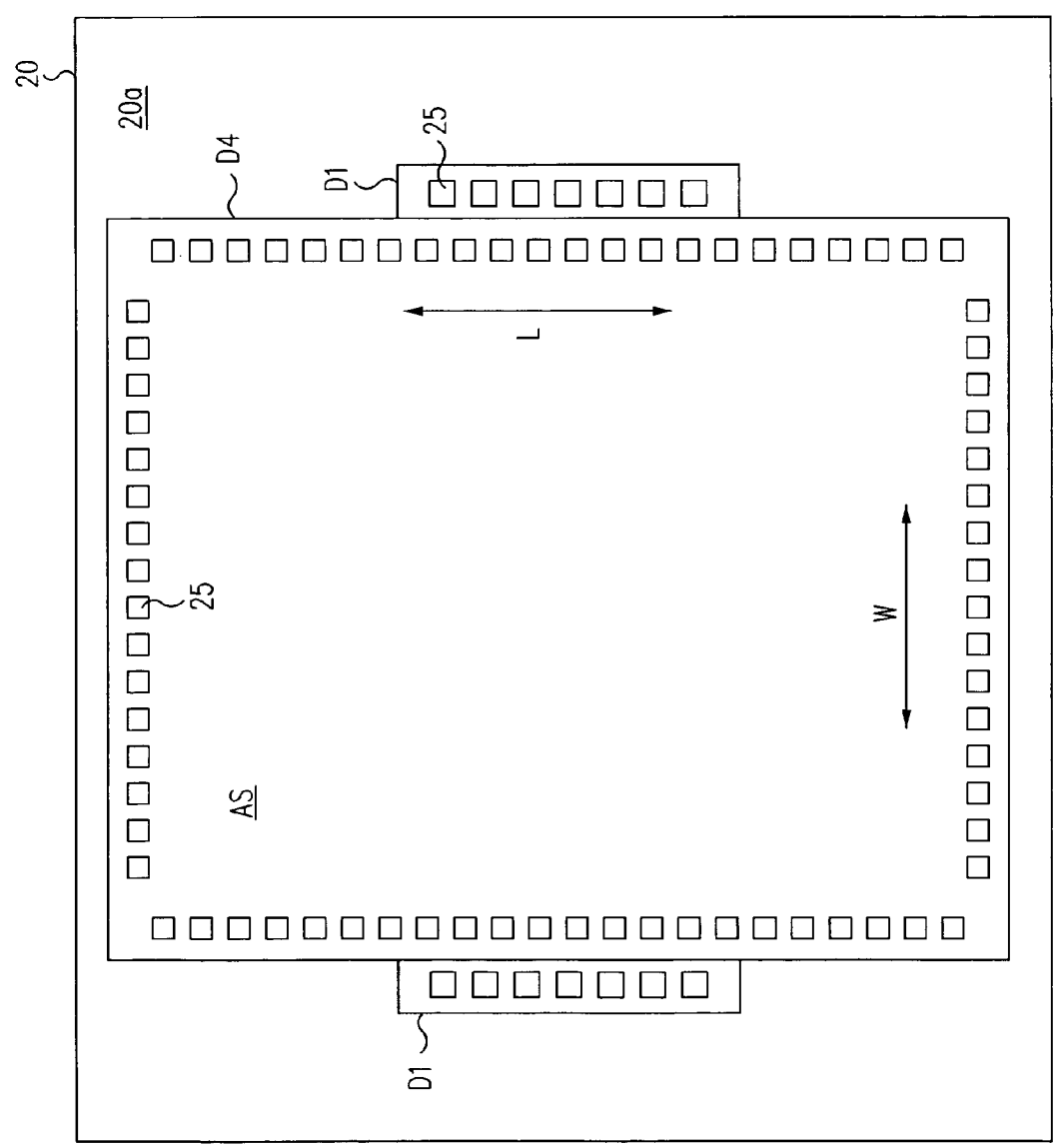

Referring to FIG. 20D, a fourth-level semiconductor die D4 is coupled to the upper surface of spacer SP3 by an adhesive layer 28. Semiconductor die D4 has an active surface AS that is larger in area than the active surface of semiconductor die D2, and the upper and lower surfaces of spacer SP3. Semiconductor die D4 includes four rows of bond pads 25 on its active surface AS, with one row along each of the four edges of the active surface AS.

As in semiconductor package 14, spacer SP3 of semiconductor package 15 is used because semiconductor D4 is too great in area to fit within the bond pads of semiconductor die D2 without overlap that would interfere with the bond wires 26 of semiconductor package D2.

In an alternative embodiment of semiconductor package 15, spacer SP3 may overhang the bond pads 25 of semiconductor die D1, if necessary, to provide adequate support to overlying levels of the stack. If the bond pads 25 of semiconductor die D1 are overlapped by spacer SP3, then the thickness of semiconductor die D2 and second-level supports S2A, S2B must be sufficient to provide vertical clearance between the bond pads 25 and bond wires 26 of semiconductor die D1 and the adhesive layer 28 on the underside of spacer SP3.

FIGS. 21A–21D are simplified top plan views of levels of an embodiment of a semiconductor package 16 in accordance with the present invention. Semiconductor package 16 is the same as semiconductor package 2 of FIGS. 4A–5D, except in two respects. First, the semiconductor dies D1–D4 of semiconductor package 16 include only one row of bond pads 25, with the single row being along one of the two short edges of the active surface AS. Second, the four semiconductor dies D1–D4 of semiconductor package 16, which are optionally all the same size and type, are slightly offset in the horizontal dimension, so that: (1) the short side and adjacent bond pads 25 of each of the upper semiconductor dies D2–D4 overhangs the short side, without bond pads 25, of the immediately underlying semiconductor die D1–D3, respectively; and (2) the bond pads 25 of the semiconductor dies D1–D3 are not overlapped by the immediately overlying semiconductor die D2–D4, respectively. The amount of overhang of semiconductor dies D2–D4 can vary, provided that the semiconductor die D2–D4 is adequately supported.

Figure 21A:
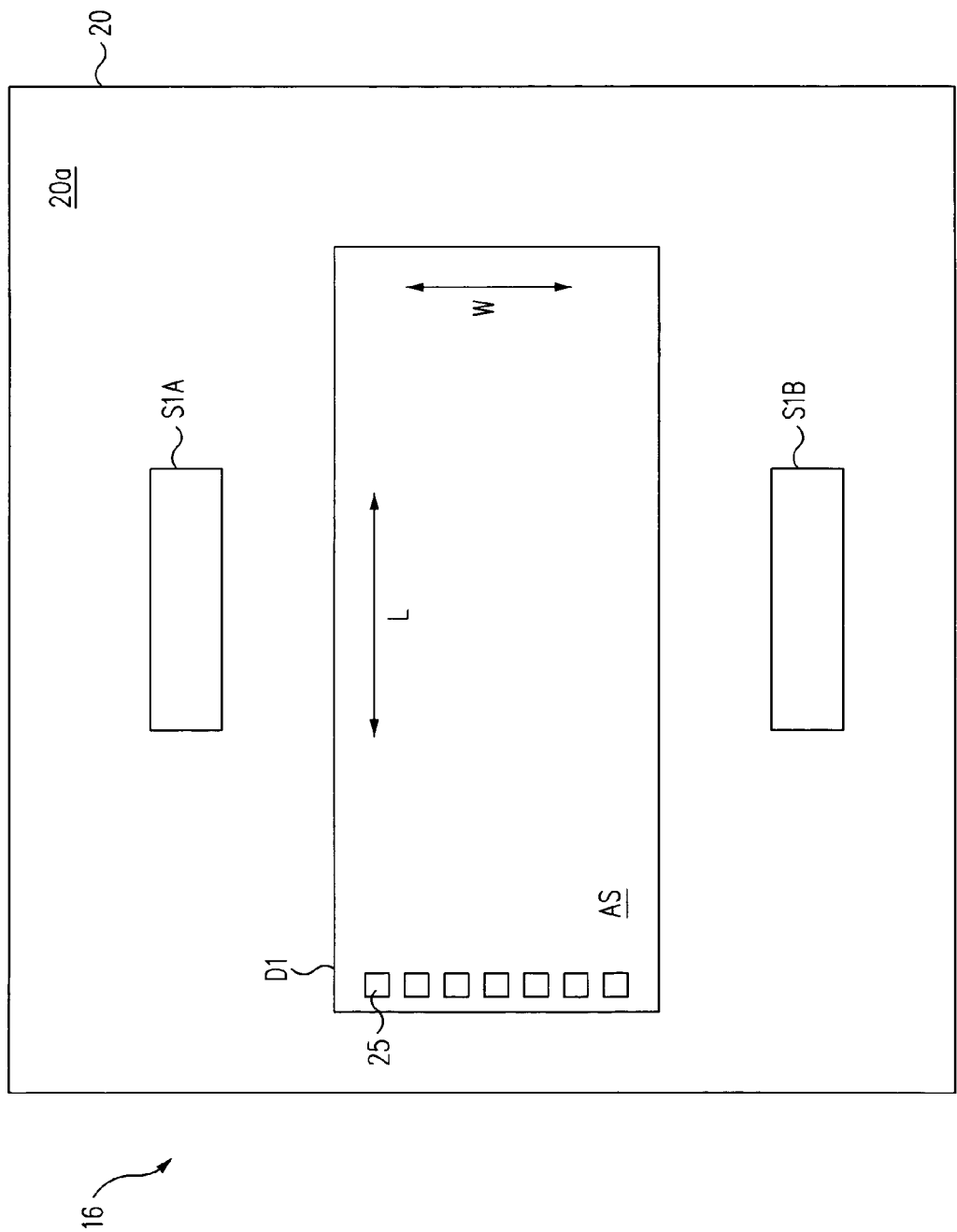
FIGS. 21A–21D are simplified top plan views of levels of a $16^{th}$ embodiment of a semiconductor package in accordance with the present invention.
Figure 21B:
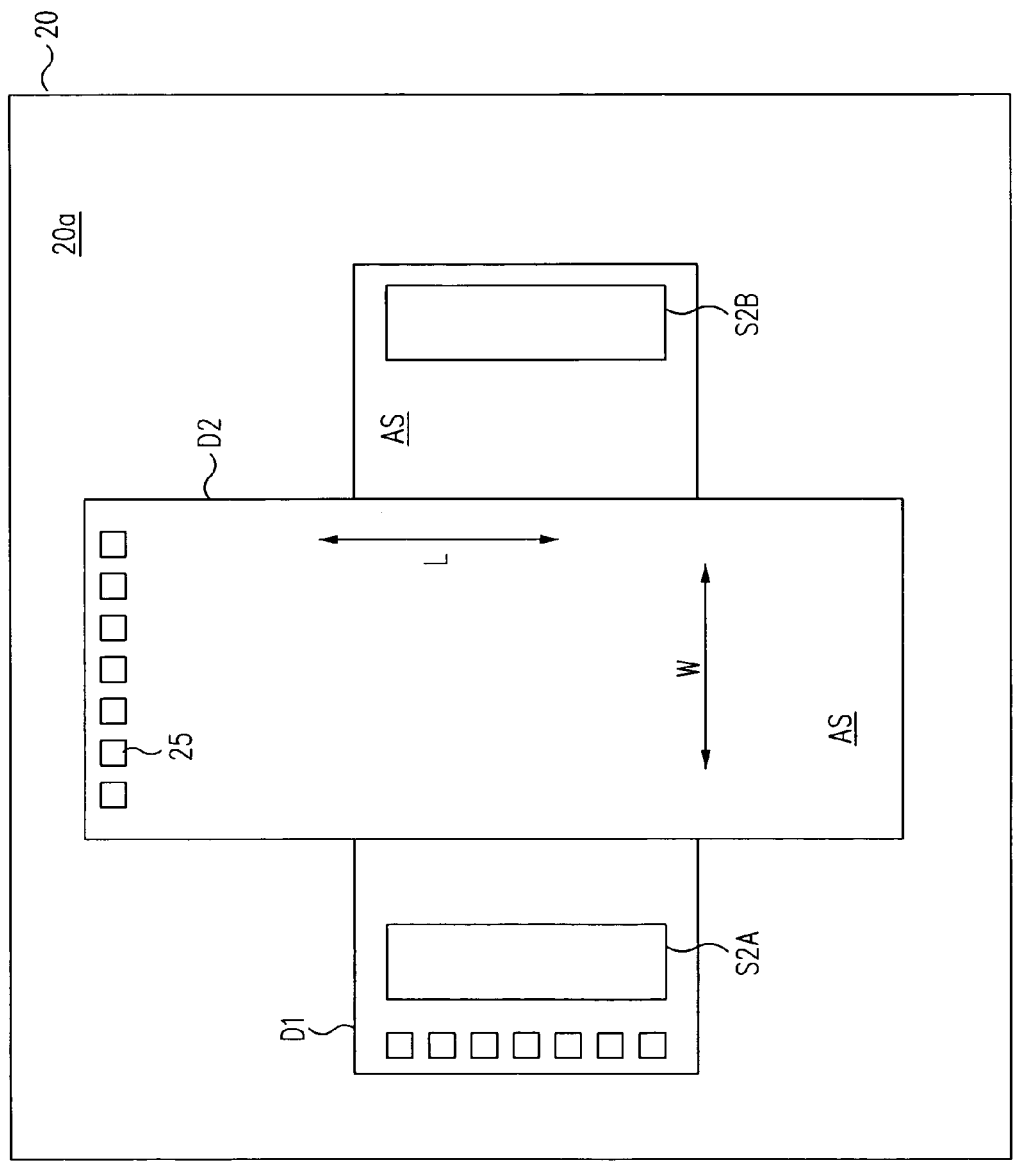
Figure 21C:
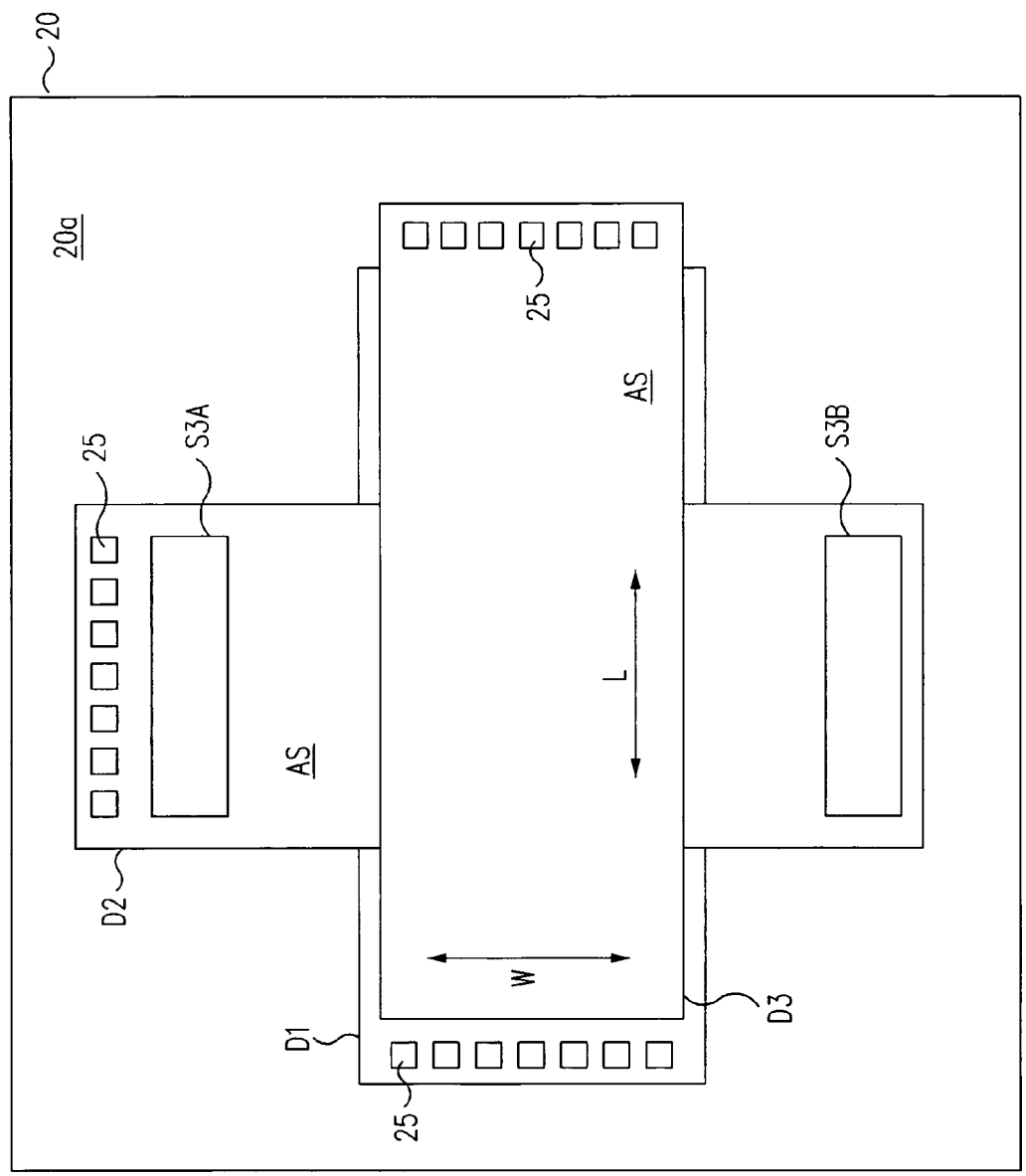
Figure 21D:
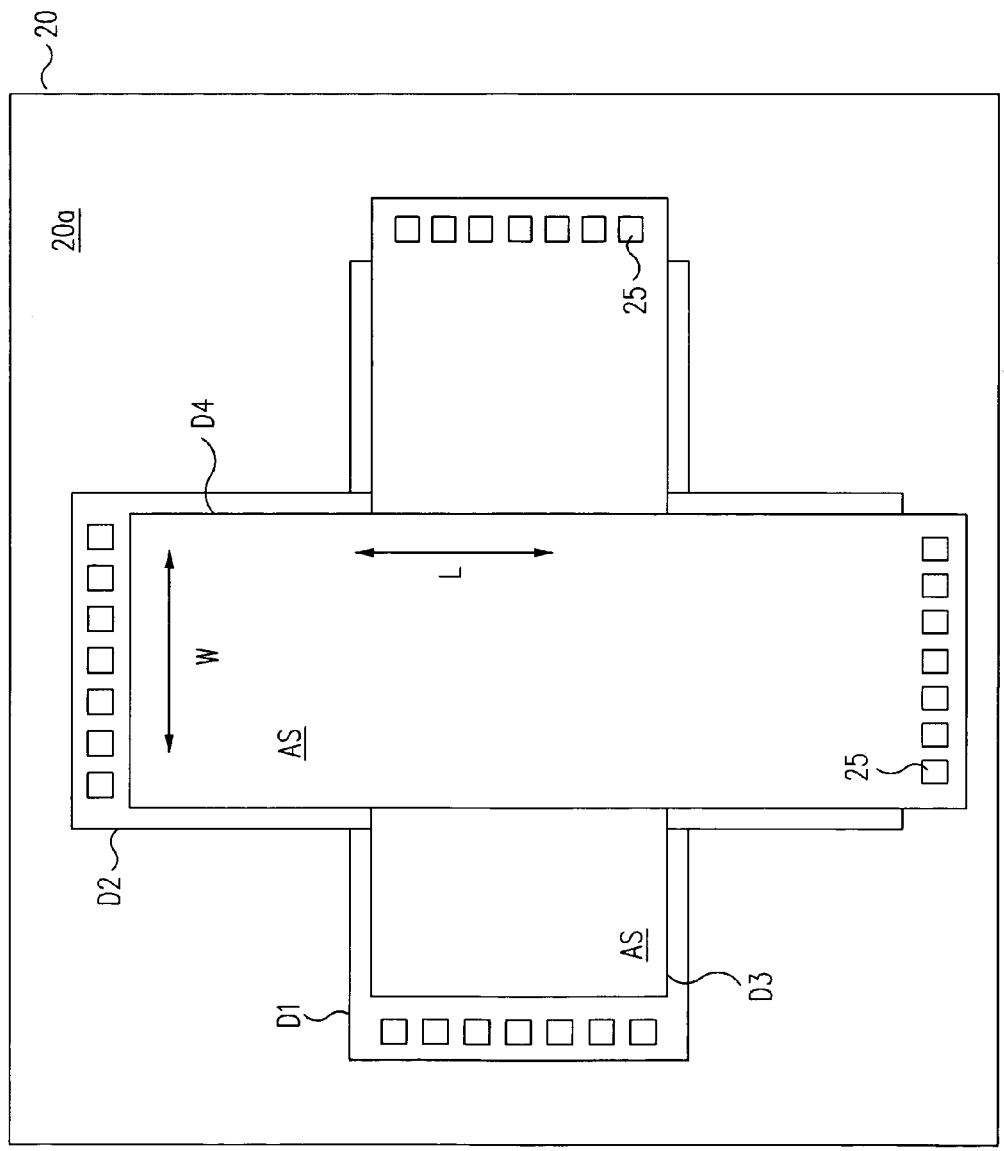

Referring to FIG. 21D, the single row of bond pads 25 of each of semiconductor dies D1–D4 is adjacent to a different one of four rectilinear edges of upper surface 20a of substrate 20. None of the bond pads 25 of any of the semiconductor dies D1–D3 is overlapped by any of the overlying semiconductor dies D2–D4. Accordingly, all of the semiconductor dies D1–D4 could be wirebonded in a single wirebond operation.

Consistent with the earlier-described embodiments, practitioners will appreciate that an underlying semiconductor die DN having a single row of bond pads 25 along only one side of the semiconductor die DN may support an overlying semiconductor die D(N+1) that overhangs the other three sides of the underlying semiconductor die DN, as long as the overlying semiconductor die D(N+1) does not overlap the single row of bond pads 25 of the underlying semiconductor die DN. In such a configuration, one or more supports SN may be positioned adjacent to the sides of the underlying semiconductor die DN. For instance, if three sides of semiconductor die D1 are overhung by semiconductor die D(N+1), then three supports SN may be used, with one support disposed adjacent to each of the three overhung sides of semiconductor die DN. The number, size, and location of supports SN may be chosen depending, for instance, on the amount of overhang and the available area for mounting the supports SN.

Figure 22A:
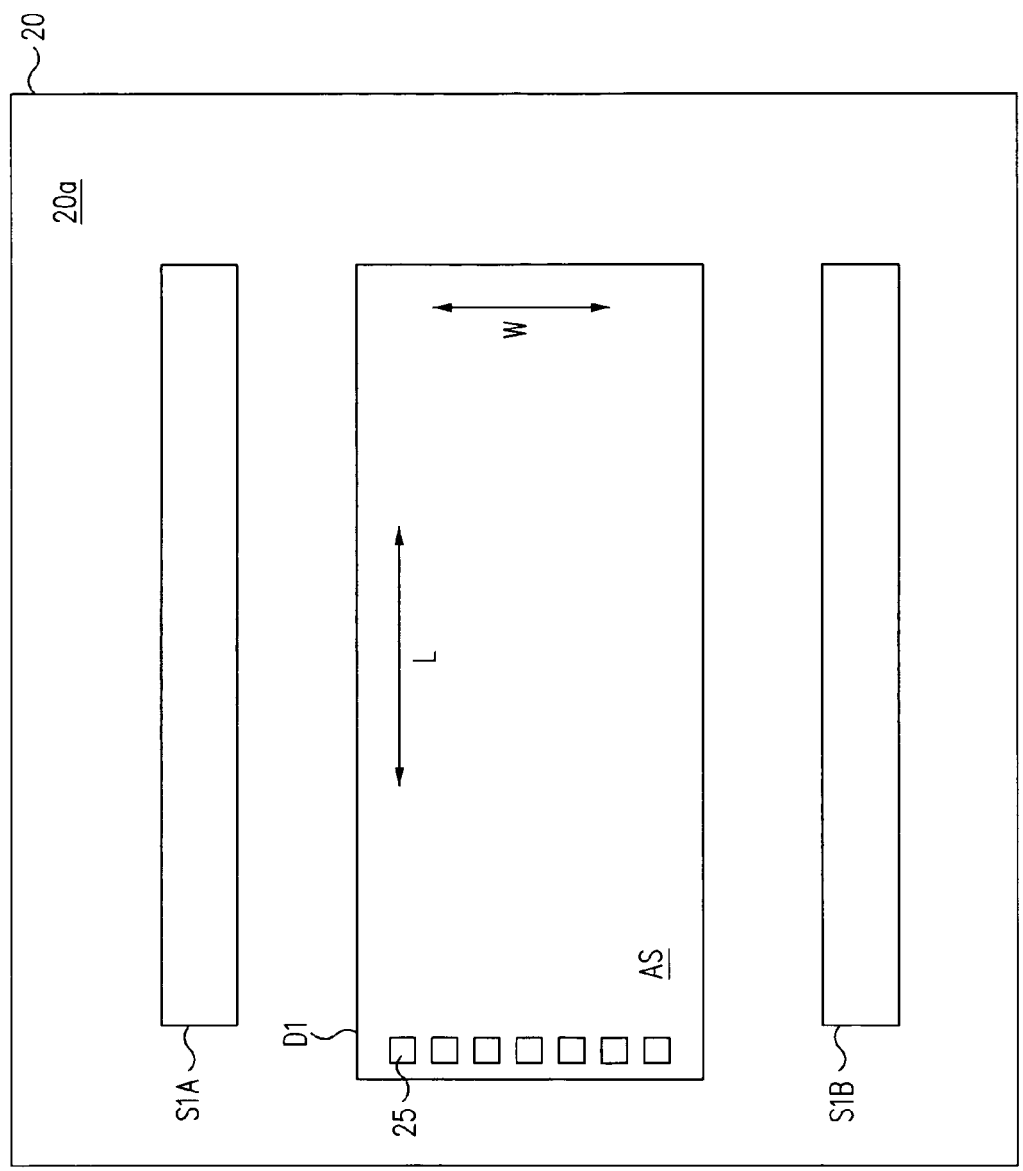
FIGS. 22A–22D are simplified top plan views of levels of a $17^{th}$ embodiment of a semiconductor package in accordance with the present invention.
Figure 22B:
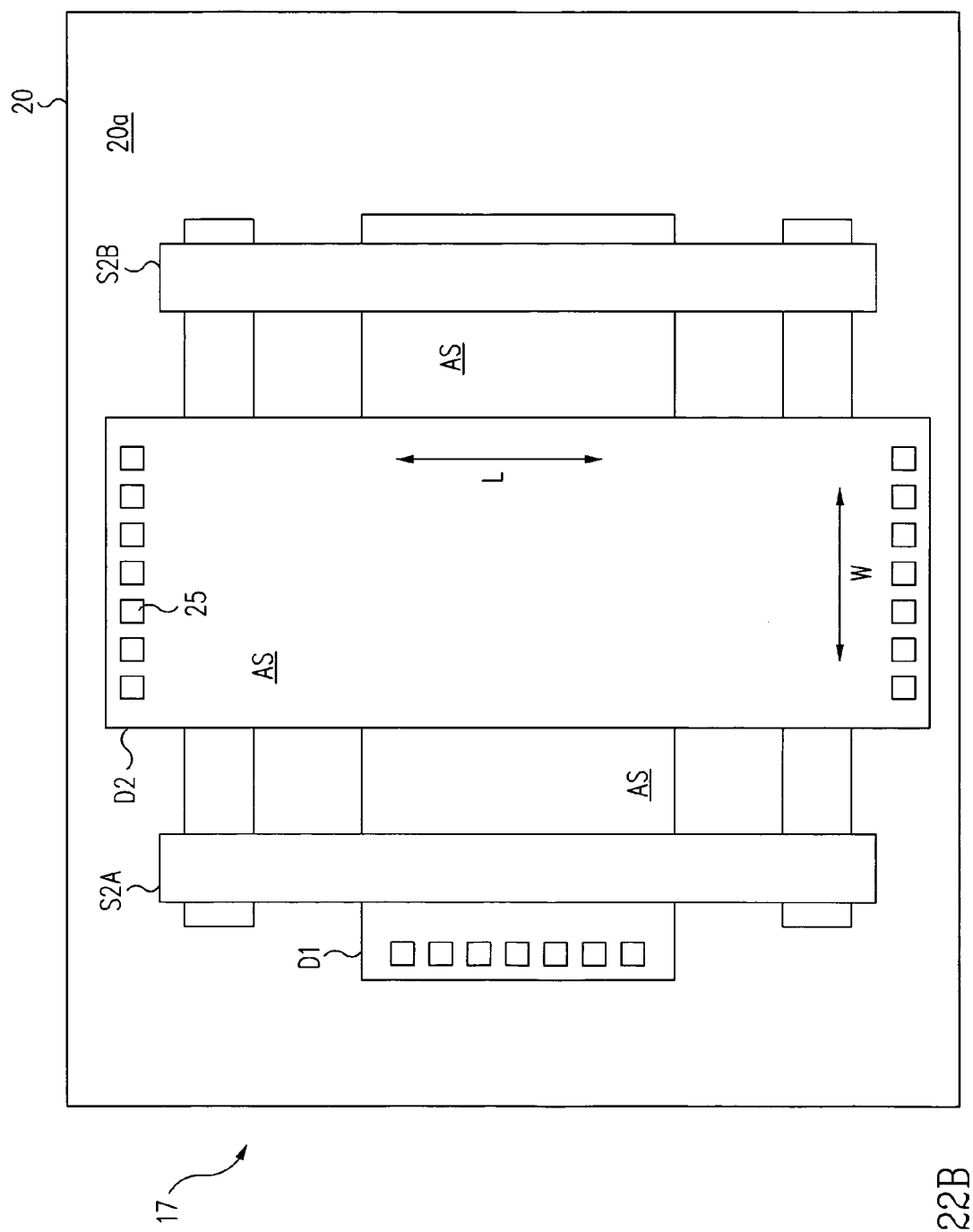
Figure 22C:
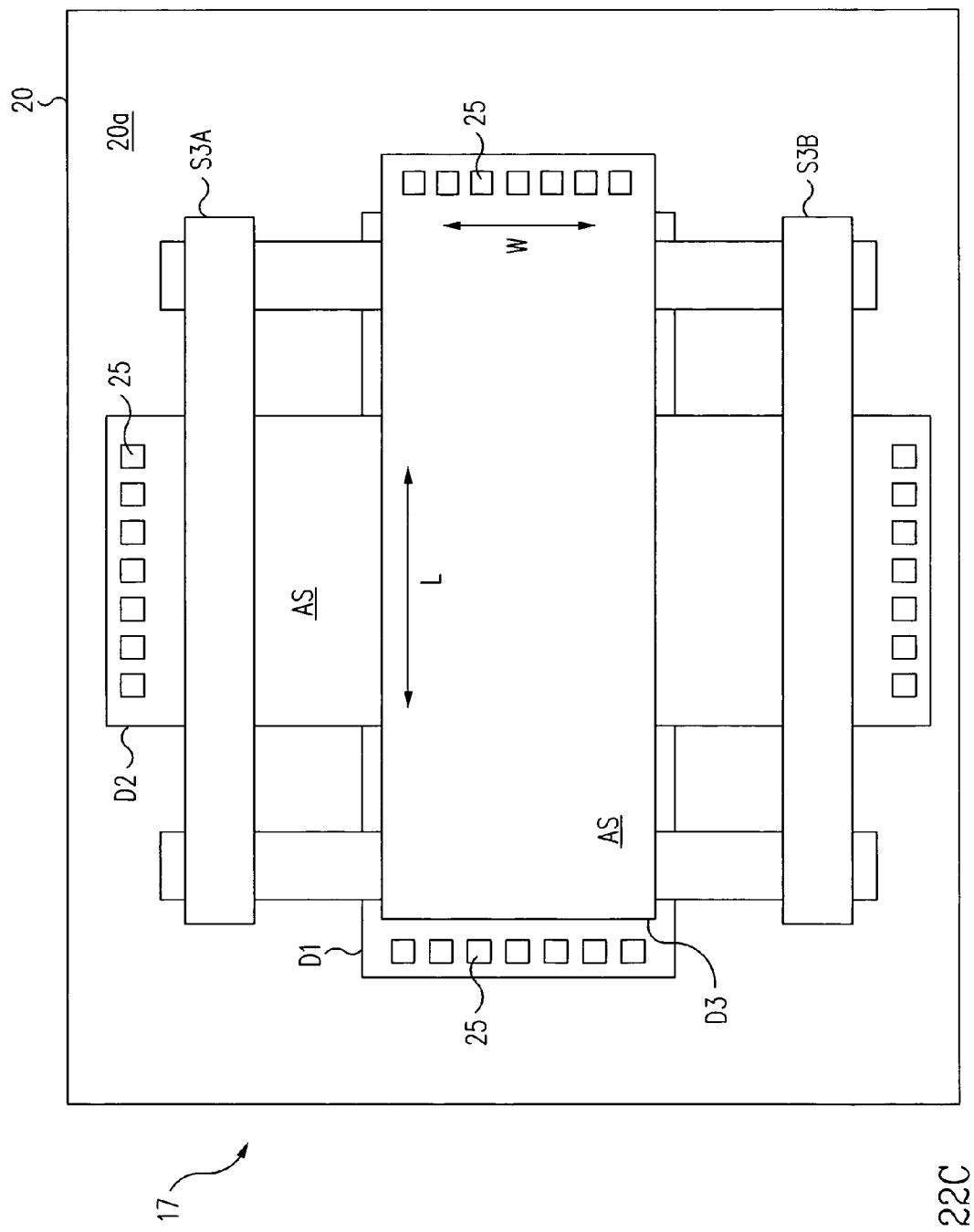

FIGS. 22A–22D are simplified top plan views of levels of an embodiment of a semiconductor package 17 in accordance with the present invention. Referring to FIGS. 22A–22C, the first three levels of semiconductor package 17 are the same as those of semiconductor package 4 of FIGS. 8A and 8B, except that semiconductor dies D1 and D3, which may be the same size and type, have only one row of bond pads 25 and are horizontally offset from each other. The short side of semiconductor die D3 having the adjacent bond pads 25 overhangs the short side without the bond pads 25 of semiconductor die D1. The amount of horizontal offset between semiconductor dies D1 and D3 can vary, provided that the overhanging portion of semiconductor D3 is adequately supported for wirebonding. The row of bond pads 25 of semiconductor dies D1, D3 are each adjacent to a respective one of two parallel edges of upper surface 20a of substrate 20.

Referring to FIG. 22C, the single row of bond pads 25 of semiconductor dies D1 and D3, and the two parallel rows of bond pads 25 of semiconductor die D2 are exposed, and thus may be wirebonded together in a single wirebond step prior to the placement of semiconductor die D4 on the stack.

Figure 22D:
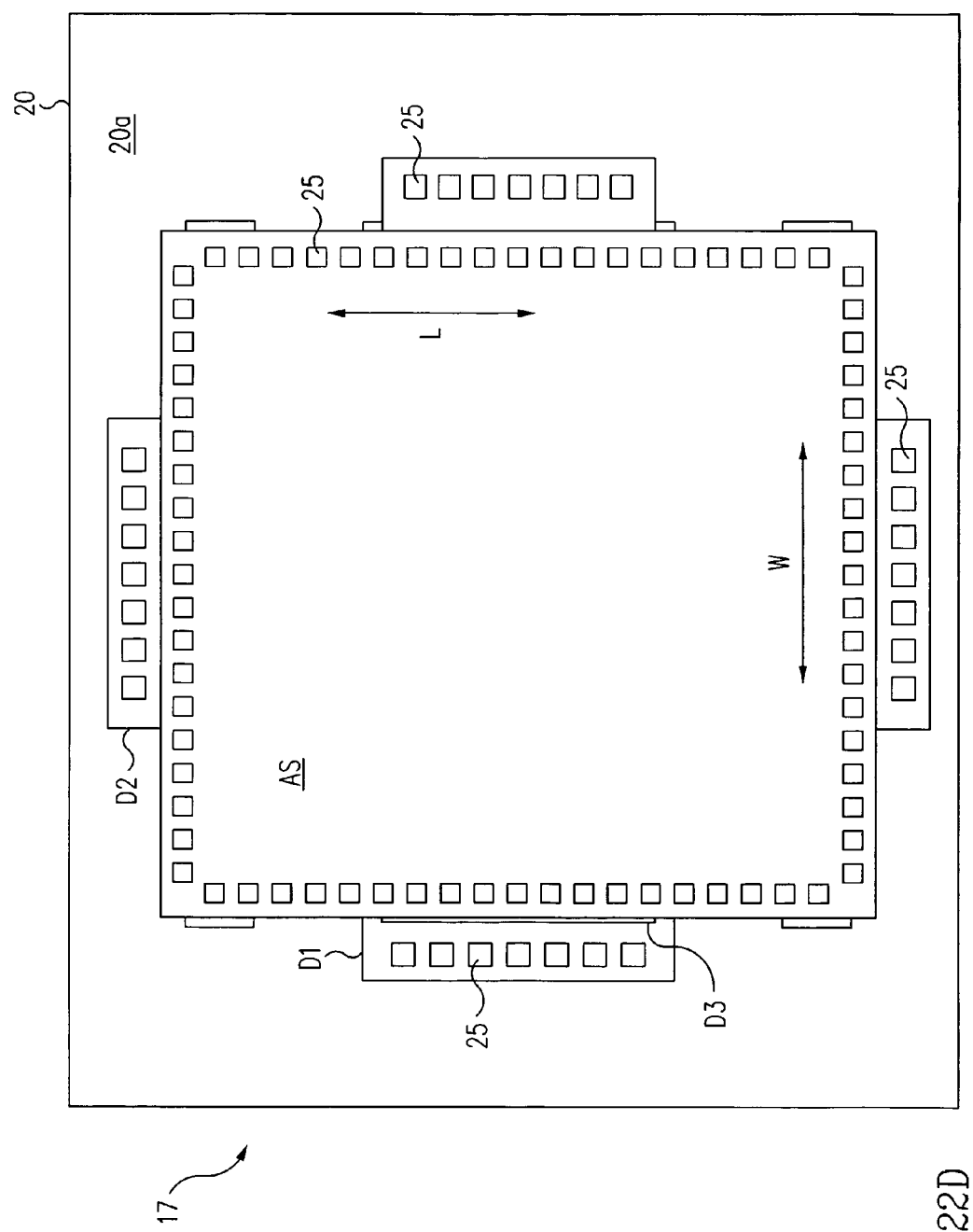

Referring to FIG. 22D, a relatively large area semiconductor die D4 is attached by an adhesive layer 28 to the coplanar active surface AS of semiconductor die D3 and upper surfaces of supports S3A, S3B. In this regard, semiconductor package 17 is similar to semiconductor package 4 of FIG. 8D. The size of semiconductor die D4 is such that semiconductor die D4 does not overlap the bond pads 25 of the immediately underlying semiconductor die D3. Optionally, as shown, semiconductor die D4 may be sized so as to not overlap any of the bond pads 25 of the underlying semiconductor dies D1–D3. Accordingly, all of the semiconductor dies D1–D4 together could be wirebonded in a single wirebond operation.

Within semiconductor package 19, bond wires 26 may be coupled between the bond pads 25 of each of the semiconductor dies D1–D4 and circuit patterns 22 of substrate 20. In addition, bond wires 26 may be coupled between the bond pads 25 of semiconductor die D4 and one, two, or all three of the underlying semiconductor dies D1–D3.

FIGS. 23A–23D are simplified top plan views of levels of an embodiment of a semiconductor package 18 in accordance with the present invention.

Figure 23A:
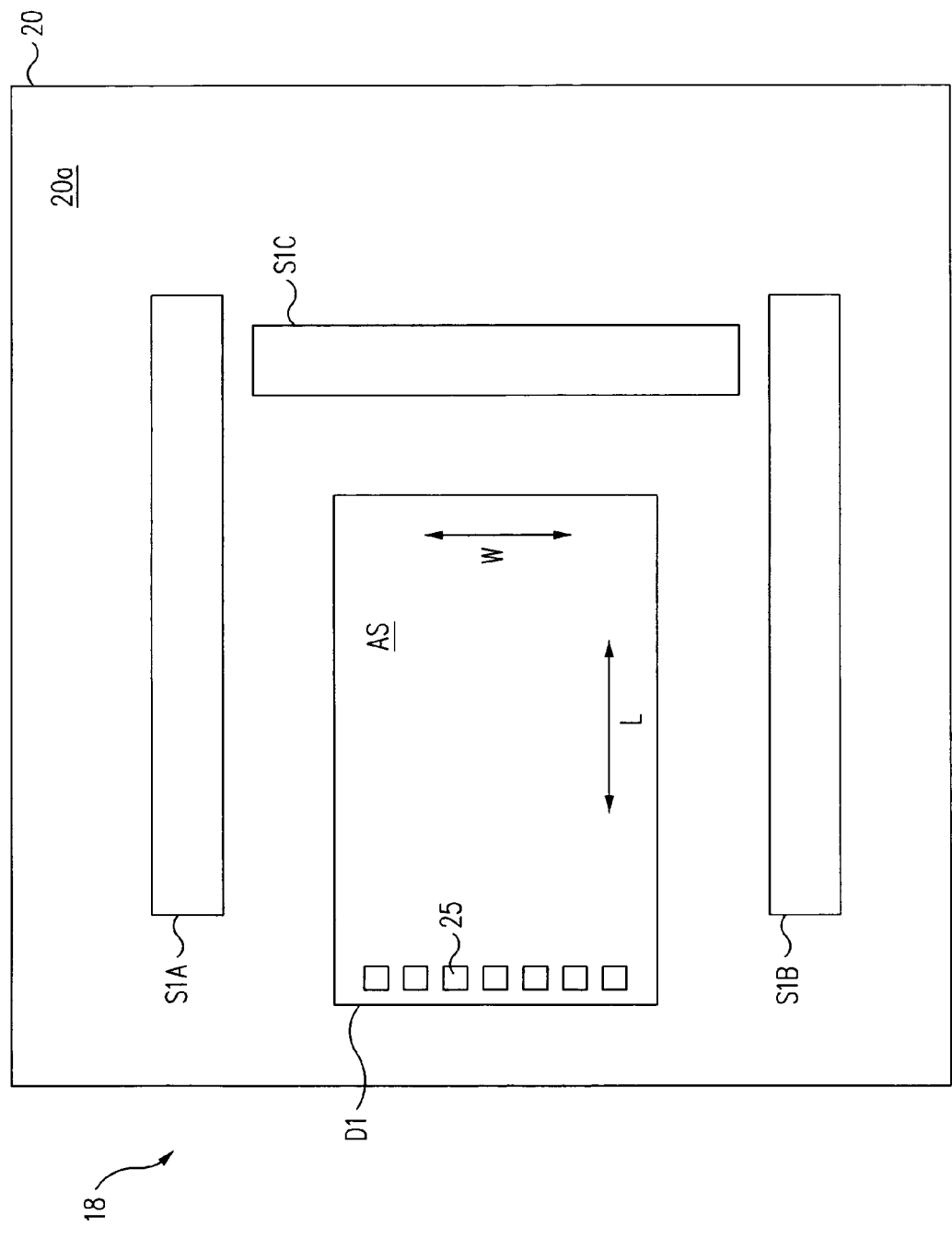
FIGS. 23A–23D are simplified top plan views of levels of an $18^{th}$ embodiment of a semiconductor package in accordance with the present invention.

Referring to FIG. 23A, a first level of semiconductor package 18 includes a semiconductor die D1 having only one row of bond pads 25, with the one row being adjacent to one of the two parallel short sides of semiconductor die D1. Two elongated same-size supports S1A, S1B are attached by an adhesive layer 27 to upper surface 20a of substrate 20, and are disposed adjacent to and parallel to, but spaced from, the long sides of semiconductor die D1. An optional third elongated support S1C is attached by an adhesive layer 27 to upper surface 20a adjacent to and parallel to, but spaced from, the short side of semiconductor die D1 that does have an adjacent row of bond pads 25. Each of the three first-level supports S1A, S1B and S1C are the same thickness (i.e., vertical height) as semiconductor die D1, and have their upper surfaces in a common plane with the active surface AS of semiconductor die D1.

Figure 23B:
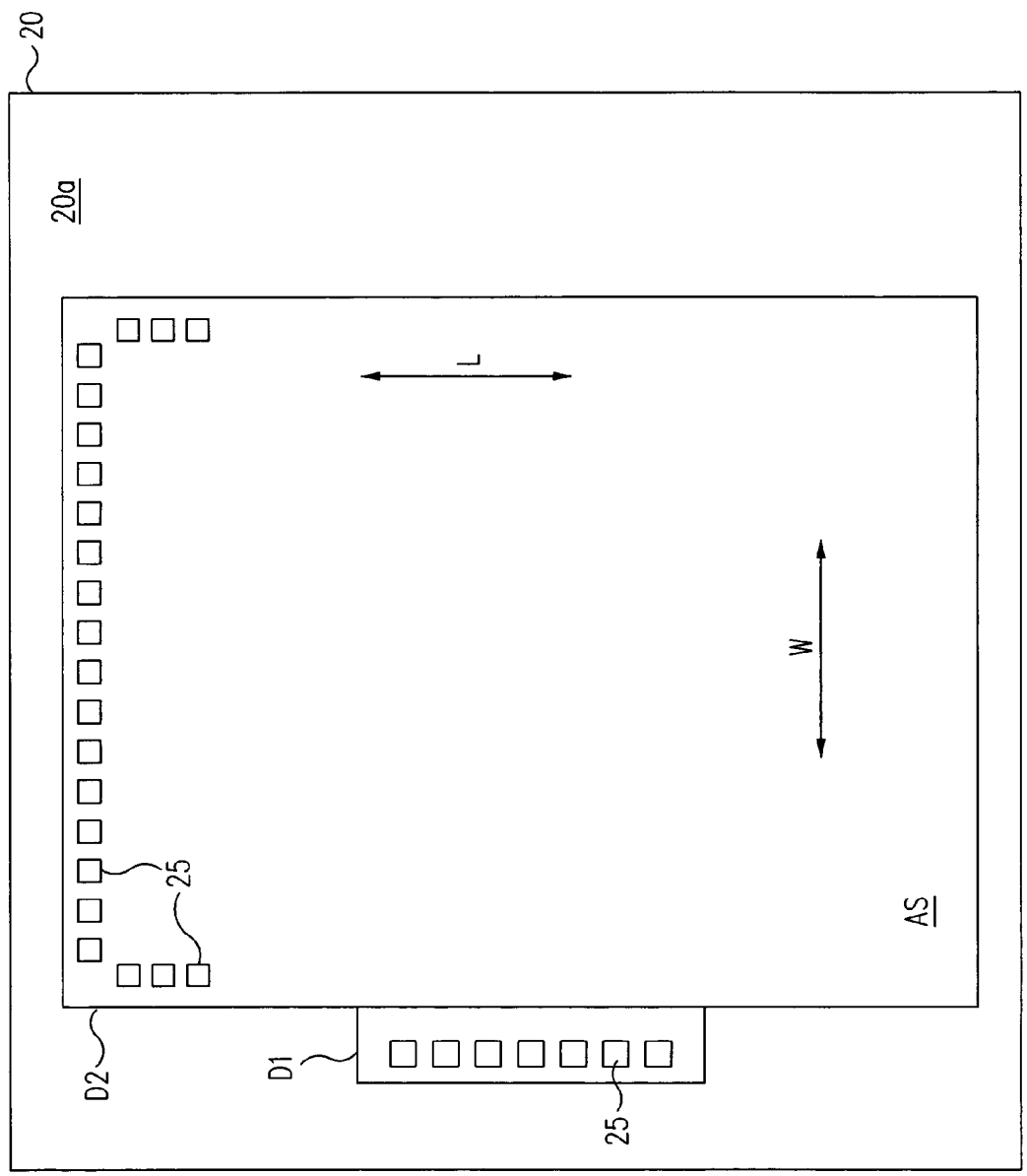

Referring to FIG. 23B, a relatively large-area semiconductor die D2 is coupled to the coplanar active surface AS of semiconductor die D1 and upper surfaces of supports S1A, S1B, and S1C. Semiconductor die D2 of FIG. 23B is sized to fit entirely within the two rows of bond pads 25 of semiconductor die D1. Semiconductor die D2 does not overlap any of the bond pads 25 of the single row of bond pads 25 of semiconductor die D1. On the other hand, semiconductor die D2 overhangs three sides of semiconductor die D1, including both of two long sides of semiconductor die D1 and the short side of semiconductor die D1 that does not have an adjacent row of bond pads 25. Semiconductor die D2 also overhangs the distal long sides of supports S1A, S1B, and S1C.

Semiconductor die D2 has three rows of bond pads 25, including one long row along one of two parallel short edges of its active surface AS, and two parallel mirror image short rows of three bond pads 25. There are no bond pads 25 along the other short edge of active surface AS, or along the majority of the length of the two long edges of active surface AS.

Figure 23C:
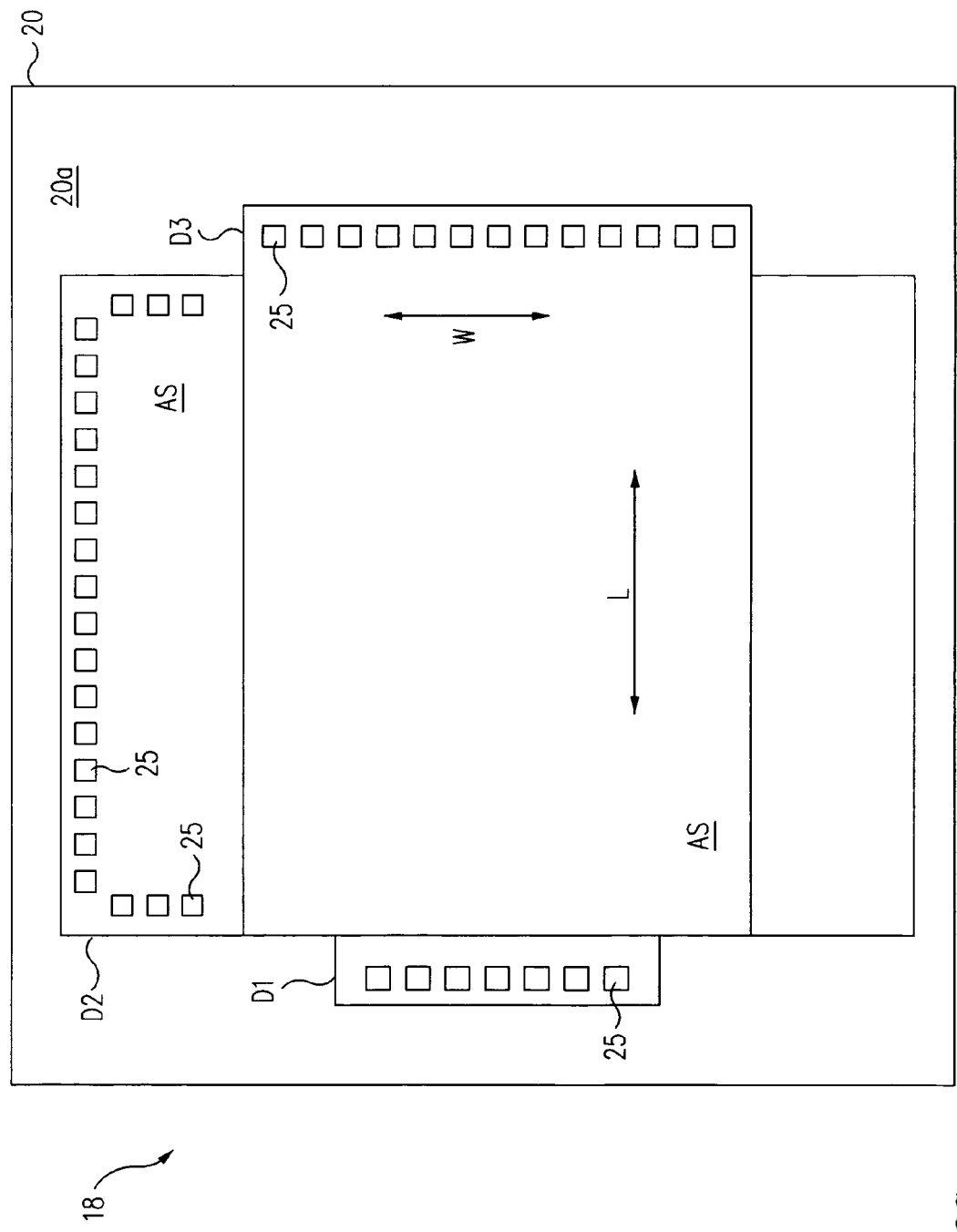

Referring to FIG. 23C, a third-level semiconductor die D3 is coupled to the active surface AS of semiconductor die D2 with an adhesive layer 28. The bond pads 25 of semiconductor die D3 are in a single row along one of the short sides of semiconductor die D3. The short side and bond pads 25 of semiconductor die D3 overhang one of the long sides of semiconductor die D2, while the row of bond pads 25 of semiconductor die D1 extend beyond the opposite long side of semiconductor die D2. The amount of overhang by semiconductor die D3 is governed by the amount of support that semiconductor die D3 needs, such as during the wirebonding step. The active surface AS of semiconductor die D3 is larger in area than the active surface of semiconductor die D1, but lesser in area than the active surface of semiconductor die D2. Semiconductor die D3 does not overlap any of the bond pads of semiconductor die D2, and optionally does not overlap any of the bond pads of semiconductor die D1.

Figure 23D:
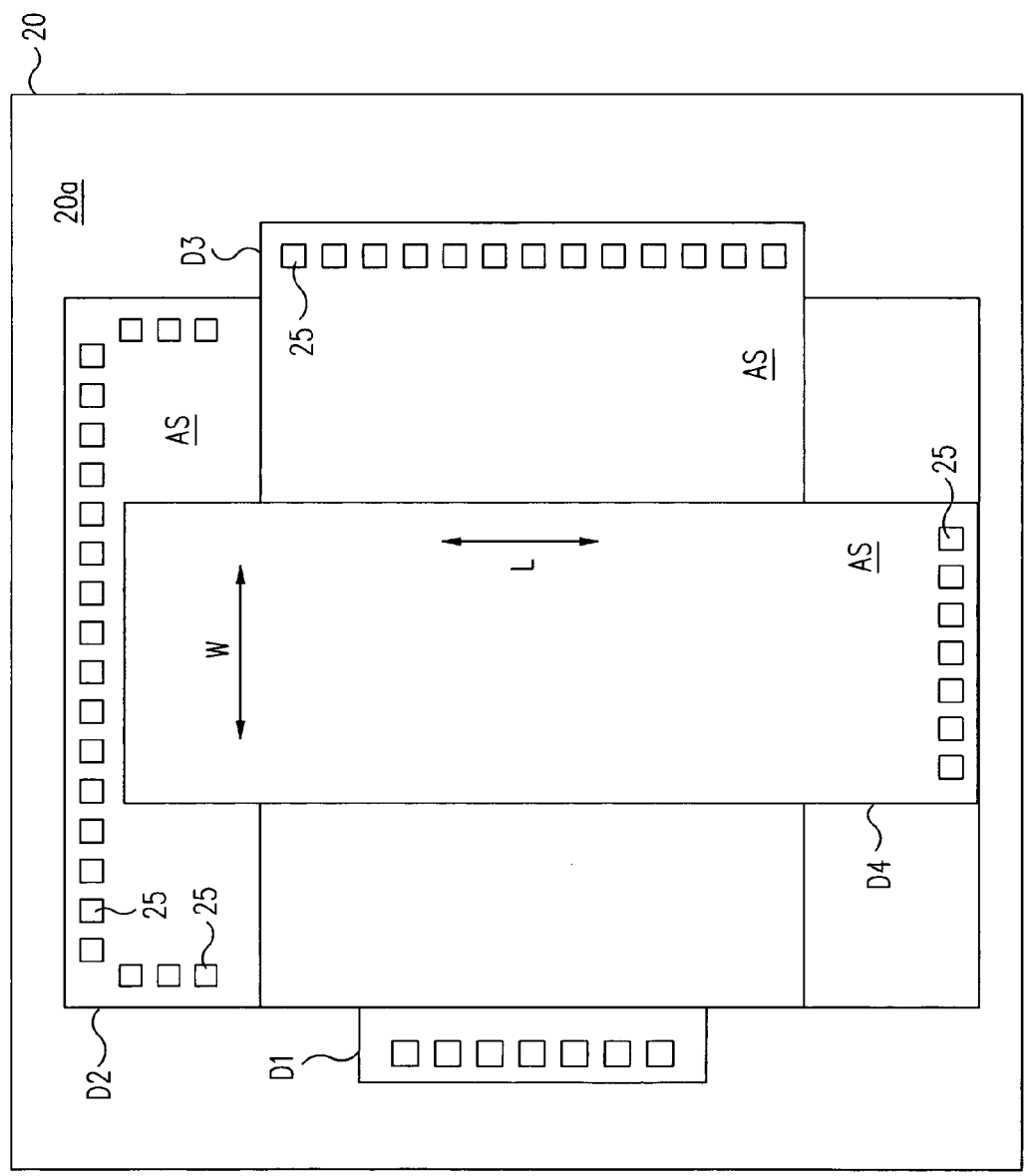

Referring to FIG. 23D, a fourth level semiconductor die D4 is coupled to the active surface of semiconductor die D3 by an adhesive layer 28. Like semiconductor dies D1 and D3, semiconductor die D4 has only a single row of bond pads 25, with the row being along a short edge of active surface AS. The row of bond pads 25 of semiconductor die D4 are on an opposite side of the stack as the bond pads 25 of semiconductor die D2. Semiconductor die D4 is sized so as to not overlap the single row of bond pads 25 of semiconductor die D3. Optionally, semiconductor die D4 is sized to fit entirely within the three rows of bond pads 25 of semiconductor die D2.

Note in FIG. 23D that the two short sides of semiconductor die D4 optionally overhang the two parallel long sides of semiconductor die D3. The amount of overhang permissible is determined by the amount of support needed by semiconductor die D4. If desired, a third-level support, or a pair of third-level supports, may be attached to the active surface AS of semiconductor die D2 adjacent the long sides of semiconductor die D3 to provide support for semiconductor die D4, provided that access to the bond pads 25 of semiconductor die D2 is not obstructed. Since the bond pads 25 of all of the four stacked semiconductor dies D1–D4 of semiconductor package 18 are accessible after semiconductor die D4 is added to the stack, the bond pads 25 of all four dies may be wirebonded in a single wirebond operation.

In an alternative embodiment of semiconductor package 18, there may be overlap between semiconductor die D3 and D4 and the bond pads 25 of semiconductor die D1, and between semiconductor die D4 and the bond pads 25 of semiconductor die D2.

Figure 24A:
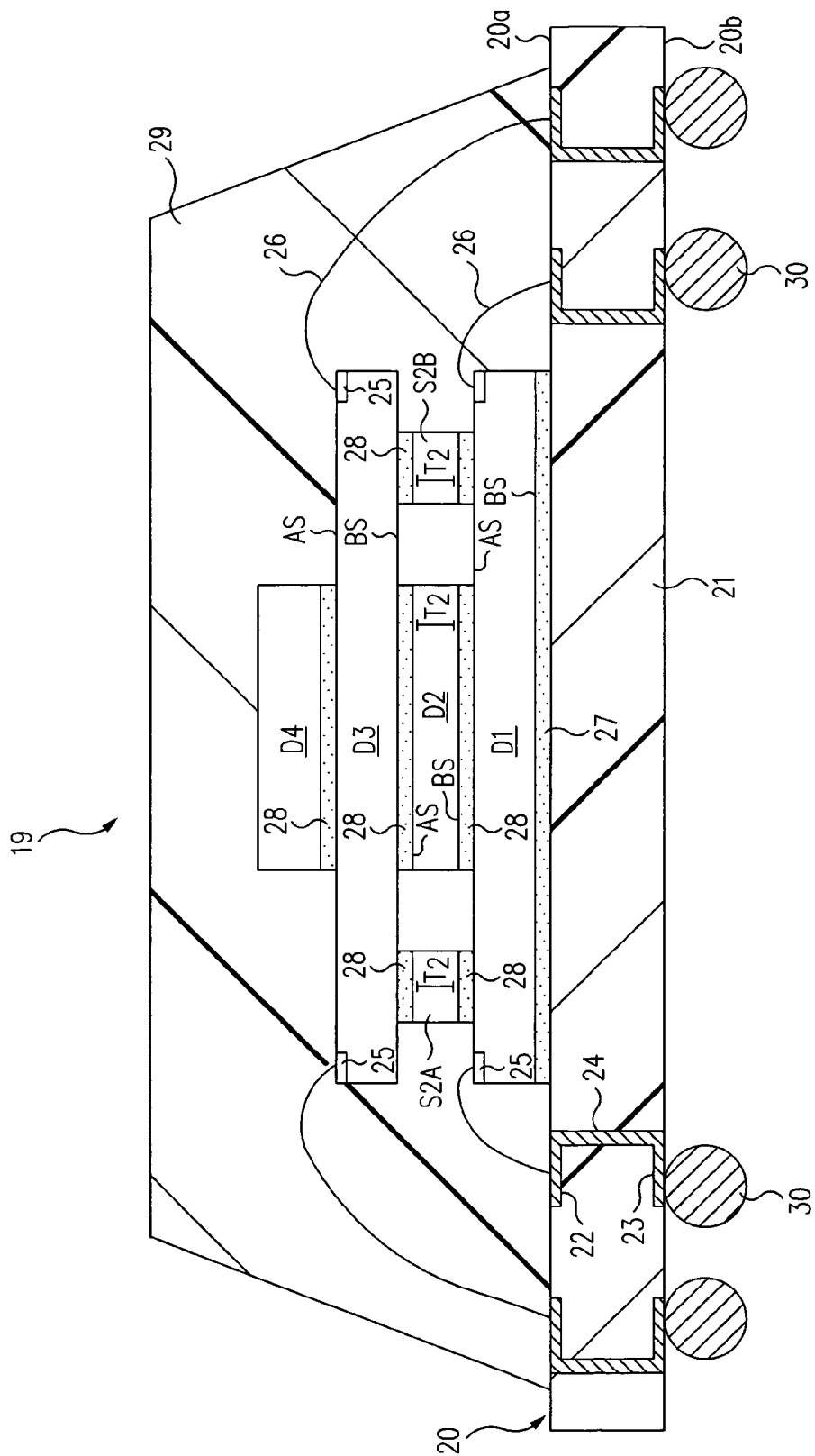
FIGS. 24A and 24B are cross-sectional side views of a $19^{th}$ embodiment of a semiconductor package in accordance with the present invention.
Figure 24B:
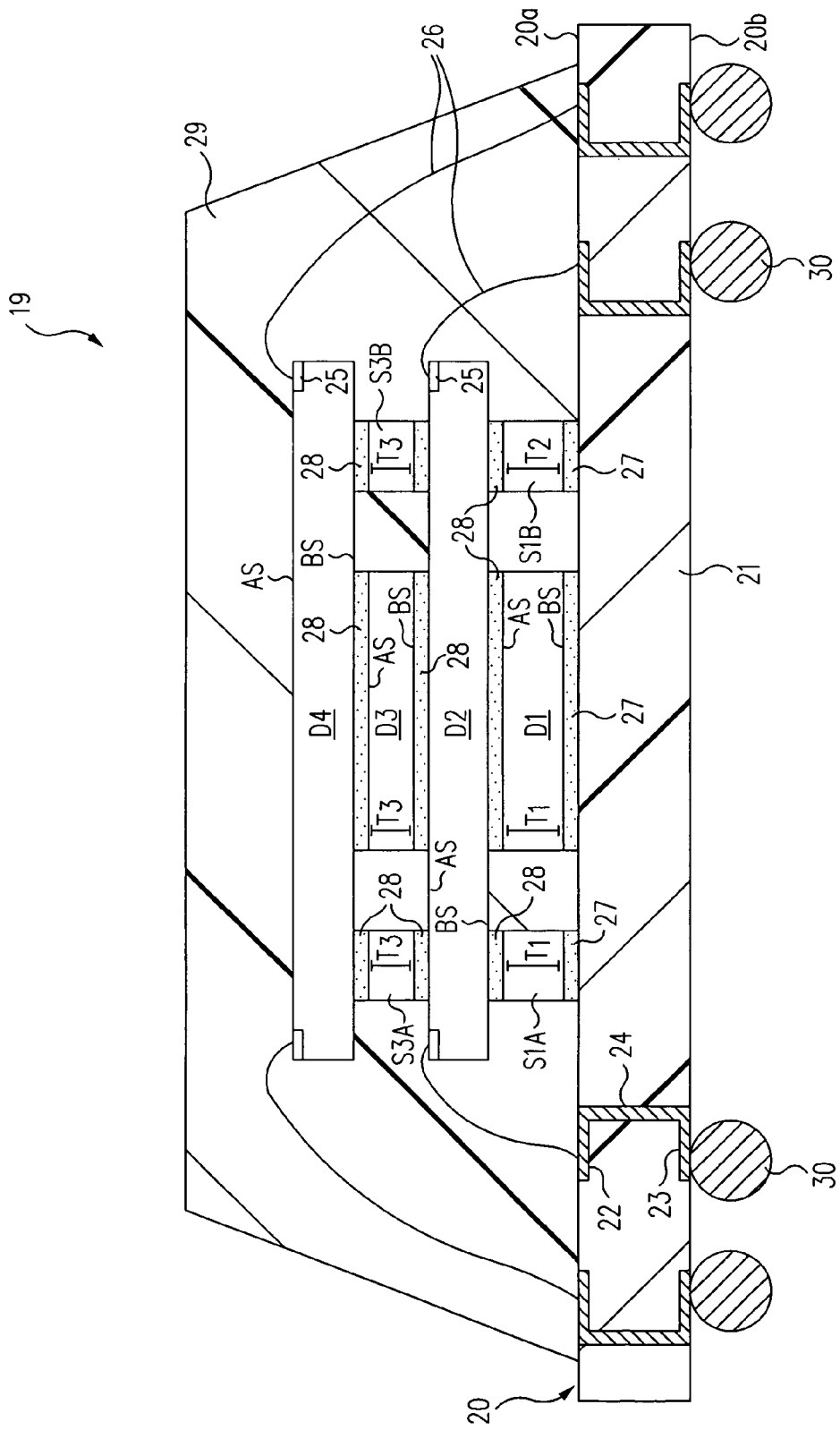

FIGS. 24A and 24B are cross-sectional side views of a semiconductor package 19 in accordance with the present invention. Semiconductor package 19 is identical to semiconductor package 2 of FIGS. 4A, 4B and 5A–5D, except with respect to the adhesive layers 28. Instead of having a respective contiguous adhesive layer 28 that covers the entire inactive surface BS of each of semiconductor dies D2, D3, and D4, the adhesive layers 28 of semiconductor package 19 are only present between: (1) the juxtaposed subportions of the inactive surface BS of the semiconductor dies D2, D3, and D4, and the active surface of the immediately underlying semiconductor die D1, D2, and D3, respectively; and (2) the juxtaposed subportions of the inactive surface BS of the semiconductor dies D2, D3, and D4 and the upper surface of first, second, and third level supports, respectively. Such a configuration is possible, for example, where each of the adhesive layers 28 is a dab of an insulative die attach paste. In such an embodiment, care should be taken to ensure that each of the dabs of die attach paste forming the adhesive layers 28 at the same level have the same thickness. In addition, care should be taken that the die attach paste does not interfere with any bond pads of an underlying one of the semiconductor dies.

Practitioners will appreciate that, within a stack of the present invention, the sizes and materials of the supports and the sizes and types of the adhesives used in the stack, can vary. Even within a level of the stack, the adhesive layers used to couple a semiconductor die to overlying and underlying surfaces may differ from the adhesive layers used to couple an adjacent support structure (or structures) to the same overlying and underlying surfaces. Accordingly, the various embodiments herein can be mixed and matched to achieve the goals of a particular application, while still achieving successive stacked semiconductor dies that are flat and parallel to the mounting surface of the underlying substrate, within manufacturing tolerances.

Figure 25A:
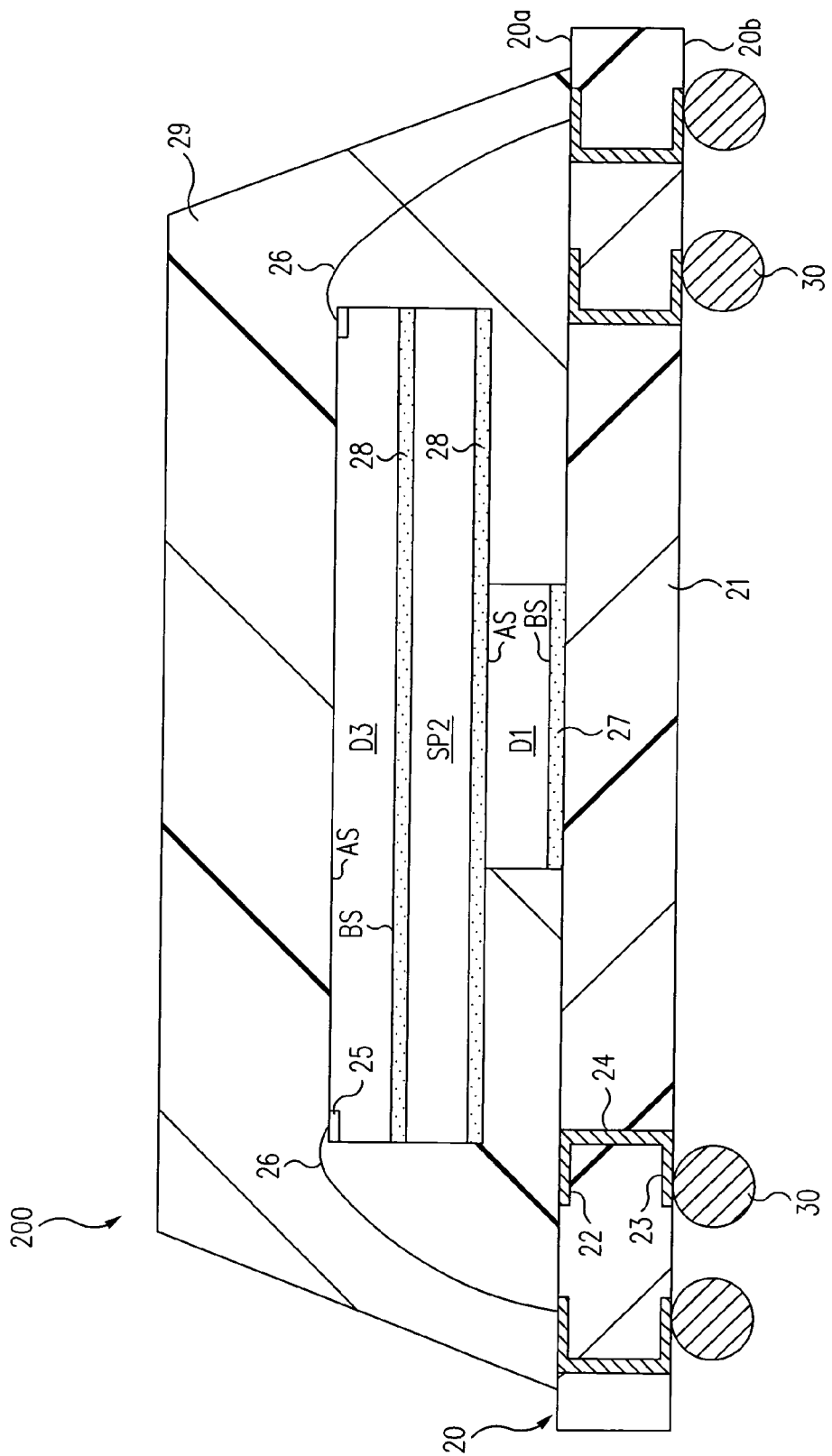
FIGS. 25A and 25B are cross-sectional side views of a $20^{th}$ embodiment of a semiconductor package in accordance with the present invention.
Figure 25B:
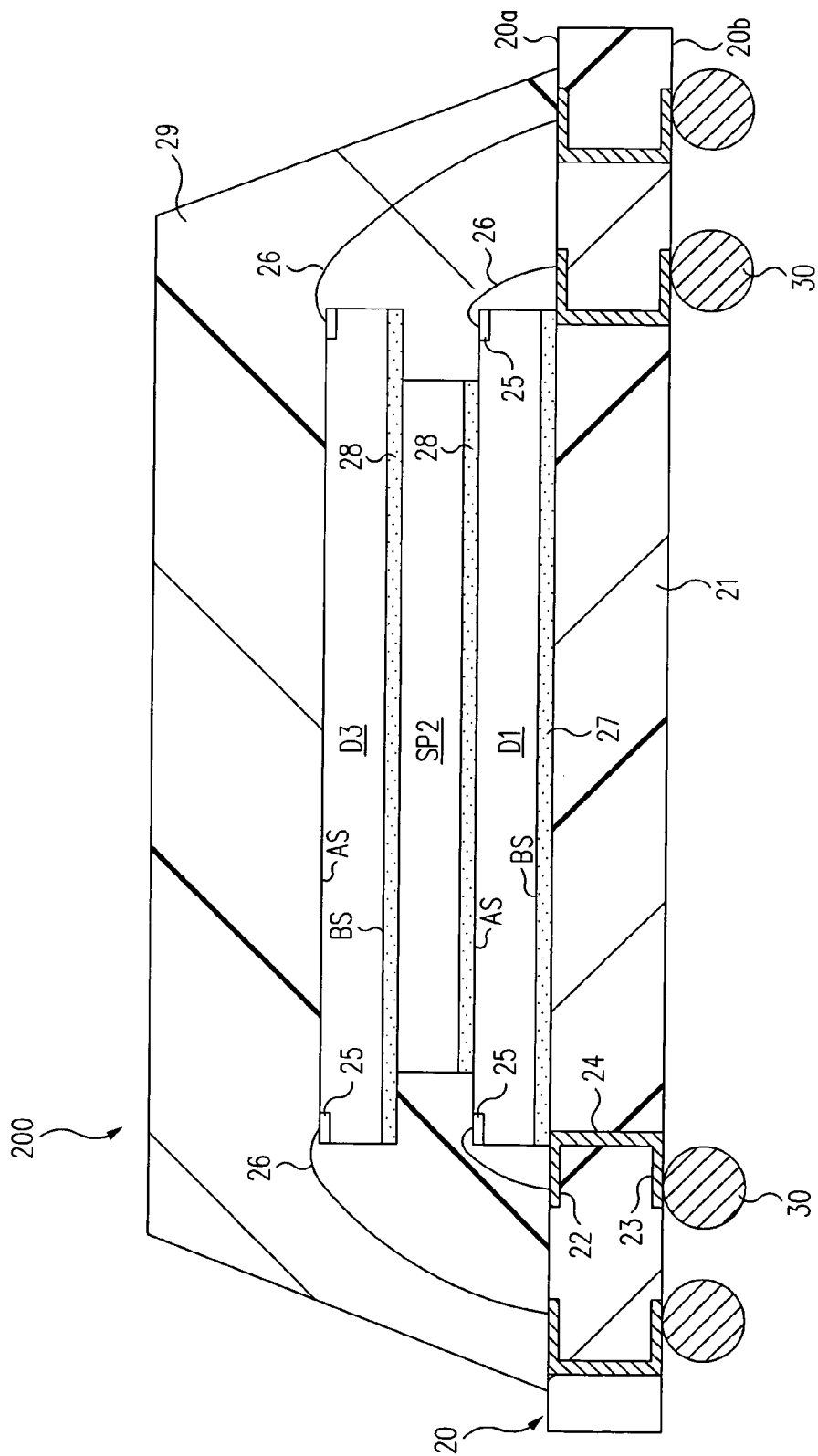
Figure 26A:
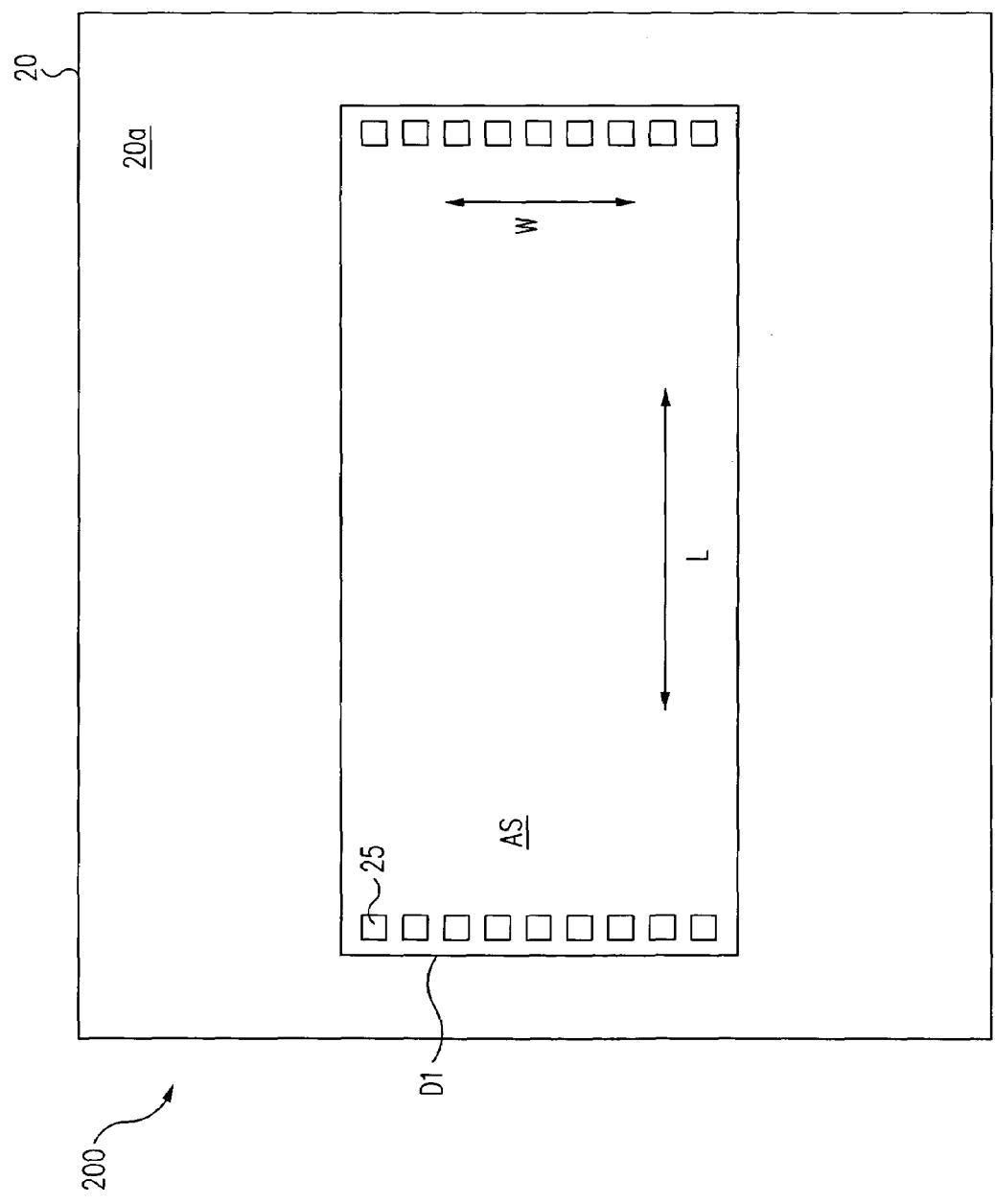
FIGS. 26A–26C are simplified top plan views of levels of the semiconductor package of FIGS. 25A and 25B.
Figure 26B:
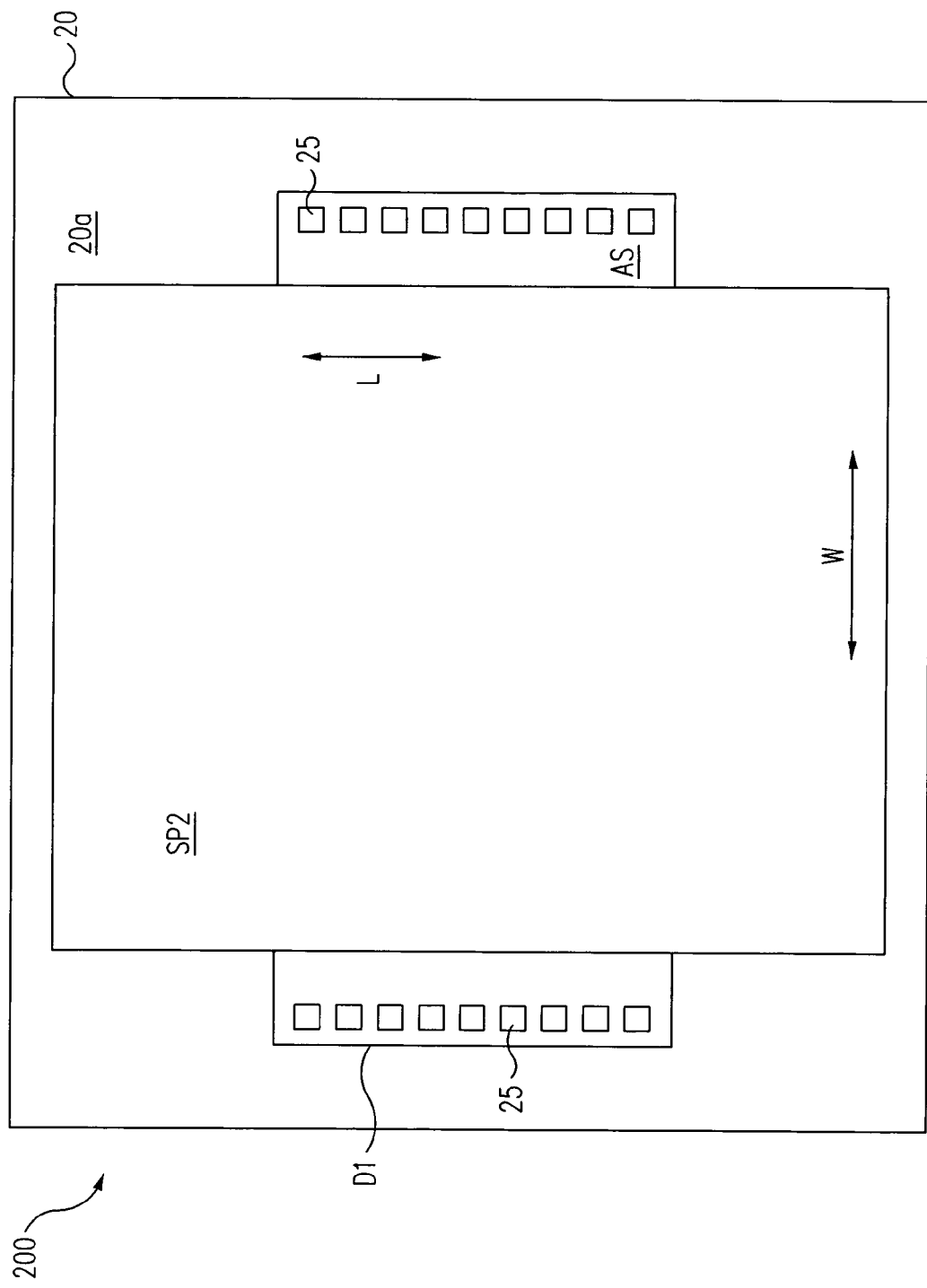
Figure 26C:
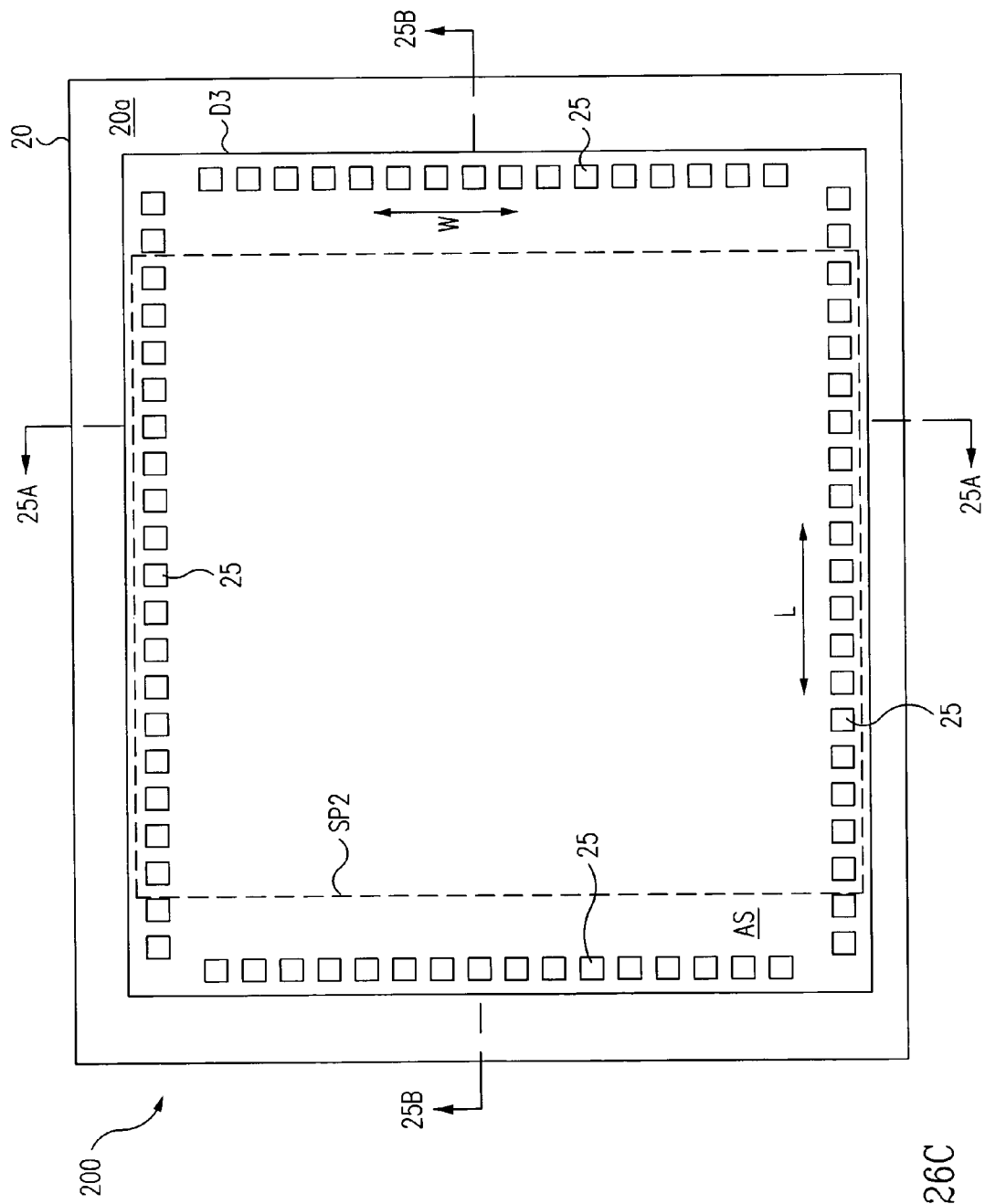

FIGS. 25A and 25B are cross-sectional side views of an embodiment of a semiconductor package 200 in accordance with the present invention. FIGS. 26A–26C are simplified top plan views of levels of semiconductor package 200. FIGS. 25A and 25B are taken 90 degrees apart, along lines 25A—25A and 25B—25B, respectively, of FIG. 26C.

Referring to FIGS. 25A, 25B, and 26A, semiconductor package 200, sometimes called a reverse pyramid die stacking package, includes a first level with a semiconductor die D1. The semiconductor die D1 is attached to upper surface 20a of substrate 20 by a uniformly-thick adhesive layer 27.

Referring to FIGS. 25A, 25B, and 26B, a second level of semiconductor package 200 includes a rigid spacer, denoted as "SP2", that is coupled to the coplanar active surface AS of semiconductor die D1 by an electrically insulative adhesive layer 28. The spacer SP2 may be formed of, for example, a rectangular prism of a semiconductor material (e.g., silicon) or of a dielectric material (e.g., ceramic). For this embodiment, the material may be assumed to be silicon. The adhesive layer 28 covers the entire lower surface of the spacer SP2.

As mentioned, spacer SP2 is a rectangular prism, e.g., a square prism. The upper and lower surfaces of spacer SP2 have an area such that spacer SP2 fits entirely within the two rows of bond pads 25 of semiconductor die D1, so that no bond pads 25 of semiconductor die D1 are overlapped by spacer SP2. On the other hand, spacer SP2 overhangs the two parallel long sides of semiconductor die D1.

Referring to FIG. 26C, a third level of semiconductor package 200 includes the semiconductor die D3 whose active surface AS is larger in area than the active surface AS of semiconductor die D1. Semiconductor die D3 includes at least one row, e.g., four rows, of bond pads 25 on its active surface AS. In this embodiment, semiconductor die D3 has one row of bond pads 25 along each of the four edges of the active surface AS. Spacer SP2 is illustrated by the dashed line in FIG. 26C.

In the case of a reverse pyramid stack such as semiconductor package 200, the semiconductor die D3 is larger than the semiconductor die D1. In this configuration, the spacer SP2 is used between the semiconductor die D1 and the semiconductor die D3 to raise the semiconductor die D3 sufficiently above the semiconductor die D1 to prevent the semiconductor die D3 from interfering with the bond wires 26 of the semiconductor die D1. Using the conventional approach for spacer dimensions, a conventional spacer would be constrained within the active surface AS of the semiconductor die D1. Using this conventional approach may require that the thickness of the semiconductor die D3 be such to prevent excessive bending of the semiconductor die D3 during the wire bond operation to the semiconductor die D3. Such excessive bending may degrade the integrity of the bond wires 26 or result in cracking of the semiconductor die D3 using the conventional approach.

However, in accordance with this embodiment of the present invention, the spacer SP2 is sized to provide adequate support to semiconductor die D3, such as during wirebonding. More particularly, the respective edges of spacer SP2 are located under the bond pads 25 of semiconductor die D3. A length L of spacer SP2 is equal to, or slightly less than (0.5 mm or less for example), width W of semiconductor die D3.

In one embodiment, semiconductor die D3 is diced from a semiconductor wafer that has had its inactive surface or backside BS polished or etched to reduce the thickness of the semiconductor dies of the wafer. Such backside polishing or etching reduces the vertical height of the semiconductor die D3, and thereby allows for a decrease in the overall height of semiconductor package 200. However, due to the reduced thickness of semiconductor die D3, and when using a conventional spacer entirely within the active surface of semiconductor die D1, semiconductor die D3 may crack or otherwise fail during wire bonding due to the overhang of semiconductor die D3 over the edges of the conventional spacer and semiconductor die D1. However, in accordance with this embodiment of the present invention, extension of spacer SP2, over the long sides of semiconductor die D1, provides additional support for semiconductor die D3, and in particular, for the overhanging portion of semiconductor die D3, allowing semiconductor die D3 to be reliably wire bonded.

The thickness of semiconductor die D3 is constrained by the overall package thickness and specifically by the thickness of the encapsulant 29, sometimes called the mold cap. Therefore, there is a need to optimize the thickness of each layer to both minimize the overall stack height and provide adequate support for each subsequent layer.

In this embodiment, the rigid spacer SP2 is sized to extend beyond the edges absent bond pads 25 of semiconductor die D1. Thus, the thickness of spacer SP2 may be used in combination with the thickness of the semiconductor die D3 to provide an effective (combined) thickness semiconductor. This combined thickness may allow the thickness of semiconductor die D3 to be reduced by the thickness of spacer SP2, to minimize the overall stack height, without reducing the inherent support for the semiconductor die D3.

As discussed above, a feature of semiconductor package 200 is that the semiconductor die D3 is larger than the semiconductor die D1. Conventionally, the semiconductor die D3 would be positioned on the semiconductor die D1 so as to not overlap bond pads 25 of the semiconductor die D1. However, when conventionally positioned, the semiconductor die D3 could crack or otherwise fail during wire bonding due to the overhang of the semiconductor die D3 over the edges of semiconductor die D1.

However, spacer SP2 has a thickness (i.e., vertical height) such that spacer SP2 spaces the adhesive layer 28 on the inactive surface BS of semiconductor die D3 vertically away from the bond pads 25 and bond wires 26 of semiconductor die D1. Thus, use of spacer SP2 allows the semiconductor die D3 to overlap over the bond pads 25 of the semiconductor die D1. Since adhesive layer 28 is electrically insulative, and typically resilient, its presence over the entire inactive surface BS of semiconductor die D3 will help to prevent the shorting of, or damage to, the bond wires 26 of semiconductor die D1 should the apex of the bond wires 26 come into contact with adhesive layer 28.

A difference between the spacer SP2 of package 200 and the conventional die stacking spacers mentioned above is that spacer SP2 overhangs the two long edges of active surface AS of semiconductor die D1, whereas the conventional die stacking spacers are entirely within the active surface and bond pads of the underlying semiconductor die. The sizing of spacer SP2 allows spacer SP2 to provide adequate support to semiconductor die D3, while at the same time providing vertical spacing between the bond pads 25 and bond wires 26 of semiconductor die D1 and the overlapping adhesive layer 28 and inactive surface BS of semiconductor die D3. Prior art spacers, as mentioned above, are entirely within the active surface AS and bond pads of the underlying semiconductor die.

Figure 27A:
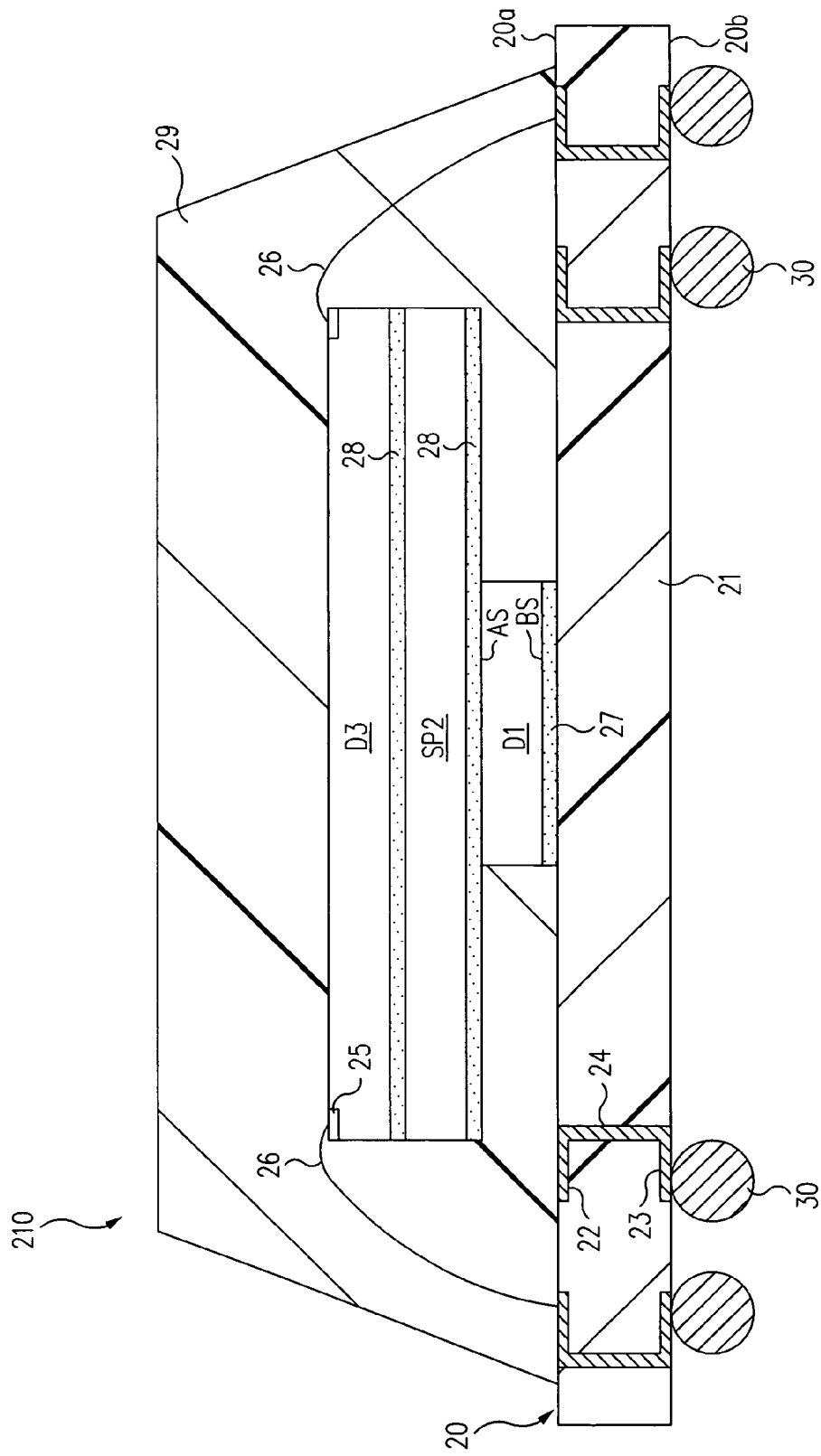
FIGS. 27A and 27B are cross-sectional side views of a $21^{th}$ embodiment of a semiconductor package in accordance with the present invention.
Figure 27B:
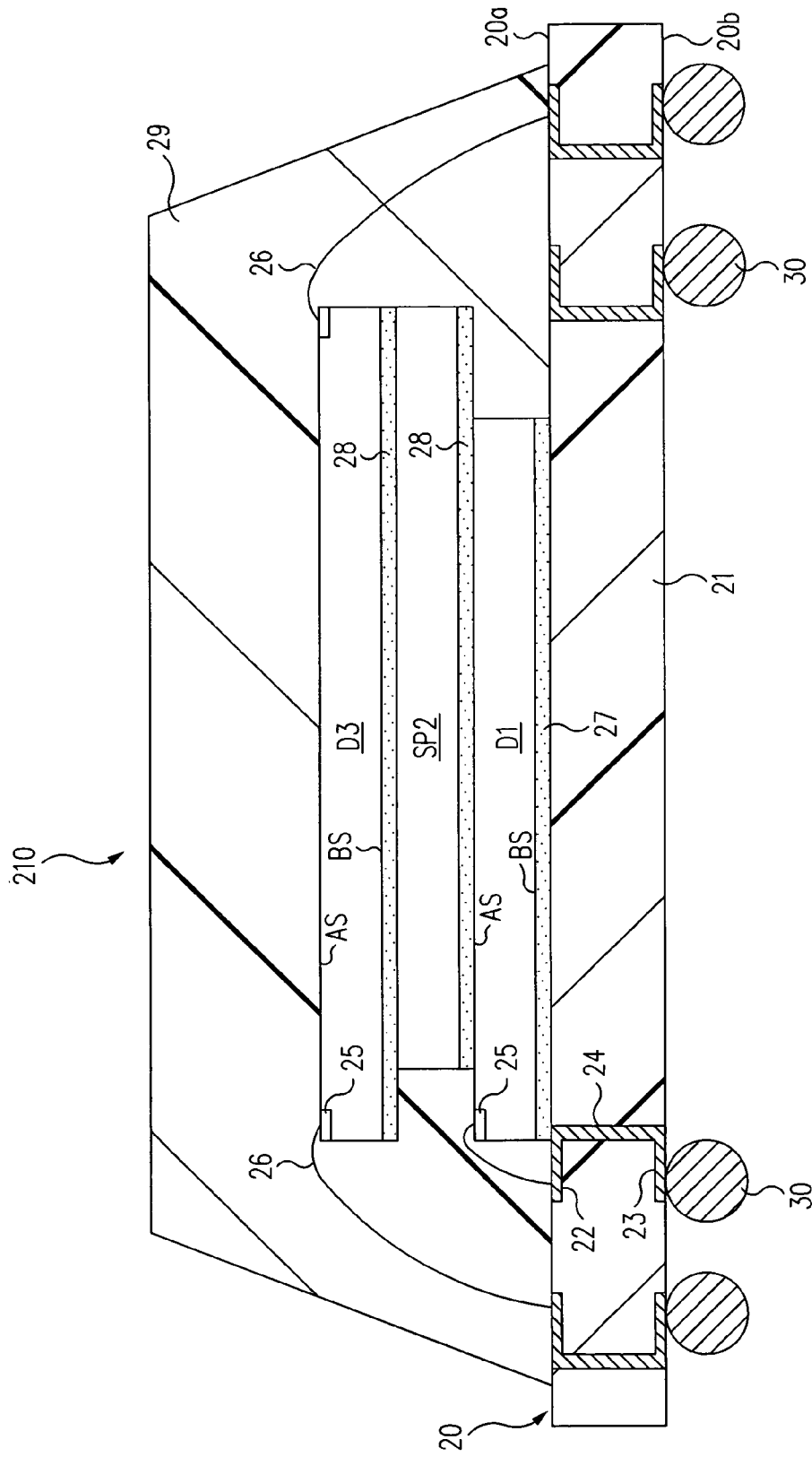
Figure 28A:
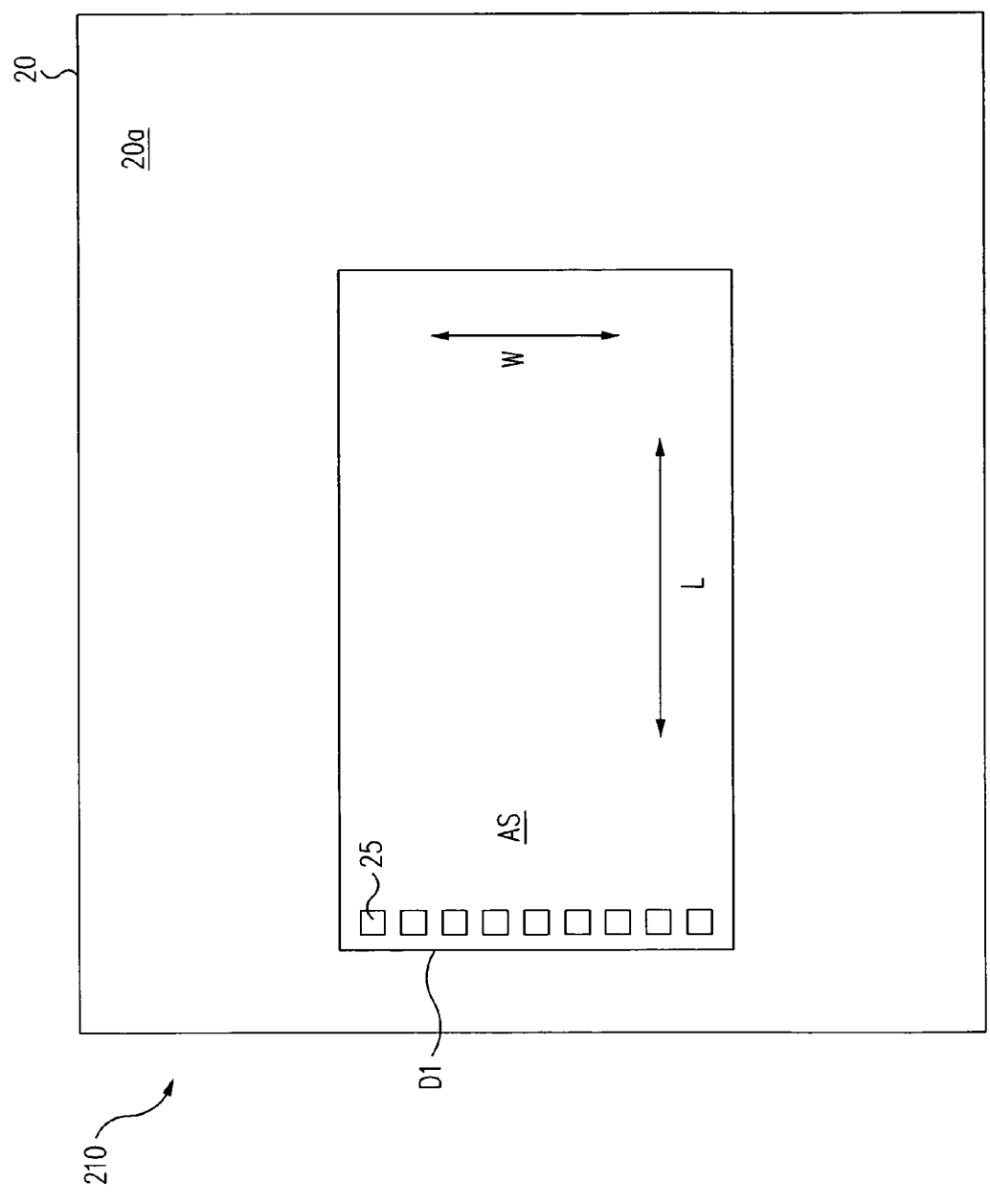
FIGS. 28A–28C are simplified top plan views of levels of the semiconductor package of FIGS. 27A and 27B.
Figure 28B:
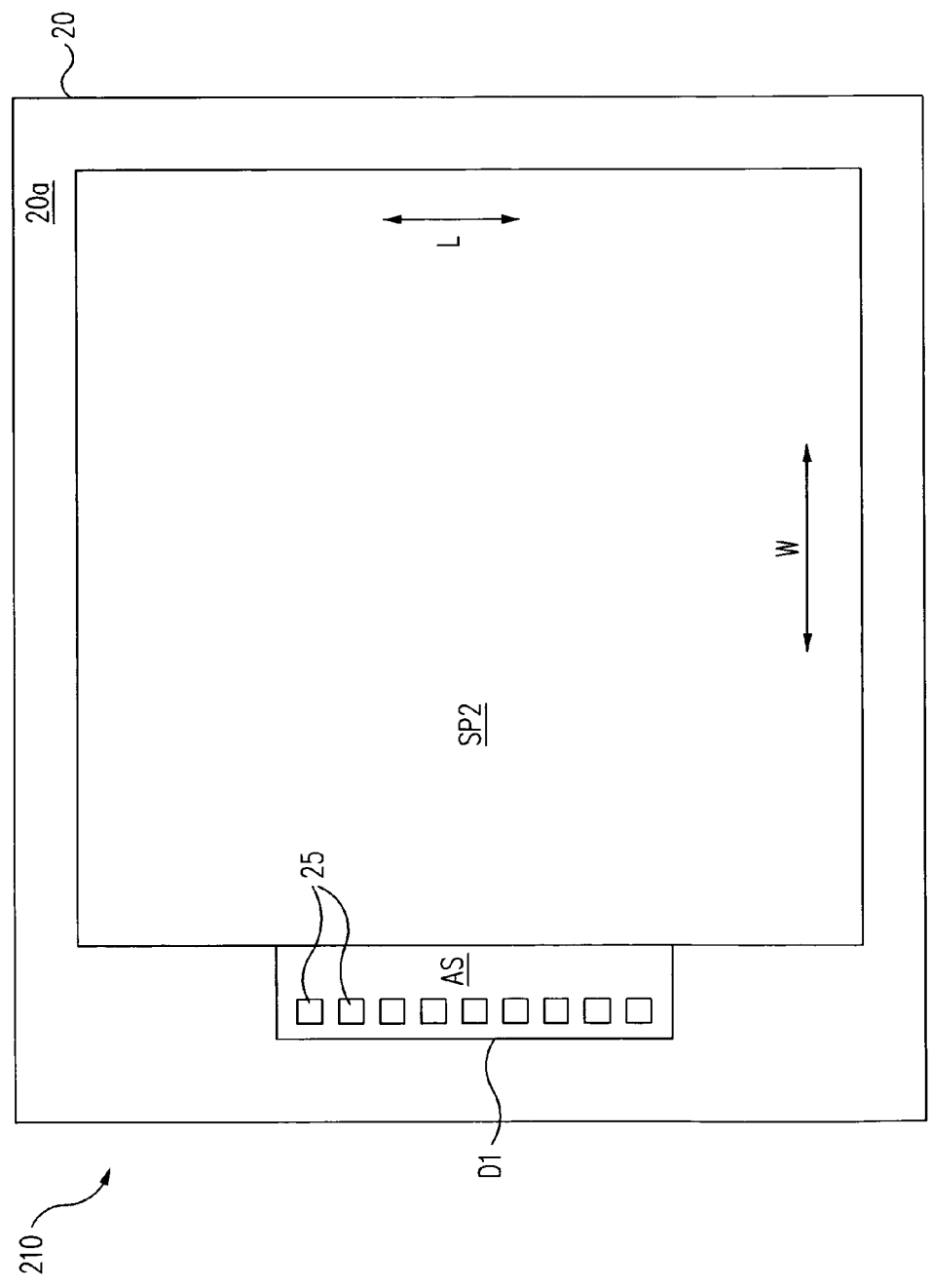
Figure 28C:
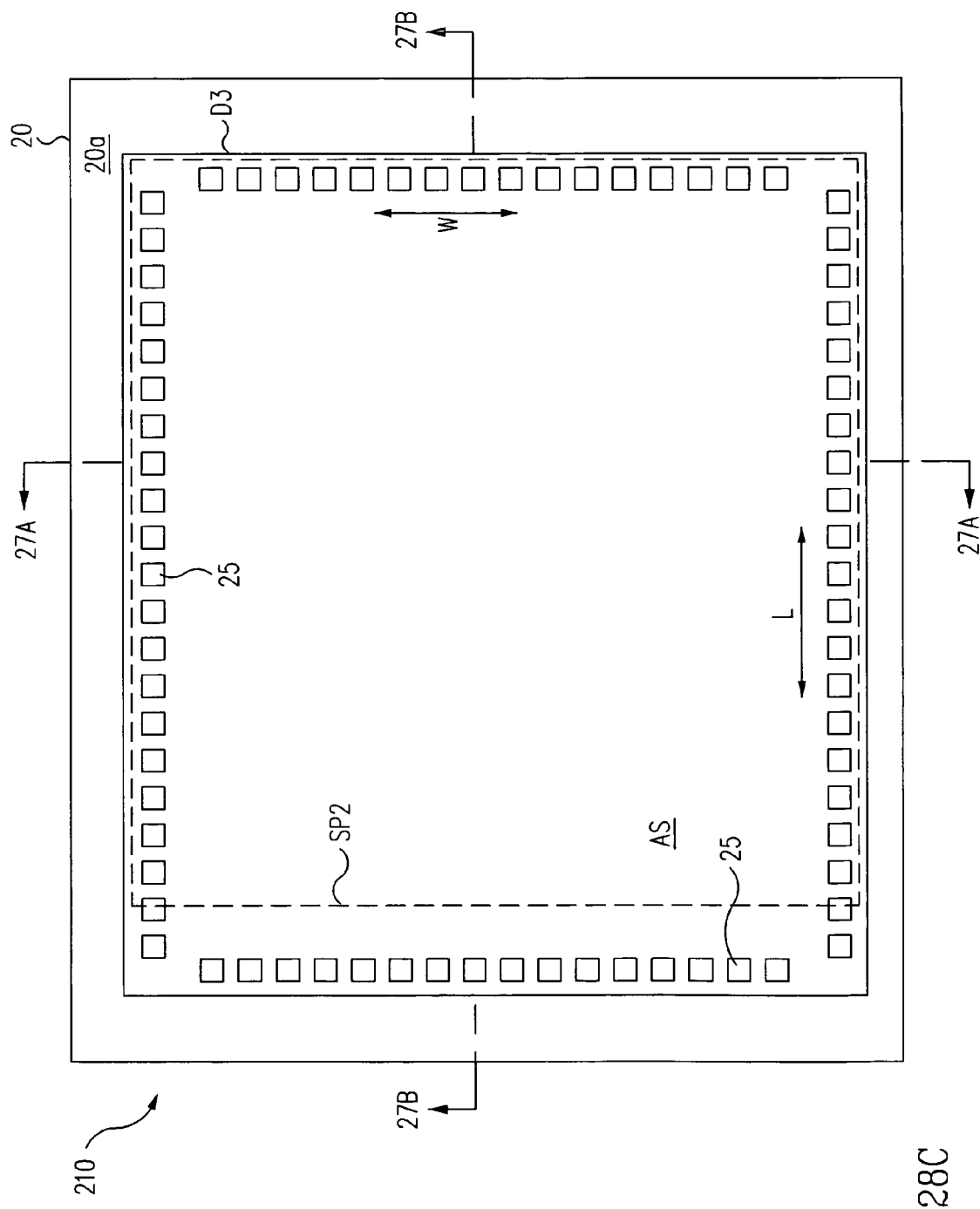

FIGS. 27A and 27B are cross-sectional side views of an embodiment of a semiconductor package 210 in accordance with the present invention. FIGS. 28A–28C are simplified top plan views of levels of semiconductor package 210. FIGS. 27A and 27B are taken 90 degrees apart, along lines 27A—27A and 27B—27B, respectively, of FIG. 28C.

Referring to FIGS. 27A, 27B, and 28A, semiconductor package 210, sometimes called a reverse pyramid die stacking package, includes a first level with a semiconductor die D1. The semiconductor die D1 is attached to upper surface 20a of substrate 20 by a uniformly-thick adhesive layer 27. In accordance with this embodiment, the semiconductor die D1 has only a single row of bond pads 25 along a single edge, the other three edges of semiconductor die D1 are absent bond pads 25.

Referring to FIGS. 27A, 27B, and 28B, a second level of semiconductor package 210 includes a rigid spacer, denoted as "SP2", that is coupled to the coplanar active surface AS of semiconductor die D1 by an electrically insulative adhesive layer 28. The spacer SP2 may be formed of, for example, a rectangular prism of a semiconductor material (e.g., silicon) or of a dielectric material (e.g., ceramic). For this embodiment, the material may be assumed to be silicon. The adhesive layer 28 covers the entire lower surface of the spacer SP2.

As mentioned, spacer SP2 is a rectangular prism, e.g., a square prism. The upper and lower surfaces of spacer SP2 have an area such that spacer SP2 overhangs the two parallel long sides of the semiconductor die D1 and the third perpendicular short side of the semiconductor die D1. More generally, spacer SP2 overhangs all three of the sides, sometimes called edges, that have an absence of bond pads 25 of the semiconductor die D1 and is positioned on the semiconductor die D1 so that no bond pads 25 of semiconductor die D1 are overlapped by spacer SP2.

Referring to FIG. 28C, a third level of semiconductor package 210 includes the semiconductor die D3 whose active surface AS is larger in area than the active surface AS of semiconductor die D1. Semiconductor die D3 includes at least one row, e.g., four rows, of bond pads 25 on its active surface AS. In this embodiment, semiconductor die D3 has one row of bond pads 25 along each of the four edges of the active surface AS. Spacer SP2 is illustrated by the dashed line in FIG. 28C.

In the case of a reverse pyramid stack such as semiconductor package 210, the semiconductor die D3 is larger than the semiconductor die D1. In this configuration, the spacer SP2 is used between the semiconductor die D1 and the semiconductor die D3 to raise the semiconductor die D3 sufficiently above the semiconductor die D1 to prevent the semiconductor die D3 from interfering with the bond wires 26 of the semiconductor die D1. Using the conventional approach for spacer dimensions, a conventional spacer would be constrained within the active surface AS of the semiconductor die D1. Using this conventional approach may require that the thickness of the semiconductor die D3 be such to prevent excessive bending of the semiconductor die D3 during the wire bond operation to the semiconductor die D3. Such excessive bending may degrade the integrity of the bond wires 26 or result in cracking of the semiconductor die D3 using the conventional approach.

However, in accordance with this embodiment of the present invention, the spacer SP2 is sized to provide adequate support to semiconductor die D3, such as during wirebonding. More particularly, the respective edges of spacer SP2 are located under the bond pads 25 of semiconductor die D3. A length L of spacer SP2 is equal to, or slightly less than (0.5 mm or less for example), width W of semiconductor die D3.

In one embodiment, semiconductor die D3 is diced from a semiconductor wafer that has had its inactive surface or backside BS polished or etched to reduce the thickness of the semiconductor dies of the wafer. Such backside polishing or etching reduces the vertical height of the semiconductor die D3, and thereby allows for a decrease in the overall height of semiconductor package 210. However, due to the reduced thickness of semiconductor die D3, and when using a conventional spacer entirely within the active surface of semiconductor die D1, semiconductor die D3 may crack or otherwise fail during wire bonding due to the overhang of semiconductor die D3 over the edges of the conventional spacer and semiconductor die D1. However, in accordance with this embodiment of the present invention, extension of spacer SP2, over the three sides of semiconductor die D1, provides additional support for semiconductor die D3, and in particular, for the overhanging portion of semiconductor die D3, allowing semiconductor die D3 to be reliably wire bonded.

The thickness of semiconductor die D3 is constrained by the overall package thickness and specifically by the thickness of the encapsulant 29, sometimes called the mold cap. Therefore, there is a need to optimize the thickness of each layer to both minimize the overall stack height and provide adequate support for each subsequent layer.

In this embodiment, the rigid spacer SP2 is sized to extend beyond the three edges absent bond pads 25 of semiconductor die D1. Thus, the thickness of spacer SP2 may be used in combination with the thickness of the semiconductor die D3 to provide an effective (combined) thickness semiconductor. This combined thickness may allow the thickness of semiconductor die D3 to be reduced by the thickness of spacer SP2, to minimize the overall stack height, without reducing the inherent support for the semiconductor die D3.

As discussed above, a feature of semiconductor package 210 is that the semiconductor die D3 is larger than the semiconductor die D1. Conventionally, the semiconductor die D3 would be positioned on the semiconductor die D1 so as to not overlap bond pads 25 of the semiconductor die D1. However, when conventionally positioned, the semiconductor die D3 could crack or otherwise fail during wire bonding due to the overhang of the semiconductor die D3 over the edges of semiconductor die D1. Further, the asymmetry that results from the conventional positioning of the semiconductor die D3 to not overlap the bond pads 25 of the semiconductor die D1 could result in excessive mechanical stress on the package elements.

However, spacer SP2 has a thickness (i.e., vertical height) such that spacer SP2 spaces the adhesive layer 28 on the inactive surface BS of semiconductor die D3 vertically away from the bond pads 25 and bond wires 26 of semiconductor die D1. Thus, use of spacer SP2 allows the semiconductor die D3 to overlap over the bond pads 25 of the semiconductor die D1. Since adhesive layer 28 is electrically insulative, and typically resilient, its presence over the entire inactive surface BS of semiconductor die D3 will help to prevent the shorting of, or damage to, the bond wires 26 of semiconductor die D1 should the apex of the bond wires 26 come into contact with adhesive layer 28. Additionally, spacer SP2 allows the semiconductor die D3 to be centered relative to the substrate 20, providing more overall symmetry to the package and less asymmetric stress.

A difference between the spacer SP2 of package 210 and the conventional die stacking spacers mentioned above is that spacer SP2 overhangs the three edges of active surface AS of semiconductor die D1, whereas the conventional die stacking spacers are entirely within the active surface and bond pads of the underlying semiconductor die. The sizing of spacer SP2 allows spacer SP2 to provide adequate support to semiconductor die D3, while at the same time providing vertical spacing between the bond pads 25 and bond wires 26 of semiconductor die D1 and the overlapping adhesive layer 28 and inactive surface BS of semiconductor die D3. Prior art spacers, as mentioned above, are entirely within the active surface AS and bond pads of the underlying semiconductor die.

This disclosure provides exemplary embodiments of the present invention. The scope of the present invention is not limited by these exemplary embodiments. Numerous variations, whether explicitly provided for by the specification or implied by the specification, such as variations in structure (e.g., additional semiconductor die and/or spacers), dimension, type of material such as use of paste adhesives and film adhesives that do not cover the entire inactive surface or backside BS of the semiconductor die or spacers, and manufacturing process may be implemented by one of skill in the art in view of this disclosure.

What is claimed is:

1. A structure comprising:
   a substrate comprising a first surface;
   a first semiconductor die comprising an active surface with opposite first and second rows of bond pads, and an opposite inactive surface attached to the first surface of the substrate;
   a spacer formed of a rigid material, the spacer coupled to the active surface of the first semiconductor die entirely within the first and second rows of bond pads of the first semiconductor die, with the spacer overhanging at least one side of the first semiconductor die; and
   a second semiconductor die comprising an active surface and an opposite inactive surface coupled to the spacer, the active surface of the second semiconductor die larger in area than the active surface of the first semiconductor die, the active surface of the second semiconductor die with at least one row of bond pads.

2. The structure of claim 1 further comprising:
   an encapsulant material covering the first surface of the substrate, the first semiconductor die, the spacer, and the second semiconductor die.

3. The structure of claim 1 wherein the spacer does not overlap the first and second rows of bond pads, the first and second rows of bond pads being parallel.

4. The structure of claim 1 wherein the at least one row of bond pads of the second semiconductor die comprises four rows of bond pads.

5. The structure of claim 1 wherein the at least one row of bond pads of the second semiconductor die comprise a row of bond pads along each of four edges of the active surface of the second semiconductor die.

6. The structure of claim 1 wherein the second semiconductor die is too large to fit within the first and second rows of bond pads of the first semiconductor die.

7. A structure comprising:
   a substrate comprising a first surface;
   a first semiconductor die comprising an active surface with opposite first and second rows of bond pads, and an opposite inactive surface attached to the first surface of the substrate;
   a spacer coupled to the active surface of the first semiconductor die entirely within the first and second rows of bond pads of the first semiconductor die, with the spacer overhanging at least one side of the first semiconductor die;
   a second semiconductor die comprising an active surface and an opposite inactive surface coupled to the spacer, the active surface of the second semiconductor die larger in area than the active surface of the first semiconductor die, the active surface of the second semiconductor die with at least one row of bond pads; and
   an adhesive layer on the inactive surface of the second semiconductor die.

8. The structure of claim 7 further comprising bond wires coupled to the first and second rows of bond pads of the first semiconductor die, the spacer spacing the adhesive layer away from the bond wires and the first and second rows of bond pads.

9. The structure of claim 1 wherein the spacer is for supporting the second semiconductor die during wirebonding to the at least one row of bond pads of the second semiconductor die.

10. A structure comprising:
    a substrate comprising a first surface;
    a first semiconductor die comprising an active surface with opposite first and second rows of bond pads, and an opposite inactive surface attached to the first surface of the substrate;
    a spacer coupled to the active surface of the first semiconductor die entirely within the first and second rows of bond pads of the first semiconductor die, with the spacer overhanging at least one side of the first semiconductor die; and
    a second semiconductor die comprising an active surface and an opposite inactive surface coupled to the spacer, the active surface of the second semiconductor die larger in area than the active surface of the first semiconductor die, the active surface of the second semiconductor die with at least one row of bond pads, wherein the respective edges of the spacer are under the at least one row of bond pads of the second semiconductor die.

11. A structure comprising:
a substrate comprising a first surface;
a first semiconductor die comprising an active surface with opposite first and second rows of bond pads, and an opposite inactive surface attached to the first surface of the substrate;
a spacer coupled to the active surface of the first semiconductor die entirely within the first and second rows of bond pads of the first semiconductor die, with the spacer overhanging at least one side of the first semiconductor die; and
a second semiconductor die comprising an active surface and an opposite inactive surface coupled to the spacer, the active surface of the second semiconductor die larger in area than the active surface of the first semiconductor die, the active surface of the second semiconductor die with at least one row of bond pads, wherein a length of the spacer is equal to a width of the second semiconductor die.

12. A structure comprising:
a substrate comprising a first surface;
a first semiconductor die comprising an active surface with opposite first and second rows of bond pads, and an opposite inactive surface attached to the first surface of the substrate;
a spacer coupled to the active surface of the first semiconductor die entirely within the first and second rows of bond pads of the first semiconductor die, with the spacer overhanging at least one side of the first semiconductor die; and
a second semiconductor die comprising an active surface and an opposite inactive surface coupled to the spacer, the active surface of the second semiconductor die larger in area than the active surface of the first semiconductor die, the active surface of the second semiconductor die with at least one row of bond pads, wherein a length of the spacer is slightly less than a width of the second semiconductor die.

13. A structure comprising:
a substrate comprising a first surface;
a first semiconductor die comprising an active surface with opposite first and second rows of bond pads, and an opposite inactive surface attached to the first surface of the substrate;
a means for supporting formed of a rigid material, the means for supporting coupled to the active surface of the first semiconductor die entirely within the first and second rows of bond pads of the first semiconductor die, the means for supporting overhanging at least one side of the first semiconductor die; and
a second semiconductor die comprising an active surface and an opposite inactive surface coupled to the means for supporting, the active surface of the second semiconductor die larger in area than the active surface of the first semiconductor die, the active surface of the second semiconductor die with at least one row of bond pads.

14. A method comprising:
coupling an inactive surface of a first semiconductor die to a first surface of a substrate, the first semiconductor die further comprising an active surface with opposite first and second rows of bond pads;
coupling a spacer to the active surface of the first semiconductor die entirely within the first and second rows of bond pads of the first semiconductor die, the spacer overhanging at least one side of the first semiconductor die;
coupling an inactive surface of a second semiconductor die to the spacer, the second semiconductor die further comprising an active surface larger in area than the active surface of the first semiconductor die, the active surface of the second semiconductor die with at least one row of bond pads; and
supporting the second semiconductor die with the spacer during wirebonding to the at least one row of bond pads of the second semiconductor die.

15. A structure comprising:
a substrate comprising a first surface;
a first semiconductor die comprising an active surface with a single row of bond pads, and an opposite inactive surface attached to the first surface of the substrate;
a spacer formed of a rigid material, the spacer coupled to the active surface of the first semiconductor die and positioned on the first semiconductor die so as to not overlap the single row of bond pads on the first semiconductor die, the spacer overhanging at least one side of the first semiconductor die; and
a second semiconductor die comprising an active surface and an opposite inactive surface coupled to the spacer, the active surface of the second semiconductor die larger in area than the active surface of the first semiconductor die, the active surface of the second semiconductor die with at least one row of bond pads.

16. A structure comprising:
a substrate comprising a first surface;
a first semiconductor die comprising an active surface with a single row of bond pads, and an opposite inactive surface attached to the first surface of the substrate;
a spacer coupled to the active surface of the first semiconductor die and positioned on the first semiconductor die so as to not overlap the single row of bond pads on the first semiconductor die, wherein the spacer overhangs three sides of the first semiconductor die; and
a second semiconductor die comprising an active surface and an opposite inactive surface coupled to the spacer, the active surface of the second semiconductor die larger in area than the active surface of the first semiconductor die, the active surface of the second semiconductor die with at least one row of bond pads.

17. The structure of claim 16 wherein the three sides of the first semiconductor die have an absence of bond pads.

18. The structure of claim 15 wherein the spacer does not overlap the single row of bond pads.

19. The structure of claim 15 wherein the at least one row of bond pads of the second semiconductor die comprises four rows of bond pads.

20. The structure of claim 15 wherein the at least one row of bond pads comprise a row of bond pads along each of four edges of the active surface of the second semiconductor die.

21. A structure comprising:
a substrate comprising a first surface;
a first semiconductor die comprising an active surface with a single row of bond pads, and an opposite inactive surface attached to the first surface of the substrate;

a spacer coupled to the active surface of the first semiconductor die and positioned on the first semiconductor die so as to not overlap the single row of bond pads on the first semiconductor die, the spacer overhanging at least one side of the first semiconductor die;

a second semiconductor die comprising an active surface and an opposite inactive surface coupled to the spacer, the active surface of the second semiconductor die larger in area than the active surface of the first semiconductor die, the active surface of the second semiconductor die with at least one row of bond pads; and an adhesive layer on the inactive surface of the second semiconductor die.

22. The structure of claim 21 further comprising bond wires coupled to the single row of bond pads of the first semiconductor die, the spacer spacing the adhesive layer away from the bond wires and the single row of bond pads.

23. The structure of claim 15 wherein the spacer is for supporting the second semiconductor die during wirebonding to the at least one row of bond pads of the second semiconductor die.

24. The structure of claim 15 wherein the respective edges of the spacer are under the at least one row of bond pads of the second semiconductor die.

25. A method comprising:

coupling an inactive surface of a first semiconductor die to a first surface of a substrate, the first semiconductor die further comprising an active surface with a single row of bond pads;

coupling a spacer formed of a rigid material to the active surface of the first semiconductor die, the spacer being positioned on the first semiconductor die so as to not overlap the single row of bond pads of the first semiconductor die, the spacer overhanging at least one side of the first semiconductor die; and coupling an inactive surface of a second semiconductor die to the spacer, the second semiconductor die further comprising an active surface larger in area than the active surface of the first semiconductor die, the active surface of the second semiconductor die with at least one row of bond pads.

* * * * *